US008294159B2

(12) United States Patent
Or-Bach et al.

(10) Patent No.: US 8,294,159 B2
(45) Date of Patent: *Oct. 23, 2012

(54) METHOD FOR FABRICATION OF A SEMICONDUCTOR DEVICE AND STRUCTURE

(75) Inventors: Zvi Or-Bach, San Jose, CA (US); Deepak C. Sekar, San Jose, CA (US); Brian Cronquist, San Jose, CA (US); Israel Beinglass, Sunnyvale, CA (US); Jan Lodewijk de Jong, Cupertino, CA (US)

(73) Assignee: MonolithIC 3D Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/073,268

(22) Filed: Mar. 28, 2011

(65) Prior Publication Data

US 2011/0233676 A1 Sep. 29, 2011

Related U.S. Application Data

(60) Division of application No. 12/792,673, filed on Jun. 2, 2010, now Pat. No. 7,964,916, which is a continuation-in-part of application No. 12/706,520, filed on Feb. 16, 2010, and a continuation-in-part of application No. 12/577,532, filed on Oct. 12, 2009.

(51) Int. Cl.
*H01L 29/04* (2006.01)

(52) U.S. Cl. ... 257/74; 257/774; 257/797; 257/E27.064; 257/E21.614

(58) Field of Classification Search .................... 257/66, 257/67, 69, 70, 74, 774, 797, E27.064, E21.61
See application file for complete search history.

(56) References Cited

U.S. PATENT DOCUMENTS

| | | | |
|---|---|---|---|
| 3,007,090 | A | 10/1961 | Rutz |
| 3,819,959 | A | 6/1974 | Chang et al. |
| 4,197,555 | A | 4/1980 | Uehara et al. |
| 4,400,715 | A | 8/1983 | Barbee et al. |
| 4,487,635 | A | 12/1984 | Kugimiya et al. |
| 4,522,657 | A | 6/1985 | Rohatgi et al. |
| 4,643,950 | A | 2/1987 | Ogura et al. |

(Continued)

FOREIGN PATENT DOCUMENTS

EP 1267594 A2 12/2002

(Continued)

OTHER PUBLICATIONS

Chen, P. et al., “Effects of Hydrogen Implantation Damage on the Performance of InP/InGaAs/InP p-i-n Photodiodes, Transferred on Silicon,” Applied Physics Letters, Jan. 2009, pp. 012101-1 to 012101-3, vol. 94, No. 1.

(Continued)

*Primary Examiner* — Eduardo A Rodela
(74) *Attorney, Agent, or Firm* — Venable LLP; Michael A. Sartori; Steven J. Schwarz

(57) ABSTRACT

A method for fabrication of 3D semiconductor devices utilizing a layer transfer and steps for forming transistors on top of a pre-fabricated semiconductor device comprising transistors formed on crystallized semiconductor base layer and metal layer for the transistors interconnections and insulation layer. The advantage of this approach is reduction of the over all metal length used to interconnect the various transistors.

7 Claims, 178 Drawing Sheets

U.S. PATENT DOCUMENTS 4,704,785 A 11/1987 Curran
4,711,858 A 12/1987 Harder et al.
4,721,885 A 1/1988 Brodie
4,732,312 A 3/1988 Kennedy et al.
4,733,288 A 3/1988 Sato
4,829,018 A 5/1989 Wahlstrom
4,854,986 A 8/1989 Raby
4,866,304 A 9/1989 Yu
4,939,568 A 7/1990 Kato et al.
4,956,307 A 9/1990 Pollack et al.
5,012,153 A 4/1991 Atkinson et al.
5,032,007 A 7/1991 Silverstein et al.
5,047,979 A 9/1991 Leung
5,087,585 A 2/1992 Hayashi
5,093,704 A 3/1992 Sato et al.
5,106,775 A 4/1992 Kaga et al.
5,152,857 A 10/1992 Ito et al.
5,162,879 A 11/1992 Gill
5,217,916 A 6/1993 Anderson et al.
5,250,460 A 10/1993 Yamagata et al.
5,258,643 A 11/1993 Cohen
5,265,047 A 11/1993 Leung et al.
5,266,511 A 11/1993 Takao
5,277,748 A 1/1994 Sakaguchi et al.
5,286,670 A 2/1994 Kang et al.
5,294,556 A 3/1994 Kawamura
5,308,782 A 5/1994 Mazure et al.
5,312,771 A 5/1994 Yonehara
5,317,236 A 5/1994 Zavracky et al.
5,324,980 A 6/1994 Kusunoki
5,355,022 A 10/1994 Sugahara et al.
5,371,037 A 12/1994 Yonehara
5,374,564 A 12/1994 Bruel
5,374,581 A 12/1994 Ichikawa et al.
5,424,560 A 6/1995 Norman et al.
5,475,280 A 12/1995 Jones et al.
5,478,762 A 12/1995 Chao
5,485,031 A 1/1996 Zhang et al.
5,498,978 A 3/1996 Takahashi et al.
5,527,423 A 6/1996 Neville et al.
5,535,342 A 7/1996 Taylor
5,554,870 A 9/1996 Fitch et al.
5,563,084 A 10/1996 Ramm et al.
5,583,349 A 12/1996 Norman et al.
5,583,350 A 12/1996 Norman et al.
5,594,563 A 1/1997 Larson
5,604,137 A 2/1997 Yamazaki et al.
5,617,991 A 4/1997 Pramanick et al.
5,627,106 A 5/1997 Hsu
5,656,548 A 8/1997 Zavracky et al.
5,670,411 A 9/1997 Yonehara
5,681,756 A 10/1997 Norman et al.
5,695,557 A 12/1997 Yamagata et al.
5,701,027 A 12/1997 Gordon et al.
5,707,745 A 1/1998 Forrest et al.
5,714,395 A 2/1998 Bruel
5,721,160 A 2/1998 Forrest et al.
5,737,748 A 4/1998 Shigeeda
5,739,552 A 4/1998 Kimura et al.
5,744,979 A 4/1998 Goetting
5,748,161 A 5/1998 Lebby et al.
5,757,026 A 5/1998 Forrest et al.
5,781,031 A 7/1998 Bertin et al.
5,829,026 A 10/1998 Leung et al.
5,835,396 A 11/1998 Zhang
5,854,123 A 12/1998 Sato et al.
5,861,929 A 1/1999 Spitzer
5,877,070 A 3/1999 Goesele et al.
5,882,987 A 3/1999 Srikrishnan
5,883,525 A 3/1999 Tavana et al.
5,889,903 A 3/1999 Rao
5,915,167 A 6/1999 Leedy
5,937,312 A 8/1999 Iyer et al.
5,943,574 A 8/1999 Tehrani et al.
5,952,680 A 9/1999 Strite
5,952,681 A 9/1999 Chen
5,965,875 A 10/1999 Merrill
5,977,579 A 11/1999 Noble
5,977,961 A 11/1999 Rindal
5,980,633 A 11/1999 Yamagata et al.
5,985,742 A 11/1999 Henley et al.
5,998,808 A 12/1999 Matsushita
6,001,693 A 12/1999 Yeouchung et al.
6,009,496 A 12/1999 Tsai
6,020,252 A 2/2000 Aspar et al.
6,020,263 A 2/2000 Shih et al.
6,027,958 A 2/2000 Vu et al.
6,030,700 A 2/2000 Forrest et al.
6,052,498 A 4/2000 Paniccia
6,057,212 A 5/2000 Chan et al.
6,071,795 A 6/2000 Cheung et al.
6,103,597 A 8/2000 Aspar et al.
6,111,260 A 8/2000 Dawson et al.
6,125,217 A 9/2000 Paniccia et al.
6,153,495 A 11/2000 Kub et al.
6,191,007 B1 2/2001 Matsui et al.
6,222,203 B1 4/2001 Ishibashi et al.
6,229,161 B1 5/2001 Nemati et al.
6,242,324 B1 6/2001 Kub et al.
6,259,623 B1 7/2001 Takahashi
6,264,805 B1 7/2001 Forrest et al.
6,281,102 B1 8/2001 Cao et al.
6,294,018 B1 9/2001 Hamm et al.
6,306,705 B1 10/2001 Parekh et al.
6,321,134 B1 11/2001 Henley et al.
6,322,903 B1 11/2001 Siniaguine et al.
6,331,468 B1 12/2001 Aronowitz et al.
6,331,790 B1 12/2001 Or-Bach et al.
6,353,492 B2 3/2002 McClelland et al.
6,355,501 B1 3/2002 Fung et al.
6,358,631 B1 3/2002 Forrest et al.
6,365,270 B2 4/2002 Forrest et al.
6,376,337 B1 4/2002 Wang et al.
6,380,046 B1 4/2002 Yamazaki
6,417,108 B1 7/2002 Akino et al.
6,420,215 B1 7/2002 Knall et al.
6,423,614 B1 7/2002 Doyle
6,429,484 B1 8/2002 Yu
6,430,734 B1 8/2002 Zahar
6,475,869 B1 11/2002 Yu
6,476,493 B2 11/2002 Or-Bach et al.
6,515,511 B2 2/2003 Sugibayashi et al.
6,526,559 B2 2/2003 Schiefele et al.
6,528,391 B1 3/2003 Henley et al.
6,534,352 B1 3/2003 Kim
6,534,382 B1 3/2003 Sakaguchi et al.
6,544,837 B1 4/2003 Divakauni et al.
6,545,314 B2 4/2003 Forbes et al.
6,555,901 B1 4/2003 Yoshihara et al.
6,563,139 B2 5/2003 Hen
6,580,289 B2 6/2003 Cox
6,600,173 B2 * 7/2003 Tiwari ............................ 257/74
6,624,046 B1 9/2003 Zavracky et al.
6,627,518 B1 9/2003 Inoue et al.
6,630,713 B2 10/2003 Geusic
6,635,552 B1 10/2003 Gonzalez
6,638,834 B2 10/2003 Gonzalez
6,642,744 B2 11/2003 Or-Bach et al.
6,653,209 B1 11/2003 Yamagata
6,661,085 B2 12/2003 Kellar et al.
6,677,204 B2 1/2004 Cleeves et al.
6,686,253 B2 2/2004 Or-Bach
6,703,328 B2 3/2004 Tanaka et al.
6,756,633 B2 6/2004 Wang et al.
6,756,811 B2 6/2004 Or-Bach
6,759,282 B2 7/2004 Campbell et al.
6,762,076 B2 7/2004 Kim et al.
6,774,010 B2 8/2004 Chu et al.
6,805,979 B2 10/2004 Ogura et al.
6,806,171 B1 10/2004 Ulyashin et al.
6,809,009 B2 10/2004 Aspar et al.
6,815,781 B2 11/2004 Vyvoda et al.
6,819,136 B2 11/2004 Or-Bach
6,821,826 B1 * 11/2004 Chan et al. .................... 438/150
6,844,243 B1 1/2005 Gonzalez
6,864,534 B2 3/2005 Ipposhi et al.
6,875,671 B2 4/2005 Faris 6,882,572 B2 4/2005 Wang et al.
6,888,375 B2 5/2005 Feng et al.
6,917,219 B2 7/2005 New
6,930,511 B2 8/2005 Or-Bach
6,943,067 B2 9/2005 Greenlaw
6,943,407 B2 9/2005 Ouyang et al.
6,953,956 B2 10/2005 Or-Bach et al.
6,967,149 B2 11/2005 Meyer et al.
6,985,012 B2 1/2006 Or-Bach
6,989,687 B2 1/2006 Or-Bach
6,995,430 B2 2/2006 Langdo et al.
6,995,456 B2 2/2006 Nowak
7,015,719 B1 3/2006 Feng et al.
7,016,569 B2 3/2006 Mule et al.
7,018,875 B2 3/2006 Madurawe
7,019,557 B2 3/2006 Madurawe
7,043,106 B2 5/2006 West et al.
7,052,941 B2 5/2006 Lee
7,064,579 B2 6/2006 Madurawe
7,067,396 B2 6/2006 Aspar et al.
7,068,070 B2 6/2006 Or-Bach
7,068,072 B2 6/2006 New et al.
7,078,739 B1 7/2006 Nemati et al.
7,094,667 B1 8/2006 Bower
7,098,691 B2 8/2006 Or-Bach et al.
7,105,390 B2 9/2006 Brask et al.
7,105,871 B2 9/2006 Or-Bach et al.
7,109,092 B2 9/2006 Tong
7,110,629 B2 9/2006 Bjorkman et al.
7,111,149 B2 9/2006 Eilert
7,115,945 B2 10/2006 Lee et al.
7,115,966 B2 10/2006 Ido et al.
7,141,853 B2 11/2006 Campbell et al.
7,148,119 B1 12/2006 Sakaguchi et al.
7,157,787 B2 1/2007 Kim et al.
7,157,937 B2 1/2007 Apostol et al.
7,166,520 B1 1/2007 Henley
7,170,807 B2 1/2007 Fazan et al.
7,173,369 B2 2/2007 Forrest et al.
7,180,091 B2 2/2007 Yamazaki et al.
7,180,379 B1 2/2007 Hopper et al.
7,189,489 B2 3/2007 Kunimoto et al.
7,205,204 B2 4/2007 Ogawa et al.
7,217,636 B1 5/2007 Atanackovic
7,223,612 B2 5/2007 Sarma
7,242,012 B2 7/2007 Leedy
7,245,002 B2 7/2007 Akino et al.
7,256,104 B2 8/2007 Ito et al.
7,259,091 B2 8/2007 Schuehrer et al.
7,265,421 B2 9/2007 Madurawe
7,271,420 B2 9/2007 Cao
7,282,951 B2 10/2007 Huppenthal et al.
7,296,201 B2 11/2007 Abramovici
7,304,355 B2 12/2007 Zhang
7,312,109 B2 12/2007 Madurawe
7,312,487 B2 12/2007 Alam et al.
7,335,573 B2 2/2008 Takayama et al.
7,337,425 B2 2/2008 Kirk
7,338,884 B2 3/2008 Shimoto et al.
7,351,644 B2 4/2008 Henley
7,358,601 B1 4/2008 Plants et al.
7,369,435 B2 5/2008 Forbes
7,371,660 B2 5/2008 Henley et al.
7,378,702 B2 5/2008 Lee
7,393,722 B1 7/2008 Issaq et al.
7,419,844 B2 9/2008 Lee et al.
7,436,027 B2 10/2008 Ogawa et al.
7,439,773 B2 10/2008 Or-Bach et al.
7,446,563 B2 11/2008 Madurawe
7,459,752 B2 12/2008 Doris et al.
7,459,763 B1 12/2008 Issaq et al.
7,459,772 B2 12/2008 Speers
7,463,062 B2 12/2008 Or-Bach et al.
7,470,142 B2 12/2008 Lee
7,470,598 B2 12/2008 Lee
7,476,939 B2 1/2009 Okhonin et al.
7,477,540 B2 1/2009 Okhonin et al.
7,485,968 B2 2/2009 Enquist et al.
7,486,563 B2 2/2009 Waller et al.
7,488,980 B2 2/2009 Takafuji et al.
7,492,632 B2 2/2009 Carman
7,495,473 B2 2/2009 McCollum et al.
7,498,675 B2 3/2009 Farnworth et al.
7,499,352 B2 3/2009 Singh
7,499,358 B2 3/2009 Bauser
7,508,034 B2 3/2009 Takafuji et al.
7,514,748 B2 4/2009 Fazan et al.
7,541,616 B2 6/2009 Fazan et al.
7,547,589 B2 6/2009 Iriguchi
7,557,367 B2 7/2009 Rogers et al.
7,563,659 B2 7/2009 Kwon et al.
7,566,855 B2 7/2009 Olsen et al.
7,586,778 B2 9/2009 Ho et al.
7,589,375 B2 9/2009 Jang et al.
7,608,848 B2 10/2009 Ho et al.
7,622,367 B1 11/2009 Nuzzo et al.
7,632,738 B2 12/2009 Lee
7,633,162 B2 12/2009 Lee
7,671,371 B2 3/2010 Lee
7,674,687 B2 3/2010 Henley
7,687,372 B2 3/2010 Jain
7,688,619 B2 3/2010 Lung et al.
7,692,202 B2 4/2010 Bensch
7,692,448 B2 4/2010 Solomon
7,692,944 B2 4/2010 Bernstein et al.
7,697,316 B2 4/2010 Lai et al.
7,709,932 B2 5/2010 Nemoto et al.
7,718,508 B2 5/2010 Lee
7,723,207 B2 5/2010 Alam et al.
7,728,326 B2 6/2010 Yamazaki et al.
7,732,301 B1 6/2010 Pinnington et al.
7,749,884 B2 7/2010 Mathew et al.
7,759,043 B2 7/2010 Tanabe et al.
7,768,115 B2 8/2010 Lee et al.
7,776,715 B2 8/2010 Wells et al.
7,777,330 B2 8/2010 Pelley et al.
7,786,460 B2 8/2010 Lung et al.
7,795,619 B2 9/2010 Hara
7,799,675 B2 9/2010 Lee
7,800,099 B2 9/2010 Yamazaki et al.
7,800,199 B2 9/2010 Oh et al.
7,846,814 B2 12/2010 Lee
7,867,822 B2 1/2011 Lee
7,888,764 B2 2/2011 Lee
8,031,544 B2 10/2011 Kim et al.
8,044,464 B2 10/2011 Yamazaki et al.
2001/0000005 A1 3/2001 Forrest et al.
2001/0014391 A1 8/2001 Forrest et al.
2002/0024140 A1 2/2002 Nakajima et al.
2002/0025604 A1 2/2002 Tiwari
2002/0081823 A1 6/2002 Cheung et al.
2002/0141233 A1 10/2002 Hosotani et al.
2002/0153243 A1 10/2002 Forrest et al.
2002/0199110 A1 12/2002 Kean
2003/0015713 A1 1/2003 Yoo
2003/0059999 A1 3/2003 Gonzalez
2003/0060034 A1 3/2003 Beyne et al.
2003/0067043 A1 4/2003 Zhang
2003/0102079 A1 6/2003 Kalvesten et al.
2003/0113963 A1 6/2003 Wurzer
2003/0119279 A1 6/2003 Enquist
2003/0139011 A1 7/2003 Cleeves et al.
2003/0157748 A1 8/2003 Kim et al.
2003/0213967 A1 11/2003 Forrest et al.
2003/0224582 A1 12/2003 Shimoda et al.
2004/0014299 A1 1/2004 Moriceau et al.
2004/0047539 A1 3/2004 Okubora et al.
2004/0061176 A1 4/2004 Takafuji et al.
2004/0113207 A1 6/2004 Hsu et al.
2004/0155301 A1 8/2004 Zhang
2004/0156233 A1 8/2004 Bhattacharyya
2004/0166649 A1 8/2004 Bressot et al.
2004/0178819 A1 9/2004 New
2004/0259312 A1 12/2004 Schlosser et al.
2004/0262635 A1 12/2004 Lee
2004/0262772 A1 12/2004 Ramanathan et al.
2005/0003592 A1 1/2005 Jones
2005/0067620 A1 3/2005 Chan et al.

2005/0067625 A1 3/2005 Hata
2005/0098822 A1 5/2005 Mathew
2005/0110041 A1 5/2005 Boutros et al.
2005/0130429 A1 6/2005 Rayssac et al.
2005/0225237 A1 10/2005 Winters
2005/0280061 A1 12/2005 Lee
2005/0280090 A1 12/2005 Anderson et al.
2005/0280154 A1 12/2005 Lee
2005/0280155 A1 12/2005 Lee
2005/0280156 A1 12/2005 Lee
2006/0014331 A1 1/2006 Tang et al.
2006/0024923 A1 2/2006 Sarma et al.
2006/0033124 A1 2/2006 Or-Bach et al.
2006/0067122 A1 3/2006 Verhoeven
2006/0071322 A1 4/2006 Kitamura
2006/0071332 A1 4/2006 Speers
2006/0083280 A1 4/2006 Tauzin et al.
2006/0113522 A1 6/2006 Lee et al.
2006/0121690 A1 6/2006 Pogge et al.
2006/0179417 A1 8/2006 Madurawe
2006/0181202 A1 8/2006 Liao et al.
2006/0195729 A1 8/2006 Huppenthal et al.
2006/0207087 A1 9/2006 Jafri et al.
2006/0275962 A1 12/2006 Lee
2007/0014508 A1 1/2007 Chen et al.
2007/0063259 A1 3/2007 Derderian et al.
2007/0072391 A1 3/2007 Pocas et al.
2007/0076509 A1 4/2007 Zhang
2007/0077694 A1 4/2007 Lee
2007/0090416 A1 4/2007 Doyle et al.
2007/0102737 A1 5/2007 Kashiwabara et al.
2007/0108523 A1 5/2007 Ogawa et al.
2007/0111386 A1 5/2007 Kim et al.
2007/0132049 A1 6/2007 Stipe
2007/0132369 A1 6/2007 Forrest et al.
2007/0158659 A1 7/2007 Bensce
2007/0187775 A1 8/2007 Okhonin et al.
2007/0190746 A1 8/2007 Ito et al.
2007/0194453 A1 8/2007 Chakraborty et al.
2007/0210336 A1 9/2007 Madurawe
2007/0228383 A1 10/2007 Bernstein et al.
2007/0262457 A1 11/2007 Lin
2007/0275520 A1 11/2007 Suzuki
2007/0283298 A1 12/2007 Bernstein et al.
2007/0287224 A1 12/2007 Alam et al.
2008/0032463 A1 2/2008 Lee
2008/0038902 A1 2/2008 Lee
2008/0048327 A1 2/2008 Lee
2008/0099780 A1 5/2008 Tran
2008/0124845 A1 5/2008 Yu et al.
2008/0128745 A1 6/2008 Mastro et al.
2008/0136455 A1 6/2008 Diamant et al.
2008/0160431 A1 7/2008 Scott et al.
2008/0160726 A1 7/2008 Lim
2008/0179678 A1* 7/2008 Dyer et al. .................... 257/351
2008/0194068 A1 8/2008 Temmler et al.
2008/0203452 A1 8/2008 Moon et al.
2008/0220558 A1 9/2008 Zehavi et al.
2008/0220565 A1 9/2008 Hsu et al.
2008/0224260 A1 9/2008 Schmit et al.
2008/0237591 A1 10/2008 Leedy
2008/0251862 A1 10/2008 Fonash et al.
2008/0254561 A2 10/2008 Yoo
2008/0254572 A1 10/2008 Leedy
2008/0261378 A1 10/2008 Yao et al.
2008/0277778 A1 11/2008 Furman et al.
2008/0283875 A1 11/2008 Mukasa et al.
2008/0284611 A1 11/2008 Leedy
2008/0296681 A1 12/2008 Georgakos et al.
2008/0315351 A1 12/2008 Kakehata
2009/0001469 A1 1/2009 Yoshida et al.
2009/0016716 A1 1/2009 Ishida
2009/0052827 A1 2/2009 Durfee et al.
2009/0055789 A1 2/2009 McIlrath
2009/0064058 A1 3/2009 McIlrath
2009/0066365 A1 3/2009 Solomon
2009/0066366 A1 3/2009 Solomon
2009/0070727 A1 3/2009 Solomon
2009/0081848 A1 3/2009 Erokhin
2009/0087759 A1 4/2009 Matsumoto et al.
2009/0096009 A1 4/2009 Dong et al.
2009/0096024 A1 4/2009 Shingu et al.
2009/0128189 A1 5/2009 Madurawe et al.
2009/0144669 A1 6/2009 Bose et al.
2009/0144678 A1 6/2009 Bose et al.
2009/0146172 A1 6/2009 Pumyea
2009/0159870 A1 6/2009 Lin et al.
2009/0160482 A1 6/2009 Karp et al.
2009/0161401 A1 6/2009 Bigler et al.
2009/0194152 A1 8/2009 Liu et al.
2009/0194768 A1* 8/2009 Leedy ............................ 257/48
2009/0204933 A1 8/2009 Rezgui
2009/0212317 A1 8/2009 Kolodin et al.
2009/0218627 A1 9/2009 Zhu
2009/0221110 A1 9/2009 Lee et al.
2009/0224364 A1 9/2009 Oh et al.
2009/0234331 A1 9/2009 Langereis et al.
2009/0242893 A1 10/2009 Tomiyasu
2009/0250686 A1 10/2009 Sato et al.
2009/0262583 A1 10/2009 Lue
2009/0263942 A1 10/2009 Ohnuma et al.
2009/0267233 A1 10/2009 Lee
2009/0272989 A1 11/2009 Shum et al.
2009/0302394 A1* 12/2009 Fujita ........................... 257/369
2009/0321830 A1 12/2009 Maly
2009/0321948 A1 12/2009 Wang et al.
2009/0325343 A1 12/2009 Lee
2010/0001282 A1 1/2010 Mieno
2010/0038743 A1 2/2010 Lee
2010/0052134 A1 3/2010 Werner et al.
2010/0058580 A1 3/2010 Yazdani
2010/0081232 A1 4/2010 Furman et al.
2010/0112753 A1 5/2010 Lee
2010/0112810 A1 5/2010 Lee et al.
2010/0133695 A1 6/2010 Lee
2010/0133704 A1 6/2010 Marimuthu et al.
2010/0190334 A1 7/2010 Lee
2010/0193964 A1 8/2010 Farooq et al.
2010/0276662 A1 11/2010 Colinge
2010/0307572 A1 12/2010 Bedell et al.
2010/0308211 A1 12/2010 Cho et al.
2011/0001172 A1 1/2011 Lee
2011/0003438 A1 1/2011 Lee
2011/0024724 A1 2/2011 Frolov et al.
2011/0026263 A1 2/2011 Xu
2011/0037052 A1 2/2011 Schmidt et al.
2011/0042696 A1 2/2011 Smith et al.
2011/0050125 A1 3/2011 Medendorp et al.
2011/0053332 A1 3/2011 Lee
2011/0084314 A1* 4/2011 Or-Bach et al. ............... 257/209
2011/0101537 A1 5/2011 Barth et al.
2011/0143506 A1 6/2011 Lee
2011/0147791 A1 6/2011 Norman et al.
2011/0241082 A1 10/2011 Bernstein et al.
2012/0001184 A1 1/2012 Ha et al.
2012/0003815 A1 1/2012 Lee

FOREIGN PATENT DOCUMENTS

EP 1909311 A2 4/2008
WO PCT/US2008/063483 5/2008

OTHER PUBLICATIONS

Lee, D. et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X. et al., "Characterization of Low-Temperature Processed Single-Crystalline Silicon Thin-Film Transistor on Glass," IEEE Electron Device Letters, Sep. 2003, pp. 574-576, vol. 24, No. 9.
Chen, W. et al., "InP Layer Transfer with Masked Implantation," Electrochemical and Solid-State Letters, Apr. 2009, H149-150, Issue 12, No. 4.
Motoyoshi, M., "3D-IC Integration," 3rd Stanford and Tohoku University Joint Open Workshop, Dec. 4, 2009, pp. 1-52.
Wong, S. et al., "Monolithic 3D Integrated Circuits," VLSI Technology, Systems and Applications, 2007, International Symposium on VLSI-TSA 2007, pp. 1-4.

Feng, J. et al., "Integration of Germanium-on-Insulator and Silicon MOSFETs on a Silicon Substrate," IEEE Electron Device Letters, Nov. 2006, pp. 911-913, vol. 27, No. 11.
Zhang, S., "Stacked CMOS Technology on SOI Substrate," IEEE Electron Device Letters, Sep. 2004, pp. 661-663, vol. 25, No. 9.
Topol, A.W. et al., "Enabling SOI-Based Assembly Technology for Three-Dimensional (3D) Integrated Circuits (ICs)," IEDM Tech. Digest, Dec. 5, 2005, p. 363-366.
Batude, P. et al., "Advances in 3D CMOS Sequential Integration," 2009 IEEE International Electron Devices Meeting (Baltimore, Maryland), Dec. 7-9, 2009, pp. 14.1.1-14.1.4.
Tan, C.S. et al., "Wafer Level 3-D ICs Process Technology," ISBN-10: 0387765328, Springer, 1st Ed., Sep. 19, 2008, pp. v-xii, 34, 58, and 59.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Demeester, P., et al., "Epitaxial lift-off and its applications," Semicond. Sci. Technol., 1993, pp. 1124-1135, vol. 8.
Yoon, J., et al., "GaAs Photovoltaics and optoelectronics using releasable multilayer epitaxial assemblies", Nature, vol. 465, May 20, 2010, pp. 329-334.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T., et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.
Burr, G. W., et al., "Overview of candidate device technologies for storage-class memory," IBM Journal of Research and Development, vol. 52, No. 4.5, pp. 449-464, Jul. 2008.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Bez, R., et al., "Introduction to Flash memory," Proceedings IEEE, 91(4), 489-502 (2003).
Kim, W., et al., "Multi-layered Vertical Gate NAND Flash overcoming stacking limit for terabit density storage", Symposium on VLSI Technology Digest of Technical Papers, 2009, pp. 188-189.
Auth, C., et al., "45nm High-k + Metal Gate Strain-Enhanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Dicioccio, L., et. al., "Direct bonding for wafer level 3D integration", ICICDT 2010, pp. 110-113.
Shino, T., et al., "Floating Body RAM Technology and its Scalability to 32nm Node and Beyond," Electron Devices Meeting, 2006, IEDM '06, International , pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K., et al., "Frontiers of silicon-on-insulator," J. App. Phys., May 1, 2003, pp. 4955-4978, vol. 93, No. 9.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nnn DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Vengurlekar, A., et al., "Mechanism of Dopant Activation Enhancement in Shallow Junctions by Hydrogen", Proceedings of the Materials Research Society, vol. 864, Spring 2005, E9.28.1-6.
Hui, K. N., et al., "Design of vertically-stacked polychromatic light-emitting diodes," Optics Express, Jun. 8, 2009, pp. 9873-9878, vol. 17, No. 12.
Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X., et al., "Cascade single-chip phosphor-free white light emitting diodes," Applied Physics Letters, 2008, pp. 013507-1-013507-3, vol. 92.
Chuai, D. X., et al., "A Trichromatic Phosphor-Free White Light-Emitting Diode by Using Adhesive Bonding Scheme," Proc. SPIE, 2009, vol. 7635.
Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Takafuji, Y., et al., "Integration of Single Crystal Si TFTs and Circuits on a Large Glass Substrate," IEEE International Electron Devices Meeting (IEDM), Dec. 7-9, 2009, pp. 1-4.
Flamand, G., et al., "Towards Highly Efficient 4-Terminal Mechanical Photovoltaic Stacks," III-Vs Review, Sep.-Oct. 2006, pp. 24-27, vol. 19, Issue 7.
Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Wierer, J.J., et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al.,"Autonomous Refresh of Floating Body Cell (FBC)", International Electron Device Meeting, 2008, pp. 801-804.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D., et al., "Design and CAD for 3D Integrated Circuits," 45th ACM/IEEE Design, Automation Conference (DAC), Jun. 8-13, 2008, pp. 668-673.
Brebner, G., "Tooling up for Reconfigurable System Design," IEE Colloquium on Reconfigurable Systems, 1999, Ref. No. 1999/061, pp. 2/1-2/4.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Dong, C., et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," pp. 407-410.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.
Weis, M., et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Gosele, U., et al., "Semiconductor Wafer Bonding," Annual Review of Materials Science, Aug. 1998, pp. 215-241, vol. 28.
Spangler, L.J., et al., "A Technology for High Performance Single-Crystal Silicon-on-Insulator Transistors," IEEE Electron Device Letters, Apr. 1987, pp. 137-139, vol. 8, No. 4.
Luo, Z.S., et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.

Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Sellathamby, C.V., et al., "Non-contact wafer probe using wireless probe cards", (2005) Proceedings—International Test Conference, 2005, pp. 447-452.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S., et al., "CELONCEL: Effective Design Technique for 3-D Monolithic Integration targeting High Performance Integrated Circuits", *Asia pacific DAC 2011*, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Meindl, J. D., "Beyond Moore's Law: The Interconnect Era", IEEE Computing in Science & Engineering, Jan./Feb. 2003, pp. 20-24.

Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Rajendran, B., et al., "Thermal Simulation of laser Annealing for 3D Integration", Proceedings VMIC 2003.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Sadaka, M., et al., "Building Blocks for wafer level 3D integration", www.electroiq.com , Aug. 18, 2010, last accessed Aug. 18, 2010.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional ICs, Having Four Stacked Active Device Layers," IEDM 1989, paper 34.6, pp. 837-840.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Gaillardon, P-E., et al., "Can We Go Towards True 3-D Architectures?," DAC 2011, paper 58, pp. 282-283.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Miller, D.A.B., "Optical interconnects to electronic chips," Applied Optics, vol. 49, No. 25, Sep. 1, 2010, pp. F59-F70.

* cited by examiner

Fig. 9A
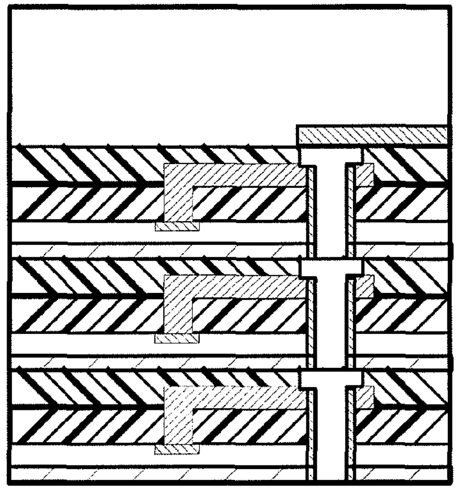
Fig. 9B
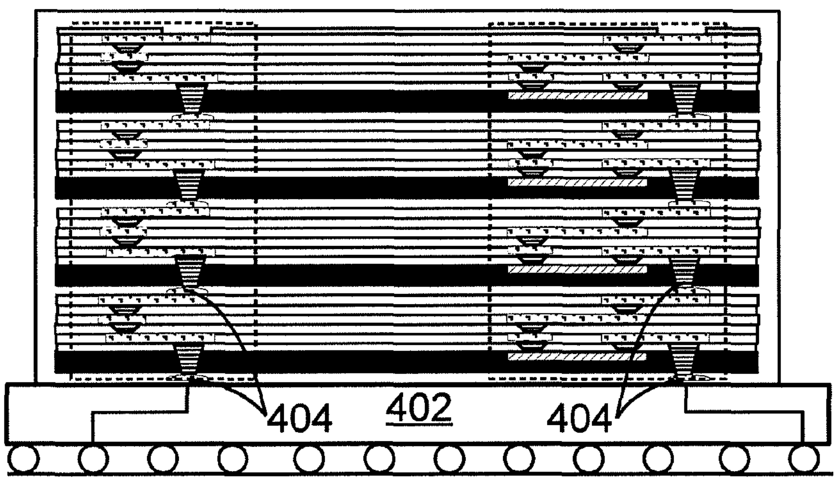
Fig. 9C
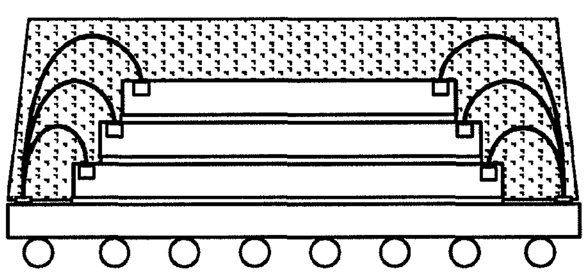
Prior Art
Fig. 9

Flow for '3D Partition' (To two dies connected by TSV):

Current flow in two dimensional plane, indicated by - - ->

METHOD FOR FABRICATION OF A SEMICONDUCTOR DEVICE AND STRUCTURE

CROSS-REFERENCE OF RELATED APPLICATION

This application is a divisional application of co-pending U.S. patent application Ser. No. 12/792,673, which claims priority of co-pending U.S. patent application Ser. Nos. 12/577,532 and 12/706,520, the contents of which are incorporated by reference.

BACKGROUND OF THE INVENTION

1. Field of the Invention

Various embodiments of the present invention may relate to configurable logic arrays and/or fabrication methods for a Field Programmable Logic Array—FPGA.

2. Discussion of Background Art

Semiconductor manufacturing is known to improve device density in an exponential manner over time, but such improvements do come with a price. The mask set cost required for each new process technology has been increasing exponentially. So while 20 years ago a mask set cost less than $20,000 it is now quite common to be charged more than $1 M for today's state of the art device mask set.

These changes represent an increasing challenge primarily to custom products, which tend to target smaller volume and less diverse markets therefore making the increased cost of product development very hard to accommodate.

Custom Integrated Circuits can be segmented into two groups. The first group includes devices that have all their layers custom made. The second group includes devices that have at least some generic layers used across different custom products. Well-known examples of the second kind are Gate Arrays, which use generic layers for all layers up to contact layer, and FPGAs, which utilize generic layers for all of their layers. The generic layers in such devices are mostly a repeating pattern structure in array form.

The logic array technology is based on a generic fabric that is customized for a specific design during the customization stage. For an FPGA the customization is done through programming by electrical signals. For Gate Arrays, which in their modern form are sometimes called Structured ASICs, the customization is by at least one custom layer, which might be done with Direct Write eBeam or with a custom mask. As designs tend to be highly variable in the amount of logic and memory and type of I/O each one needs, vendors of logic arrays create product families with a number of Master Slices covering a range of logic, memory size and I/O options. Yet, it is always a challenge to come up with minimum set of Master Slices that will provide a good fit for the maximal number of designs because it is quite costly if a dedicated mask set is required for each Master Slice.

U.S. Pat. No. 4,733,288 issued to Sato Shinji Sato in March 1988, discloses a method "to provide a gate-array LSI chip which can be cut into a plurality of chips, each of the chips having a desired size and a desired number of gates in accordance with a circuit design." The prior art in the references cited present few alternative methods to utilize a generic structure for different sizes of custom devices.

The array structure fits the objective of variable sizing. The difficulty to provide variable-sized array structure devices is due to the need of providing I/O cells and associated pads to connect the device to the package. To overcome this limitation Sato suggests a method where I/O could be constructed from the transistors that are also used for the general logic gates. Anderson also suggested a similar approach. U.S. Pat. No. 5,217,916 issued to Anderson et al. on Jun. 8, 1993, discloses a configurable gate array free of predefined boundaries—borderless—using transistor gate cells, of the same type of cells used for logic, to serve the input and output function. Accordingly, the input and output functions may be placed to surround the logic array sized for the specific application. This method places a severe limitation on the I/O cell to use the same type of transistors as used for the logic and; hence, would not allow the use of higher operating voltages for the I/O.

U.S. Pat. No. 7,105,871 issued to Or-Bach, et al. Sep. 12, 2006, discloses a semiconductor device that includes a borderless logic array and area I/Os. The logic array may comprise a repeating core, and at least one of the area I/Os may be a configurable I/O.

In the past it was reasonable to design an I/O cell that could be configured to the various needs of most customers. The ever increasing need of higher data transfer rate in and out of the device drove the development of special I/O circuits called SerDes. These circuits are complex and require a far larger silicon area than conventional I/Os. Consequently, the variations needed are combinations of various amounts of logic, various amounts and types of memories, and various amounts and types of I/O. This implies that even the use of the borderless logic array of the prior art will still require multiple expensive mask sets.

The most common FPGAs in the market today are based on SRAM as the programming element. Floating-Gate Flash programmable elements are also utilized to some extent. Less commonly, FPGAs use an antifuse as the programming element. The first generation of antifuse FPGAs used antifuses that were built directly in contact with the silicon substrate itself. The second generation moved the antifuse to the metal layers to utilize what is called the Metal to Metal Antifuse. These antifuses function like vias. However, unlike vias that are made with the same metal that is used for the interconnection, these antifuses generally use amorphous silicon and some additional interface layers. While in theory antifuse technology could support a higher density than SRAM, the SRAM FPGAs are dominating the market today. In fact, it seems that no one is advancing Antifuse FPGA devices anymore. One of the severe disadvantages of antifuse technology has been their lack of re-programmability. Another disadvantage has been the special silicon manufacturing process required for the antifuse technology which results in extra development costs and the associated time lag with respect to baseline IC technology scaling.

The general disadvantage of common FPGA technologies is their relatively poor use of silicon area. While the end customer only cares to have the device perform his desired function, the need to program the FPGA to any function requires the use of a very significant portion of the silicon area for the programming and programming check functions.

Some embodiments of the current invention seek to overcome the prior-art limitations and provide some additional benefits by making use of special types of transistors that are fabricated above the antifuse configurable interconnect circuits and thereby allow far better use of the silicon area.

One type of such transistors is commonly known in the art as Thin Film Transistors or TFT. Thin Film Transistors has been proposed and used for over three decades. One of the better-known usages has been for displays where the TFT are fabricated on top of the glass used for the display. Other type of transistors that could be fabricated above the antifuse configurable interconnect circuits are called Vacuum FET and was introduced three decades ago such as in U.S. Pat. No. 4,721,885.

Other techniques could also be used such as an SOI approach. In U.S. Pat. Nos. 6,355,501 and 6,821,826, both assigned to IBM, a multilayer three-dimensional—3D—CMOS Integrated Circuit is proposed. It suggests bonding an additional thin SOI wafer on top of another SOI wafer forming an integrated circuit on top of another integrated circuit and connecting them by the use of a through-silicon-via. Substrate supplier Soitec SA, Bernin, France is now offering a technology for stacking of a thin layer of a processed wafer on top of a base wafer.

Integrating top layer transistors above an insulation layer is not common in an IC because the base layer of crystallized silicon is ideal to provide high density and high quality transistors, and hence preferable. There are some applications where it was suggested to build memory cells using such transistors as in U.S. Pat. Nos. 6,815,781, 7,446,563 and a portion of an SRAM based FPGA such as in U.S. Pat. Nos. 6,515,511 and 7,265,421.

Embodiments of the current invention seek to take advantage of the top layer transistor to provide a much higher density antifuse-based programmable logic. An additional advantage for such use will be the option to further reduce cost in high volume production by utilizing custom mask(s) to replace the antifuse function, thereby eliminating the top layer(s) anti-fuse programming logic altogether.

SUMMARY

Embodiments of the present invention seek to provide a new method for semiconductor device fabrication that may be highly desirable for custom products. Embodiments of the current invention suggest the use of a Re-programmable antifuse in conjunction with 'Through Silicon Via' to construct a new type of configurable logic, or as usually called, FPGA devices. Embodiments of the current invention may provide a solution to the challenge of high mask-set cost and low flexibility that exists in the current common methods of semiconductor fabrication. An additional advantage of some embodiments of the invention is that it could reduce the high cost of manufacturing the many different mask sets required in order to provide a commercially viable range of master slices. Embodiments of the current invention may improve upon the prior art in many respects, which may include the way the semiconductor device is structured and methods related to the fabrication of semiconductor devices.

Embodiments of the current invention reflect the motivation to save on the cost of masks with respect to the investment that would otherwise have been required to put in place a commercially viable set of master slices. Embodiments of the current invention also seek to provide the ability to incorporate various types of memory blocks in the configurable device. Embodiments of the current invention provide a method to construct a configurable device with the desired amount of logic, memory, I/Os, and analog functions.

In addition, embodiments of the current invention allow the use of repeating logic tiles that provide a continuous terrain of logic. Embodiments of the current invention show that with Through-Silicon-Via (TSV) a modular approach could be used to construct various configurable systems. Once a standard size and location of TSV has been defined one could build various configurable logic dies, configurable memory dies, configurable I/O dies and configurable analog dies which could be connected together to construct various configurable systems. In fact it may allow mix and match between configurable dies, fixed function dies, and dies manufactured in different processes. Embodiments of the current invention seek to provide additional benefits by making use of special type of transistors that are placed above the antifuse configurable interconnect circuits and thereby allow a far better use of the silicon area. In general an FPGA device that utilizes antifuses to configure the device function may include the electronic circuits to program the antifuses. The programming circuits may be used primarily to configure the device and are mostly an overhead once the device is configured. The programming voltage used to program the antifuse may typically be significantly higher than the voltage used for the operating circuits of the device. The design of the antifuse structure may be designed such that an unused antifuse will not accidentally get fused. Accordingly, the incorporation of the antifuse programming in the silicon substrate may require special attention for this higher voltage, and additional silicon area may, accordingly, be required.

Unlike the operating transistors that are desired to operate as fast as possible, to enable fast system performance, the programming circuits could operate relatively slowly. Accordingly using a thin film transistor for the programming circuits could fit very well with the required function and would reduce the required silicon area.

The programming circuits may, therefore, be constructed with thin film transistors, which may be fabricated after the fabrication of the operating circuitry, on top of the configurable interconnection layers that incorporate and use the antifuses. An additional advantage of such embodiments of the invention is the ability to reduce cost of the high volume production. One may only need to use mask-defined links instead of the antifuses and their programming circuits. This will in most cases require one custom via mask, and this may save steps associated with the fabrication of the antifuse layers, the thin film transistors, and/or the associated connection layers of the programming circuitry.

In accordance with an embodiment of the present invention an Integrated Circuit device is thus provided, comprising; a plurality of antifuse configurable interconnect circuits and plurality of transistors to configure at least one of said antifuse; wherein said transistors are fabricated after said antifuse.

Further provided in accordance with an embodiment of the present invention is an Integrated Circuit device comprising; a plurality of antifuse configurable interconnect circuits and plurality of transistors to configure at least one of said antifuse; wherein said transistors are placed over said antifuse.

Still further in accordance with an embodiment of the present invention the Integrated Circuit device comprises second antifuse configurable logic cells and plurality of second transistors to configure said second antifuse wherein these second transistors are fabricated before said second antifuse.

Still further in accordance with an embodiment of the present invention the Integrated Circuit device comprises also second antifuse configurable logic cells and a plurality of second transistors to configure said second antifuse wherein said second transistors are placed underneath said second antifuse.

Further provided in accordance with an embodiment of the present invention is an Integrated Circuit device comprising; first antifuse layer, at least two metal layers over it and a second antifuse layer over this two metal layers.

In accordance with an embodiment of the present invention a configurable logic device is presented, comprising: antifuse configurable look up table logic interconnected by antifuse configurable interconnect.

In accordance with an embodiment of the present invention a configurable logic device is also provided, comprising: plurality of configurable look up table logic, plurality of configurable PLA logic, and plurality of antifuse configurable interconnect.

In accordance with an embodiment of the present invention a configurable logic device is also provided, comprising: plurality of configurable look up table logic and plurality of configurable drive cells wherein the drive cells are configured by plurality of antifuses.

In accordance with an embodiment of the present invention a configurable logic device is additionally provided, comprising: configurable logic cells interconnected by a plurality of antifuse configurable interconnect circuits wherein at least one of the antifuse configurable interconnect circuits is configured as part of a non volatile memory.

Further in accordance with an embodiment of the present invention the configurable logic device comprises at least one antifuse configurable interconnect circuit, which is also configurable to a PLA function.

In accordance with an alternative embodiment of the present invention an integrated circuit system is also provided, comprising a configurable logic die and an I/O die wherein the configurable logic die is connected to the I/O die by the use of Through-Silicon-Via.

Further in accordance with an embodiment of the present invention the integrated circuit system comprises; a configurable logic die and a memory die wherein these dies are connected by the use of Through-Silicon-Via.

Still further in accordance with an embodiment of the present invention the integrated circuit system comprises a first configurable logic die and second configurable logic die wherein the first configurable logic die and the second configurable logic die are connected by the use of Through-Silicon-Via.

Moreover in accordance with an embodiment of the present invention the integrated circuit system comprises an I/O die that was fabricated utilizing a different process than the process utilized to fabricate the configurable logic die.

Further in accordance with an embodiment of the present invention the integrated circuit system comprises at least two logic dies connected by the use of Through-Silicon-Via and wherein some of the Through-Silicon-Vias are utilized to carry the system bus signal.

Moreover in accordance with an embodiment of the present invention the integrated circuit system comprises at least one configurable logic device. Further in accordance with an embodiment of the present invention the integrated circuit system comprises, an antifuse configurable logic die and programmer die and these dies are connected by the use of Through-Silicon-Via.

BRIEF DESCRIPTION OF THE DRAWINGS

Various embodiments of the present invention will be understood and appreciated more fully from the following detailed description, taken in conjunction with the drawings in which:

FIG. 9A through 9C are a drawing illustration of an IC system utilizing Through Silicon Via of a prior art;

DETAILED DESCRIPTION

Embodiments of the present invention are now described with reference to FIGS. 1-68, it being appreciated that the figures illustrate the subject matter not to scale or to measure.

Figure 1:
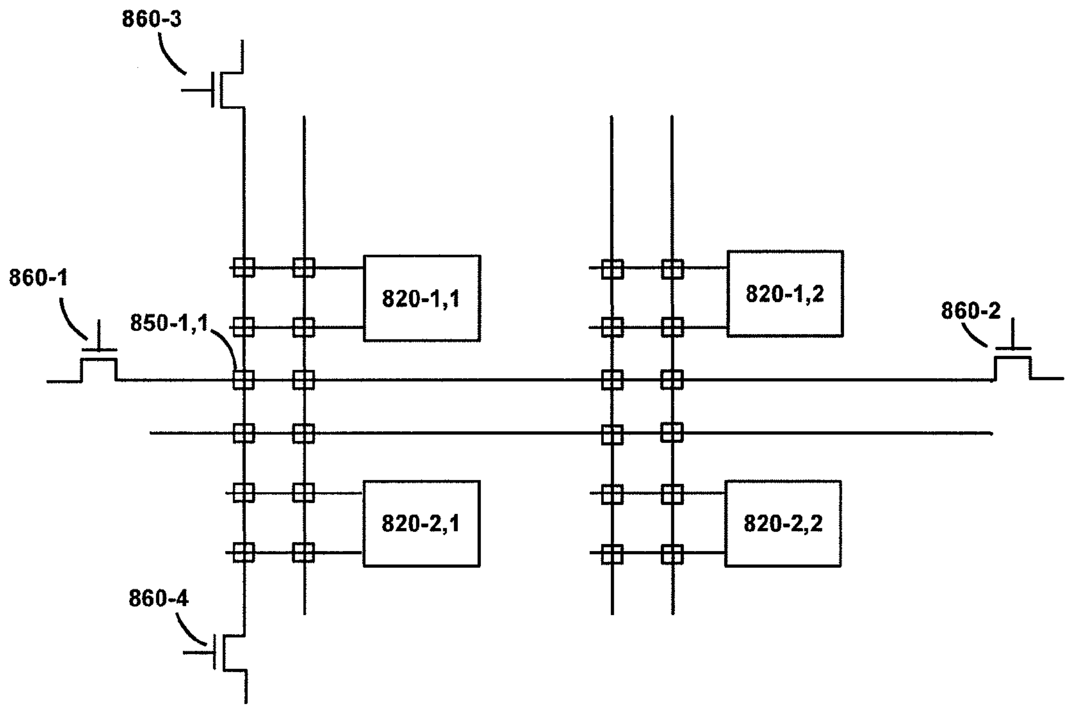
FIG. 1 is a circuit diagram illustration of a prior art.

FIG. 1 illustrates a circuit diagram illustration of a prior art, where, for example, 860-1 to 860-4 are the programming transistors to program antifuse 850-1,1.

Figure 2:
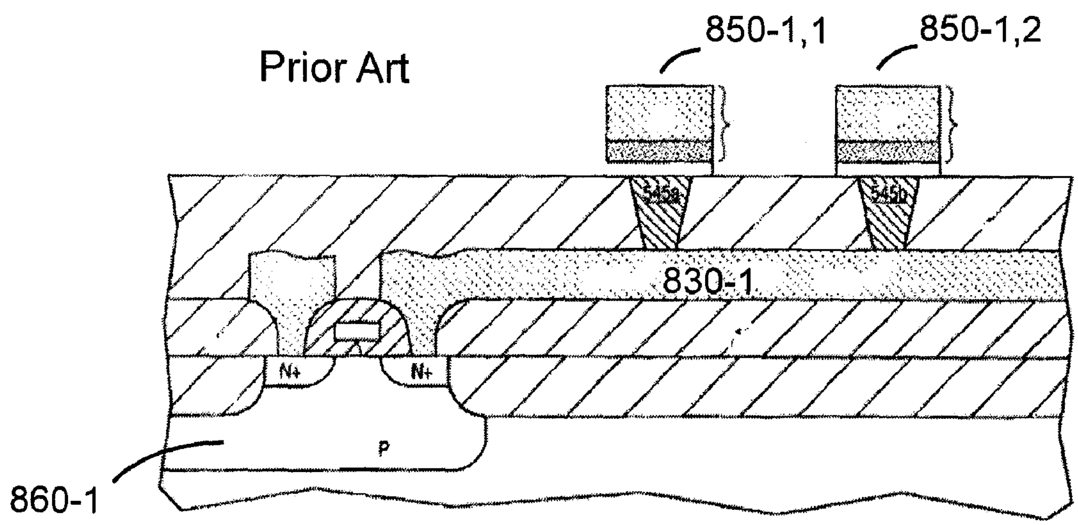
FIG. 2 is a cross-section illustration of a portion of a prior art represented by the circuit diagram of FIG. 1.

FIG. 2 is a cross-section illustration of a portion of a prior art represented by the circuit diagram of FIG. 1 showing the programming transistor 860-1 built as part of the silicon substrate.

Figure 3A:
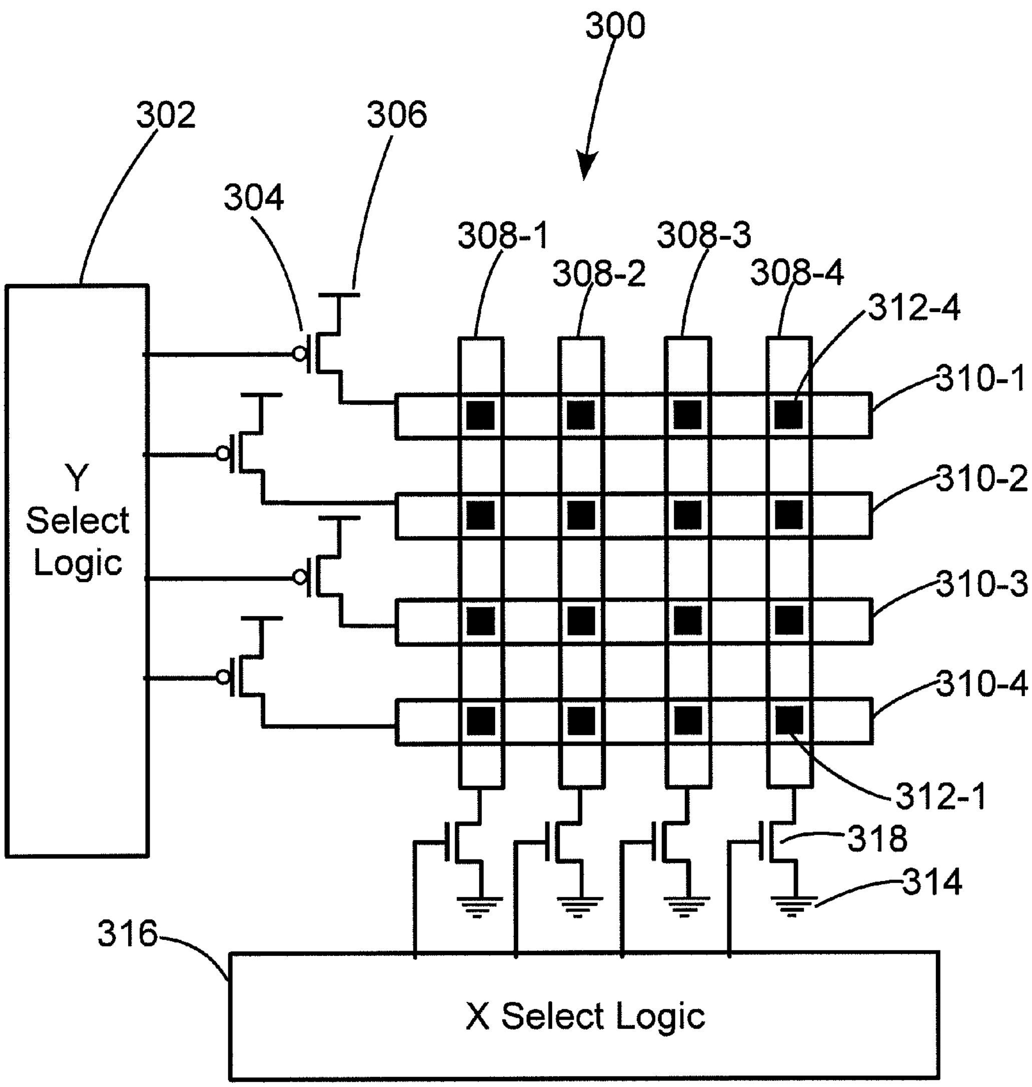
FIG. 3A is a drawing illustration of a programmable interconnect structure.

FIG. 3A is a drawing illustration of a programmable interconnect tile. 310-1 is one of 4 horizontal metal strips, which form a band of strips. The typical IC today has many metal layers. In a typical programmable device the first two or three metal layers will be used to construct the logic elements. On top of them metal 4 to metal 7 will be used to construct the interconnection of those logic elements. In an FPGA device the logic elements are programmable, as well as the interconnects between the logic elements. The configurable interconnect of the current invention is constructed from 4 metal layers or more. For example, metal 4 and 5 could be used for long strips and metal 6 and 7 would comprise short strips. Typically the strips forming the programmable interconnect have mostly the same length and are oriented in the same direction, forming a parallel band of strips as 310-1, 310-2, 310-3 and 310-4. Typically one band will comprise 10 to 40 strips. Typically the strips of the following layer will be oriented perpendicularly as illustrated in FIG. 3A, wherein strips 310 are of metal 6 and strips 308 are of metal 7. In this example the dielectric between metal 6 and metal 7 comprises antifuse positions at the crossings between the strips of metal 6 and metal 7. Tile 300 comprises 16 such antifuses. 312-1 is the antifuse at the cross of strip 310-4 and 308-4. If activated, it will connect strip 310-4 with strip 308-4. FIG. 3A was made simplified, as the typical tile will comprise 10-40 strips in each layer and multiplicity of such tiles, which comprises the antifuse configurable interconnect structure. 304 is one of the Y programming transistors connected to strip 310-1. 318 is one of the X programming transistors connected to strip 308-4. 302 is the Y select logic which at the programming phase allows the selection of a Y programming transistor. 316 is the X select logic which at the programming phase allows the selection of an X programming transistor. Once 304 and 318 are selected the programming voltage 306 will be applied to strip 310-1 while strip 308-4 will be grounded causing the antifuse 312-4 to be activated.

Figure 3B:
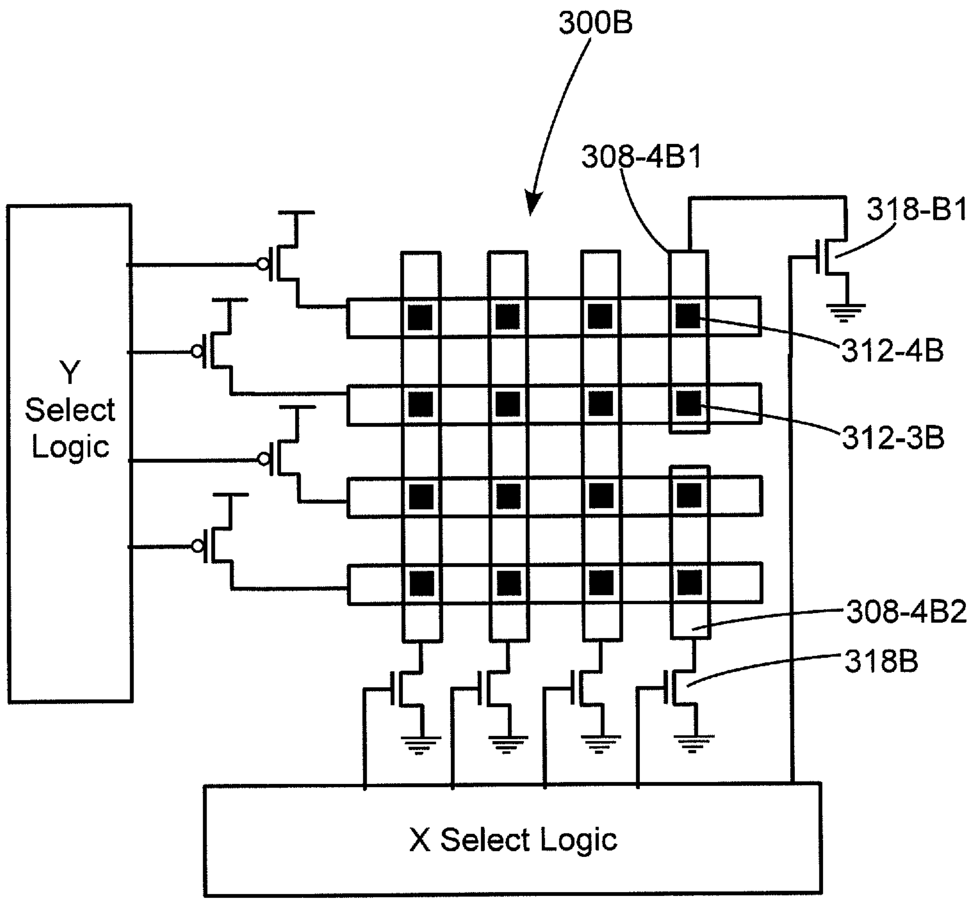
FIG. 3B is a drawing illustration of a programmable interconnect structure.

FIG. 3B is a drawing illustration of a programmable interconnect structure 300B. 300B is variation of 300A wherein some strips in the band are of a different length. Instead of strip 308-4 in this variation there are two shorter strips 308-4B1 and 308-4B2. This might be useful for bringing signals in or out of the programmable interconnect structure 300B in order to reduce the number of strips in the tile, that are dedicated to bringing signals in and out of the interconnect structure versus strips that are available to perform the routing. In such variation the programming circuit needs to be augmented to support the programming of antifuses 312-3B and 312-4B.

Unlike the prior art, various embodiments of the current invention suggest constructing the programming transistors not in the base silicon diffusion layer but rather above the antifuse configurable interconnect circuits. The programming voltage used to program the antifuse is typically significantly higher than the voltage used for the operational circuits of the device. This is part of the design of the antifuse structure so that the antifuse will not become accidentally activated. In addition, extra attention, design effort, and silicon resources might be needed to make sure that the programming phase will not damage the operating circuits. Accordingly the incorporation of the antifuse programming transistors in the silicon substrate may require attention and extra silicon area.

Unlike the operational transistors that are desired to operate as fast as possible and so to enable fast system performance, the programming circuits could operate relatively slowly. Accordingly, a thin film transistor for the programming circuits could fit the required function and could reduce the require silicon area.

Alternatively other type of transistors, such as Vacuum FET, bipolar, etc., could be used for the programming circuits and be placed not in the base silicon but rather above the antifuse configurable interconnect.

Yet in another alternative the programming transistors and the programming circuits could be fabricated on SOI wafers which may then be bonded to the configurable logic wafer and connected to it by the use of through-silicon-via. An advantage of using an SOI wafer for the antifuse programming function is that the high voltage transistors that could be built on it are very efficient and could be used for the programming circuit including support function such as the programming controller function. Yet as an additional variation, the programming circuits could be fabricated on an older process on SOI wafers to further reduce cost. Or some other process technology and/or wafer fab located anywhere in the world.

Also there are advanced technologies to deposit silicon or other semiconductors layers that could be integrated on top of the antifuse configurable interconnect for the construction of the antifuse programming circuit. As an example, a recent technology proposed the use of a plasma gun to spray semiconductor grade silicon to form semiconductor structures including, for example, a p-n junction. The sprayed silicon may be doped to the respective semiconductor type. In addition there are more and more techniques to use graphene and Carbon Nano Tubes (CNT) to perform a semiconductor function. For the purpose of this invention we will use the term "Thin-Film-Transistors" as general name for all those technologies, as well as any similar technologies, known or yet to be discovered.

A common objective is to reduce cost for high volume production without redesign and with minimal additional mask cost. The use of thin-film-transistors, for the programming transistors, enables a relatively simple and direct volume cost reduction. Instead of embedding antifuses in the isolation layer a custom mask could be used to define vias on all the locations that used to have their respective antifuse activated. Accordingly the same connection between the strips that used to be programmed is now connected by fixed vias. This may allow saving the cost associated with the fabrication of the antifuse programming layers and their programming circuits. It should be noted that there might be differences between the antifuse resistance and the mask defined via resistance. A conventional way to handle it is by providing the simulation models for both options so the designer could validate that the design will work properly in both cases.

An additional objective for having the programming circuits above the antifuse layer is to achieve better circuit density. Many connections are needed to connect the programming transistors to their respective metal strips. If those connections are going upward they could reduce the circuit overhead by not blocking interconnection routes on the connection layers underneath.

While FIG. 3A shows an interconnection structure of 4×4 strips, the typical interconnection structure will have far more strips and in many cases more than 20×30. For a 20×30 tile there is needed about 20+30=50 programming transistors. The 20×30 tile area is about 20hp×30vp where 'hp' is the horizontal pitch and 'vp' is the vertical pitch. This may result in a relatively large area for the programming transistor of about 12hp×vp (20hp×30vp/50=12hp×vp). Additionally, the area available for each connection between the programming layer and the programmable interconnection fabric needs to be handled. Accordingly, one or two redistribution layers might be needed in order to redistribute the connection within the available area and then bring those connections down, preferably aligned so to create minimum blockage as they are routed to the underlying strip 310 of the programmable interconnection structure.

Figure 4A:
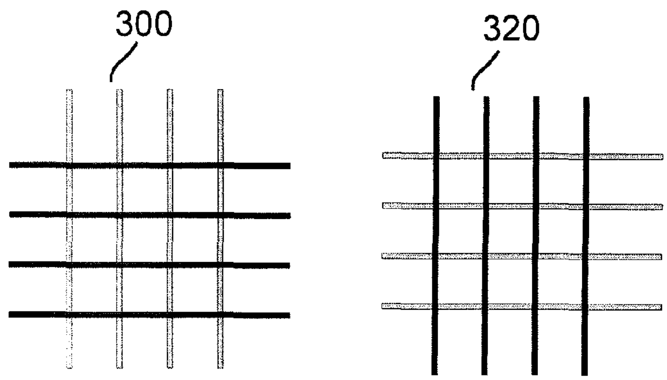
FIG. 4A is a drawing illustration of a programmable interconnect tile.
Figure 4B:
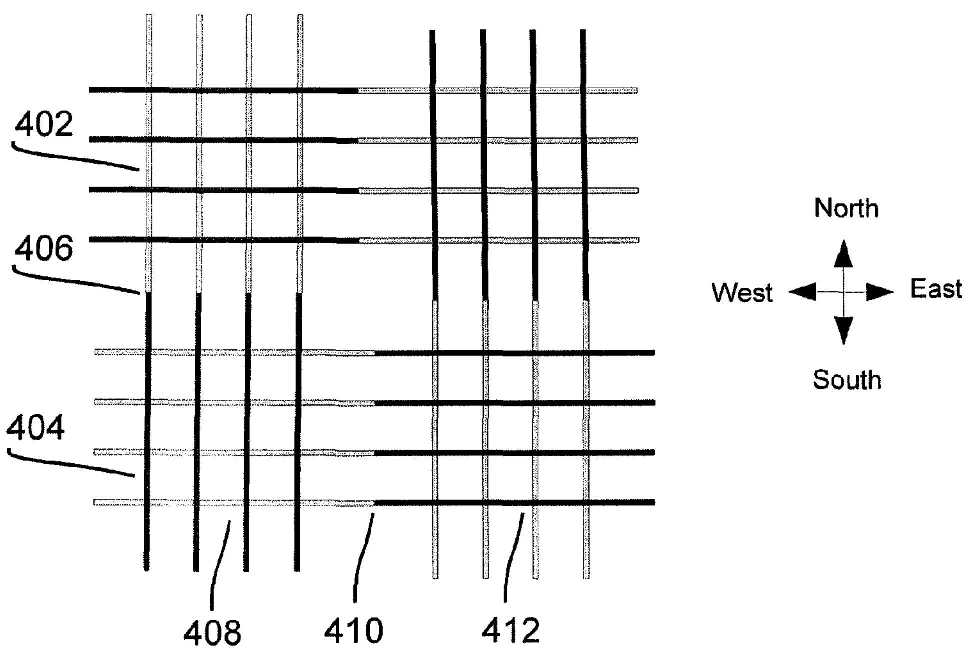
FIG. 4B is a drawing illustration of a programmable interconnect of 2×2 tiles.

FIG. 4A is a drawing illustration, of a programmable interconnect tile 300 and another programmable interface tile 320. As a higher silicon density is achieved it becomes desirable to construct the configurable interconnect in the most compact fashion. FIG. 4B is a drawing illustration of a programmable interconnect of 2×2 tiles. It comprises checkerboard style of tiles 300 and tiles 320 which is a tile 300 rotated by 90 degrees. For a signal to travel South to North, south to north strips need to be connected with antifuses such as 406. 406 and 410 are antifuses that are positioned at the end of a strip to allow it to connect to another strip in the same direction. The signal traveling from South to North is alternating from metal 6 to metal 7. Once the direction needs to change, an antifuse such as 312-1 is used.

The configurable interconnection structure function may be used to interconnect the output of logic cells to the input of logic cells to construct the desired semi-custom logic. The logic cells themselves are constructed by utilizing the first few metal layers to connect transistors that are built in the silicon substrate. Usually the metal 1 layer and metal 2 layer are used for the construction of the logic cells. Sometimes it is effective to also use metal 3 or a part of it.

Figure 5A:
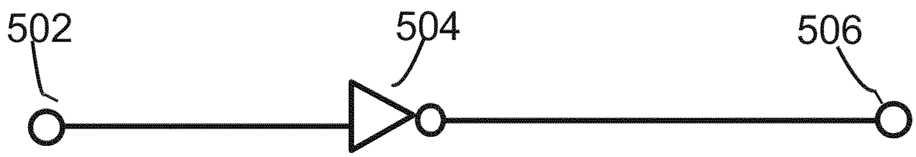
FIG. 5A is a drawing illustration of an inverter logic cell.

FIG. 5A is a drawing illustration of inverter 504 with an input 502 and an output 506. An inverter is the simplest logic cell. The input 502 and the output 506 might be connected to strips in the configurable interconnection structure.

Figure 5B:
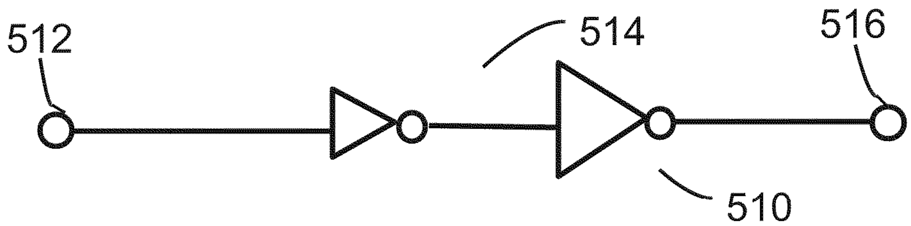
FIG. 5B is a drawing illustration of a buffer logic cell.

FIG. 5B is a drawing illustration of a buffer 514 with an input 512 and an output 516. The input 512 and the output 516 might be connected to strips in the configurable interconnection structure.

Figure 5C:
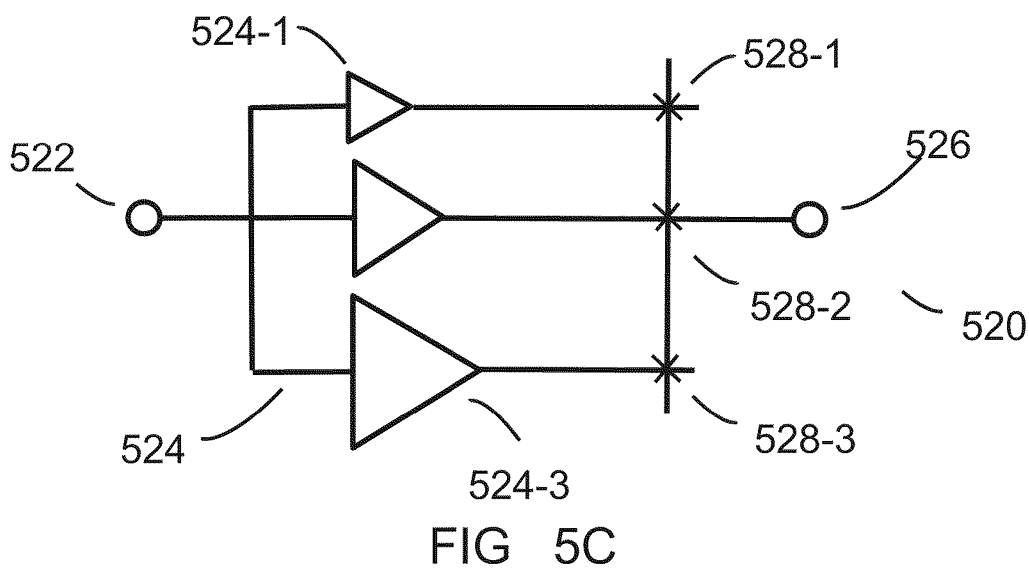
FIG. 5C is a drawing illustration of a configurable strength buffer logic cell.

FIG. 5C is a drawing illustration of a configurable strength buffer 524 with an input 522 and an output 526. The input 522 and the output 526 might be connected to strips in the configurable interconnection structure. 524 is configurable by means of antifuses 528-1, 528-2 and 528-3 constructing an antifuse configurable drive cell.

Figure 5D:
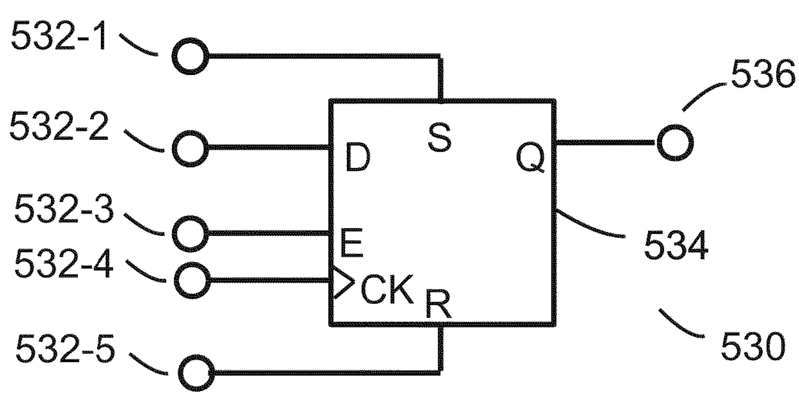
FIG. 5D is a drawing illustration of a D-Flip Flop logic cell.

FIG. 5D is a drawing illustration of D-Flip Flop 534 with inputs 532-2, and output 536 with control inputs 532-1, 532-3, 532-4 and 532-5. The control signals could be connected to the configurable interconnects or to local or global control signals.

Figure 6:
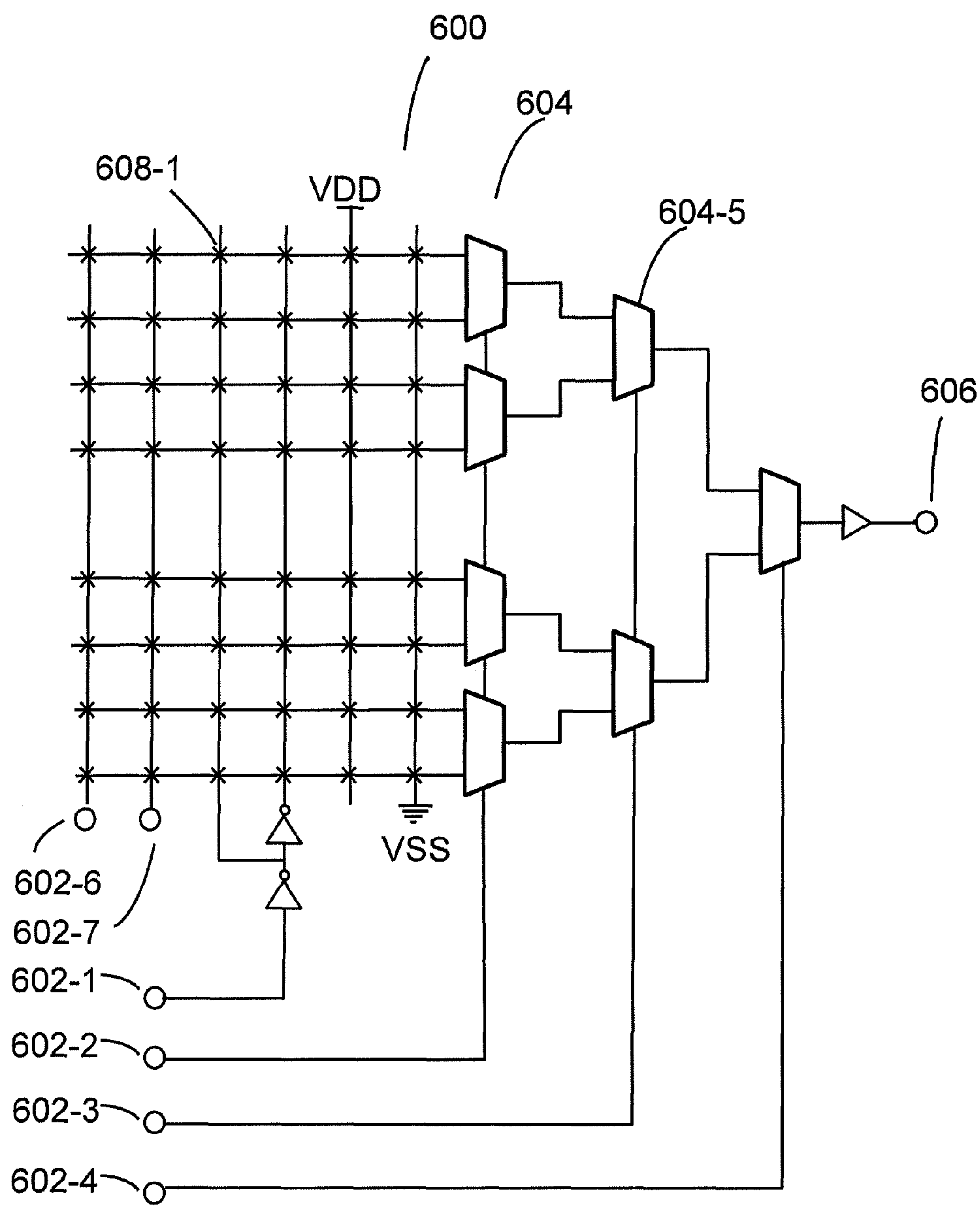
FIG. 6 is a drawing illustration of a LUT 4 logic cell.

FIG. 6 is a drawing illustration of a LUT 4. LUT4 604 is a well-known logic element in the FPGA art called a 16 bit Look-Up-Table or in short LUT4. It has 4 inputs 602-1, 602-2, 602-3 and 602-4. It has an output 606. In general a LUT4 can be programmed to perform any logic function of 4 inputs or less. The LUT function of FIG. 6 may be implemented by 32 antifuses such as 608-1. 604-5 is a two to one multiplexer. The common way to implement a LUT4 in FPGA is by using 16 SRAM bit-cells and 15 multiplexers. The illustration of FIG. 6 demonstrates an antifuse configurable look-up-table implementation of a LUT4 by 32 antifuses and 7 multiplexers. The programmable cell of FIG. 6 may comprise additional inputs 602-6, 602-7 with additional 8 antifuse for each input to allow some functionality in addition to just LUT4.

Figure 6A:
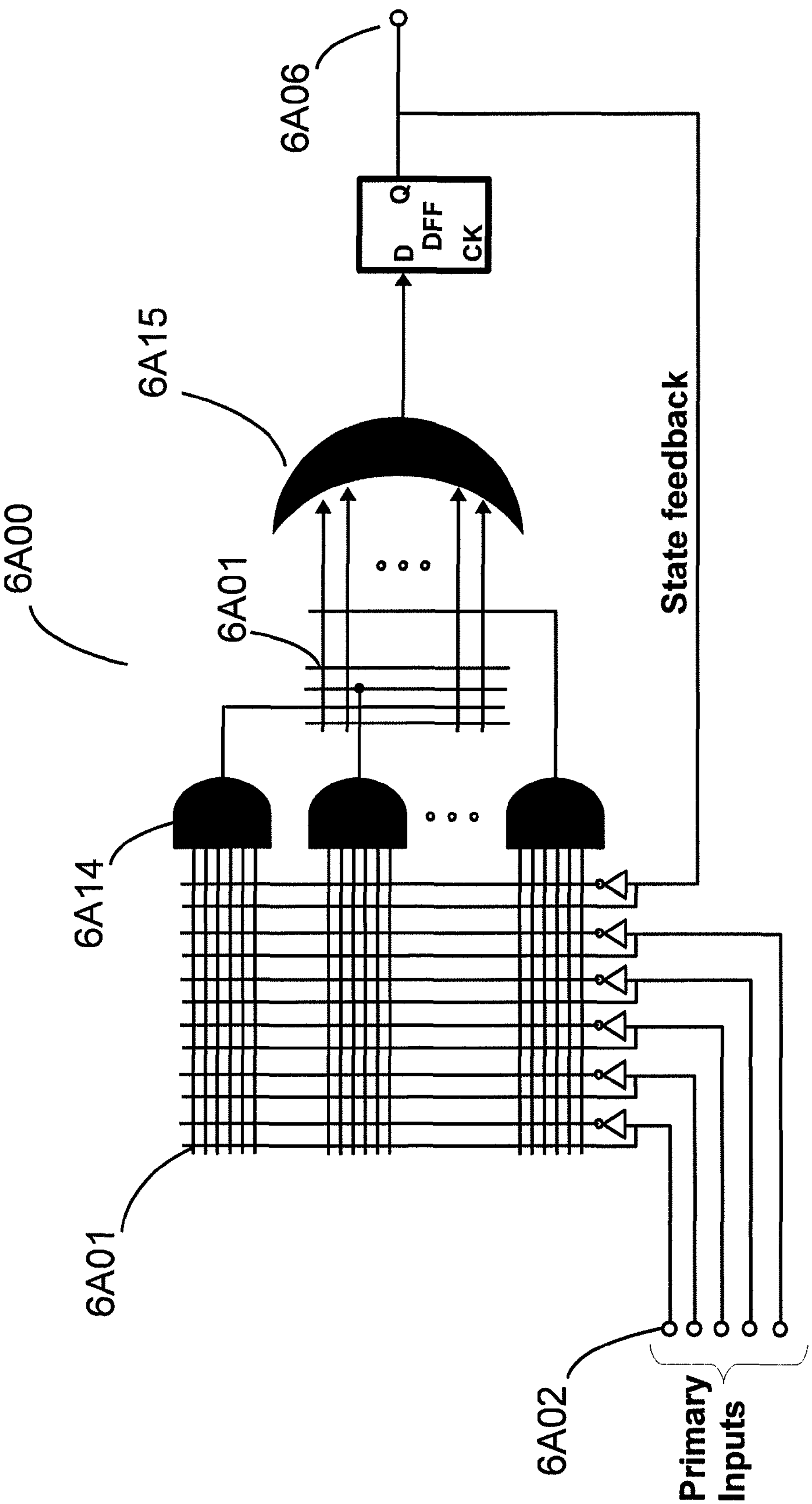
FIG. 6A is a drawing illustration of a PLA logic cell.

FIG. 6A is a drawing illustration of a PLA logic cell 6A00. This used to be the most popular programmable logic primitive until LUT logic took the leadership. Other acronyms used for this type of logic are PLD and PAL. 6A01 is one of the antifuses that enables the selection of the signal fed to the multi-input AND 6A14. In this drawing any cross between vertical line and horizontal line comprises an antifuse to allow the connection to be made according to the desired end function. The large AND cell 6A14 constructs the product term by performing the AND function on the selection of inputs 6A02 or their inverted replicas. A multi-input OR 6A15 performs the OR function on a selection of those product terms to construct an output 6A06. FIG. 6A illustrates an antifuse configurable PLA logic.

The logic cells presented in FIG. 5, FIG. 6 and FIG. 6A are just representatives. There exist many options for construction of programmable logic fabric including additional logic cells such as AND, MUX and many others, and variations on those cells. Also, in the construction of the logic fabric there might be variation with respect to which of their inputs and outputs are connected by the configurable interconnect fabric and which are connected directly in a non-configurable way.

Figure 7:
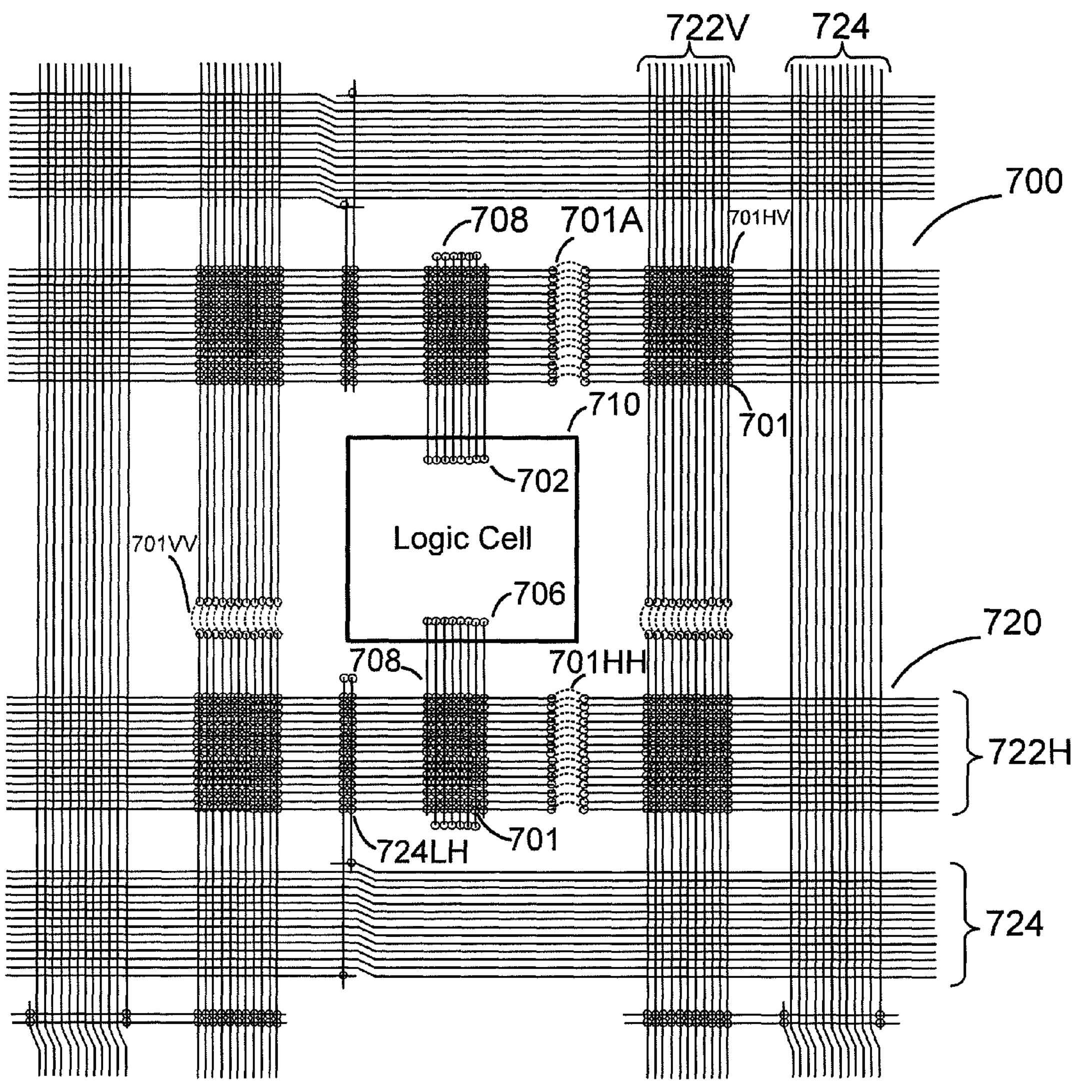
FIG. 7 is a drawing illustration of a programmable cell.

FIG. 7 is a drawing illustration of a programmable cell 700. By tiling such cells a programmable fabric is constructed. The tiling could be of the same cell being repeated over and over to form a homogenous fabric. Alternatively, a blend of different cells could be tiled for heterogeneous fabric. The logic cell 700 could be any of those presented in FIGS. 5 and 6, a mix and match of them or other primitives as discussed before. The logic cell 710 inputs 702 and output 706 are connected to the configurable interconnection fabric 720 with input and output strips 708 with associated antifuses 701. The short interconnects 722 are comprising metal strips that are the length of the tile, they comprise horizontal strips 722H, on one metal layer and vertical strips 722V on another layer, with antifuse 701HV in the cross between them, to allow selectively connecting horizontal strip to vertical strip. The connection of a horizontal strip to another horizontal strip is with antifuse 701HH that functions like antifuse 410 of FIG. 4. The connection of a vertical strip to another vertical strip is with antifuse 701VV that functions like fuse 406 of FIG. 4. The long horizontal strips 724 are used to route signals that travel a longer distance, usually the length of 8 or more tiles. Usually one strip of the long bundle will have a selective connection by antifuse 724LH to the short strips, and similarly, for the vertical long strips 724. FIG. 7 illustrates the programmable cell 700 as a two dimensional illustration. In real life 700 is a three dimensional construct where the logic cell 710 utilizes the base silicon with Metal 1, Metal 2, and some times Metal 3. The programmable interconnect fabric including the associated antifuses will be constructed on top of it.

Figure 8:
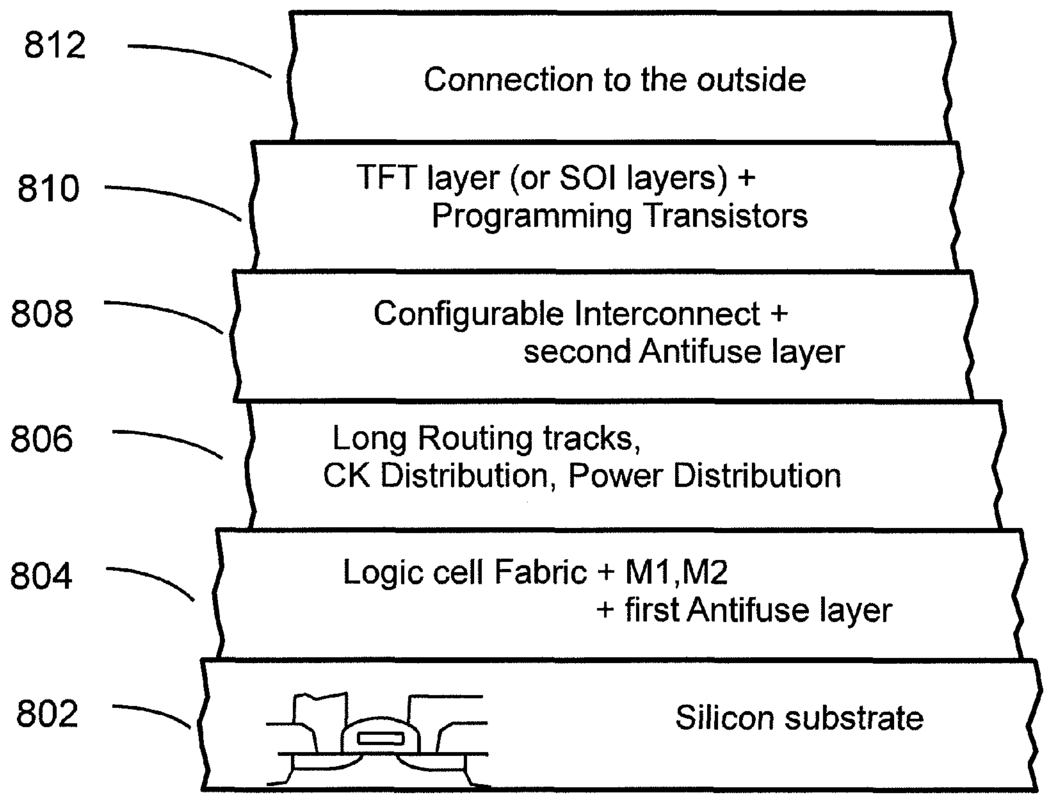
FIG. 8 is a drawing illustration of a programmable device layers structure.

FIG. 8 is a drawing illustration of a programmable device layers structure according to an alternative of the current invention. In this alternative there are two layers comprising antifuses. The first is designated to configure the logic terrain and, in some cases, to also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 8 starts with the semiconductor substrate 802 comprising the transistors used for the logic cells and also the first antifuse layer programming transistors. Then comes layers 804 comprising Metal 1, dielectric, Metal 2, and sometimes Metal 3. These layers are used to construct the logic cells and often I/O and other analog cells. In this alternative of the current invention a plurality of first antifuses are incorporated in the isolation layer between metal 1 and metal 2 or in the isolation layer between metal 2 and metal 3 and their programming transistors could be embedded in the silicon substrate 802 being underneath the first antifuses. These first antifuses could be used to program logic cells such as 520, 600 and 700 and to connect individual cells to construct larger logic functions. These first antifuses could also be used to configure the logic clock distribution. The first antifuse layer could also be used to manage some of the power distribution to save power by not providing power to unused circuits. This layer could also be used to connect some of the long routing tracks and/or one or more connections to the inputs and outputs of the cells.

The following few layers 806 could comprise long interconnection tracks for power distribution and clock networks, or a portion of these, in addition to what was fabricated in the first few layers 804.

The following few layers 808 could comprise the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric 810. The programming element could be a thin film transistor or other alternatives for over oxide transistors as was mentioned previously. In such case the antifuse programming transistors are placed over the antifuse layer, which may thereby enable the configurable interconnect 808 or 804. It should be noted that in some cases it might be useful to construct part of the control logic for the second antifuse programming circuits, in the base layers 802 and 804.

The final step is the connection to the outside 812. These could be pads for wire bonding, soldering balls for flip chip, optical, or other connection structures such as those required for TSV.

In another alternative of the current invention the antifuse programmable interconnect structure could be designed for multiple use. The same structure could be used as a part of the interconnection fabric, or as a part of the PLA logic cell, or as part of a ROM function. In an FPGA product it might be desirable to have an element that could be used for multiple purposes. Having resources that could be used for multiple functions could increase the utility of the FPGA device.

Figure 8A:
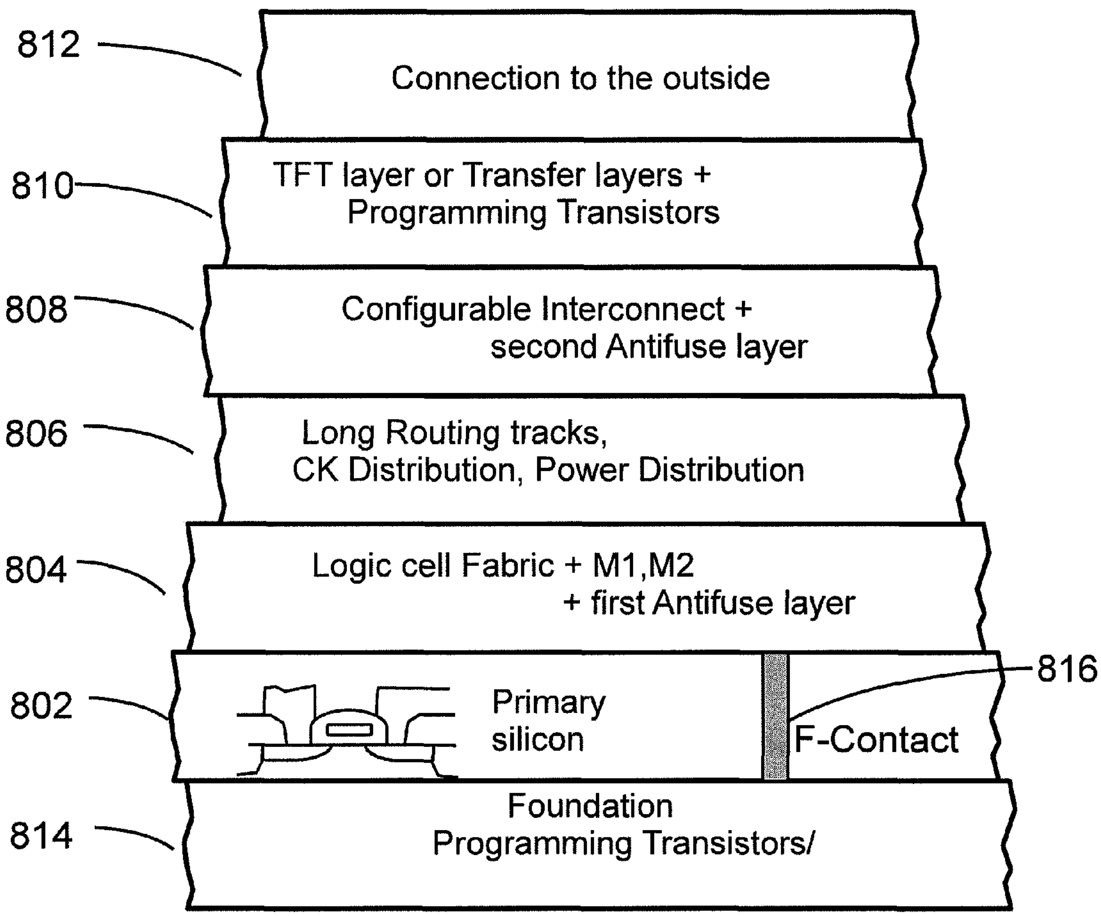
FIG. 8A is a drawing illustration of a programmable device layers structure.

FIG. 8A is a drawing illustration of a programmable device layers structure according to another alternative of the current invention. In this alternative there is additional circuit 814 connected by contact connection 816 to the first antifuse layer 804. This underlying device is providing the programming transistor for the first antifuse layer 804. In this way, the programmable device substrate diffusion layer 816 does not suffer the cost penalty of the programming transistors required for the first antifuse layer 804. Accordingly the programming connection of the first antifuse layer will be directed downward to connect to the underlying programming device 814 while the programming connection to the second antifuse layer will be directed upward to connect to the programming circuits 810. This could provide less congestion of the circuit internal interconnection routes.

An alternative technology for such underlying circuitry is to use the "SmartCut" process. The "SmartCut" process is a well understood technology used for fabrication of SOI wafers. The "SmartCut" process, together with wafer bonding technology, enables a "Layer Transfer" whereby a thin layer of a silicon wafer is transferred from one wafer to another wafer. The "Layer Transfer" could be done at less than 400° C. and the resultant transferred layer could be even less than 100 nm thick. The process with some variations and under different name is commercially available by two companies—Soitec, Crolles, France and SiGen—SiliconGenesis Corporation, San Jose, Calif.

Figure 14:
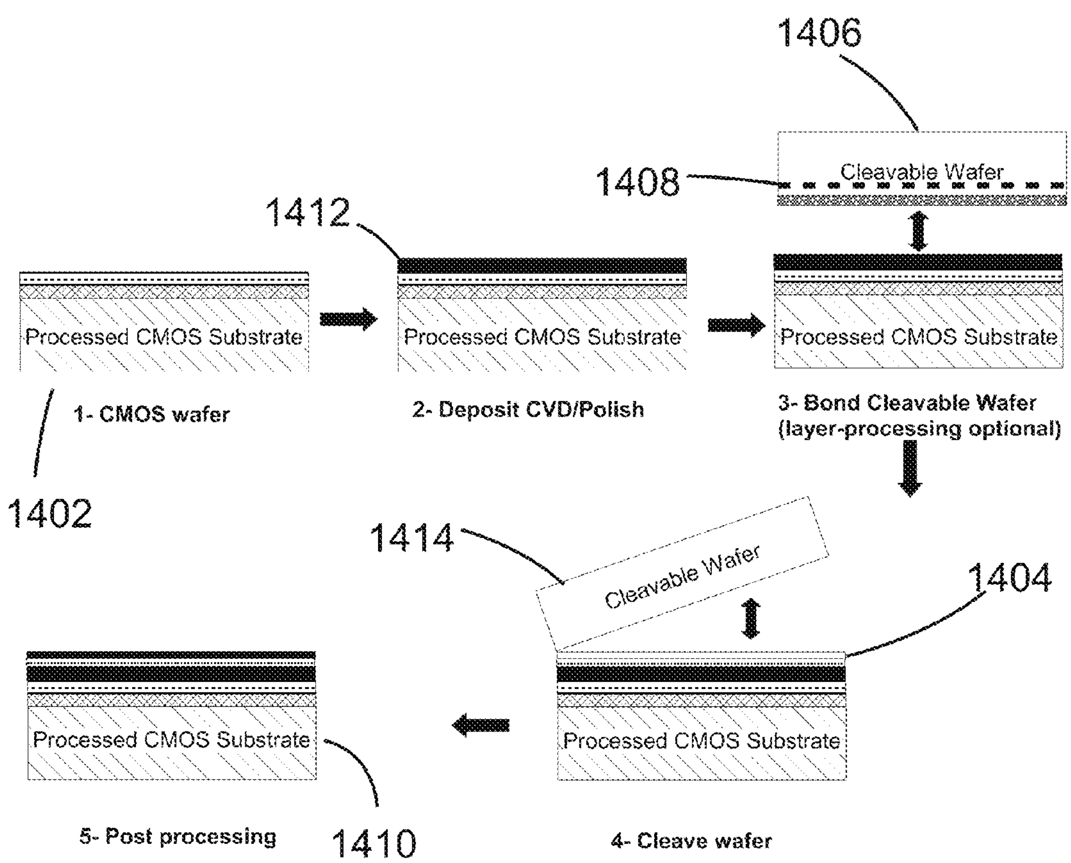
FIG. 14 is a drawing illustration of a layer transfer process flow.

FIG. 14 is a drawing illustration of a layer transfer process flow. In another alternative of the invention, "Layer-Transfer" is used for construction of the underlying circuitry 814. 1402 is a wafer that was processed to construct the underlying circuitry. The wafer 1402 could be of the most advanced process or more likely a few generations behind. It could comprise the programming circuits 814 and other useful structures. An oxide layer 1412 is then deposited on top of the wafer 1402 and then is polished for better planarization and surface preparation. A donor wafer 1406 is then brought in to be bonded to 1402. The surfaces of both donor wafer 1406 and wafer 1402 may have a plasma pretreatment to enhance the bond strength. The donor wafer 1406 is pre-prepared for "SmartCut" by an ion implant of an atomic species, such as H+ ions, at the desired depth to prepare the SmartCut line 1408. After bonding the two wafers a SmartCut step is performed to cleave and remove the top portion 1414 of the donor wafer 1406 along the cut layer 1408. The result is a 3D wafer 1410 which comprises wafer 1402 with an added layer 1404 of crystallized silicon. Layer 1404 could be quite thin at the range of 50-200 nm as desired. The described flow is called "layer transfer". Layer transfer is commonly utilized in the fabrication of SOI—SiliconOn Insulator—wafers. For SOI wafers the upper surface is oxidized so that after "layer transfer" a buried oxide—BOX—provides isolation between the top thin crystallized silicon layer and the bulk of the wafer.

Now that a "layer transfer" process is used to bond a thin crystallized silicon layer 1404 on top of the preprocessed wafer 1402, a standard process could ensue to construct the rest of the desired circuits as is illustrated in FIG. 8A, starting with layer 802 on the transferred layer 1404. The lithography step will use alignment marks on wafer 1402 so the following circuits 802 and 816 and so forth could be properly connected to the underlying circuits 814. An aspect that should be accounted for is the high temperature that would be needed for the processing of circuits 802. The pre-processed circuits on wafer 1402 would need to withstand this high temperature needed for the activation of the semiconductor transistors 802 fabricated on the 1404 layer. Those foundation circuits on wafer 1402 will comprise transistors and local interconnects of poly-silicon and some other type of interconnection that could withstand high temperature such as tungsten. An advantage of using layer transfer for the construction of the underlying circuits is having the layer transferred 1404 be very thin which enables the through silicon via connections 816 to have low aspect ratios and be more like normal contacts, which could be made very small and with minimum area penalty. The thin transferred layer also allows conventional direct thru-layer alignment techniques to be performed, thus increasing the density of silicon via connections 816.

Figure 15:
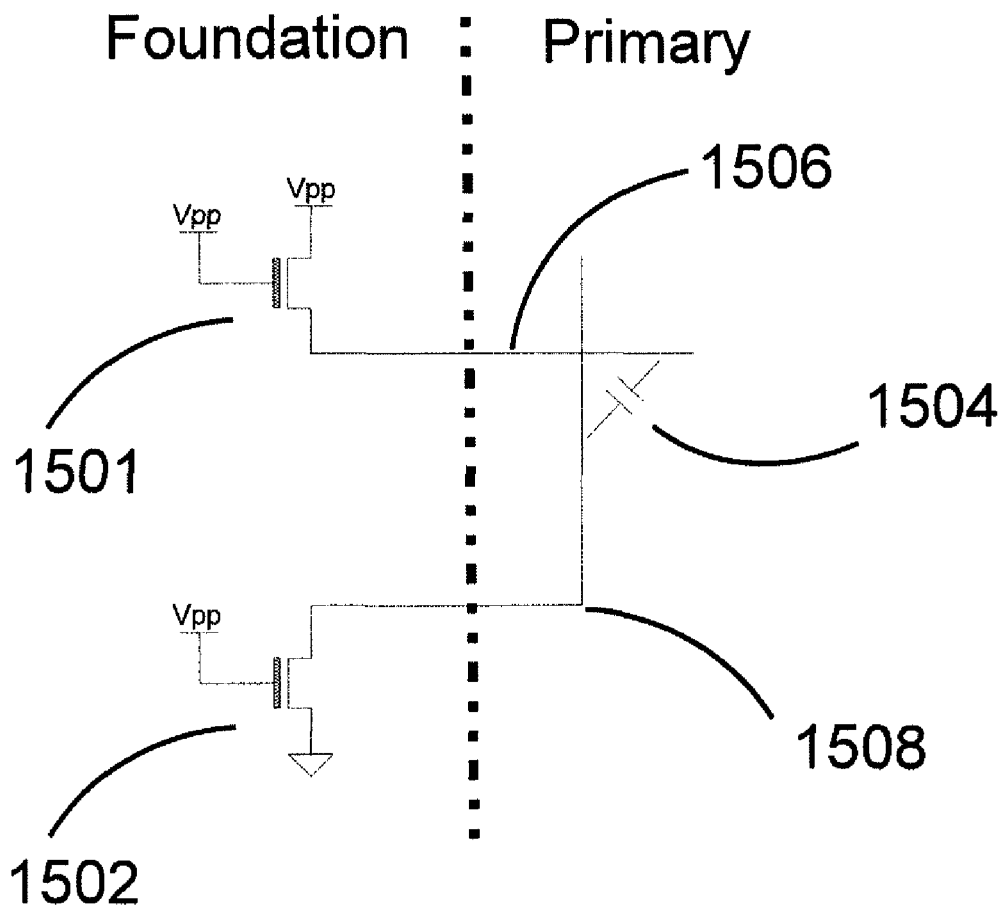
FIG. 15 is a drawing illustration of an underlying programming circuits.

FIG. 15 is a drawing illustration of an underlying programming circuit. Programming Transistors 1501 and 1502 are pre-fabricated on the foundation wafer 1402 and then the programmable logic circuits and the antifuse 1504 are built on the transferred layer 1404. The programming connections 1506, 1508 are connected to the programming transistors by contact holes through layer 1404 as illustrated in FIG. 8A by 816. The programming transistors are designed to withstand the relatively higher programming voltage required for the antifuse 1504 programming.

Figure 16:
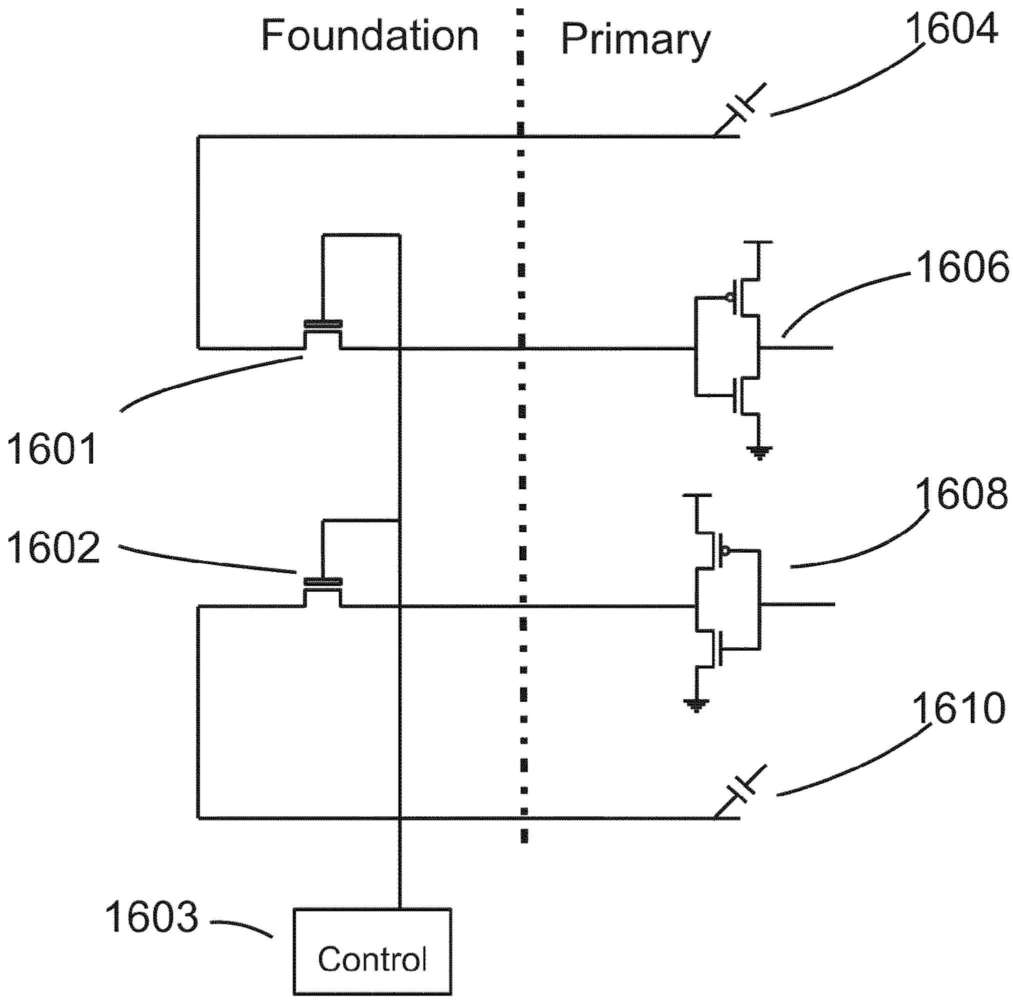
FIG. 16 is a drawing illustration of an underlying isolation transistors circuits.

FIG. 16 is a drawing illustration of an underlying isolation transistor circuit. The higher voltage used to program the antifuse 1604 might damage the logic transistors 1606, 1608. To protect the logic circuits, isolation transistors 1601, 1602, which are designed to withstand higher voltage, are used. The higher programming voltage is only used at the programming phase at which time the isolation transistors are turned off by the control circuit 1603. The underlying wafer 1402 could also be used to carry the isolation transistors. Having the relatively large programming transistors and isolation transistor on the foundation silicon 1402 allows far better use of the primary silicon 802 (1404). Usually the primary silicon will be built in an advanced process to provide high density and performance. The foundation silicon could be built in a less advanced process to reduce costs and support the higher voltage transistors. It could also be built with other than CMOS transistors such as DMOS or bi-polar when such is advantageous for the programming and the isolation function. In many cases there is a need to have protection diodes for the gate input that are called Antennas. Such protection diodes could be also effectively integrated in the foundation alongside the input related Isolation Transistors. On the other hand the isolation transistors 1601, 1602 would provide the protection for the antenna effect so no additional diodes would be needed.

An additional alternative embodiment of the invention is where the foundation layer 1402 is pre-processed to carry a plurality of back bias voltage generators. A known challenge in advanced semiconductor logic devices is die-to-die and within-a-die parameter variations. Various sites within the die might have different electrical characteristics due to dopant variations and such. The most critical of these parameters that affect the variation is the threshold voltage of the transistor. Threshold voltage variability across the die is mainly due to channel dopant, gate dielectric, and critical dimension variability. This variation becomes profound in sub 45 nm node devices. The usual implication is that the design should be done for the worst case, resulting in a quite significant performance penalty. Alternatively complete new designs of devices are being proposed to solve this variability problem with significant uncertainty in yield and cost. A possible solution is to use localized back bias to drive upward the performance of the worst zones and allow better overall performance with minimal additional power. The foundation-located back bias could also be used to minimize leakage due to process variation.

Figure 17A:
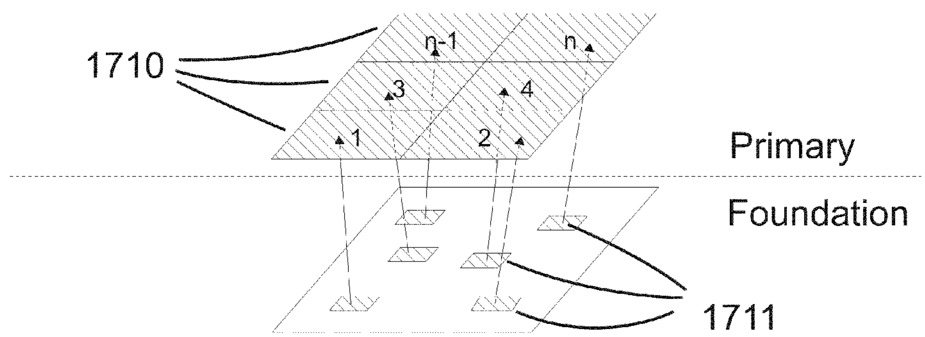
FIG. 17A is a topology drawing illustration of underlying back bias circuitry.

FIG. 17A is a topology drawing illustration of back bias circuitry. The foundation layer 1402 carries back bias circuits 1711 to allow enhancing the performance of some of the zones 1710 on the primary device which otherwise will have lower performance.

Figure 17B:
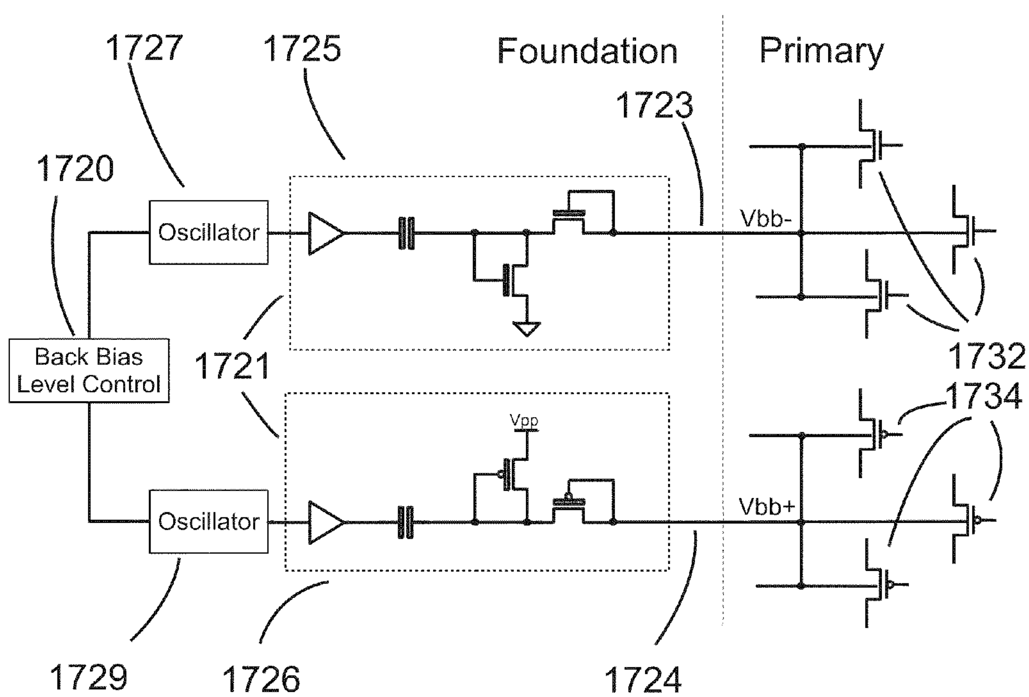
FIG. 17B is a drawing illustration of underlying back bias circuits.

FIG. 17B is a drawing illustration of back bias circuits. A back bias level control circuit 1720 is controlling the oscillators 1727 and 1729 to drive the voltage generators 1721. The negative voltage generator 1725 will generate the desired negative bias which will be connected to the primary circuit by connection 1723 to back bias the NMOS transistors 1732 on the primary silicon 1404. The positive voltage generator 1726 will generate the desired negative bias which will be connected to the primary circuit by connection 1724 to back bias the PMOS transistors 1724 on the primary silicon 1404. The setting of the proper back bias level per zone will be done in the initiation phase. It could be done by using external tester and controller or by on-chip self test circuitry. Preferably a non volatile memory will be used to store the per zone back bias voltage level so the device could be properly initialized at power up. Alternatively a dynamic scheme could be used where different back bias level(s) are used in different operating modes of the device. Having the back bias circuitry in the foundation allows better utilization of the primary device silicon resources and less distortion for the logic operation on the primary device.

Figure 17C:
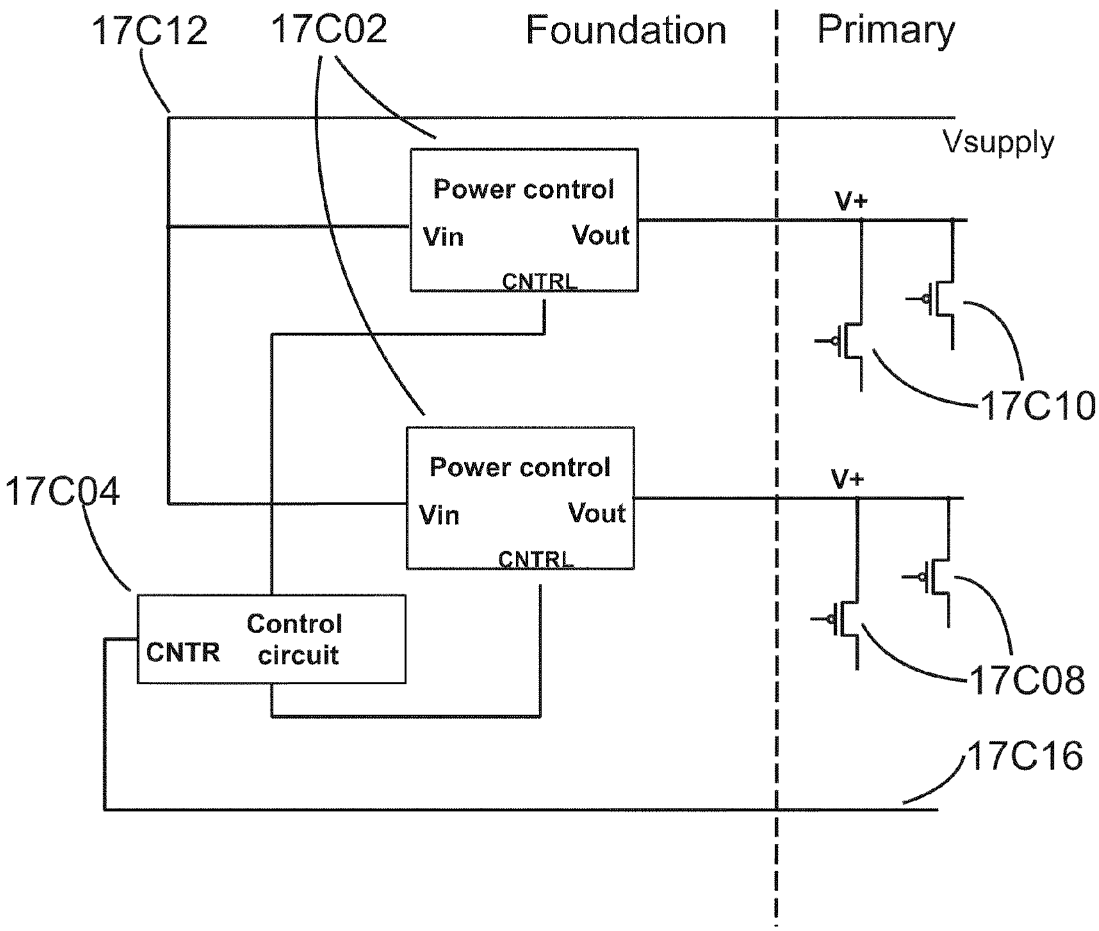
FIG. 17C is a drawing illustration of power control circuits

FIG. 17C illustrates an alternative circuit function that may fit well in the "Foundation." In many IC designs it is desired to integrate power control to reduce either voltage to sections of the device or to totally power off these sections when those sections are not needed or in an almost 'sleep' mode. In general such power control is best done with higher voltage transistors. Accordingly a power control circuit cell 17C02 may be constructed in the Foundation. Such power control 17C02 may have its own higher voltage supply and control or regulate supply voltage for sections 17C10 and 17C08 in the "Primary" device. The control may come from the primary device 17C16 and be managed by control circuit 17C04 in the Foundation.

Figure 17D:
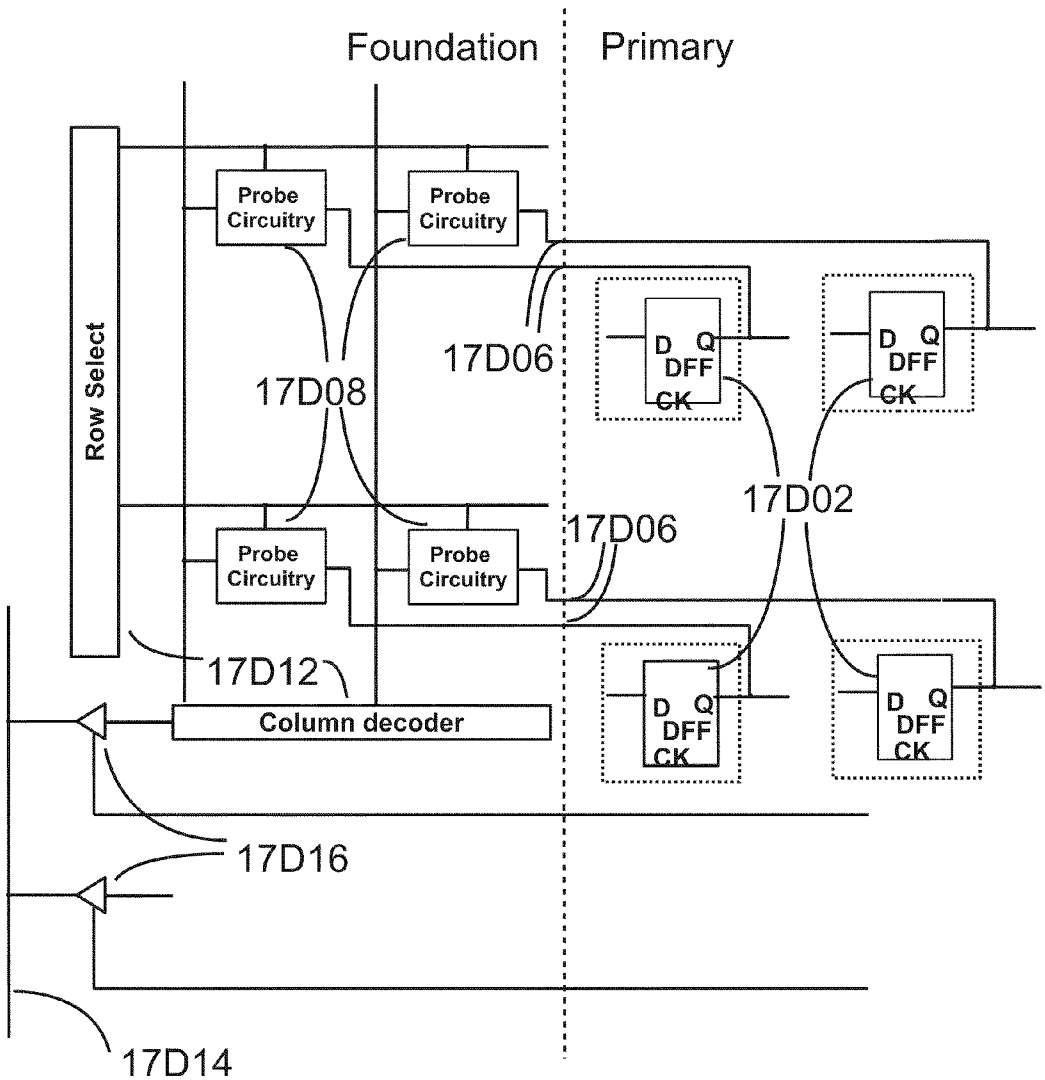
FIG. 17D is a drawing illustration of probe circuits

FIG. 17D illustrates an alternative circuit function that may fit well in the "Foundation." In many IC designs it is desired to integrate a probe auxiliary system that will make it very easy to probe the device in the debugging phase, and to support production testing. Probe circuits have been used in the prior art sharing the same transistor layer as the active circuit. FIG. 17D illustrates a probe circuit constructed in the Foundation underneath the active circuits. FIG. 17D illustrates that the connections are made to the sequential active circuit elements 17D02. Those connections are routed to the Foundation 17D06 where a high impedance probe circuitry 17D08 will be used to sense the sequential element output. A selector circuit 17D12 allows one of those sequential outputs to be routed out, buffers 17D16 which are controlled by signals from the Primary circuit to supply the drive of the sequential output signal to the probed signal output 17D14 for debugging or testing.

Figure 18:
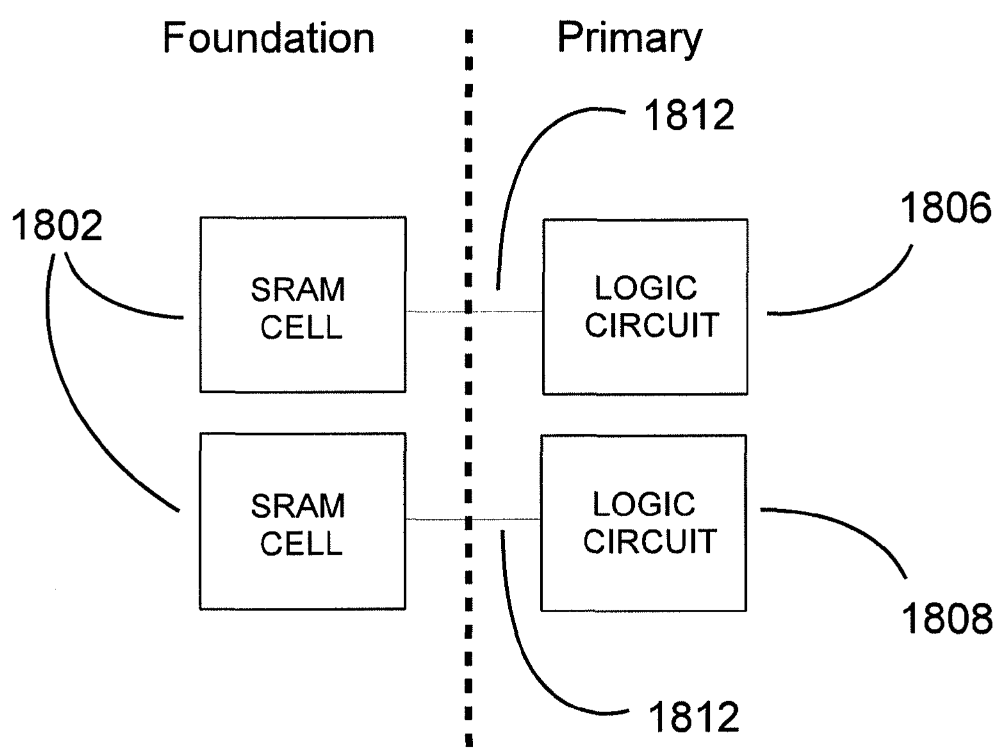
FIG. 18 is a drawing illustration of an underlying SRAM.

In another alternative the foundation substrate 1402 could additionally carry SRAM cells as illustrated in FIG. 18. The SRAM cells 1802 pre-fabricated on the underlying substrate 1402 could be connected 1812 to the primary logic circuit 1806, 1808 built on 1404. As mentioned before, the layers built on 1404 could be aligned to the pre-fabricated structure on the underlying substrate 1402 so that the logic cells could be properly connected to the underlying RAM cells.

Figure 19A:
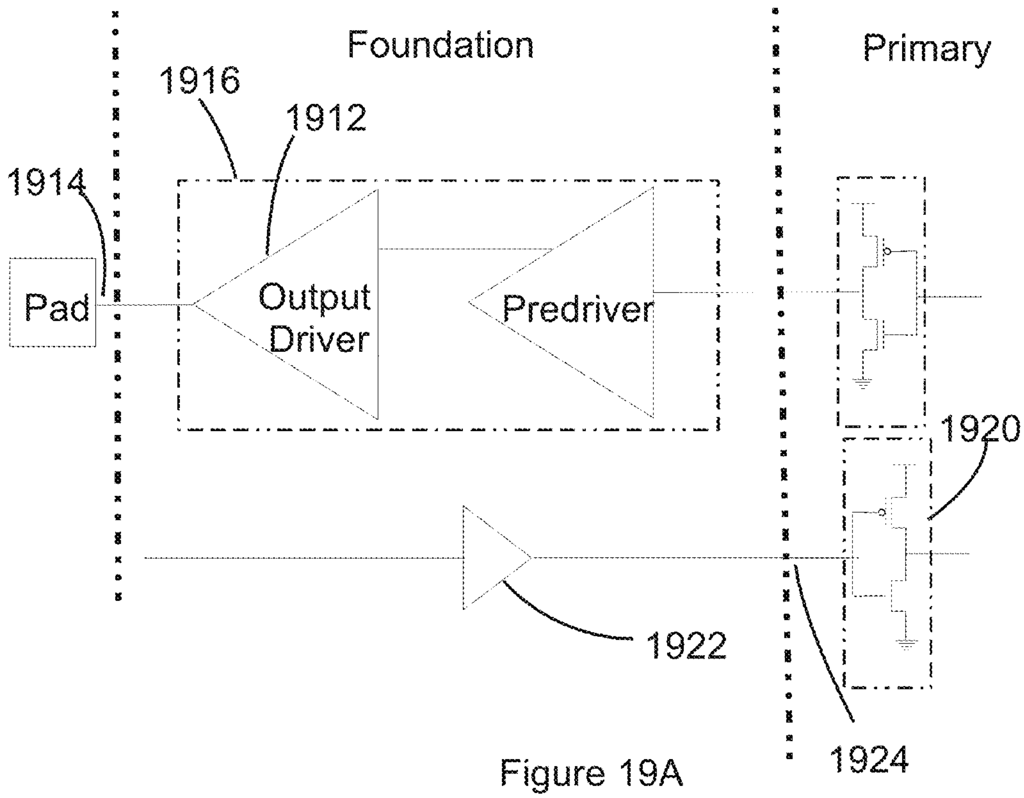
FIG. 19A is a drawing illustration of an underlying I/O.
Figure 19B:
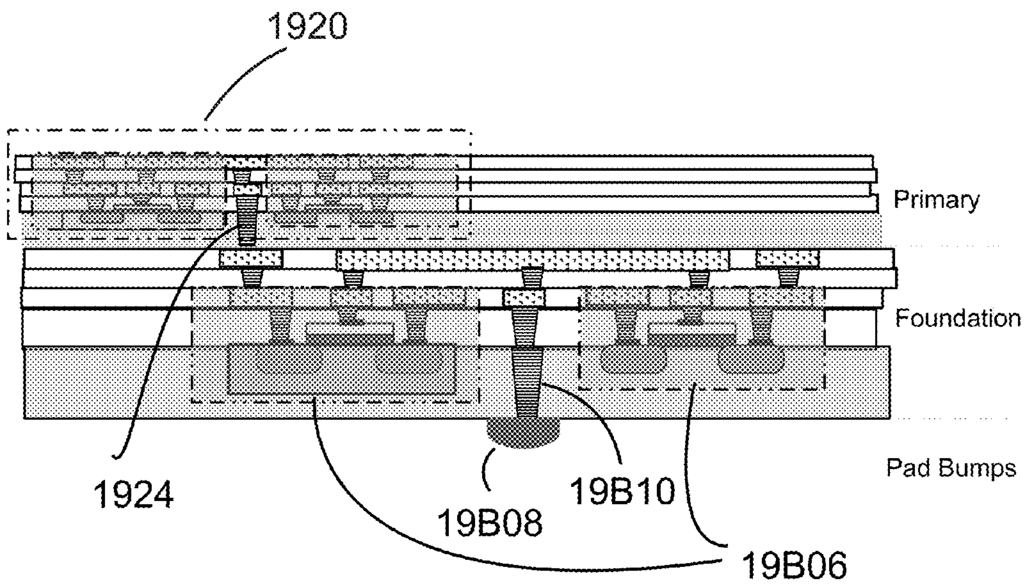
FIG. 19B is a drawing illustration of side "cut"

FIG. 19A is a drawing illustration of an underlying I/O. The foundation 1402 could also be preprocessed to carry the I/O circuits or part of it, such as the relatively large transistors of the output drive 1912. Additionally TSV in the foundation could be used to bring the I/O connection 1914 all the way to the back side of the foundation. FIG. 19B is a drawing illustration of a side "cut" of an integrated device. The Output Driver is illustrated by 19B06 using TSV 19B10 to connect to a backside pad 19B08. The connection material used in the foundation 1402 can be selected to withstand the temperature of the following process constructing the full device on 1404 as illustrated in FIG. 8A—802, 804, 806, 808, 810, 812, such as tungsten. The foundation could also carry the input protection circuit 1922 connecting the pad 19B08 to the input logic 1920 in the primary circuits.

Additional alternative is to use TSV 19B10 to connect between wafers to form 3D Integrated Systems. In general each TSV takes a relatively large area—a few micron sq. When the need is for many TSVs, the overall cost of the required area for these TSVs might be high if the use of that area for high density transistors is precluded. Pre-processing these vias on the donor wafer on a relatively older process line will significantly reduce the effective costs of the 3D TSV connections. The connection 1924 to the primary silicon circuitry 1920 could be then made at the minimum contact size of few tens of nanometers, which is two orders of magnitude lower than the few microns required by the TSVs. FIG. 19B is for illustration only and is not drawn to scale.

Figure 19C:
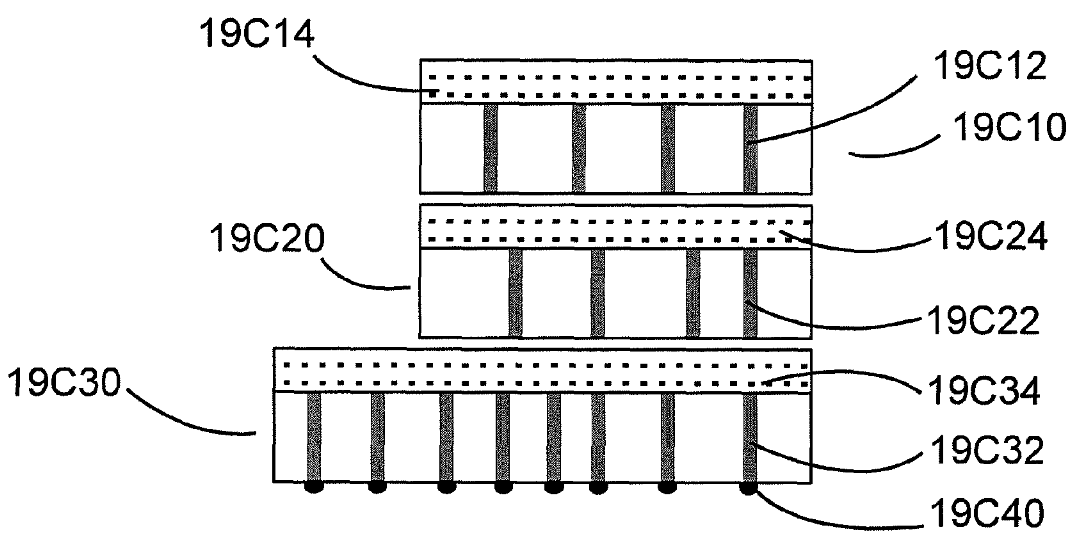
FIG. 19C is a drawing illustration of a 3D IC system.

FIG. 19C demonstrates a 3D system comprising three dies 19C10, 19C20 and 19C30 connected with TSVs 19C12, 19C22 and 19C32 of the type described before in 19B10. The stack of three dies utilize TSV in the Foundations 19C12, 19C22, and 19C32 for the 3D interconnect allowing minimum effect or silicon area loss of the Primary silicon 19C14, 19C24 and 19C34. The three die stacks may be connected to a PC Board using bumps 19C40 connected to the bottom die TSVs 19C32.

Figure 19D:
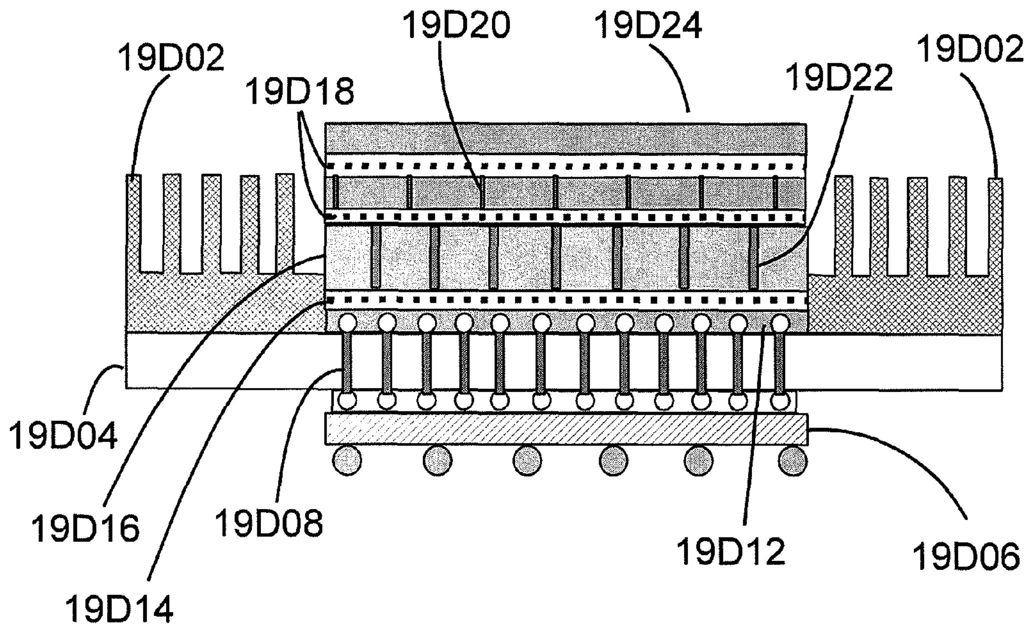
FIG. 19D is a drawing illustration of a 3D IC processor and DRAM system.

FIG. 19D illustrates a 3D IC processor and DRAM system. A well known problem in the computing industry is known as the "memory wall" and relates to the speed the processor can access the DRAM. The prior art proposed solution was to connect a DRAM stack using TSV directly on top of the processor and use a heat spreader attached to the processor back to remove the processor heat. But in order to do so, a special via needs to go "through DRAM" so that the processor I/Os and power could be connected. Having many processor-related 'through-DRAM vias" leads to a few severe disadvantages. First, it reduces the usable silicon area of the DRAM by a few percent. Second, it increases the power overhead by a few percent. Third, it requires that the DRAM design be coordinated with the processor design which is very commercially challenging. FIG. 19D suggests a solution by having a foundation with TSV as illustrated in FIGS. 19B and 19C. The use of the foundation and house structure enables the connections of the processor without going through the DRAM.

In FIG. 19D the processor I/Os and power are connected from the face-down microprocessor active area 19D14—the 'house,' by vias 19D08 to an interposer 19D06. A heat spreader 19D12 the substrate 19D04 and heat sink 19D02 are used to spread the heat generated on the processor active area 19D14. TSVs 19D22 through the Foundation 19D16 are used for the connection of the DRAM stack 19D24. The DRAM stack comprises multiple thinned DRAM 19D18 interconnected by TSV 19D20. Accordingly the DRAM stack does not need to pass through the processor I/O and power planes and could be designed and produced independent of the processor design and layout. The DRAM chip 19D18 that is closest to the Foundation 19D16 may be designed to connect to the Foundation TSVs 19D22, or a separate RDL (ReDistribution Layer) may be added in between, or the Foundation 19D16 could serve that function with preprocessed high temperature interconnect layers, such as Tungsten, as described previously. And the processor's active area is not compromised by having TSVs through it as those are done in the Foundation 19D16.

Alternatively the Foundation vias 19D22 could be used to pass the processor I/O and power to the substrate 19D04 and to the interposer 19D06 while the DRAM stack would be connected directly to the processor active area 19D14.

Figure 19E:
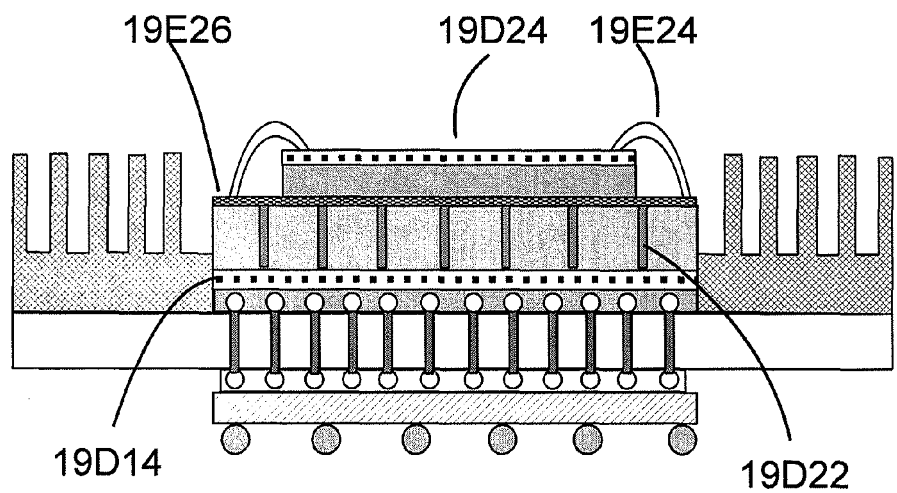
FIG. 19E is a drawing illustration of a 3D IC processor and DRAM system.

FIG. 19E illustrates another option wherein the DRAM stack 19D24 is connected by wire bonds 19E24 to an RDL (ReDistribution Layer) 19E26 that connects the DRAM to the Foundation vias 19D22, and thus connects to the face-down processor 19D14.

Figure 19F:
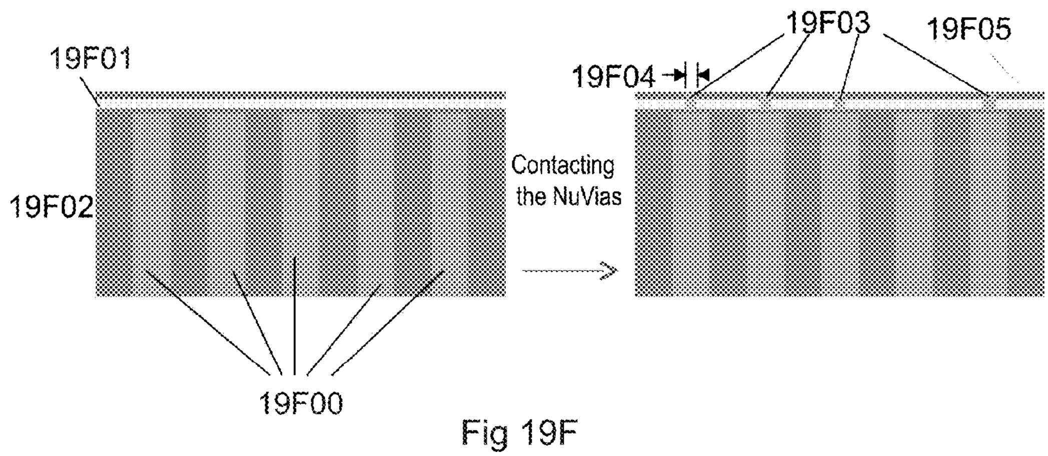
FIG. 19F is a drawing illustration of a custom SOI wafer used to build through-silicon connections.
Figure 19G:
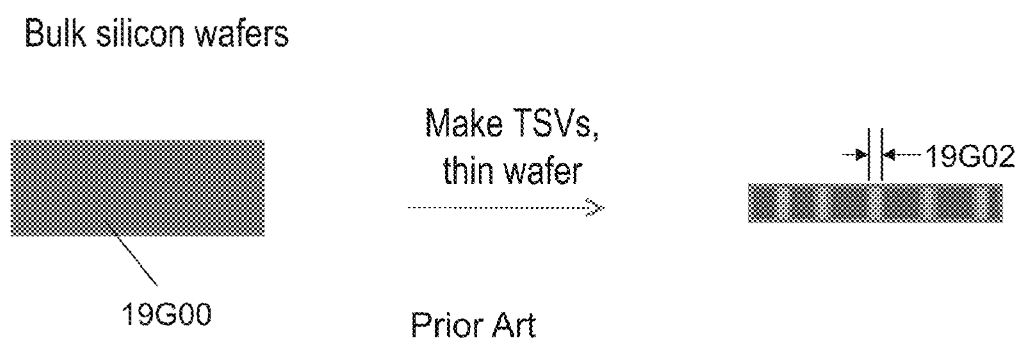
FIG. 19G is a drawing illustration of a prior art method to make through-silicon vias.

In yet another embodiment, custom SOI wafers are used where NuVias 19F00 may be processed by the wafer supplier. This is illustrated in FIG. 19F with handle wafer 19F02 and Buried Oxide BOX 19F01. The handles wafer 19F02 may typically be many hundreds of microns thick, and the BOX 19F01 may typically be a few hundred nanometers thick. The Integrated Device Manufacturer (IDM) or foundry then processes NuContacts 19F03 to connect to the NuVias 19F00. The NuContact diameter $D_{NuContact}$ 19F04, in FIG. 19F may then be processed in the nanometer range. The prior art of construction with bulk silicon wafers 19G00 as illustrated in FIG. 19G typically has a TSV diameter, $D_{TSV\_prior\_art}$ 19G02, in the micron range. Reduced NuContact dimension $D_{NuContact}$ 19F04 in FIG. 19F may have important implications for semiconductor designers. These implications may include reduced die size penalty of through-silicon connections, reduced handling of very thin silicon wafers, and reduced design complexity. The arrangement of TSVs in custom SOI wafers can be based on a high-volume integrated device manufacturer (IDM) or foundry's request, or be based on a commonly agreed industry standard.

Figure 19H:
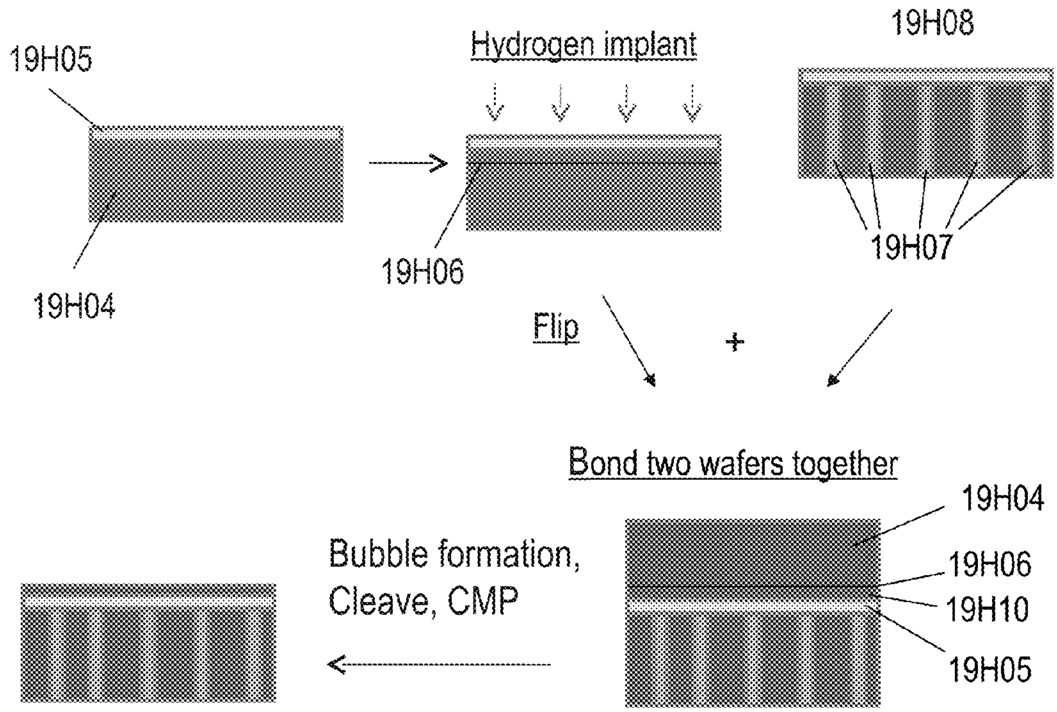
FIG. 19H is a drawing illustration of a process flow for making custom SOI wafers.

A process flow as illustrated in FIG. 19H may be utilized to manufacture these custom SOI wafers. Such a flow may be used by a wafer supplier. A silicon donor wafer 19H04 is taken and its surface 19H05 may be oxidized. Hydrogen may then be implanted at a certain depth 19H06. Oxide-to-oxide bonding as described in other embodiments may then be used to bond this wafer with another acceptor wafer 19H08 having pre-processed NuVIAs 19H07. The NuVIAs 19H07 may be constructed with a conductive material, such as tungsten or doped silicon, that can withstand high-temperature processing with an insulating barrier such as silicon oxide. Alternatively, the wafer supplier may construct NuVias 19H07 with silicon oxide. The integrated device manufacturer or foundry etches out this oxide after the high-temperature transistor fabrication and may replace this oxide with a metal such as copper or aluminum. This process may allow a low-melting point, but highly conductive metal, like copper to be used. Following the bonding, part 19H10 of the donor silicon wafer 19H04 may be cleaved at 19H06 and then chemically mechanically polished as described in other embodiments.

Figure 19I:
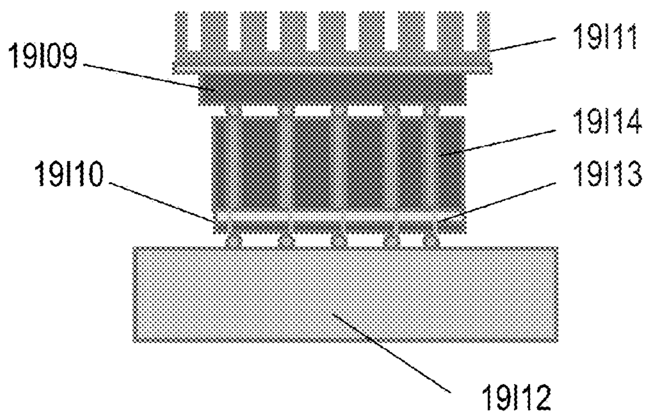
FIG. 19I is a drawing illustration of a processor-DRAM stack.
Figure 19J:
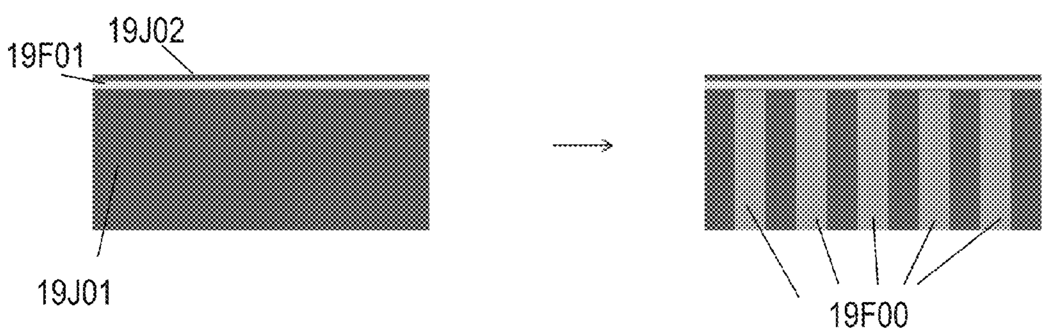
FIG. 19J is a drawing illustration of a process flow for making custom SOI wafers.

FIG. 19J depicts another technique to manufacture custom SOI wafers. A standard SOI wafer with substrate 19J01, box 19F01, and top silicon layer 19J02 may be taken and NuVias 19F00 may be formed from the back-side up to the oxide layer. This technique might require a thicker buried oxide 19F01 than a standard SOI process.

FIG. 19I depicts how a custom SOI wafer may be used for 3D stacking of a processor 19I09 and a DRAM 19I10. In this configuration, a processor's power distribution and I/O connections have to pass from the substrate 19I12, go through the DRAM 19I10 and then connect onto the processor 19I09. The above described technique in FIG. 19F may results in small contact area on the DRAM active silicon, which is very convenient for this processor-DRAM stacking application. The transistor area lost on the DRAM die due to the through-silicon connection 19I13 and 19I14 is very small due to the nanometer diameter NuContact 19I13 in the active DRAM silicon. It is difficult to design a DRAM when large areas in its center are blocked by large through-silicon connections. Having small size through-silicon connections may help tackle this issue. Similarly, this technique may be applied to building processor-SRAM stacks, processor-flash memory stacks, processor-graphics processor-memory stacks and any combination of the above.

In yet another alternative, the foundation substrate 1402 could additionally carry re-drive cells. Re-drive cells are common in the industry for signals which is routed over a relatively long path. As the routing has a severe resistance and capacitance penalty it is helpful to insert re-drive circuits along the path to avoid a severe degradation of signal timing and shape. An advantage of having re-drivers in the foundation 1402 is that these re-drivers could be constructed from transistors who could withstand the programming voltage. Otherwise isolation transistors such as 1601 and 1602 should be used at the logic cell input and output.

FIG. 8A is a cut illustration of a programmable device, with two antifuse layers. The programming transistors for the first one 804 could be prefabricated on 814, and then, utilizing "smart-cut", a single crystal silicon layer 1404 is transferred on which the primary programmable logic 802 is fabricated with advanced logic transistors and other circuits. Then multi-metal layers are fabricated including a lower layer of antifuses 804, interconnection layers 806 and second antifuse layer with its configurable interconnects 808. For the second antifuse layer the programming transistors 810 could be fabricated also utilizing a second "smart-cut" layer transfer.

Figure 20:
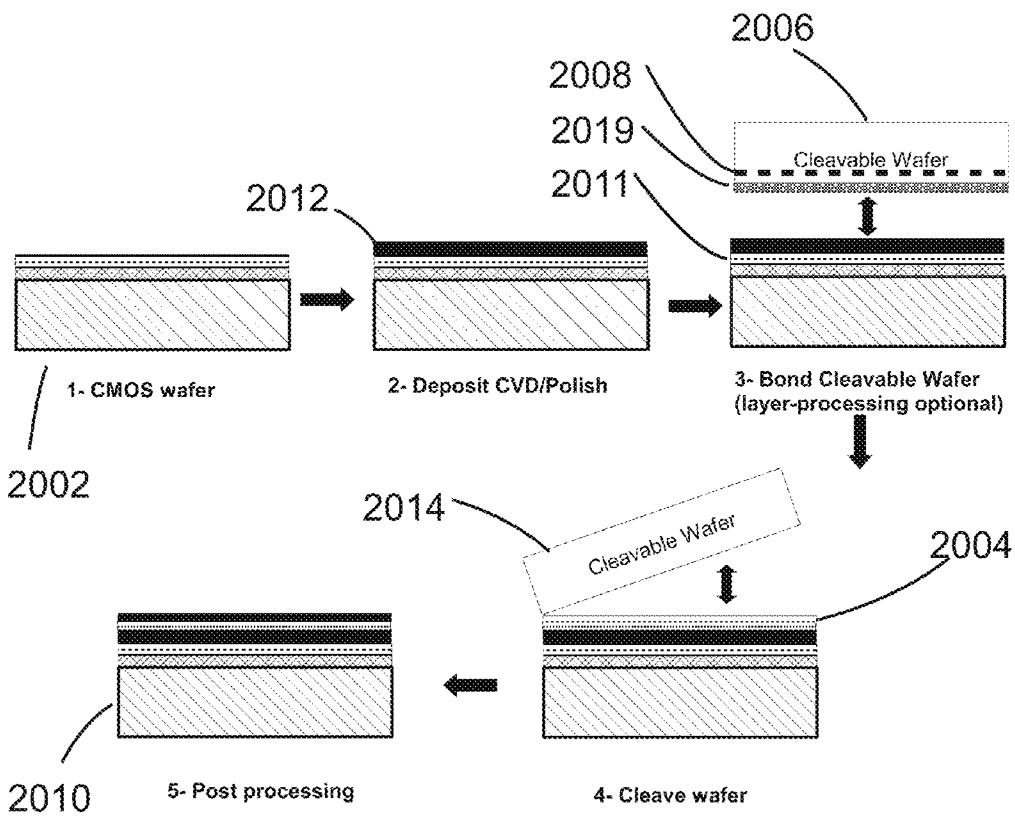
FIG. 20 is a drawing illustration of a layer transfer process flow.

FIG. 20 is a drawing illustration of the second layer transfer process flow. The primary processed wafer 2002 comprises all the prior layers—814, 802, 804, 806, and 808. An oxide layer 2012 is then deposited on top of the wafer 2002 and then polished for better planarization and surface preparation. A donor wafer 2006 is then brought in to be bonded to 2002. The donor wafer 2006 is pre processed to comprise the semiconductor layers 2019 which will be later used to construct the top layer of programming transistors 810 as an alternative to the TFT transistors. The donor wafer 2006 is also prepared for "SmartCut" by ion implant of an atomic species, such as H+, at the desired depth to prepare the SmartCut line 2008. After bonding the two wafers a SmartCut step is performed to pull out the top portion 2014 of the donor wafer 2006 along the cut layer 2008. The result is a 3D wafer 2010 which comprises wafer 2002 with an added layer 2004 of single crystal silicon pre-processed to carry additional semiconductor layers. The transferred slice 2004 could be quite thin at the range of 10-200 nm as desired. Utilizing "SmartCut" layer transfer provides single crystal semiconductors layer on top of a pre-processed wafer without heating the pre-processed wafer to more than 400° C.

There are a few alternatives to construct the top transistors precisely aligned to the underlying pre-fabricated layers 808, utilizing "SmartCut" layer transfer and not exceeding the temperature limit of the underlying pre-fabricated structure. As the layer transfer is less than 200 nm thick, then the transistors defined on it could be aligned precisely to the top metal layer of 808 as required and those transistors have less than 40 nm misalignment.

One alternative is to have a thin layer transfer of single crystal silicon which will be used for epitaxial Ge crystal growth using the transferred layer as the seed for the germanium. Another alternative is to use the thin layer transfer of crystallized silicon for epitaxial growth of $Ge_xSi_{1-x}$. The percent Ge in Silicon of such layer would be determined by the transistor specifications of the circuitry. Prior art have presented approaches whereby the base silicon is used to epi-crystallize the germanium on top of the oxide by using holes in the oxide to drive seeding from the underlying silicon crystal. However, it is very hard to do such on top of multiple interconnection layers. By using layer transfer we can have the silicon crystal on top and make it relatively easy to seed and epi-crystallize an overlying germanium layer. Amorphous germanium could be conformally deposited by CVD at 300° C. and pattern aligned to the underlying layer 808 and then encapsulated by a low temperature oxide. A short μs-duration heat pulse melts the Ge layer while keeping the underlying structure below 400° C. The Ge/Si interface will start the epi-growth to crystallize the germanium layer. Then implants are made to form Ge transistors and activated by laser pulses without damaging the underlying structure taking advantage of the low melting temperature of germanium.

Figure 21A:
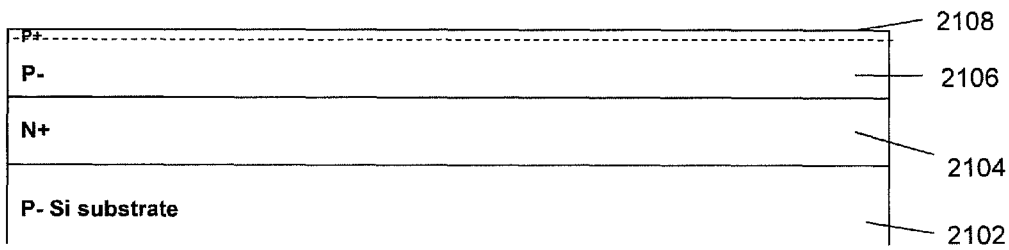
FIG. 21A is a drawing illustration of a pre-processed wafer used for a layer transfer.
Figure 21B:
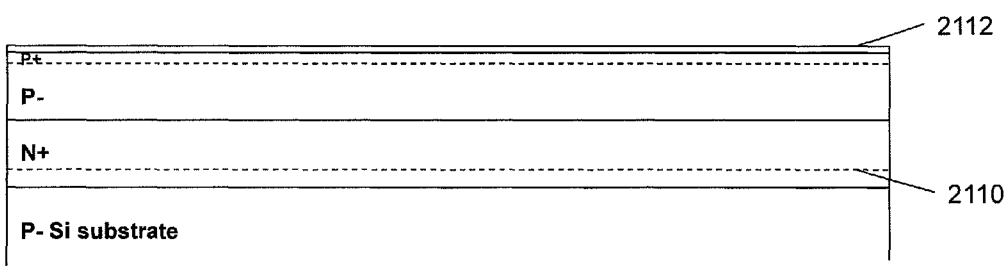
FIG. 21B is a drawing illustration of a pre-processed wafer ready for a layer transfer.

Another alternative is to preprocess the wafer used for layer transfer 2006 as illustrated in FIG. 21. FIG. 21A is a drawing illustration of a pre-processed wafer used for a layer transfer. A P− wafer 2102 is processed to have a "buried" layer of N+ 2104, by implant and activation, or by shallow N+ implant and diffusion followed by a P− epi growth (epitaxial growth) 2106. Optionally, if a substrate contact is needed for transistor performance, an additional shallow P+ layer 2108 is implanted and activated. FIG. 21B is a drawing illustration of the pre-processed wafer made ready for a layer transfer by an implant of an atomic species, such as H+, preparing the SmartCut "cleaving plane" 2110 in the lower part of the N+ region and an oxide deposition or growth 2112 in preparation for oxide to oxide bonding. Now a layer-transfer-flow should be performed, as illustrated in FIG. 20, to transfer the pre-processed single crystal P− silicon with N+ layer, on top of 808.

Figure 22A:
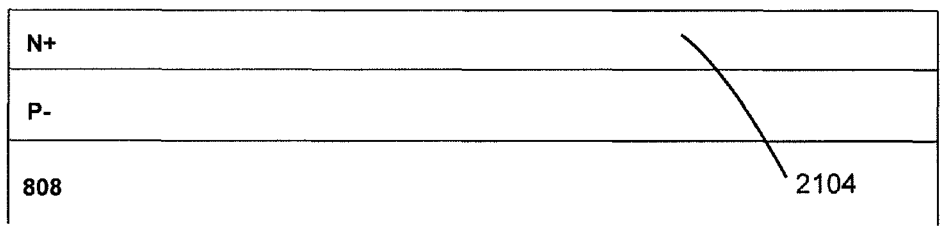
FIG. 22A-22H are drawing illustrations of formation of top planar transistors.
Figure 22B:
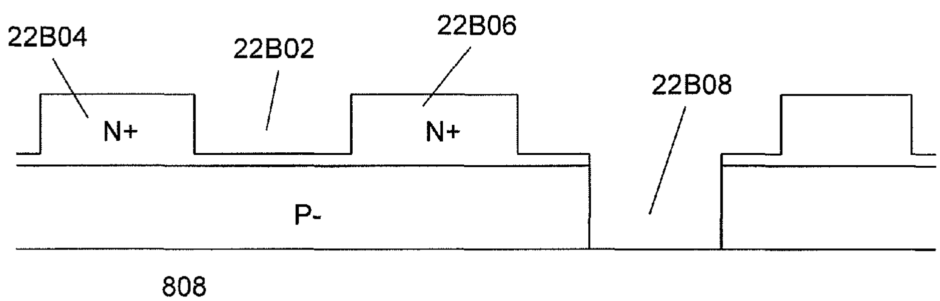
Figure 22C:
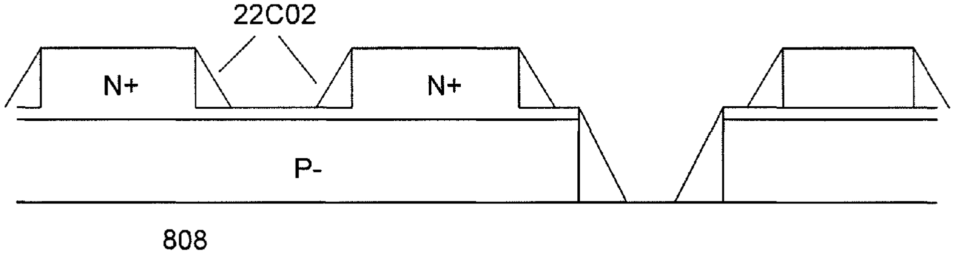
Figure 22D:
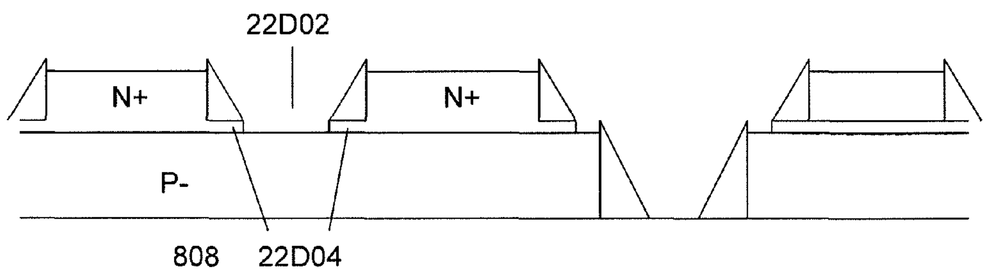
Figure 22E:
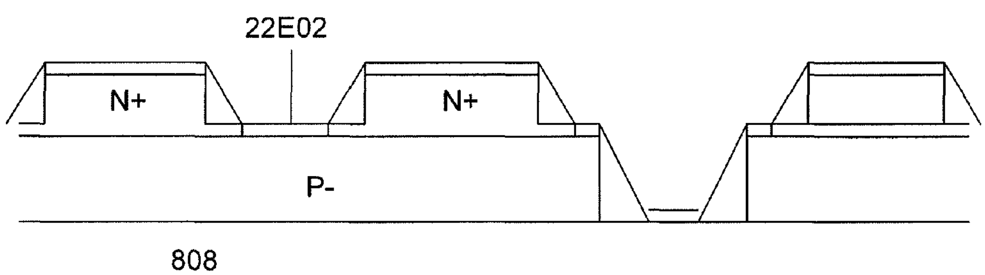

FIGS. 22A-22H are drawing illustrations of the formation of planar top source extension transistors. FIG. 22A illustrates the layer transferred on top of a second antifuse layer with its configurable interconnects 808 after the smart cut wherein the N+ 2104 is on top. Then the top transistor source 22B04 and drain 22B06 are defined by etching away the N+ from the region designated for gates 22B02, leaving a thin more lightly doped N+ layer for the future source and drain extensions, and the isolation region between transistors 22B08. Utilizing an additional masking layer, the isolation region 22B08 is defined by an etch all the way to the top of 808 to provide full isolation between transistors or groups of transistors. Etching away the N+ layer between transistors is helpful as the N+ layer is conducting. This step is aligned to the top of the 808 layer so that the formed transistors could be properly connected to the underlying second antifuse layer with its configurable interconnects 808 layers. Then a highly conformal Low-Temperature Oxide 22C02 (or Oxide/Nitride stack) is deposited and etched resulting in the structure illustrated in FIG. 22C. FIG. 22D illustrates the structure following a self aligned etch step preparation for gate formation 22D02, thereby forming the source and drain extensions 22D04. FIG. 22E illustrates the structure following a low temperature microwave oxidation technique, such as the TEL SPA (Tokyo Electron Limited Slot Plane Antenna) oxygen radical plasma, that grows or deposits a low temperature Gate Dielectric 22E02 to serve as the MOSFET gate oxide. Alternatively, a high k metal gate structure may be formed as follows. Following an industry standard HF/SC1/SC2 clean to create an atomically smooth surface, a high-k dielectric 22E02 is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing $N^+$ poly as the gate electrode needs to have a work function of ~4.2 eV for the device to operate properly and at the right threshold voltage. Alternatively, a metal replacing $P^+$ poly as the gate electrode needs to have a work function of ~5.2 eV to operate properly. The TiAl and TiAlN based family of metals, for example, could be used to tune the work function of the metal from 4.2 eV to 5.2 eV.

Figure 22F:
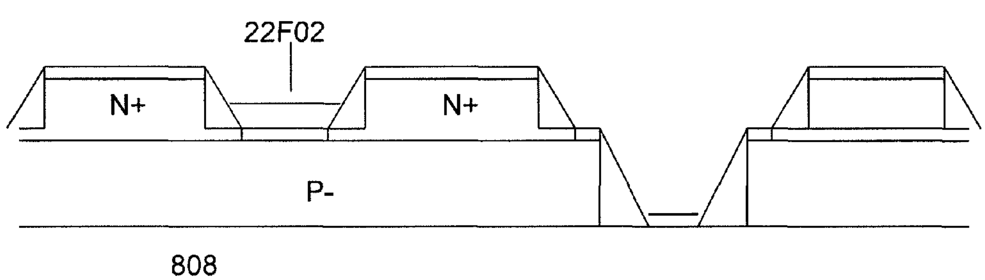

FIG. 22F illustrates the structure following deposition, mask, and etch of metal gate 22F02. Optionally, to improve transistor performance, a targeted stress layer to induce a higher channel strain may be employed. A tensile nitride layer may be deposited at low temperature to increase channel stress for the NMOS devices illustrated in FIG. 22. A PMOS transistor may be constructed via the above process flow by changing the initial P− wafer or epi-formed P− on N+ layer 2104 to an N− wafer or an N− on P+ epi layer; and the N+ layer 2104 to a P+ layer. Then a compressively stressed nitride film would be deposited post metal gate formation to improve the PMOS transistor performance.

Figure 22G:
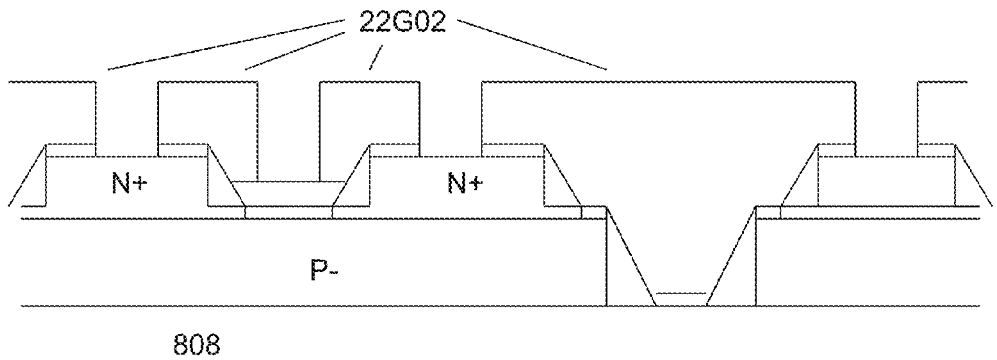
Figure 22H:
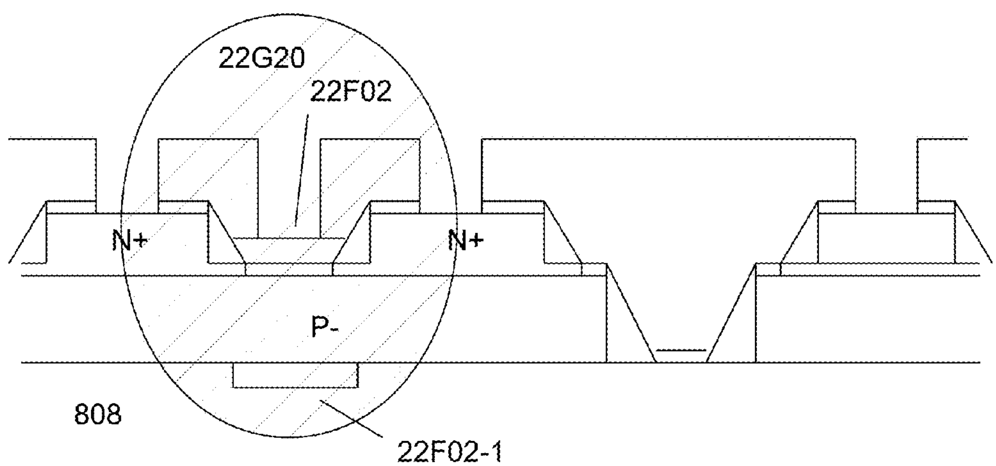

Finally a thick oxide 22G02 is deposited and etched preparing the transistors to be connected as illustrated in FIG. 22G. This flow enables the formation of fully crystallized top MOS transistors that could be connected to the underlying multi-metal layer semiconductor device without exposing the underlying devices and interconnects metals to high temperature. These transistors could be used as programming transistors of the Antifuse on layer 808 or for other functions in a 3D integrated circuit. These transistors can be considered "planar MOSFET transistors," meaning that current flow in the transistor channel is in the horizontal direction. These transistors can also be referred to as horizontal transistors or lateral transistors. An additional advantage of this flow is that the SmartCut H+, or other atomic species, implant step is done prior to the formation of the MOS transistor gates avoiding potential damage to the gate function. If needed the top layer of 808 could comprise a 'back-gate' 22F02-1 whereby gate 22F02 may be aligned to be directly on top of the back-gate 22F02-1 as illustrated in FIG. 22H. According to some embodiments of the current invention, during a normal fabrication of the device layers as illustrated in FIG. 8, every new layer is aligned to the underlying layers using prior alignment marks. Sometimes the alignment marks of one layer could be used for the alignment of multiple layers on top of it and sometimes the new layer will also have alignment marks to be used for the alignment of additional layers put on top of it in the following fabrication step. So layers of 804 are aligned to layers of 802, layers of 806 are aligned to layers of 804 and so forth. An advantage of the described process flow is that the layer transferred is thin enough so that during the following patterning step as described in connection to FIG. 22B, the transferred layer is aligned to the alignment marks of layer 808 or those of underneath layers such as layers 806. Therefore the 'back-gate' 22F02-1 which is part of the top metal layer of 808 would be precisely underneath gate 22F02 as all the layers are patterned as being aligned to each other. In this context alignment precision may be highly dependent on the equipment used for the patterning steps. For processes of 45 nm and below, overlay alignment of better than 5 nm is usually required. The alignment requirement only gets tighter with scaling where modern steppers now can do better than 2 nm. This alignment requirement is orders of magnitude better than what could be achieved for TSV based 3D IC systems as described in relation to FIG. 12 where even 0.5 micron overlay alignment is extremely hard to achieve. Connection between top-gate and back-gate would be made through a top layer via. This may allow further reduction of leakage as both the gate 22F02 and the back-gate 22F02-1 could be connected together to better shut off the transistor 22G20. As well, one could create a sleep mode, a normal speed mode, and fast speed mode by dynamically changing the threshold voltage of the top gated transistor by independently changing the bias of the 'back-gate' 22F02-1. Additionally, an accumulation mode (fully depleted) MOSFET transistor could be constructed via the above process flow by changing the initial P− wafer 2102 or epi-formed P− 2106 on N+ layer 2104 to an N− wafer or an N− epi layer on N+.

An additional aspect of this technique for forming top transistors is the size of the via used to connect the top transistors 22G20 to the layers 808 underneath. The general rule of thumb is that the size of a via should be larger than one tenth the thickness of the layer that the via is going through. Since the thickness of the layers in the structures presented in FIG. 12 is usually more than 50 micron, the TSV used in such structures are about 10 micron on the side. The thickness of the transferred layer in FIG. 22A is less than 100 nm and accordingly the vias to connect top transistors 22G20 to the layers 808 underneath could be less than 50 nm on the side. As the process is scaled to smaller feature sizes, the thickness of the transferred layer and accordingly the size of the via to connect to the underline structures could be scaled down. For some advanced processes, the end thickness of the transferred layer could be made below 10 nm.

Figures 29A, 29B, 29C:
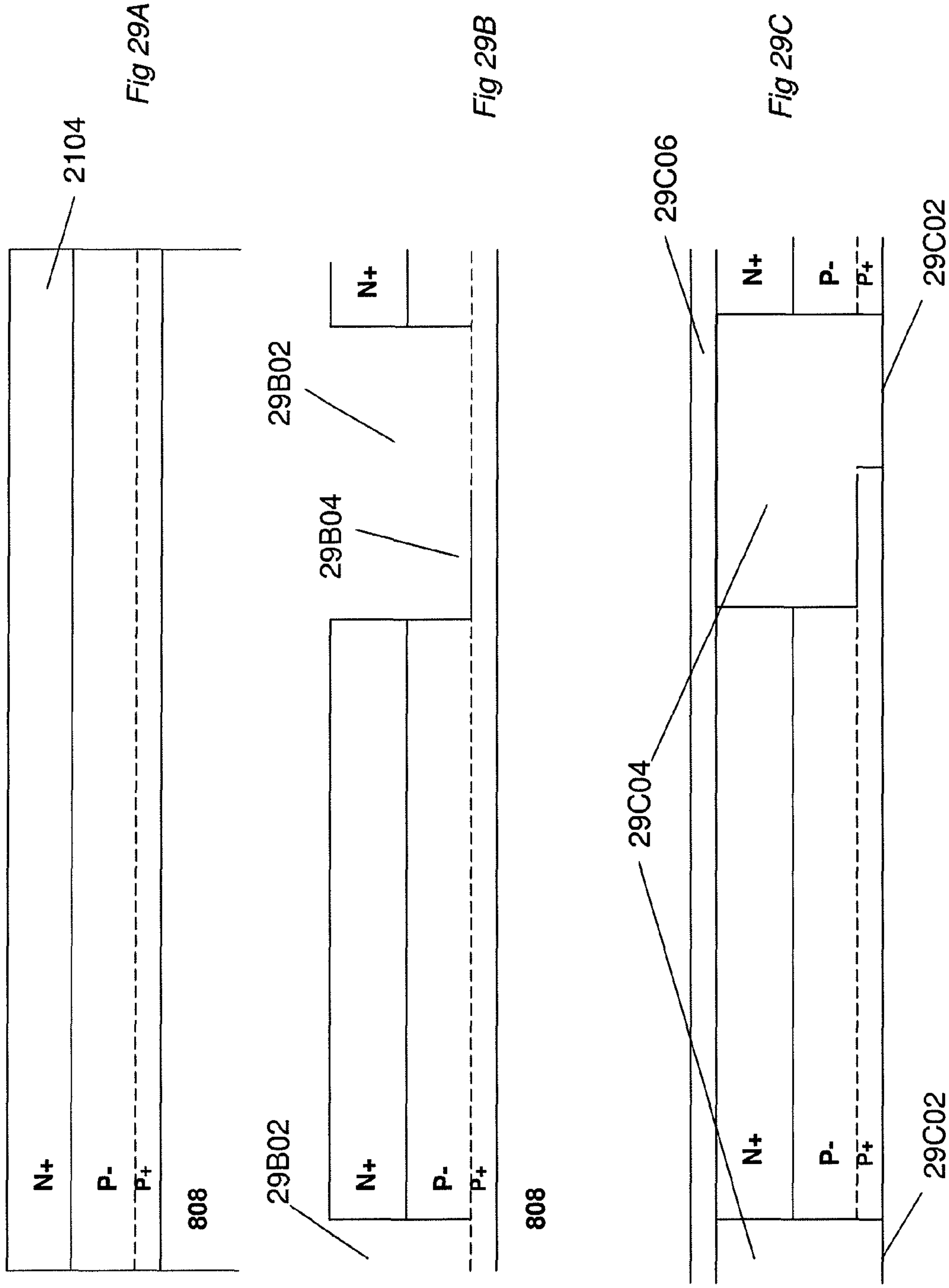
FIG. 29A-29G are drawing illustrations of formations of top planar transistors.
Figure 29D:
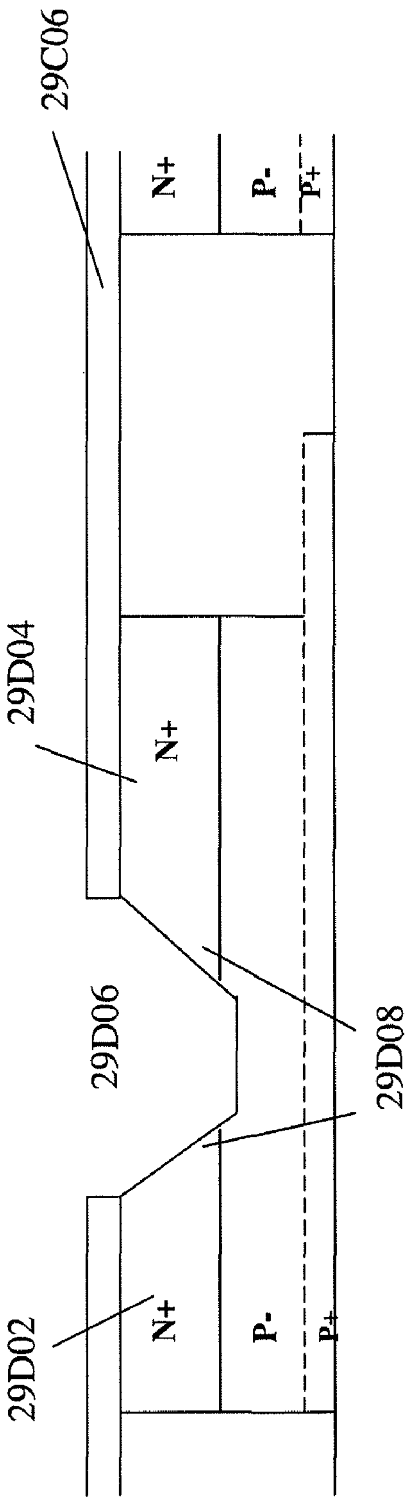
Figure 29E:
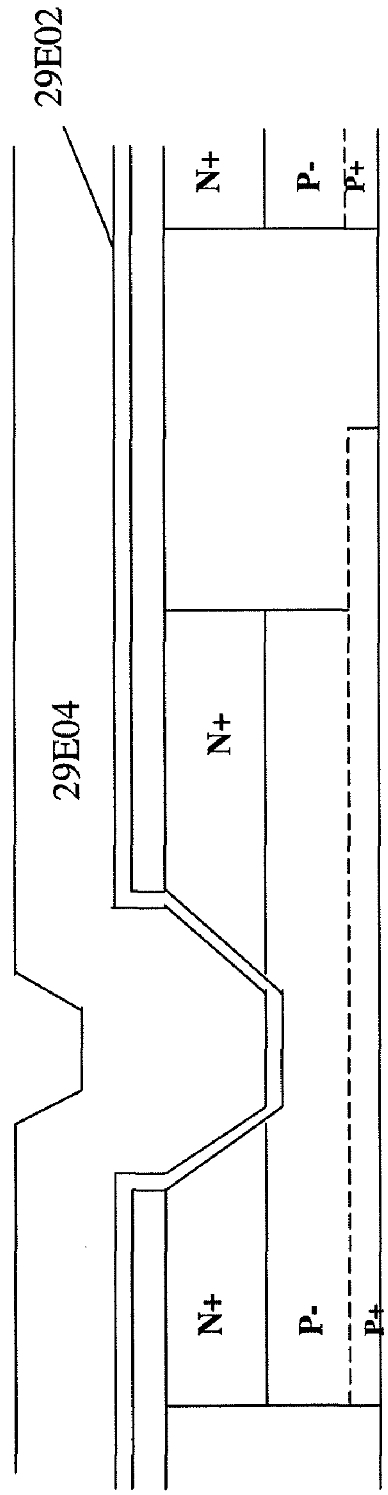

Another alternative for forming the planar top transistors with source and drain extensions is to process the prepared wafer of FIG. 21B as shown in FIGS. 29A-29G. FIG. 29A illustrates the layer transferred on top of the second antifuse layer with its configurable interconnects 808 after the smart cut wherein the N+ 2104 is on top. Then the substrate P+ source 29B04 contact opening and transistor isolation 29B02 is masked and etched as shown in FIG. 29B. Utilizing an additional masking layer, the isolation region 29C02 is defined by etch all the way to the top of 808 to provide full isolation between transistors or groups of transistors in FIG. 29C. Etching away the P+ layer between transistors is helpful as the P+ layer is conducting. Then a Low-Temperature Oxide 29C04 is deposited and chemically mechanically polished. Then a thin polish stop layer 29C06 such as low temperature silicon nitride is deposited resulting in the structure illustrated in FIG. 29C. Source 29D02, drain 29D04 and self-aligned Gate 29D06 may be defined by masking and etching the thin polish stop layer 29C06 and then a sloped N+ etch as illustrated in FIG. 29D. The sloped (30-90 degrees, 45 is shown) etch or etches may be accomplished with wet chemistry or plasma etching techniques. This process forms angular source and drain extensions 29D08. FIG. 29E illustrates the structure following deposition and densification of a low temperature based Gate Dielectric 29E02, or alternately a low temperature microwave plasma oxidation of the silicon surfaces, to serve as the MOSFET gate oxide, and then deposition of a gate material 29E04, such as aluminum or tungsten.

Alternatively, a high-k metal gate structure may be formed as follows. Following an industry standard HF/SC1/SC2 cleaning to create an atomically smooth surface, a high-k dielectric 29E02 is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing $N^+$ poly as the gate electrode needs to have a work function of ~4.2 eV for the device to operate properly and at the right threshold voltage. Alternatively, a metal replacing $P^+$ poly as the gate electrode needs to have a work function of ~5.2 eV to operate properly. The TiAl and TiAlN based family of metals, for example, could be used to tune the work function of the metal from 4.2 eV to 5.2 eV.

Figure 29F:
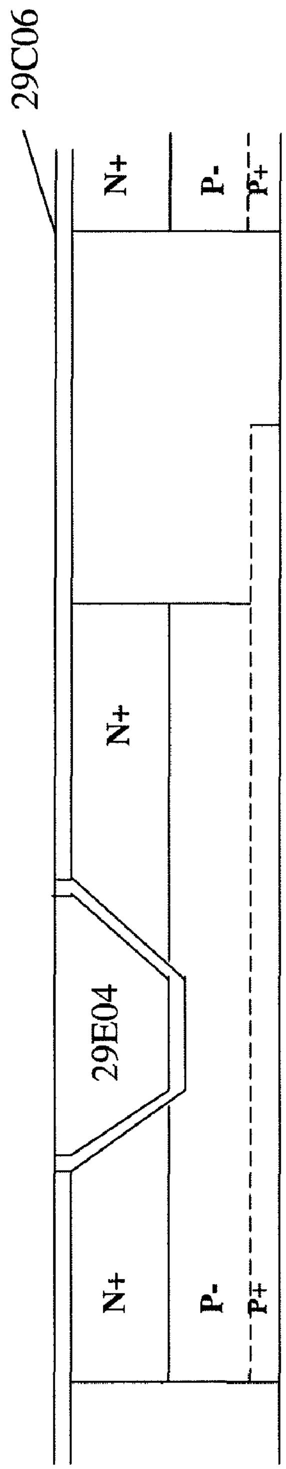

FIG. 29F illustrates the structure following a chemical mechanical polishing of the metal gate 29E04 utilizing the nitride polish stop layer 29C06. A PMOS transistor could be constructed via the above process flow by changing the initial P− wafer or epi-formed P− on N+ layer 2104 to an N− wafer or an N− on P+ epi layer; and the N+ layer 2104 to a P+ layer. Similarly, layer 2108 would change from P+ to N+ if the substrate contact option was used.

Figure 29G:
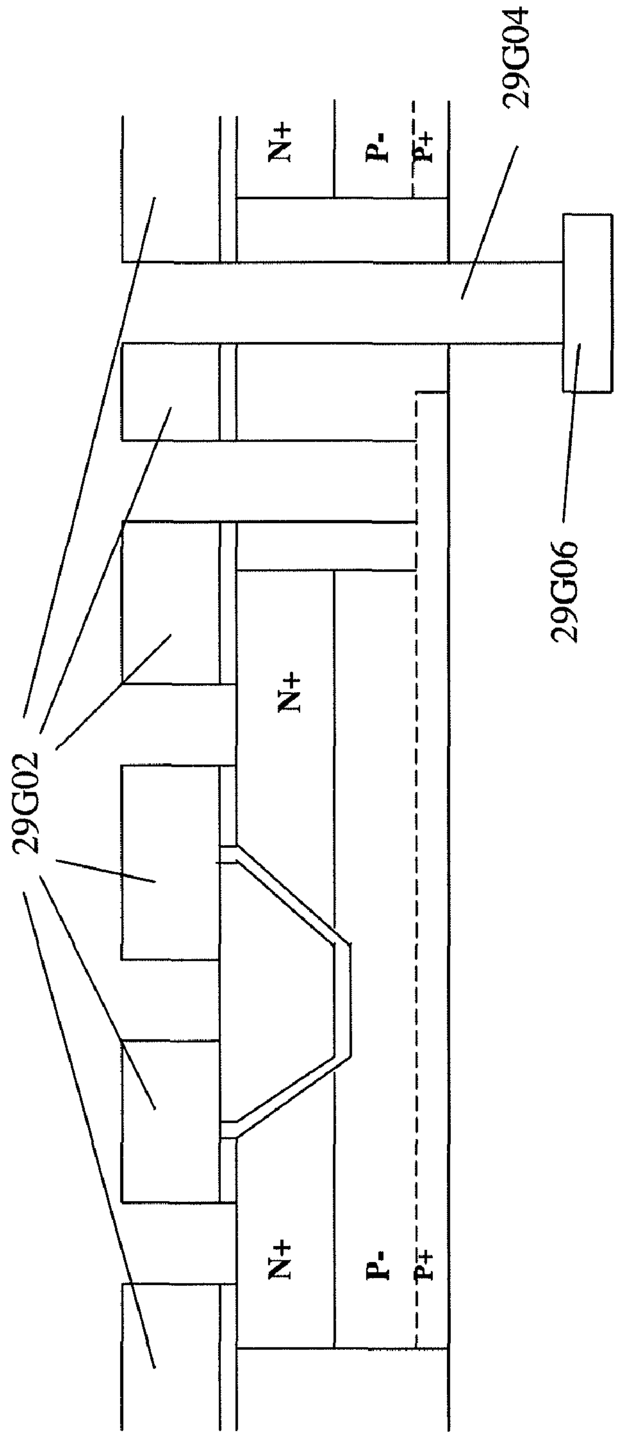

Finally a thick oxide 29G02 is deposited and contact openings are masked and etched preparing the transistors to be connected as illustrated in FIG. 29G. This thick or any low temperature oxide in this patent may be deposited via Chemical Vapor Deposition (CVD), Physical Vapor Deposition (PVD), or Plasma Enhanced Chemical Vapor Deposition (PECVD) techniques. This figure also illustrates the layer transfer silicon via 29G04 masked and etched to provide interconnection of the top transistor wiring to the lower layer 808 interconnect wiring 29G06. This flow enables the formation of fully crystallized top MOS transistors that may be connected to the underlying multi-metal layer semiconductor device without exposing the underlying devices and interconnects metals to high temperature. These transistors may be used as programming transistors of the antifuse on layer 808 or for other functions in a 3D integrated circuit. These transistors can be considered to be "planar MOSFET transistors", where current flow in the transistor channel is in the horizontal direction. These transistors can also be referred to as horizontal transistors or lateral transistors. An additional advantage of this flow is that the SmartCut H+, or other atomic species, implant step is done prior to the formation of the MOS transistor gates avoiding potential damage to the gate function. Additionally, an accumulation mode (fully depleted) MOSFET transistor may be constructed via the above process flow by changing the initial P− wafer or epi-formed P− on N+ layer 2104 to an N− wafer or an N− epi layer on N+.

Figure 23A:
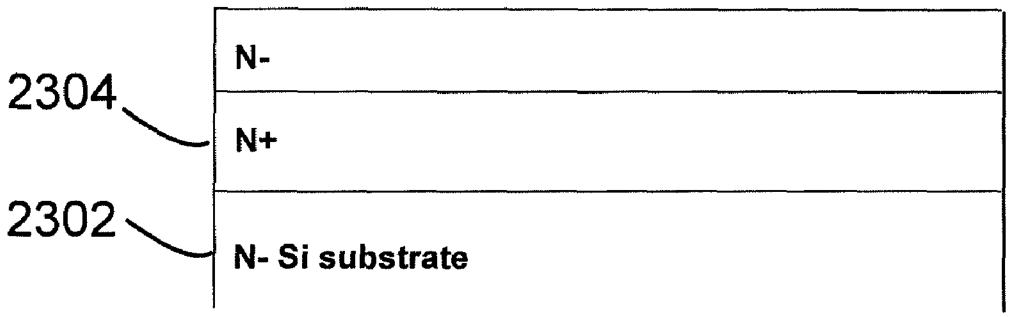
FIG. 23A, 23B is a drawing illustration of a pre-processed wafer used for a layer transfer.
Figure 23B:
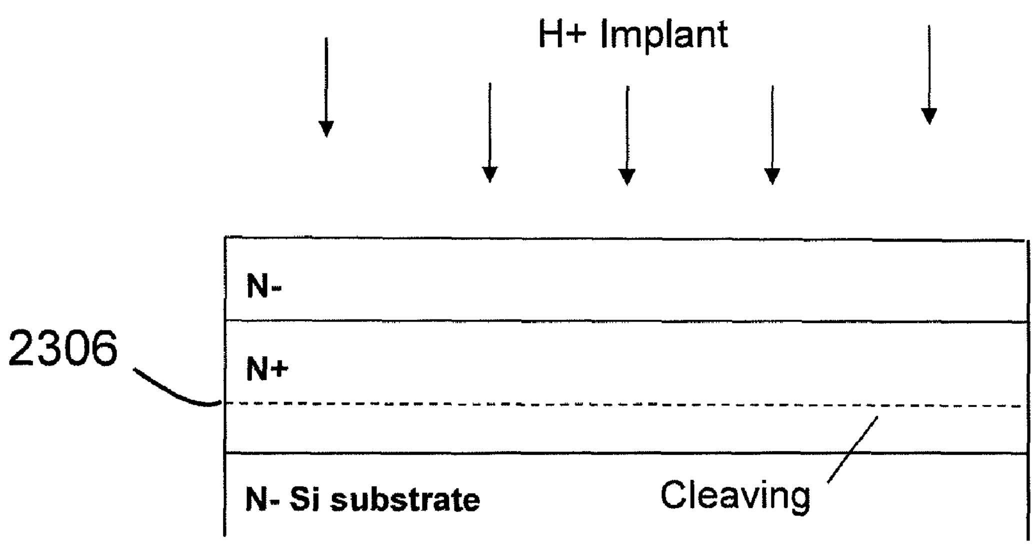

Another alternative is to preprocess the wafer used for layer transfer 2006 as illustrated in FIG. 23. FIG. 23A is a drawing illustration of a pre-processed wafer used for a layer transfer. An N− wafer 2302 is processed to have a "buried" layer of N+ 2304, by implant and activation, or by shallow N+ implant and diffusion followed by an N− epi growth (epitaxial growth). FIG. 23B is a drawing illustration of the pre-processed wafer made ready for a layer transfer by a deposition or growth of an oxide 2308 and by an implant of an atomic species, such as H+, preparing the SmartCut cleaving plane 2306 in the lower part of the N+ region. Now a layer-transfer-flow should be performed, as illustrated in FIG. 20, to transfer the pre-processed crystallized N− silicon with N+ layer, on top of the second antifuse layer with its configurable interconnects 808.

Figure 24A:
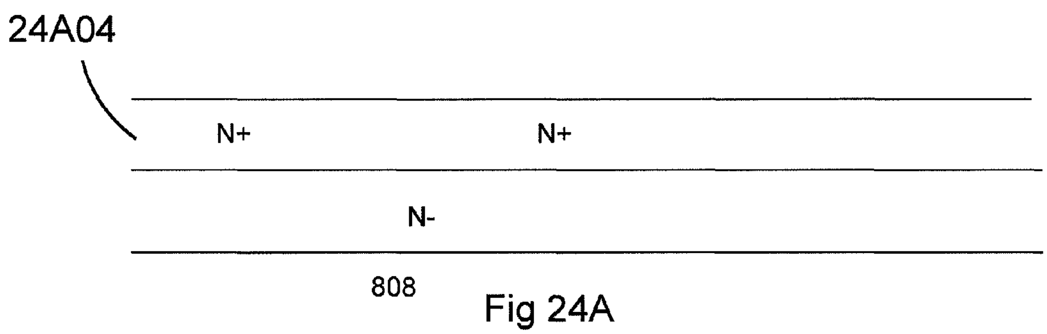
FIG. 24A-24F are drawing illustrations of formation of top planar transistors.
Figure 24B:
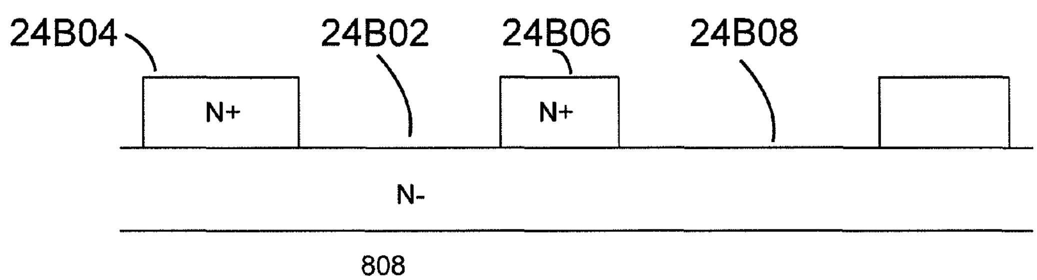
Figure 24C:
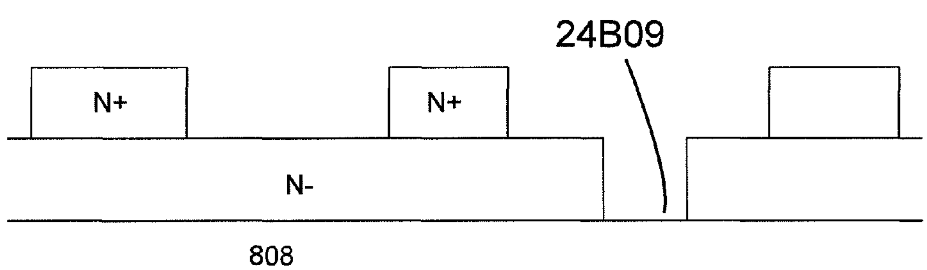
Figure 24D:
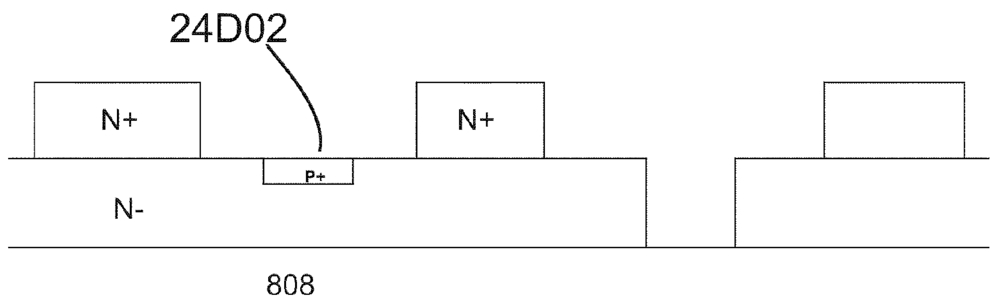
Figure 24E:
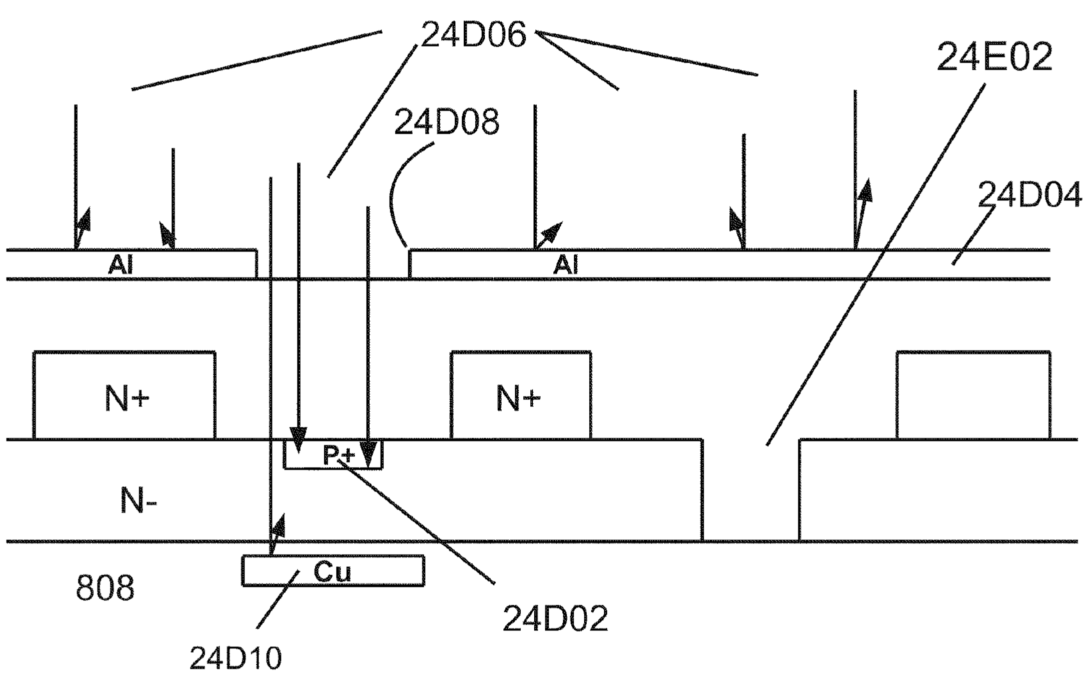
Figures 1, 24E:
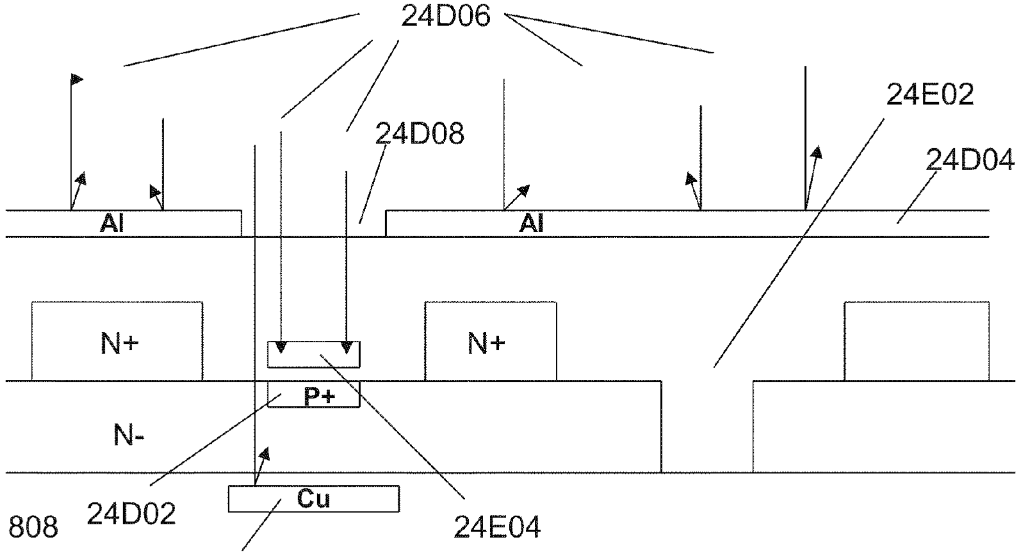
Figure 24F:
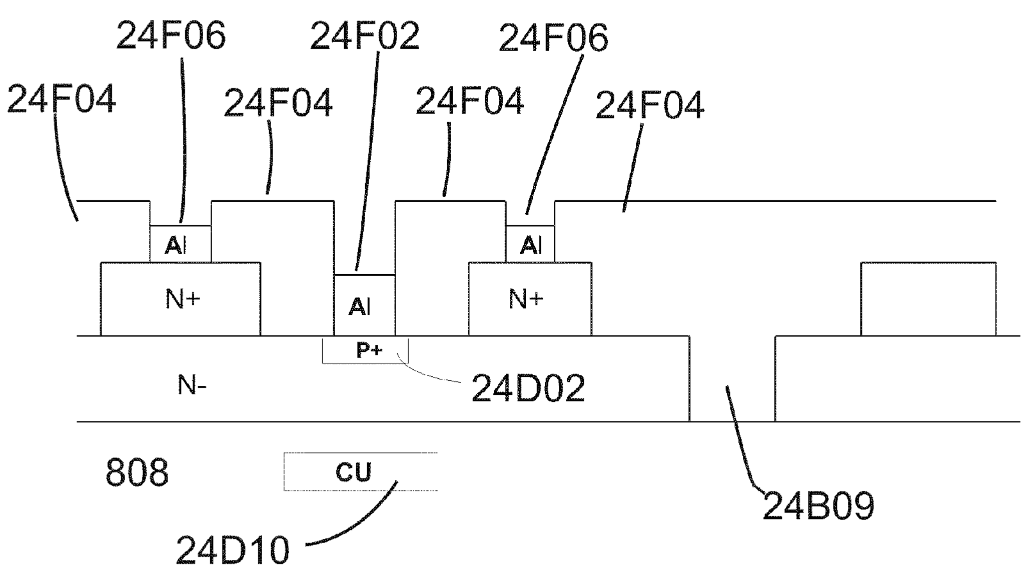

FIGS. 24A-24F are drawing illustrations of the formation of planar Junction Gate Field Effect Transistor (JFET) top transistors. FIG. 24A illustrates the structure after the layer is transferred on top of 808. So, after the smart cut, the N+ 2304 is on top and now marked as 24A04. Then the top transistor source 24B04 and drain 24B06 are defined by etching away the N+ from the region designated for gates 24B02 and the isolation region between transistors 24B08. This step is aligned to the 808 layer so the formed transistors could be properly connected to the underlying 808 layers. Then an additional masking and etch step is performed to remove the N− layer between transistors, shown as 24C02, thus providing better transistor isolation as illustrated in FIG. 24C. FIG. 24D illustrates an optional formation of shallow P+ region 24D02 for the JFET gate formation. In this option there might be a need for laser or other method of optical annealing to activate the P+. FIG. 24E illustrates how to utilize the laser anneal and minimize the heat transfer to layer 808. After the thick oxide deposition 24E02, a layer of Aluminum 24D04, or other light reflecting material, is applied as a reflective layer. An opening 24D08 in the reflective layer is masked and etched, allowing the laser light 24D06 to heat the P+ 24D02 implanted area, and reflecting the majority of the laser energy 24D06 away from layer 808. Normally, the open area 24D08 is less than 10% of the total wafer area. Additionally, a copper layer 24D10, or, alternatively, a reflective Aluminum layer or other reflective material, may be formed in the layer 808 that will additionally reflect any of the laser energy 24D08 that might travel to layer 808. Layer 24D10 could also be utilized as a ground plane or backgate electrically when the formed devices and circuits are in operation. Certainly, openings in layer 24D10 would be made through which later thru vias connecting the second top transferred layer to the layer 808 may be constructed. This same reflective laser anneal or other methods of optical anneal technique might be utilized on any of the other illustrated structures to enable implant activation for transistor gates in the second layer transfer process flow. In addition, absorptive materials may, alone or in combination with reflective materials, also be utilized in the above laser or other method of optical annealing techniques. A photonic energy absorbing layer 24E04, such as amorphous carbon of an appropriate thickness, may be deposited or sputtered at low temperature over the area that needs to be laser heated, and then masked and etched as appropriate, as shown in FIG. 24 E-1. This allows the minimum laser or other optical energy to be employed to effectively heat the area to be implant activated, and thereby minimizes the heat stress on the reflective layers 24D04 & 24D10 and the base layer 808. FIG. 24F illustrates the structure, following etching away of the laser reflecting layer 24D04, and the deposition, masking, and etch of a thick oxide 24F04 to open contacts 24F06 and 24F02, and deposition and partial etch-back (or Chemical Mechanical Polishing (CMP)) of aluminum (or other metal as required to obtain an optimal Schottky or ohmic contact at 24F02) to form contacts 24F06 and gate 24F02. If necessary, N+ contacts 24F06 and gate contact 24F02 can be masked and etched separately to allow a different metal to be deposited in each to create a Schottky or ohmic contact in the gate 24F02 and ohmic connections in the N+ contacts 24F06. The thick oxide 24F04 is a non conducting dielectric material also filling the etched space 24B08 and 24B09 between the top transistors and could be comprised from other isolating material such as silicon nitride. The top transistors will therefore end up being surrounded by isolating dielectric unlike conventional bulk integrated circuits transistors that are built in single crystal silicon wafer and only get covered by non conducting isolating material. This flow enables the formation of fully crystallized top JFET transistors that could be connected to the underlying multi-metal layer semiconductor device without exposing the underlying device to high temperature.

Another variation for the previous flow could be in utilizing a transistor technology called pseudo-MOSFET utilizing a molecular monolayer that is covalently grafted onto the channel region between the drain and source. This is a process that can be done at relatively low temperatures.

Figure 25A:
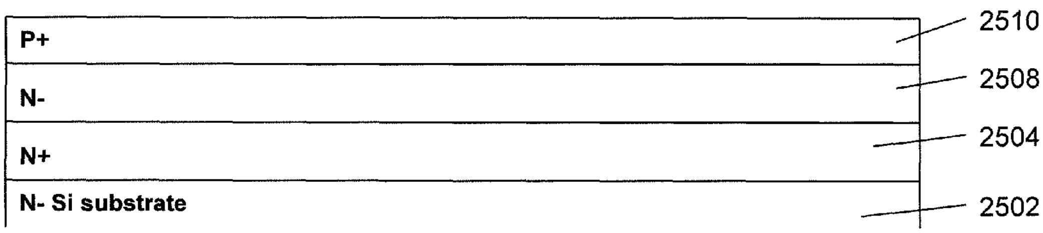
FIG. 25A, 25B is a drawing illustration of a pre-processed wafer used for a layer transfer.
Figure 25B:
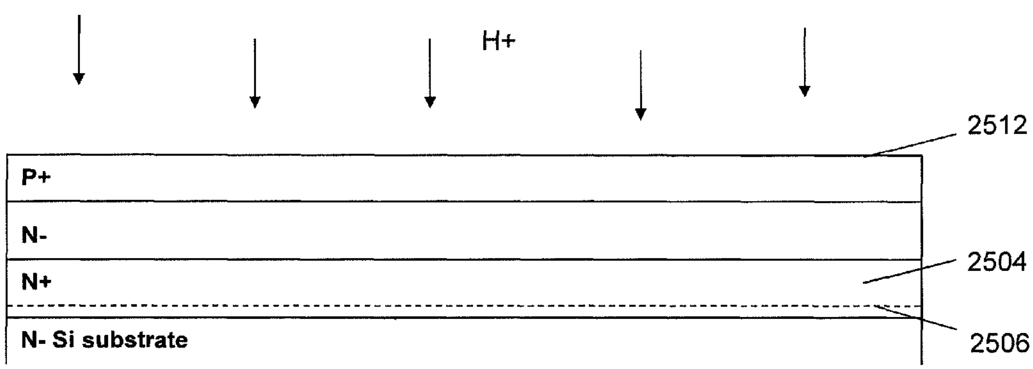

Another variation is to preprocess the wafer used for layer transfer 2006 of FIG. 20 as illustrated in FIG. 25. FIG. 25A is a drawing illustration of a pre-processed wafer used for a layer transfer. An N− wafer 2502 is processed to have a "buried" layer of N+ 22504, by implant and activation, or by shallow N+ implant and diffusion followed by an N− epi growth (epitaxial growth) 2508. An additional P+ layer 2510 is processed on top. This P+ layer 2510 could again be processed, by implant and activation, or by P+ epi growth. FIG. 25B is a drawing illustration of the pre-processed wafer made ready for a layer transfer by a deposition or growth of an oxide 2512 and by an implant of an atomic species, such as H+, preparing the SmartCut cleaving plane 2506 in the lower part of the N+ 2504 region. Now a layer-transfer-flow should be performed, as illustrated in FIG. 20, to transfer the pre-processed single crystal silicon with N+ and N− layers, on top of 808.

Figure 26A:
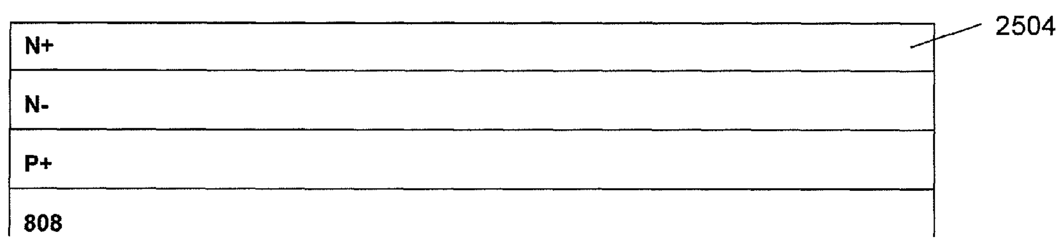
FIG. 26A-26E are drawing illustrations of formation of top planar transistors.
Figure 26B:
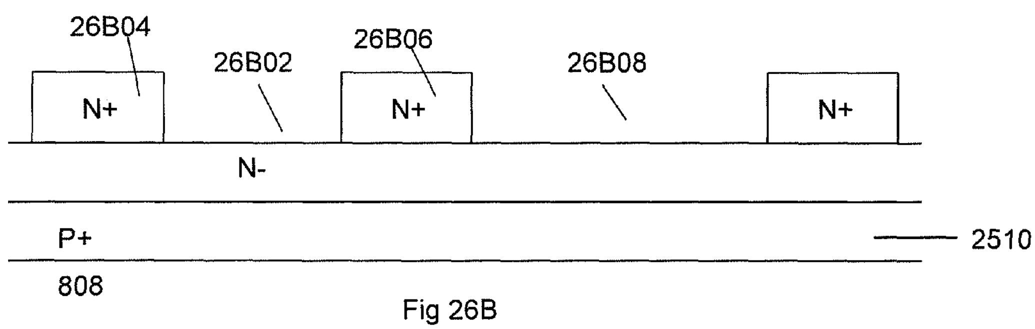
Figure 26C:
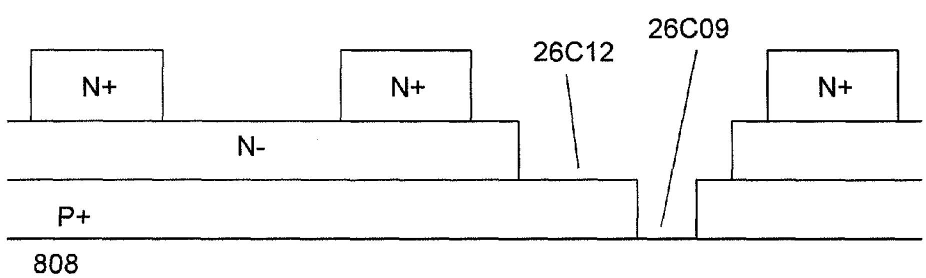
Figure 26D:
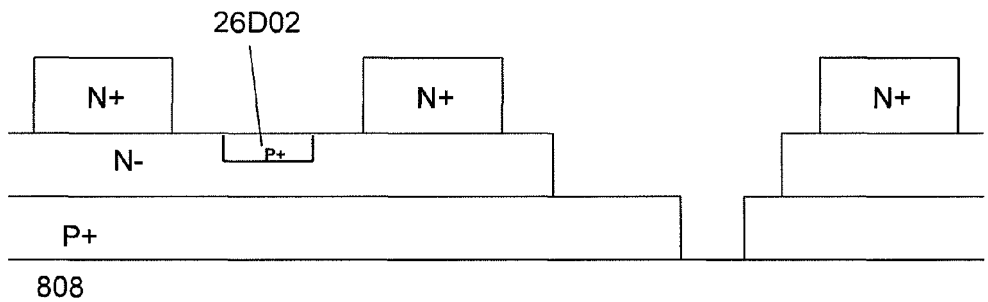
Figure 26E:
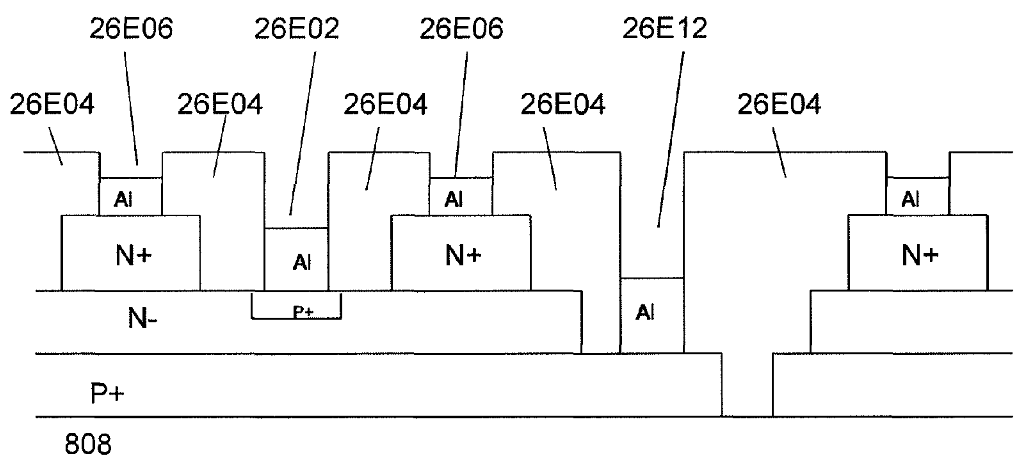

FIGS. 26A-26E are drawing illustrations of the formation of top planar JFET transistors with back bias or double gate. FIG. 26A illustrates the layer transferred on top of 808 after the smart cut wherein the N+ 2504 is on top. Then the top transistor source 26B04 and drain 26B06 are defined by etching away the N+ from the region designated for gates 26B02 and the isolation region between transistors 26B08. This step is aligned to the 808 layer so that the formed transistors could be properly connected to the underlying 808 layers. Then a masking and etch step is performed to remove the N− between transistors 26C12 and to allow contact to the now buried P+ layer 2510. And then a masking and etch step is performed to remove in between transistors 26C09 the buried P+ layer 2510 for full isolation as illustrated in FIG. 26C. FIG. 26D illustrates an optional formation of a shallow P+ region 26D02 for gate formation. In this option there might be a need for laser anneal to activate the P+. FIG. 26E illustrates the structure, following deposition and etch or CMP of a thick oxide 26E04, and deposition and partial etch-back of aluminum (or other metal as required to obtain an optimal Schottky or ohmic contact at 26E02) contacts 26E06, 26E12 and gate 26E02. If necessary, N+ contacts 26E06 and gate contact 26E02 can be masked and etched separately to allow a different metal to be deposited in each to create a Schottky or ohmic contact in the gate 26E02 and ohmic connections in the N+ contacts 26E06 & 26E12. The thick oxide 26E04 is a non conducting dielectric material also filling the etched space 26B08 and 26C09 between the top transistors and could be comprised from other isolating material such as silicon nitride. Contact 26E12 is to allow a back bias of the transistor or can be connected to the gate 26E02 to provide a double gate JFET. Alternatively the connection for back bias could be included in layers 808 connecting to layer 2510 from underneath. This flow enables the formation of fully crystallized top ultra thin body planar JFET transistors with back bias or double gate capabilities that may be connected to the underlying multi-metal layer semiconductor device without exposing the underlying device to high temperature.

Figure 27A:
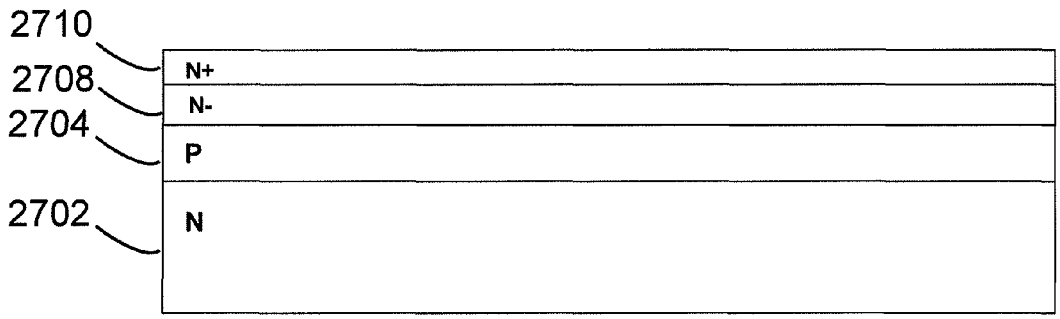
FIG. 27A, 27B is a drawing illustration of a pre-processed wafer used for a layer transfer.
Figure 27B:
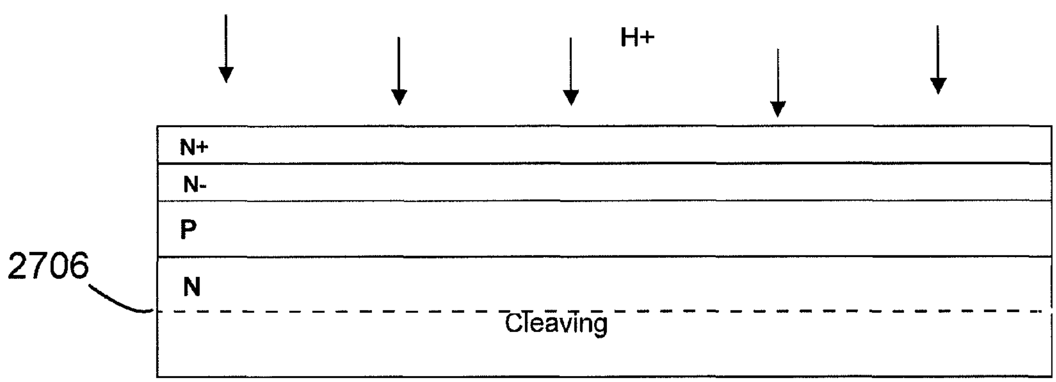

Another alternative is to preprocess the wafer used for layer transfer 2006 as illustrated in FIG. 27. FIG. 27A is a drawing illustration of a pre-processed wafer used for a layer transfer. An N+ wafer 2702 is processed to have "buried" layers by ion implantation and diffusion to create a vertical structure to be the building block for NPN (or PNP) transistors. Starting with P layer 2704, then N− layer 2708, and finally N+ layer 2710 and then activating these layers by heating to a high activation temperature. FIG. 27B is a drawing illustration of the pre-processed wafer made ready for a layer transfer by a deposition or growth of an oxide 2712 and by an implant of an atomic species, such as H+, preparing the SmartCut cleaving plane 2706 in the N+region. Now a layer-transfer-flow should be performed, as illustrated in FIG. 20, to transfer the pre-processed layers, on top of 808.

Figure 28A:
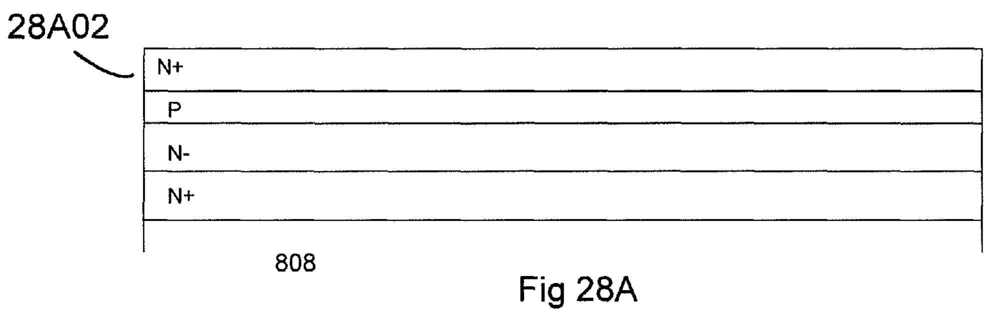
FIG. 28A-28E are drawing illustrations of formations of top transistors.
Figure 28B:
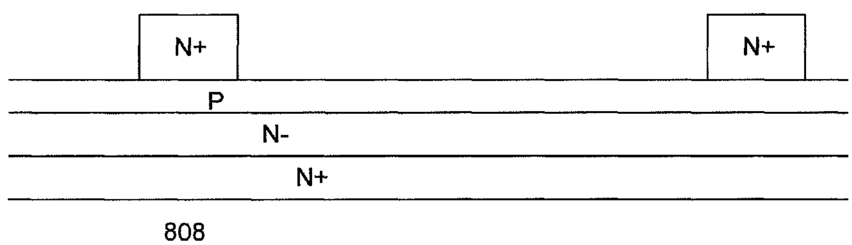
Figure 28C:
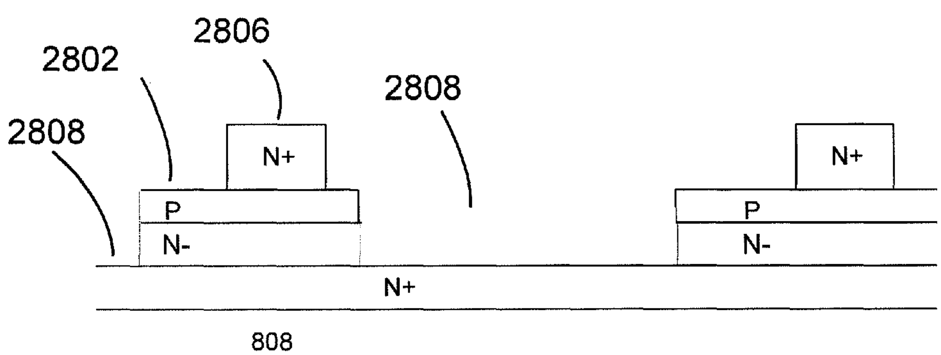
Figure 28D:
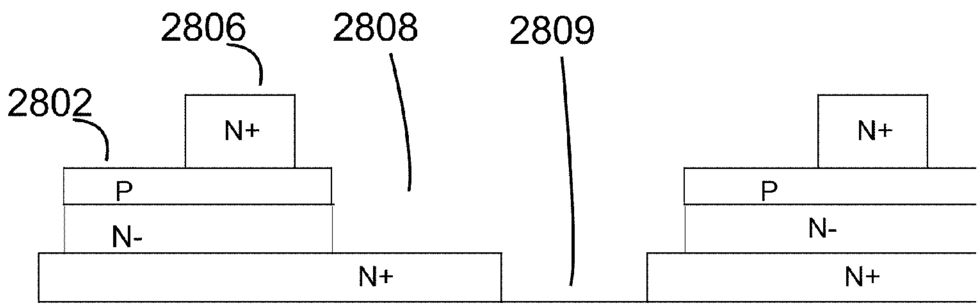
Figure 28E:
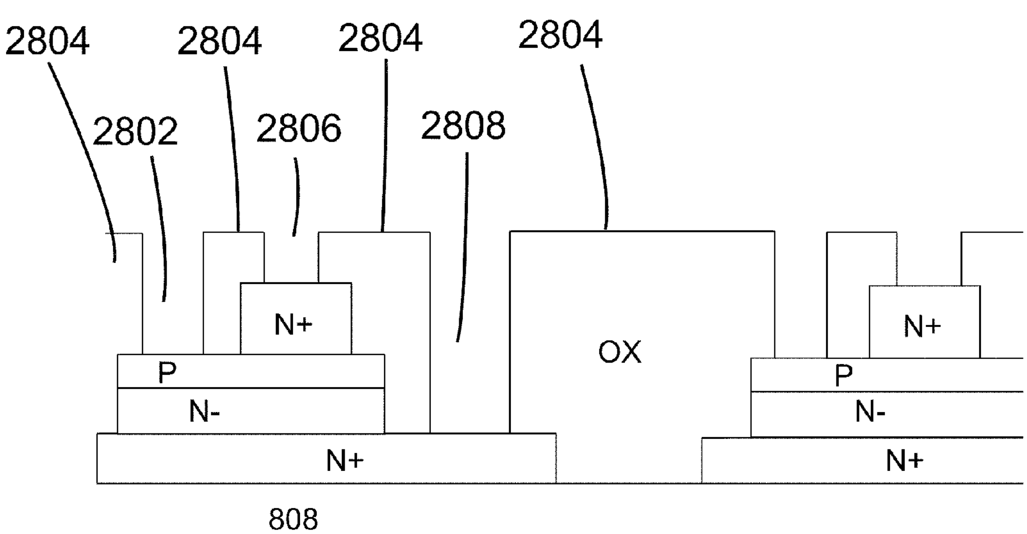

FIGS. 28A-28E are drawing illustrations of the formation of top bipolar transistors. FIG. 28A illustrates the layer transferred on top of the second antifuse layer with its configurable interconnects 808 after the smart cut wherein the N+ 28A02 which was part of 2702 is now on top. Effectively at this point there is a giant transistor overlaying the entire wafer. The following steps are multiple etch steps as illustrated in FIG. 28B to 28D where the giant transistor is cut and defined as needed and aligned to the underlying layers 808. These etch steps also expose the different layers comprising the bipolar transistors to allow contacts to be made with the emitter 2806, base 2802 and collector 2808, and etching all the way to the top oxide of 808 to isolate between transistors as 2809 in FIG. 28D. Then the entire structure may be covered with a Low Temperature Oxide 2804, the oxide planarized with CMP, and then mask & etch contacts to the emitter, base and collectors—2806, 2802 and 2808 as in FIG. 28E. The oxide 2804 is a non conducting dielectric material also filling the etched space 2809 between the top transistors and could be comprised from other isolating material such as silicon nitride. This flow enables the formation of fully crystallized top bipolar transistors that could be connected to the underlying multi-metal layer semiconductor device without exposing the underlying device to high temperature.

Figures 52A, 52B:
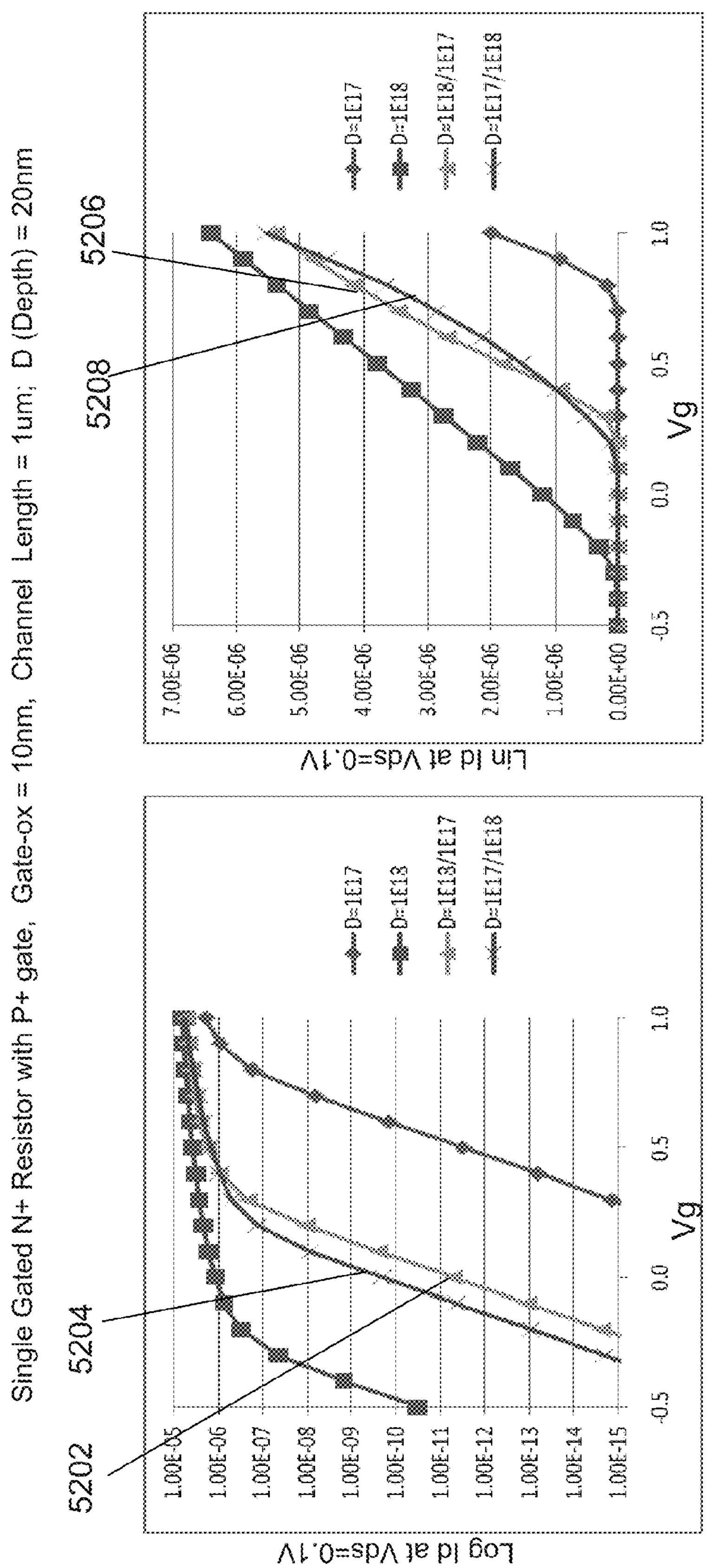
FIG. 52A, 52B are device simulations of a junction-less transistor.

Another class of devices that may be constructed partly at high temperature before layer transfer to a substrate with metal interconnects and then completed at low temperature after layer transfer is a junction-less transistor. For example, in deep sub micron processes copper metallization is utilized, so a high temperature would be above 400° C., whereby a low temperature would be 400° C. and below. The junction-less transistor structure avoids the sharply graded junctions required as silicon technology scales, and provides the ability to have a thicker gate oxide for an equivalent performance when compared to a traditional MOSFET transistor. The junction-less transistor is also known as nanowire transistors without junctions, or gated resistor, or nanowire transistor as described in a paper by Jean-Pierre Colinge, et. al., published in Nature Nanotechnology on Feb. 21, 2010. The junction-less transistors discussed below are constructed whereby the transistor channel is a thin solid piece of evenly and heavily doped single crystal silicon. One of the challenges of a junction-less transistor device is turning the channel off with minimal leakage at a zero gate bias. To enhance gate control over the transistor channel, the channel may be doped unevenly; whereby the heaviest doping is closest to the gate or gates and the channel doping is lighter the farther away from the gate electrode. One example would be where the center of a 2, 3, or 4 gate sided junction-less transistor channel is more lightly doped than the edges. This may enable much lower off currents for the same gate work function and control. FIGS. 52 A and 52B show, on logarithmic and linear scales respectively, simulated drain to source current Ids as a function of the gate voltage Vg for various junction-less transistor channel dopings where the total thickness of the n-channel is 20 nm. Two of the four curves in each figure correspond to evenly doping the 20 nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 shows the simulated results where the 10 nm channel portion doped at 1E18 is closest to the gate electrode while the 10 nm channel portion doped at 1E17 is farthest away from the gate electrode. In FIG. 52 A, curves 5202 and 5204 correspond to doping patterns of D=1E18/1E17 and D=1E17/1E18, respectively. According to FIG. 52A, at a Vg of 0 volts, the off current for the doping pattern of D=1E18/1E17 is approximately 50 times lower than that of the reversed doping pattern of D=1E17/1E18. Likewise, in FIG. 52 B, curves 5206 and 5208 correspond to doping patterns of D=1E18/1E17 and D=1E17/1E18, respectively. FIG. 52B shows that at a Vg of 1 volt, the Ids of both doping patterns are within a few percent of each other. The transistor channel may be constructed with graded or discrete layers of doping. The channel may be constructed with materials other than doped single crystal silicon, such as polysilicon, or other semi-conducting, insulating, or conducting material, and may be in combination with other layers of similar or different material. For example, the center of the channel may comprise a layer of oxide, or of lightly doped silicon, and the edges more heavily doped single crystal silicon. This may enhance the gate control effectiveness for the off state of the resistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as an embedded SiGe implantation and anneal. The cross section of the transistor channel may be rectangular, circular, or oval shaped, to enhance the gate control of the channel.

Figures 56A, 56B:
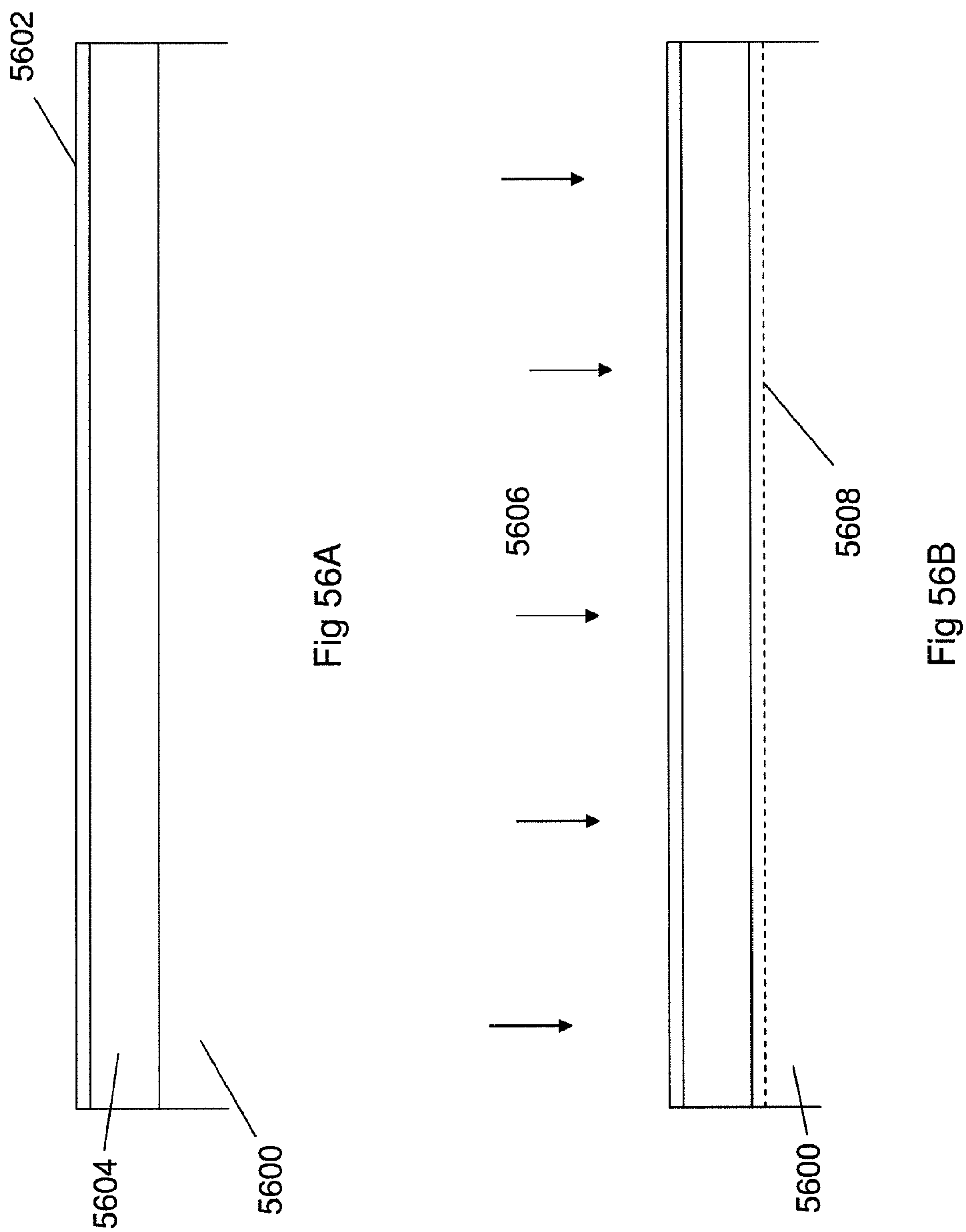
FIG. 56A-M are drawing illustrations of the formation of a junction-less transistor.
Figure 56C:
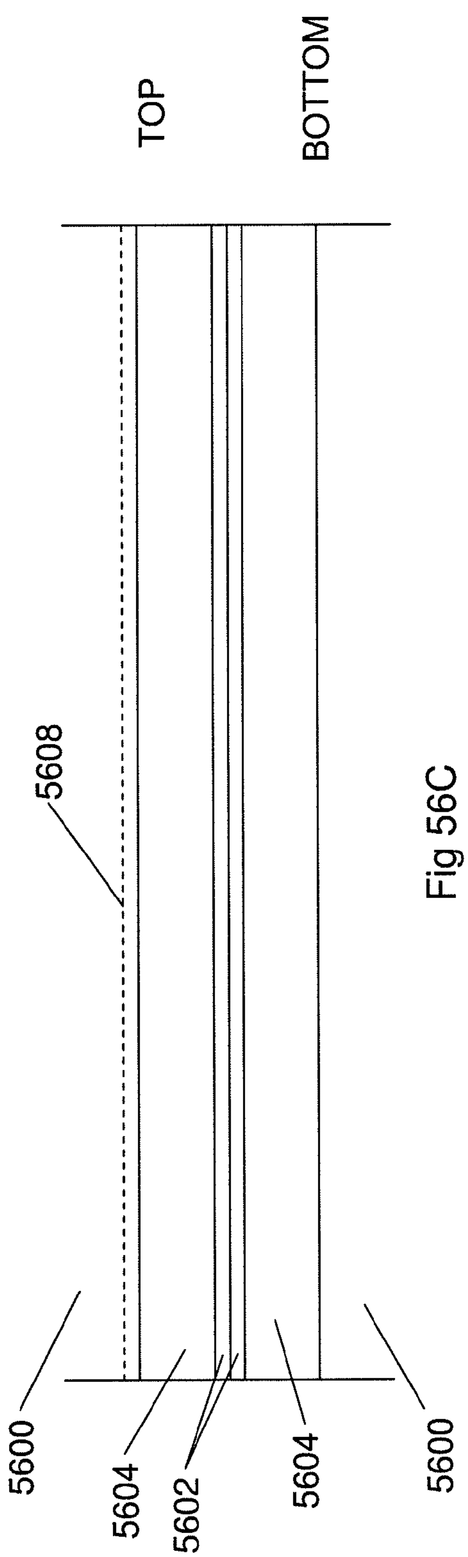
Figure 56D:
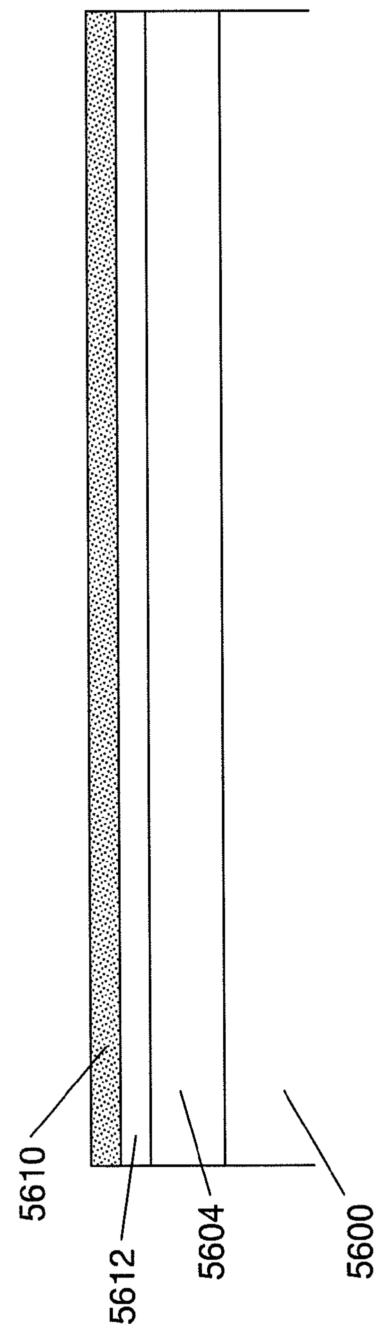

To construct an n-type 4 gate sided junction-less transistor a silicon wafer is preprocessed to be used for layer transfer 2006 as illustrated in FIG. 56A-56G. These processes may be at temperatures above 400 degree Centigrade as the layer transfer to the processed substrate with metal interconnects has yet to be done. As illustrated in FIG. 56A, an N− wafer 5600 is processed to have a layer of N+ 5604, by implant and activation, or by an N+ epitaxial growth. A gate oxide 5602 may be grown before or after the implant, to a thickness approximately half of the desired final top-gate oxide thickness. FIG. 56B is a drawing illustration of the pre-processed wafer made ready for a layer transfer by an implant 5606 of an atomic species, such as H+, preparing the "cleaving plane" 5608 in the N− region 5600 of the substrate and plasma or other surface treatments to prepare the oxide surface for wafer oxide to oxide bonding. Another wafer is prepared as above and the two are bonded as illustrated in FIG. 56C, to transfer the pre-processed single crystal N− silicon with N+ layer and half gate oxide, on top of a similarly pre-processed, but not cleave implanted, wafer. The top wafer is cleaved and removed from the bottom wafer. This top wafer may now also be processed and reused for more layer transfers to form the resistor layer. The remaining top wafer N− and N+ layers are chemically and mechanically polished to a very thin N+ silicon layer 5610 as illustrated in FIG. 56D. This thin N+ doped silicon layer 5610 is on the order of 5 to 40 nm thick and will eventually form the resistor that will be gated on four sides. The two 'half' gate oxides 5602 are now atomically bonded together to form the top gate oxide 5612. A high temperature anneal may be performed to remove any residual oxide or interface charges. Alternatively, the wafer that becomes the bottom wafer in FIG. 56C may be constructed wherein the N+ layer 5604 may be formed with heavily doped polysilicon and the half gate oxide 5602 is deposited or grown prior to layer transfer. The bottom wafer N+ silicon or polysilicon layer will eventually become the top-gate of the junction-less transistor.

Figure 56E:
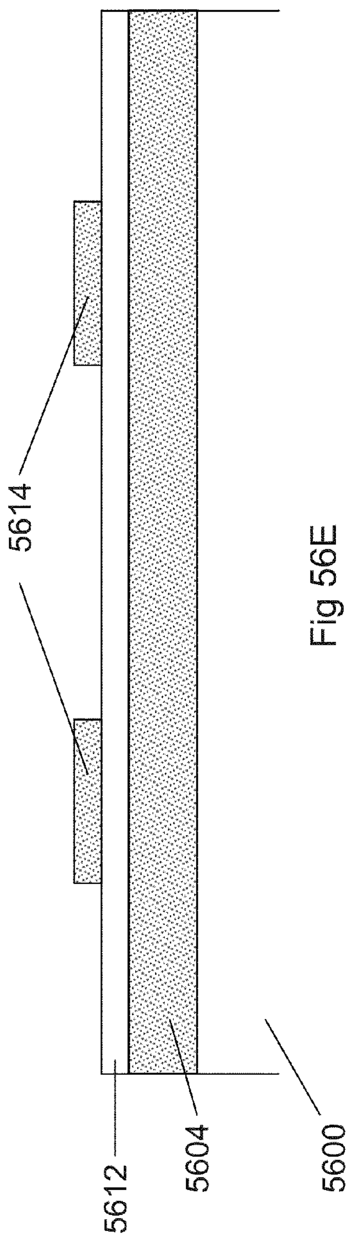
Figure 56F:
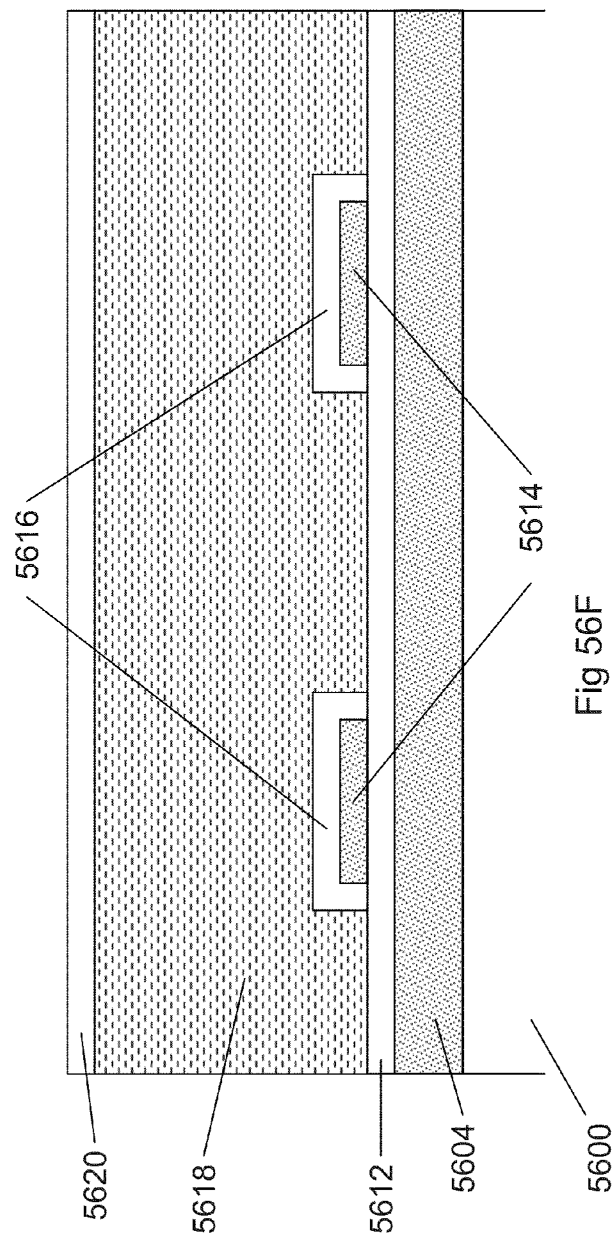
Figure 56G:
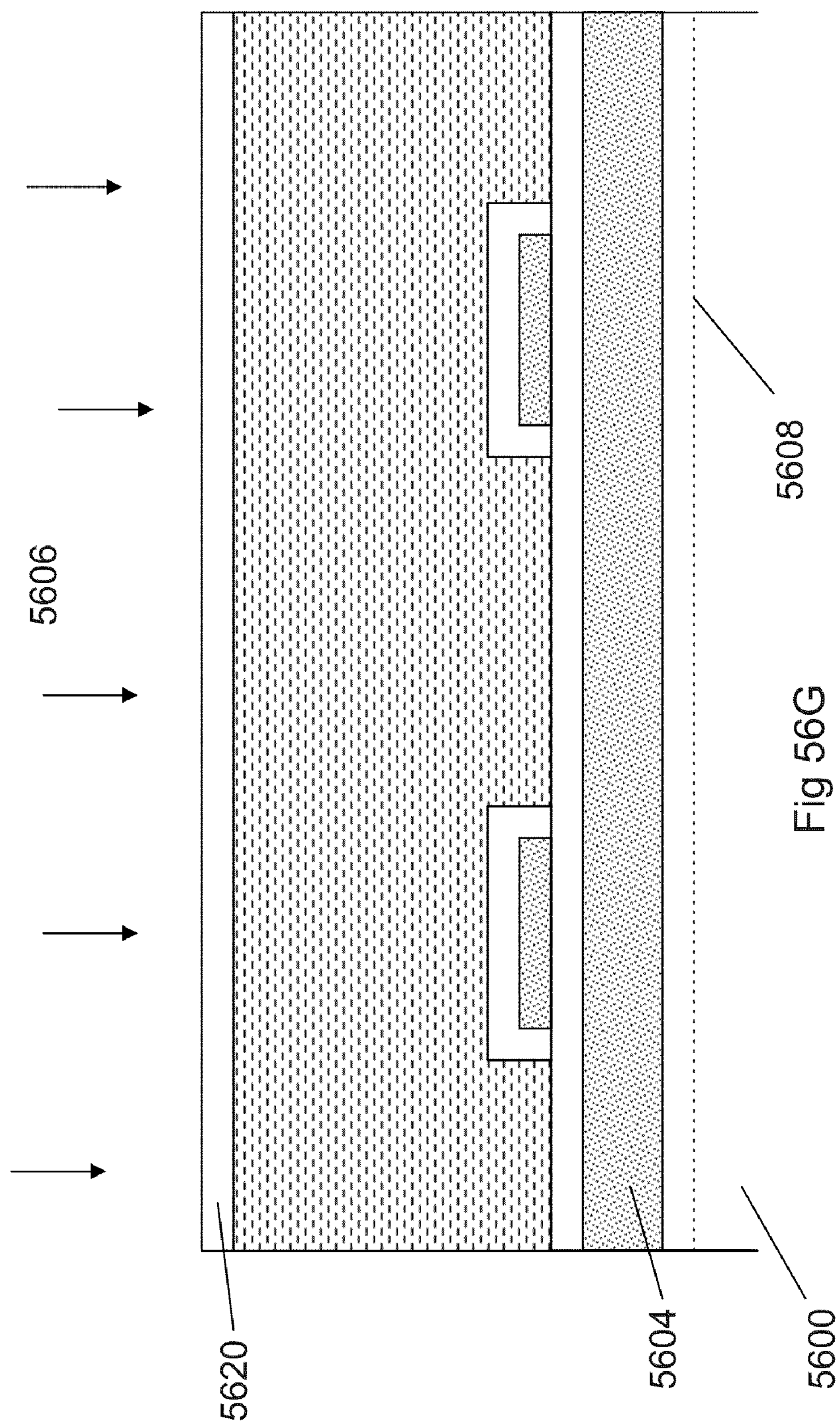
Figure 56H:
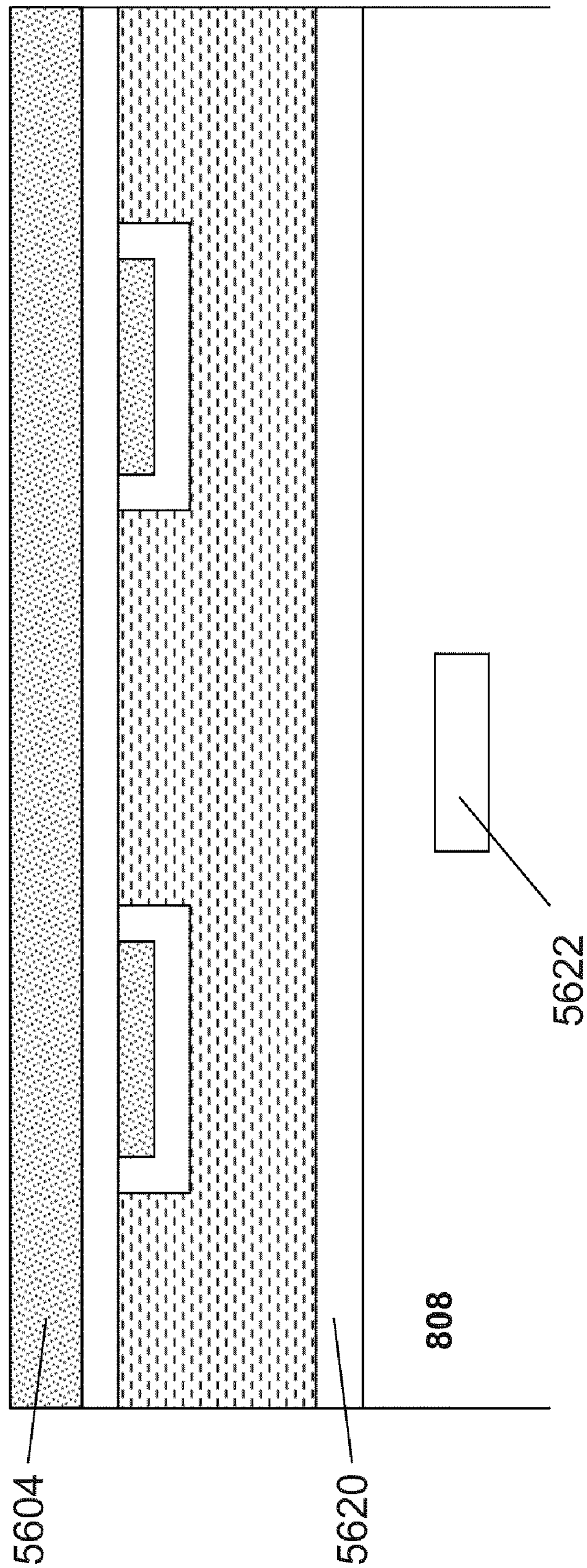

As illustrated in FIGS. 56E to 56G, the wafer is conventionally processed, at temperatures higher than 400° C. as necessary, in preparation to layer transfer the junction-less transistor structure to the processed 'house' wafer 808. A thin oxide may be grown to protect the thin resistor silicon 5610 layer top, and then long and parallel wires 5614 of repeated pitch of the thin resistor layer are masked and etched as illustrated in FIG. 56E and then the photoresist is removed. The thin oxide is striped in a dilute hydrofluoric acid (HF) solution and a conventional gate oxide 5616 is grown and polysilicon 5618, doped or undoped, is deposited as illustrated in FIG. 56F. The polysilicon is chemically and mechanically polished (CMP'ed) flat and a thin oxide 5620 is grown or deposited to facilitate a low temperature oxide to oxide wafer bonding in the next step. The polysilicon 5618 may be implanted for additional doping either before or after the CMP. This polysilicon will eventually become the bottom and side gates of the junction-less transistor. FIG. 56G is a drawing illustration of the wafer being made ready for a layer transfer by an implant 5606 of an atomic species, such as H+, preparing the "cleaving plane" 5608 in the N− region 5600 of the substrate and plasma or other surface treatments to prepare the oxide surface for wafer oxide to oxide bonding. The acceptor wafer 808 with logic transistors and metal interconnects is prepared for a low temperature oxide to oxide wafer bond with surface treatments of the top oxide and the two are bonded as illustrated in FIG. 56H. The top donor wafer is cleaved and removed from the bottom acceptor wafer 808 and the top N− substrate is chemically and mechanically polished (CMP'ed) into the N+ layer 5604 to form the top gate layer of the junction-less transistor. A metal interconnect layer 5622 in the house 808 is also illustrated in FIG. 56H.

Figure 56I:
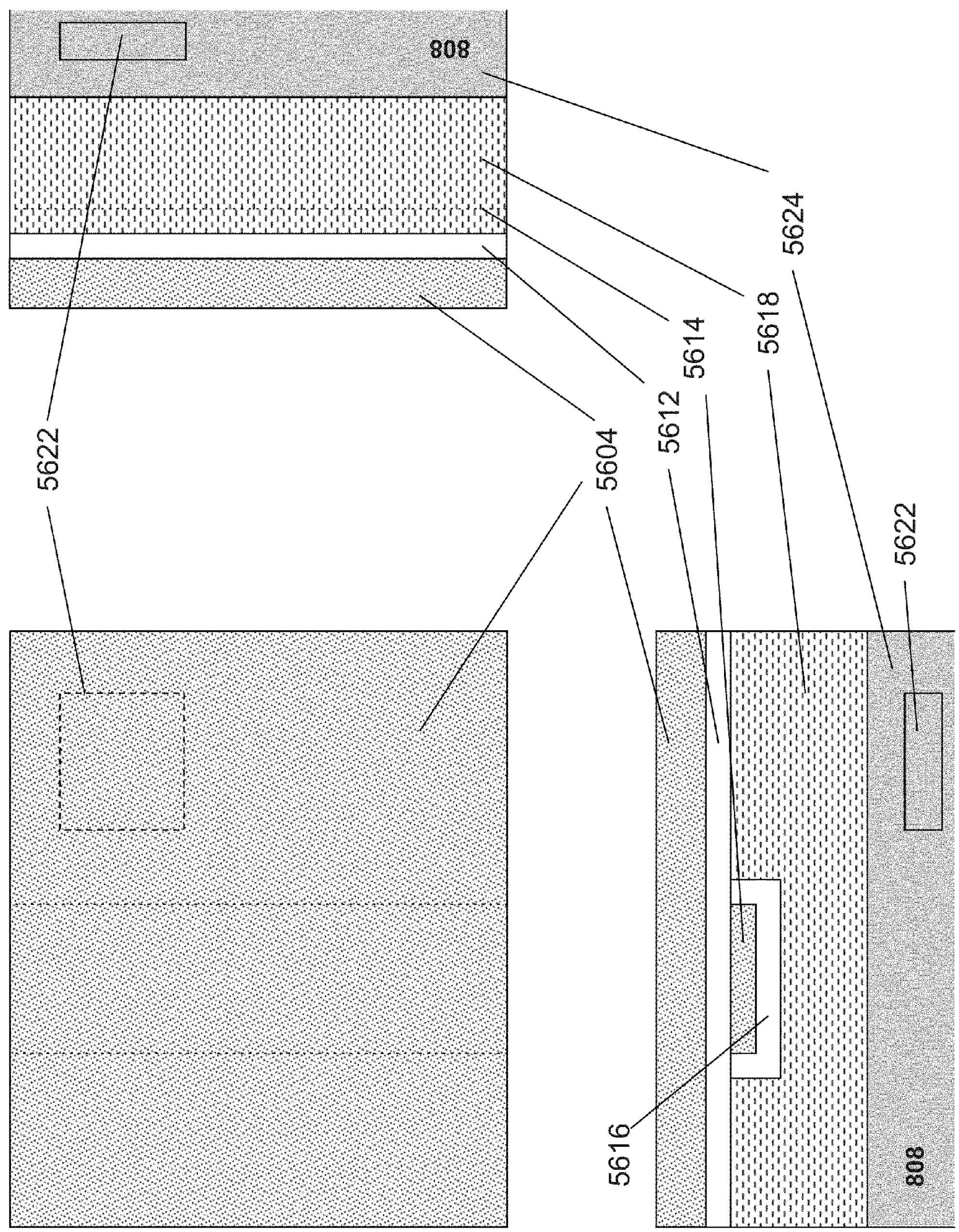
Figure 56J:
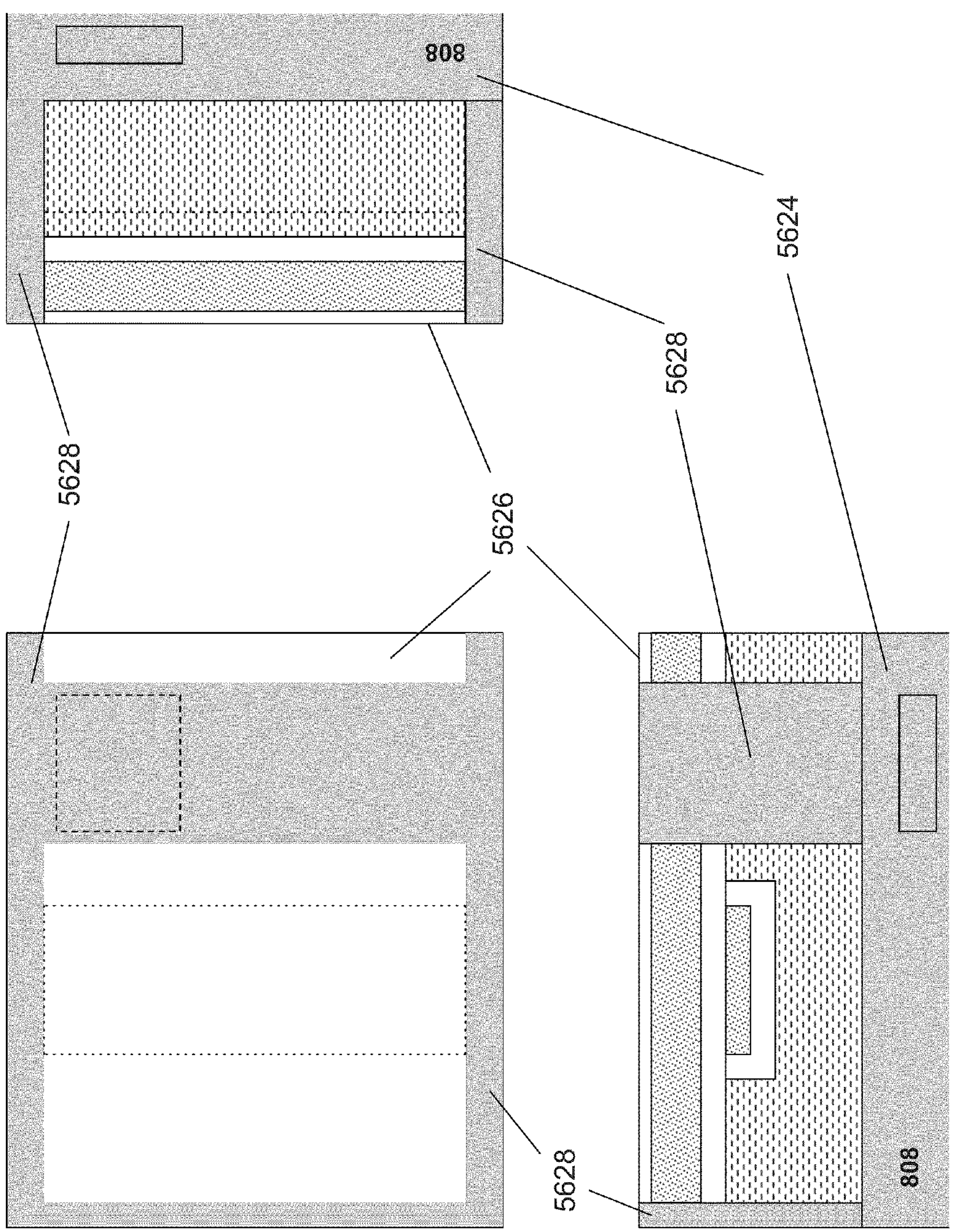
Figure 56K:
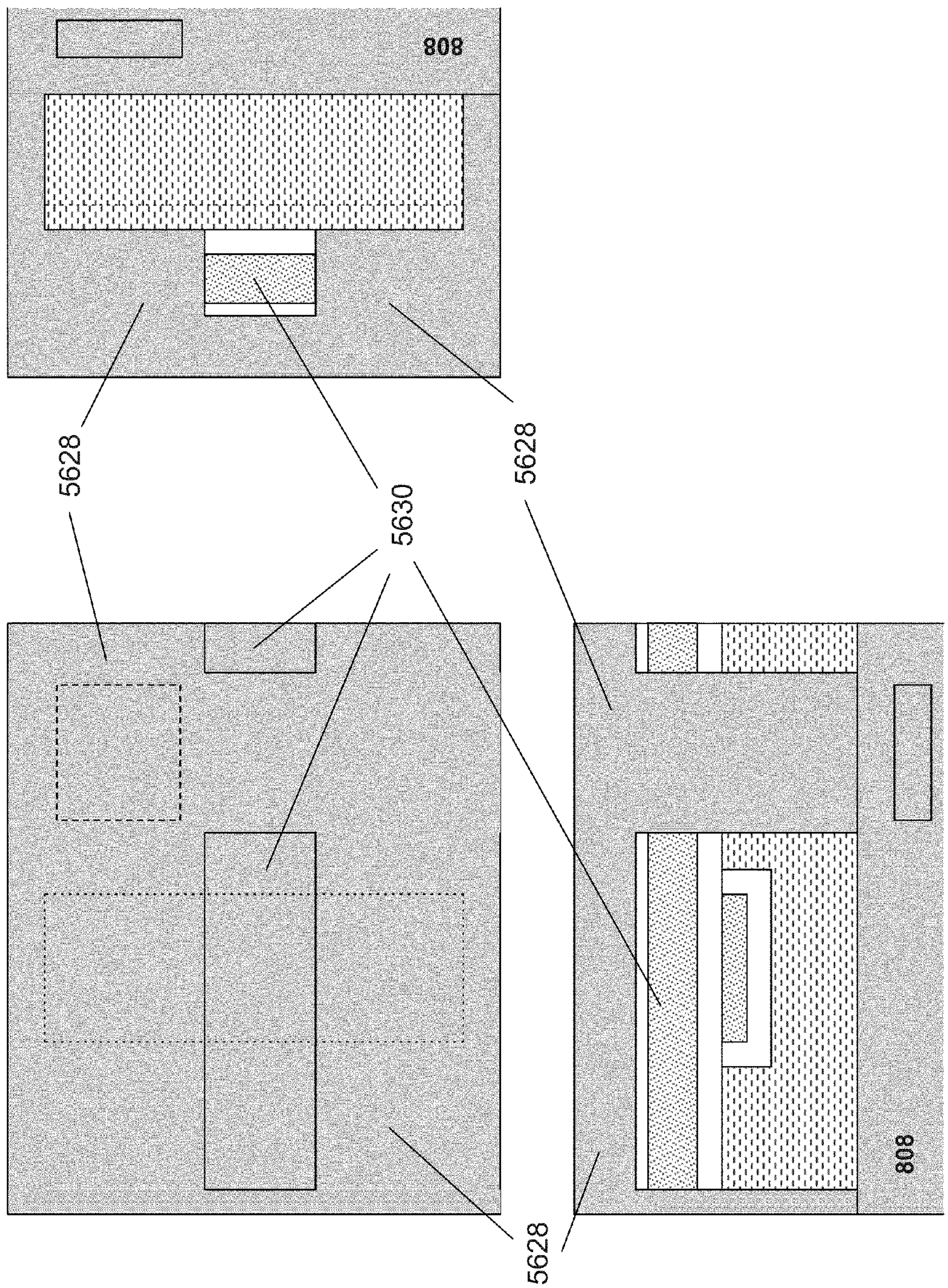
Figure 56L:
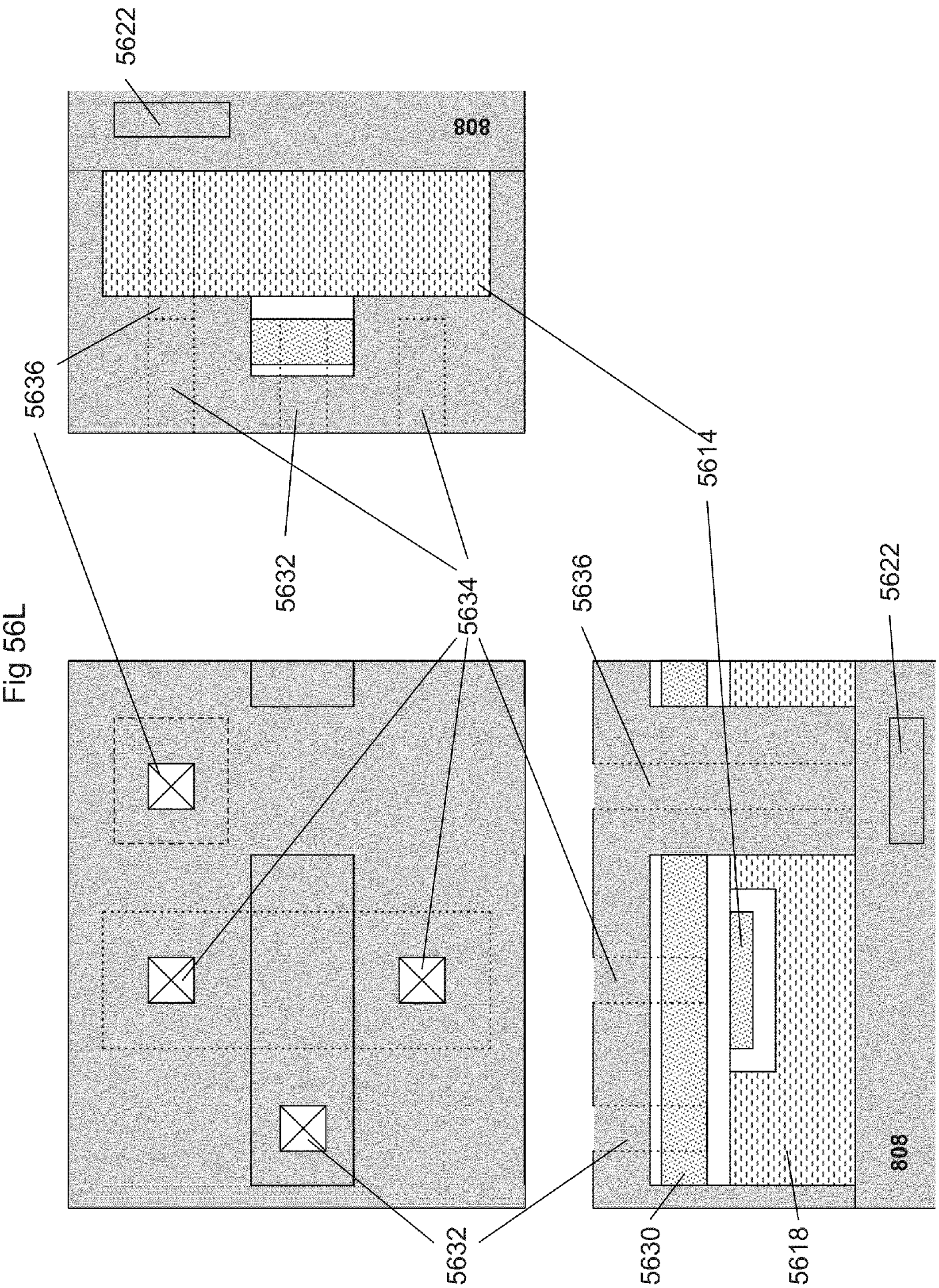
Figure 56M:
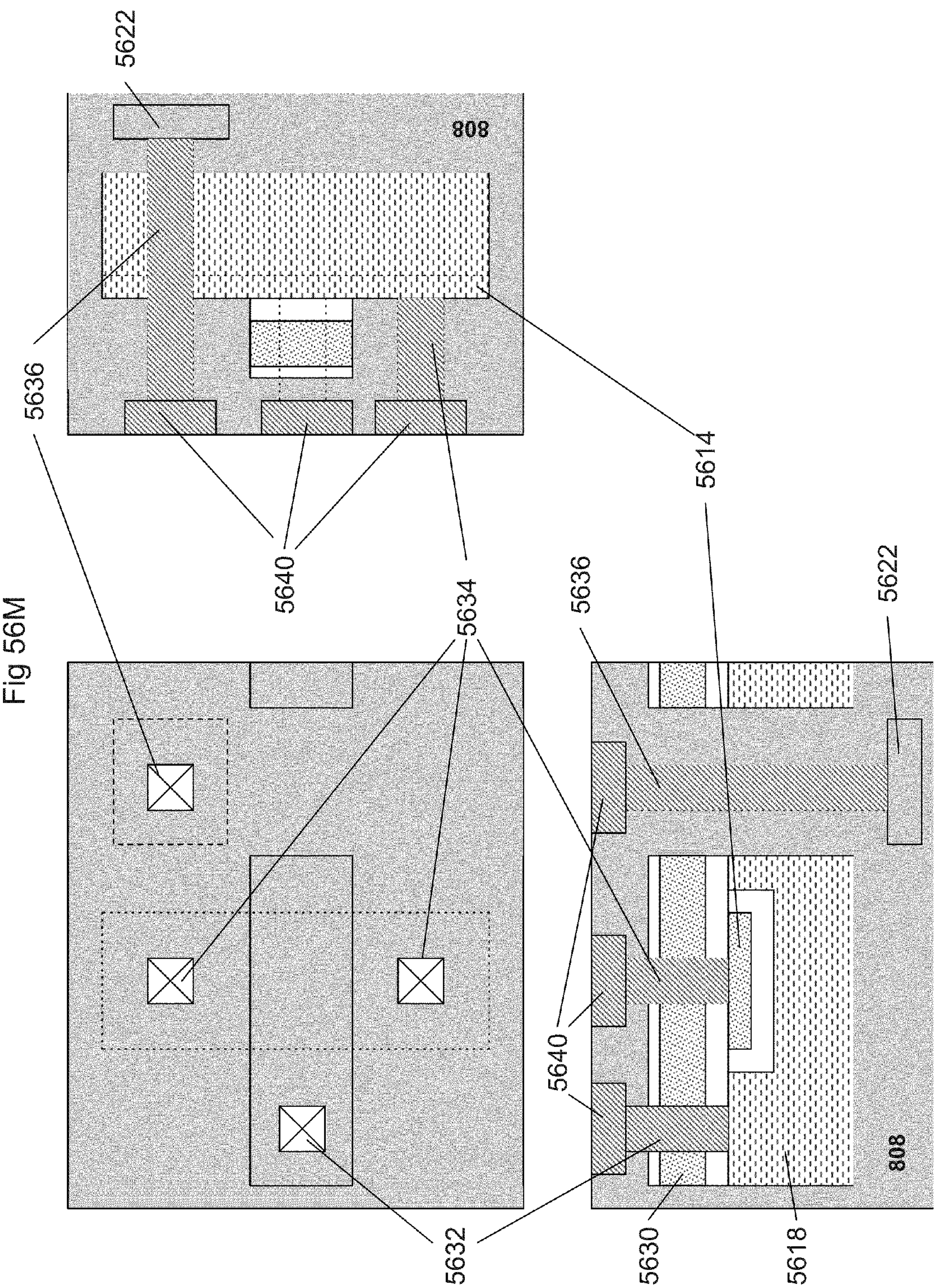

FIG. 56I is an orthogonal illustration of the wafer at the same step as FIG. 56H. The N+ layer 5604, which will eventually form the top gate of the resistor, and the top gate oxide 5612 will gate one side of the resistor line 5614, and the bottom and side gate oxide 5616 with the polysilicon bottom and side gate 5618 will gate the other three sides of the resistor 5614. The logic house wafer 808 has a top oxide layer 5614 that also encases the top metal interconnect pad 5622. A polish stop layer 5626 of a material such as oxide and silicon nitride is deposited, and isolation openings 5628 are masked and etched to the depth of the house 808 oxide 5624 to fully isolate transistors. The isolation openings 5628 are filled with a low temperature gap fill oxide, and chemically and mechanically polished (CMP'ed) flat as illustrated in FIG. 56J. The top gate 5630 is masked and etched as illustrated in FIG. 56K, and then the etched openings 5628 are filled with a low temperature gap fill oxide deposition, and chemically and mechanically (CMP'ed) polished flat, then an additional oxide layer is deposited to enable interconnect metal isolation. The contacts are masked and etched as illustrated in FIG. 56L. The gate contact 5632 is masked and etched, so that the contact etches through the top gate layer 5630, and during the metal opening mask and etch process, the top 5630 and bottom 5618 gates are connected together. The contacts 5634 to the two terminals of the resistor layer 5614 are masked and etched. And then the thru vias 5636 to the house wafer 808 and metal interconnect 5622 are masked and etched. The metal lines 5640 are mask defined and etched, filled with barrier metals and copper interconnect, and CMP'ed in a normal Dual Damascene interconnect scheme, thereby completing the contact via 5632 connections to the top 5630 and bottom 5618 gates, the two terminals 5634 of the resistor layer 5614, and the thru via to the house wafer 808 metal interconnect 5622, as illustrated in FIG. 56M. This flow enables the formation of a fully crystallized 4-gate sided junction-less transistor that could be connected to the underlying multi-metal layer semiconductor device without exposing the underlying devices to high temperature.

Figure 57A:
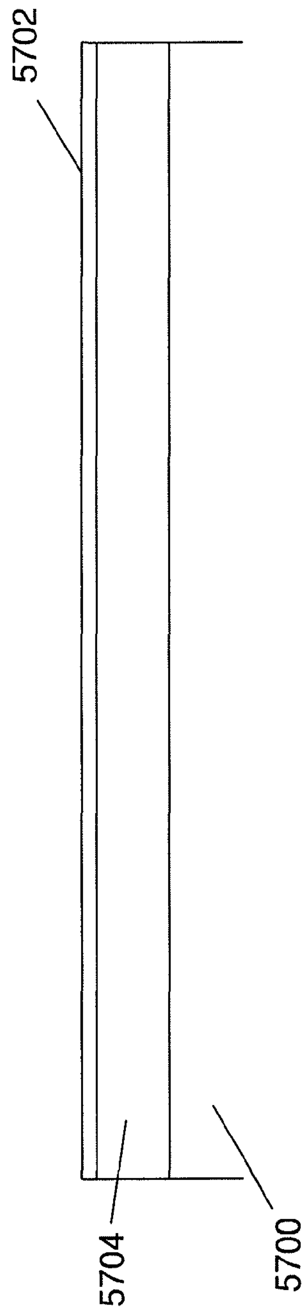
FIG. 57A-G are drawing illustrations of the formation of a junction-less transistor.
Figure 57B:
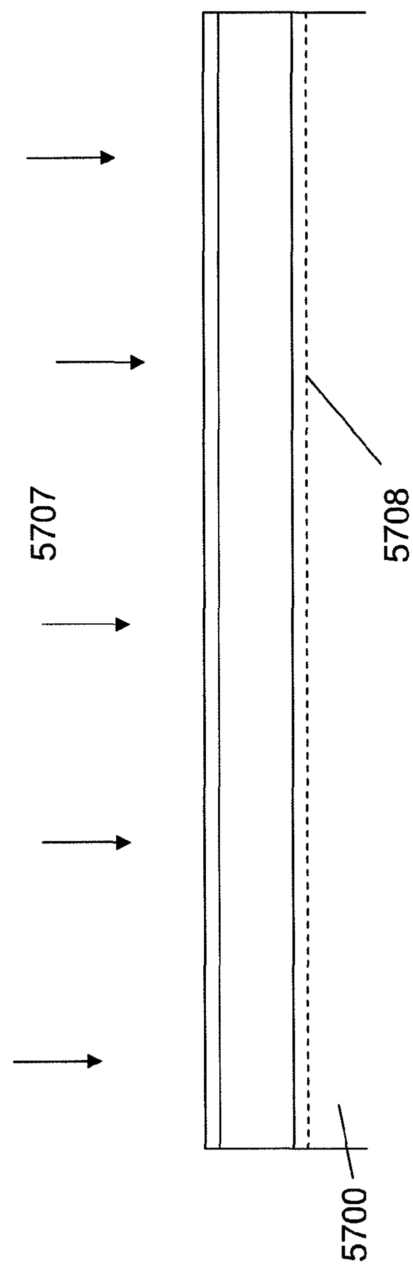
Figure 57C:
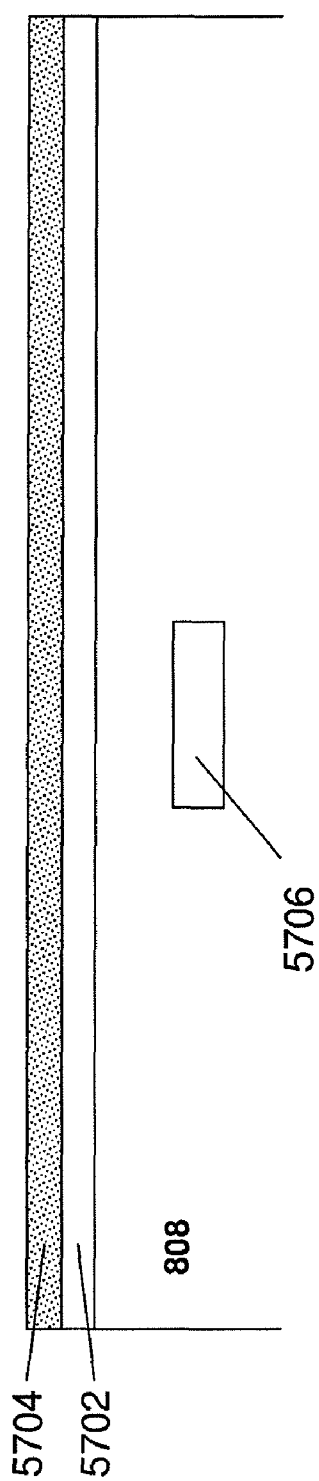

Alternatively, an n-type 3-gate sided junction-less transistor may be constructed as follows in FIGS. 57 A to 57G. A silicon wafer is preprocessed to be used for layer transfer 2006 as illustrated in FIGS. 57A and 57B. These processes may be at temperatures above 400° C. as the layer transfer to the processed substrate with metal interconnects has yet to be done. As illustrated in FIG. 57A, an N− wafer 5700 is processed to have a layer of N+ 5704, by implant and activation, or by an N+ epitaxial growth. A screen oxide 5702 may be grown before the implant to protect the silicon from implant contamination and to provide an oxide surface for later wafer to wafer bonding. FIG. 57B is a drawing illustration of the pre-processed wafer made ready for a layer transfer by an implant 5707 of an atomic species, such as H+, preparing the "cleaving plane" 5708 in the N− region 5700 of the donor substrate and plasma or other surface treatments to prepare the oxide surface for wafer oxide to oxide bonding. The acceptor wafer or house 808 with logic transistors and metal interconnects is prepared for a low temperature oxide to oxide wafer bond with surface treatments of the top oxide and the two are bonded as illustrated in FIG. 57C. The top donor wafer is cleaved and removed from the bottom acceptor wafer 808 and the top N− substrate is chemically and mechanically polished (CMP'ed) into the N+ layer 5704 to form the top gate layer of the junction-less transistor. A metal interconnect layer 5706 in the acceptor wafer or house 808 is also illustrated in FIG. 57C. For illustration simplicity and clarity, the donor wafer oxide layer 5702 will not be drawn independent of the acceptor wafer or house 808 oxide.

Figure 57D:
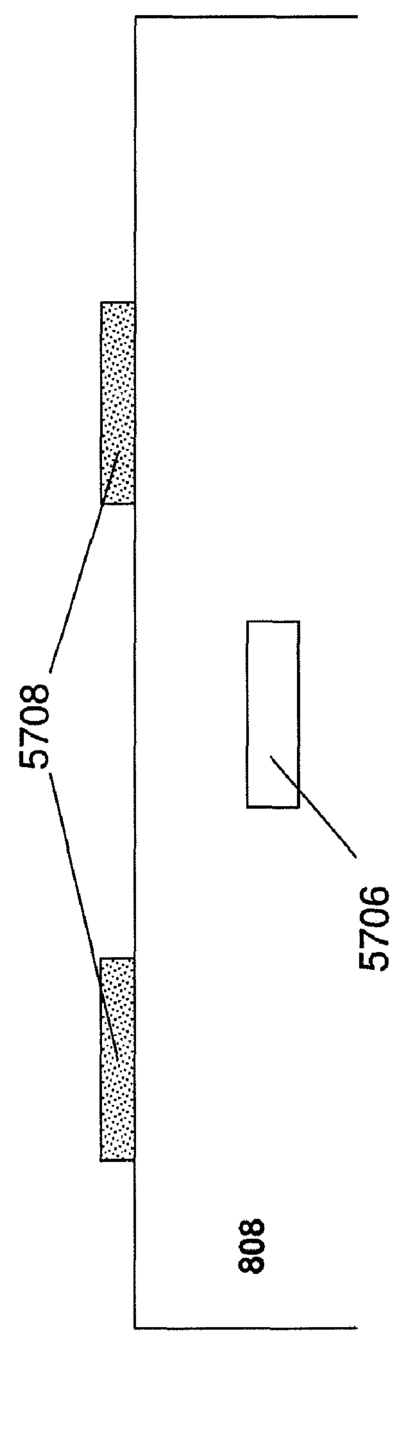
Figure 57E:
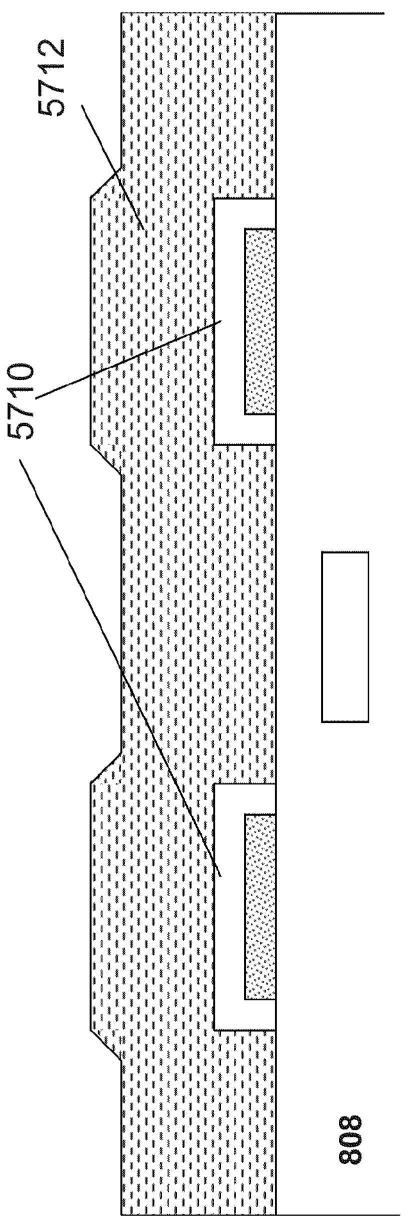
Figure 57F:
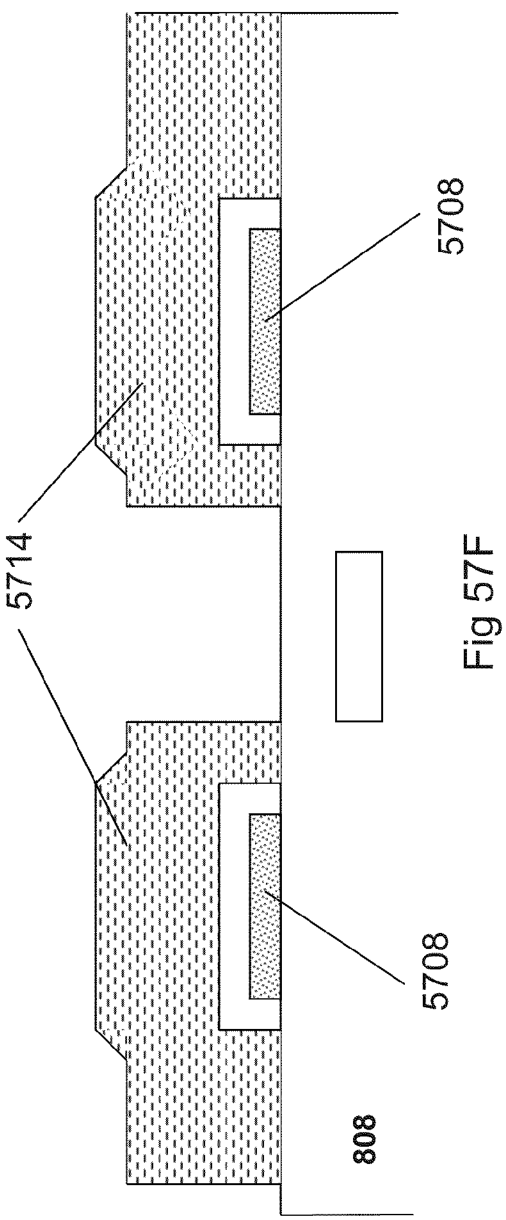
Figure 57G:
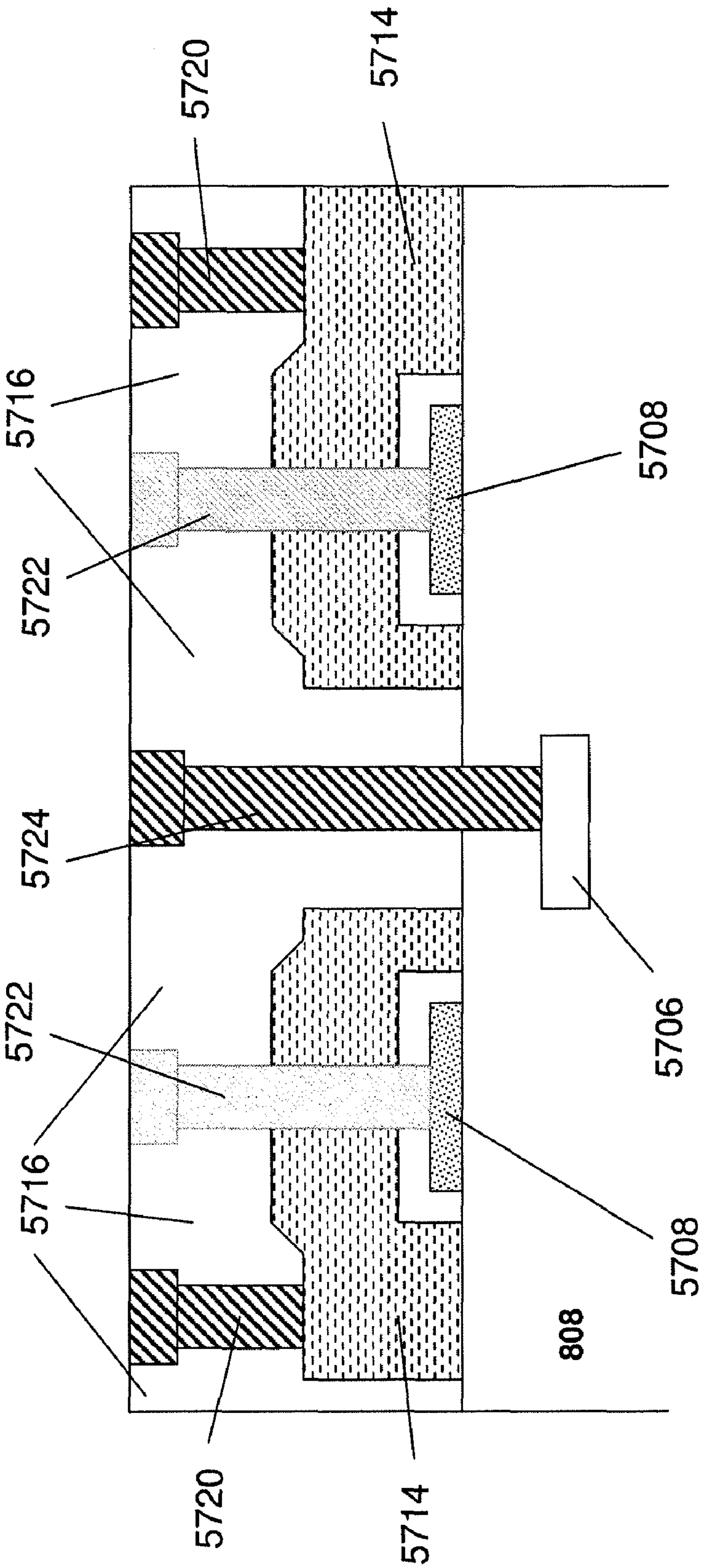

A thin oxide may be grown to protect the thin transistor silicon 5704 layer top, and then the transistor channel elements 5708 are masked and etched as illustrated in FIG. 57D and then the photoresist is removed. The thin oxide is striped in a dilute HF solution and a low temperature based Gate Dielectric may be deposited and densified to serve as the junction-less transistor gate oxide 5710. Alternatively, a low temperature microwave plasma oxidation of the silicon surfaces may serve as the junction-less transistor gate oxide 5710. Then deposition of a low temperature gate material 5712, such as doped or undoped amorphous silicon as illustrated in FIG. 57E, may be performed. Alternatively, a high-k metal gate structure may be formed as described previously. The gate material 5712 is then masked and etched to define the top and side gates 5714 of the transistor channel elements 5708 in a crossing manner, generally orthogonally. Then the entire structure may be covered with a Low Temperature Oxide 5716, the oxide planarized with chemical mechanical polishing, and then contacts and metal interconnects may be masked and etched as illustrated FIG. 57G. The gate contact 5720 connects to the gate 5714. The two transistor channel terminal contacts 5722 independently connect to transistor element 5708 on each side of the gate 5714. The thru via 5724 connects the transistor layer metallization to the acceptor wafer or house 808 at interconnect 5706. This flow enables the formation of fully crystallized 3-gate sided junction-less transistor that may be formed and connected to the underlying multi-metal layer semiconductor device without exposing the underlying devices to a high temperature.

Figure 58A:
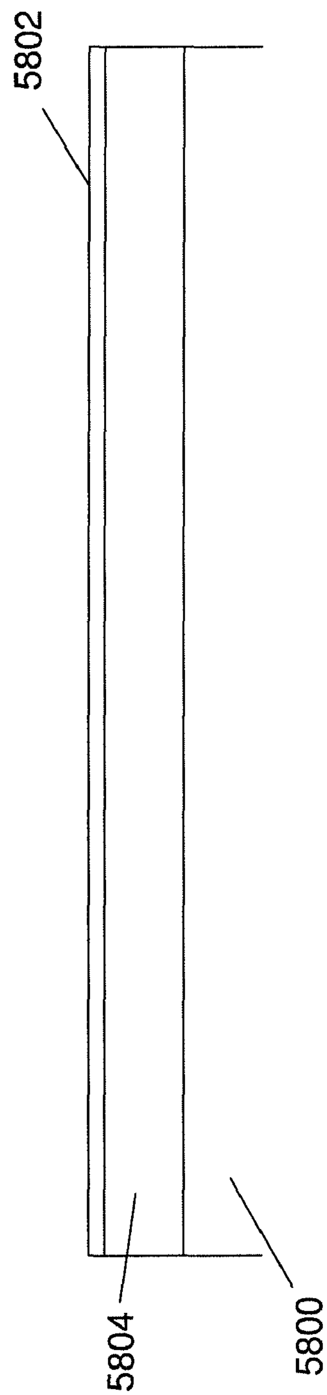
FIG. 58 A-G are drawing illustrations of the formation of a junction-less transistor.
Figure 58B:
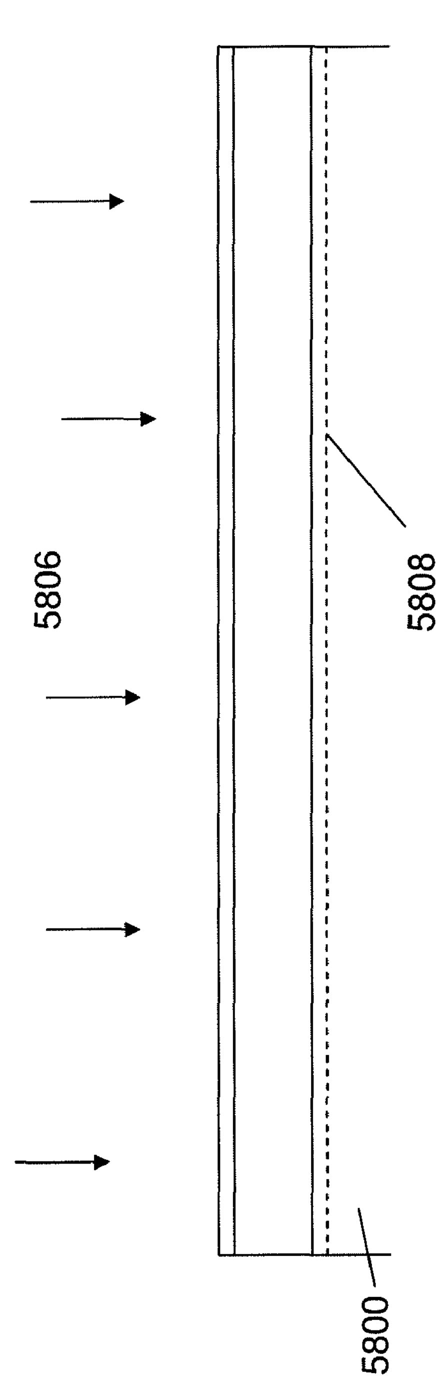
Figure 58C:
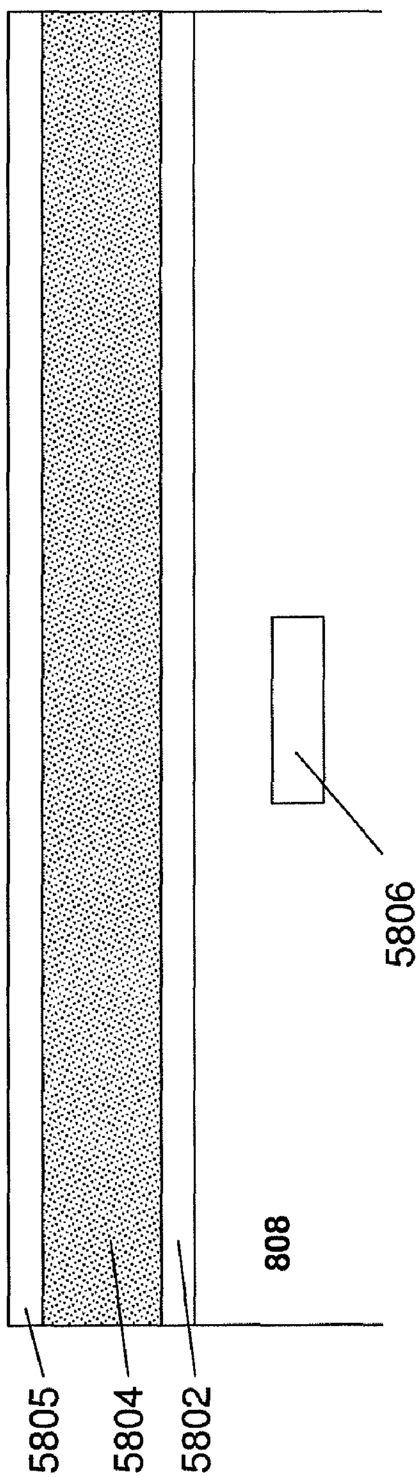

Alternatively, an n-type 3-gate sided thin-side-up junction-less transistor may be constructed as follows in FIGS. 58A to 58G. A thin-side-up junction-less transistor may have the thinnest dimension of the channel cross-section facing up, that face being parallel to the silicon base substrate surface. Previously and subsequently described junction-less transistors may have the thinnest dimension of the channel cross section perpendicular to the silicon base substrate surface A silicon wafer is preprocessed to be used for layer transfer 2006 as illustrated in FIGS. 58A and 58B. These processes may be at temperatures above 400° C. as the layer transfer to the processed substrate with metal interconnects has yet to be done. As illustrated in FIG. 58A, an N− wafer 5800 is processed to have a layer of N+ 5804, by ion implantation and activation, or by an N+ epitaxial growth. A screen oxide 5802 may be grown before the implant to protect the silicon from implant contamination and to provide an oxide surface for later wafer to wafer bonding. FIG. 58B is a drawing illustration of the pre-processed wafer made ready for a layer transfer by an implant 5806 of an atomic species, such as H+, preparing the "cleaving plane" 5808 in the N− region 5700 of the donor substrate, and plasma or other surface treatments to prepare the oxide surface for wafer oxide to oxide bonding. The acceptor wafer 808 with logic transistors and metal interconnects is prepared for a low temperature oxide to oxide wafer bond with surface treatments of the top oxide and the two are bonded as illustrated in FIG. 58C. The top donor wafer is cleaved and removed from the bottom acceptor wafer 808 and the top N− substrate is chemically and mechanically polished (CMP'ed) into the N+ layer 5804 to form the junction-less transistor channel layer. FIG. 58C also illustrates the deposition of a CMP and plasma etch stop layer 5805, such as low temperature SiN on oxide, on top of the N+ layer 5804. A metal interconnect layer 5806 in the acceptor wafer or house 808 is also shown in FIG. 58C. For illustration simplicity and clarity, the donor wafer oxide layer 5802 will not be drawn independent of the acceptor wafer or house 808 oxide.

Figure 58D:
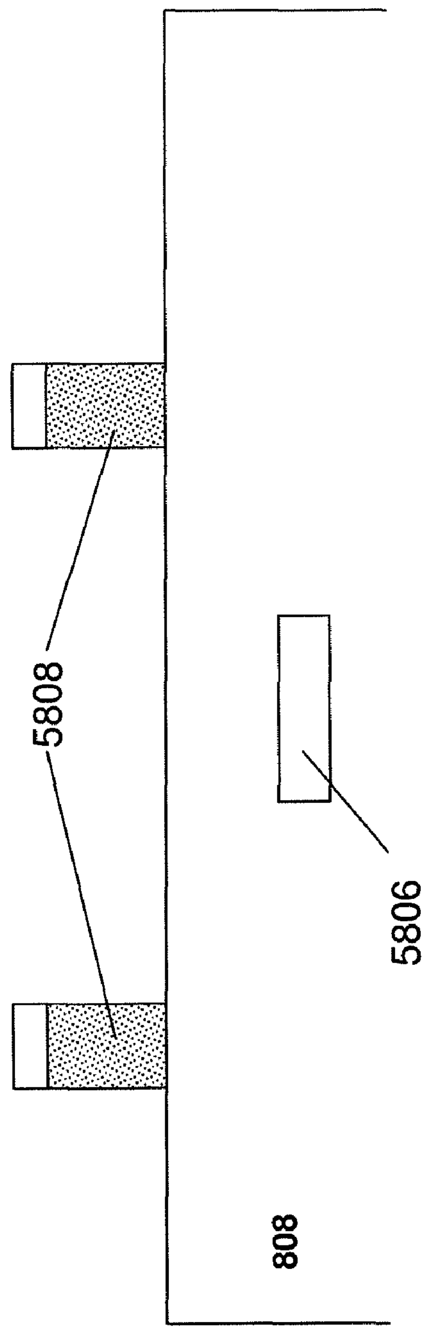
Figure 58E:
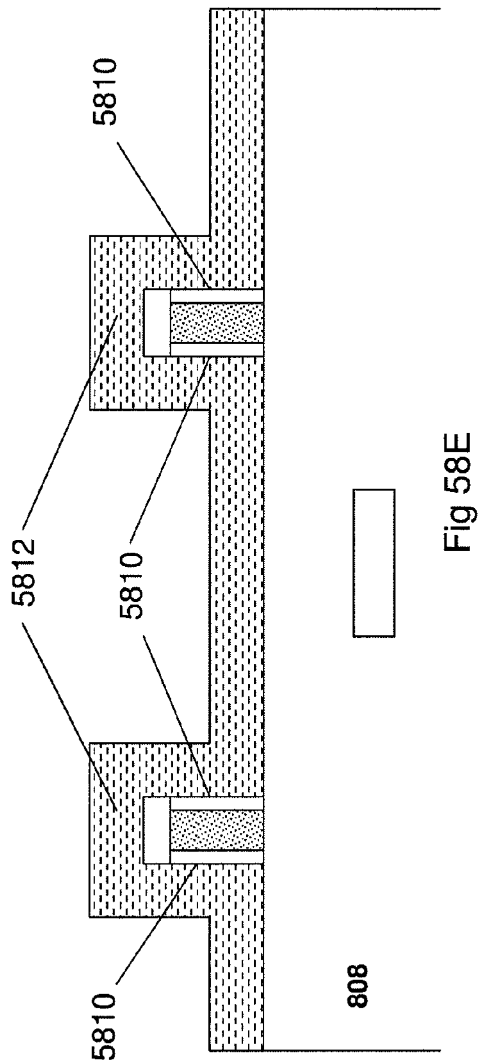
Figure 58F:
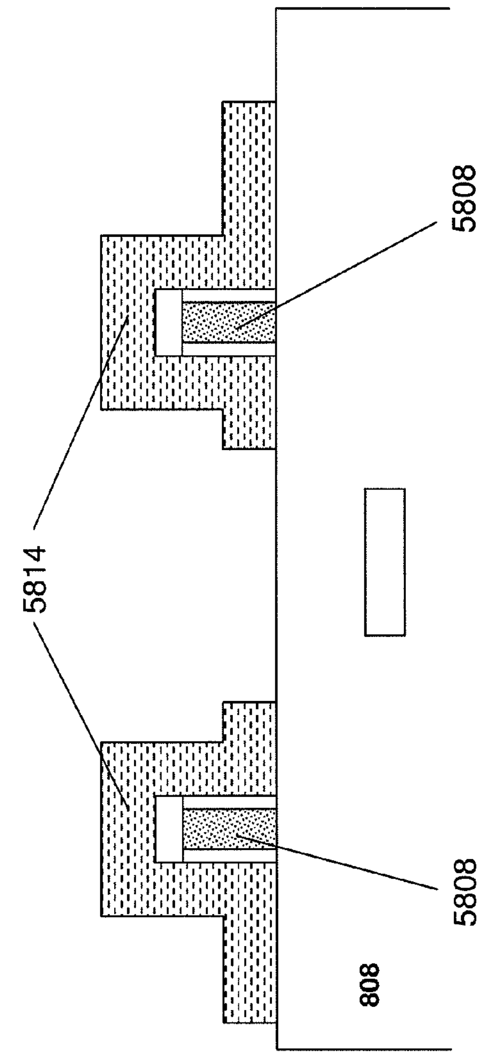
Figure 58G:
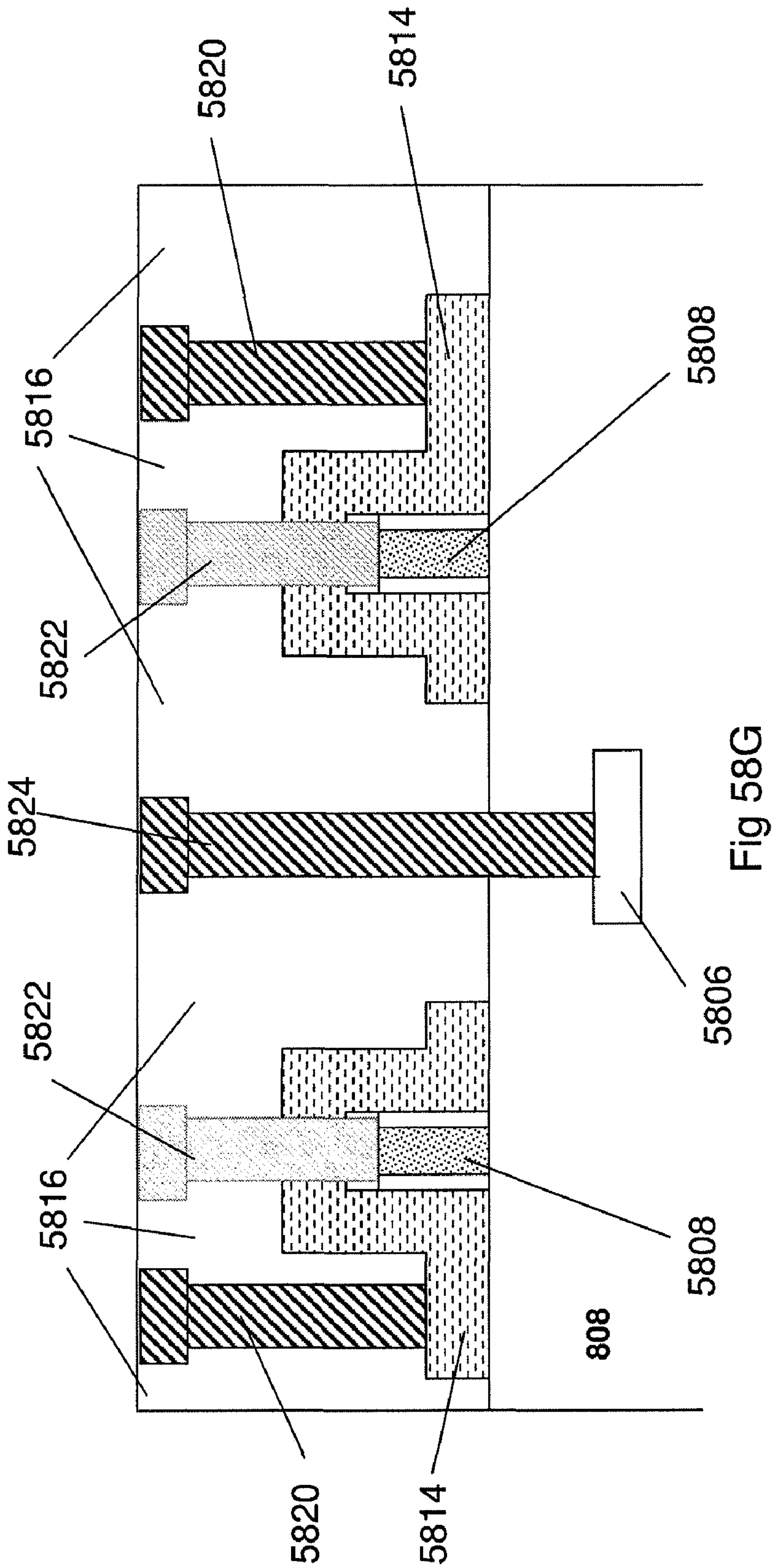

The transistor channel elements 5808 are masked and etched as illustrated in FIG. 58D and then the photoresist is removed. A low temperature based Gate Dielectric may be deposited and densified to serve as the junction-less transistor gate oxide 5810. Alternatively, a low temperature microwave plasma oxidation of the silicon surfaces may serve as the junction-less transistor gate oxide 5810. Then deposition of a low temperature gate material 5812, such as P+ doped amorphous silicon as illustrated in FIG. 58E, may be performed. Alternatively, a high-k metal gate structure may be formed as described previously. The gate material 5812 is then masked and etched to define the top and side gates 5814 of the transistor channel elements 5808 in a crossing manner, generally orthogonally. Then the entire structure may be covered with a Low Temperature Oxide 5816, the oxide planarized with chemical mechanical polishing (CMP), and then contacts and metal interconnects may be masked and etched as illustrated FIG. 58G. The gate contact 5820 connects to the resistor gate 5814. The two transistor channel terminal contacts 5822 per transistor independently connect to the transistor channel element 5808 on each side of the gate 5814. The thru via 5824 connects the transistor layer metallization to the acceptor wafer or house 808 interconnect 5806. This flow enables the formation of fully crystallized 3-gate sided thin-side-up junction-less transistor that may be formed and connected to the underlying multi-metal layer semiconductor device without exposing the underlying devices to a high temperature.

Figure 61A:
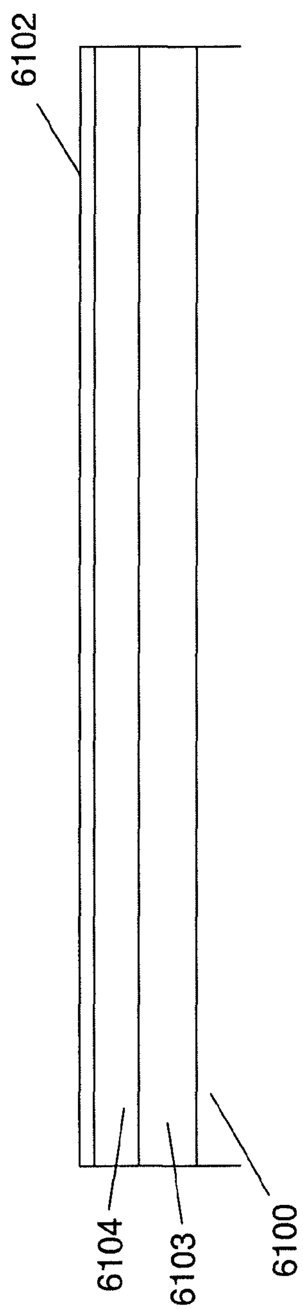
FIG. 61A-I are drawing illustrations of a junction-less transistor.
Figure 61B:
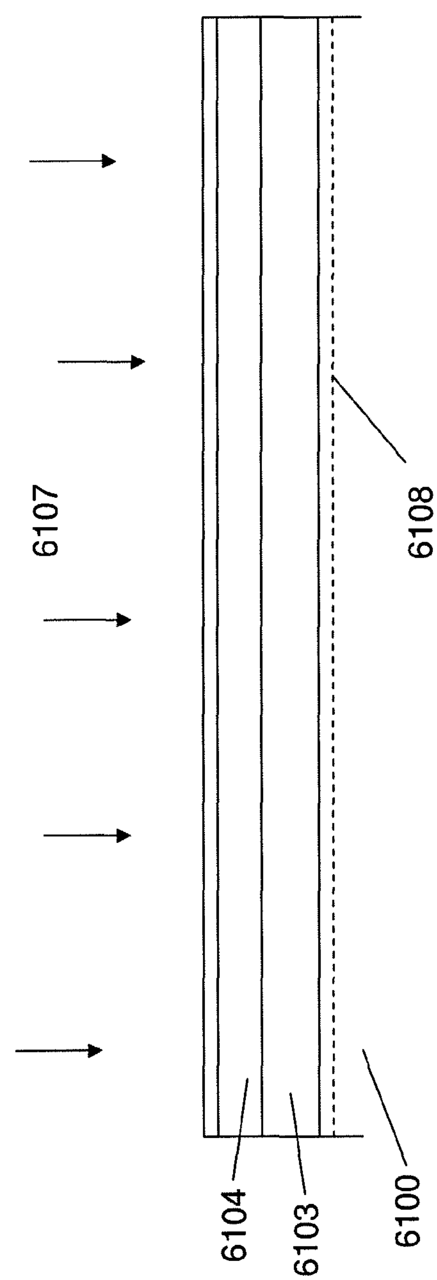
Figure 61C:
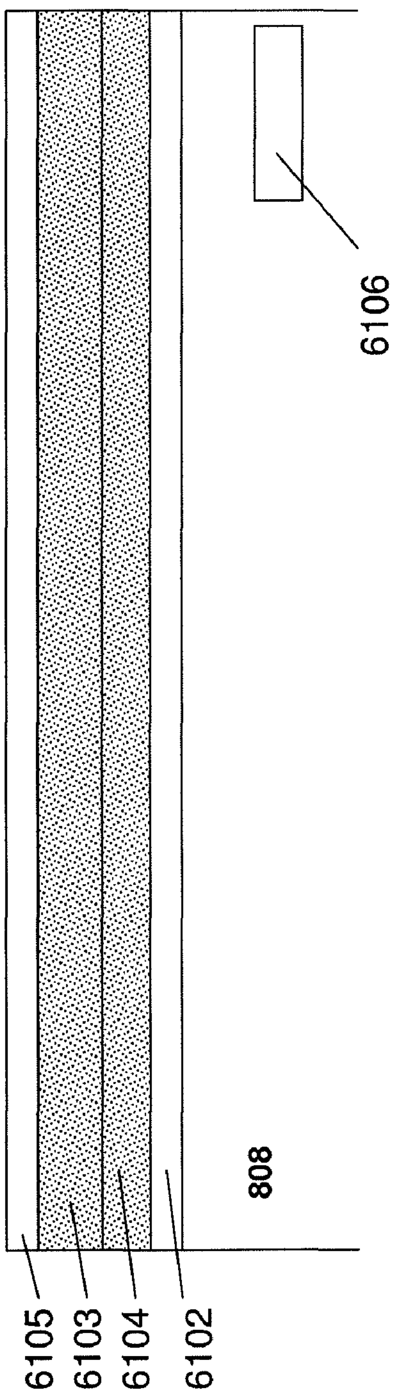

Alternatively, a two layer n-type 3-gate sided junction-less transistor may be constructed as shown in FIGS. 61A to 61I. This structure may improve the source and drain contact resistance by providing for a higher doping at the contact surface than the channel. Additionally, this structure may be utilized to create a two layer channel wherein the layer closest to the gate is more highly doped. A silicon wafer may be preprocessed for layer transfer 2006 as illustrated in FIGS. 61A and 61B. These preprocessings may be performed at temperatures above 400° C. as the layer transfer to the processed substrate with metal interconnects has yet to be done. As illustrated in FIG. 61A, an N− wafer 5700 is processed to have two layers of N+, the top layer 6104 with a lower doping concentration than the bottom N+ layer 6103, by an implant and activation, or an N+ epitaxial growth, or combinations thereof. A screen oxide 6102 may be grown before the implant to protect the silicon from implant contamination and to provide an oxide surface for later wafer-to-wafer bonding. FIG. 61B is a drawing illustration of the pre-processed wafer for a layer transfer by an implant 6107 of an atomic species, such as H+, preparing the "cleaving plane" 6108 in the N− region 6100 of the donor substrate and plasma or other surface treatments to prepare the oxide surface for wafer oxide to oxide bonding. The acceptor wafer or house 808 with logic transistors and metal interconnects is prepared for a low temperature oxide-to-oxide wafer bond with surface treatments of the top oxide and the two are bonded as illustrated in FIG. 61C. The top donor wafer is cleaved and removed from the bottom acceptor wafer 808 and the top N− substrate is chemically and mechanically polished (CMP'ed) into the more highly doped N+ layer 6103. An etch hard mask layer of low temperature silicon nitride 6105 may be deposited on the surface of 6103, including a thin oxide stress buffer layer. A metal interconnect layer 6106 in the acceptor wafer or house 808 is also illustrated in FIG. 61C. For illustration simplicity and clarity, the donor wafer oxide layer 6102 will not be drawn independent of the acceptor wafer or house 808 oxide.

Figure 61D:
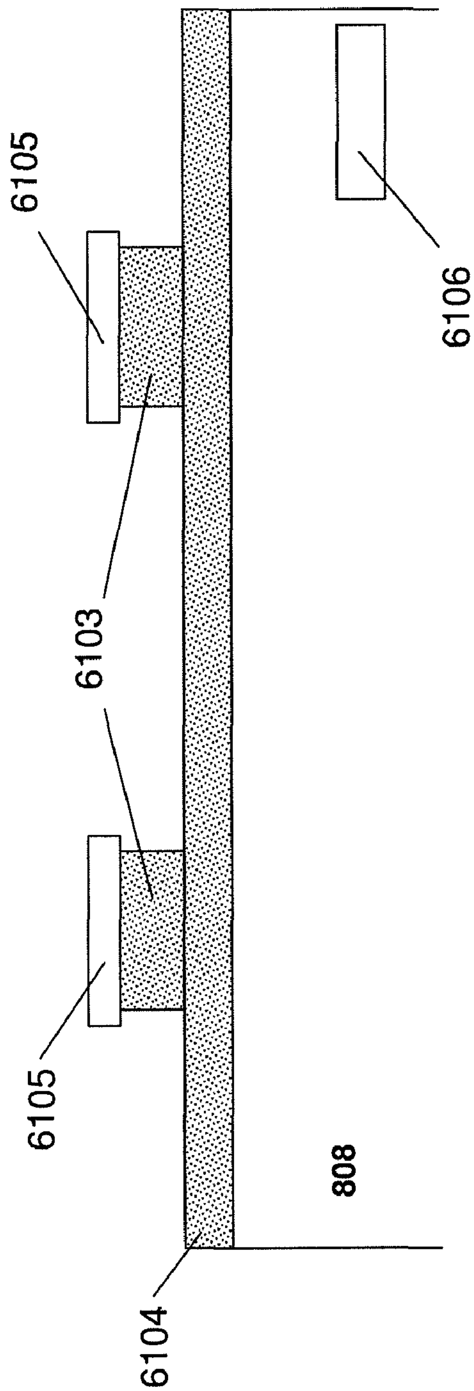
Figure 61E:
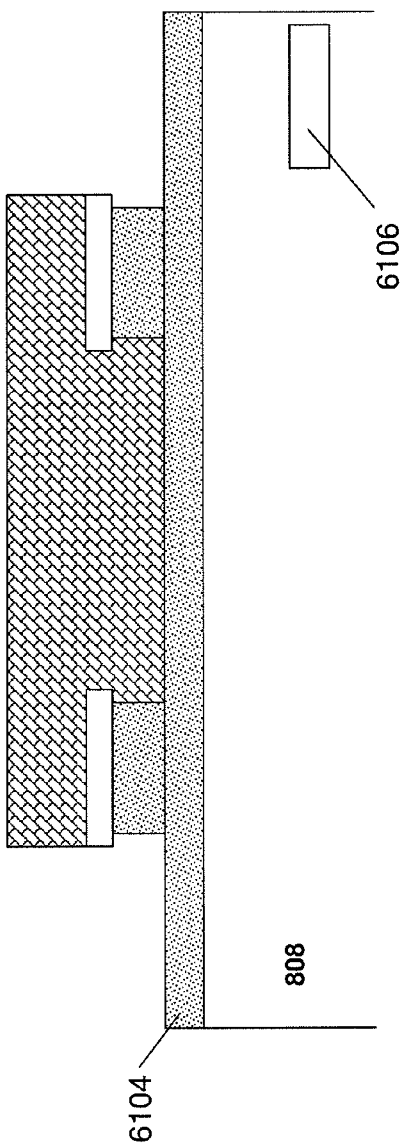
Figure 61F:
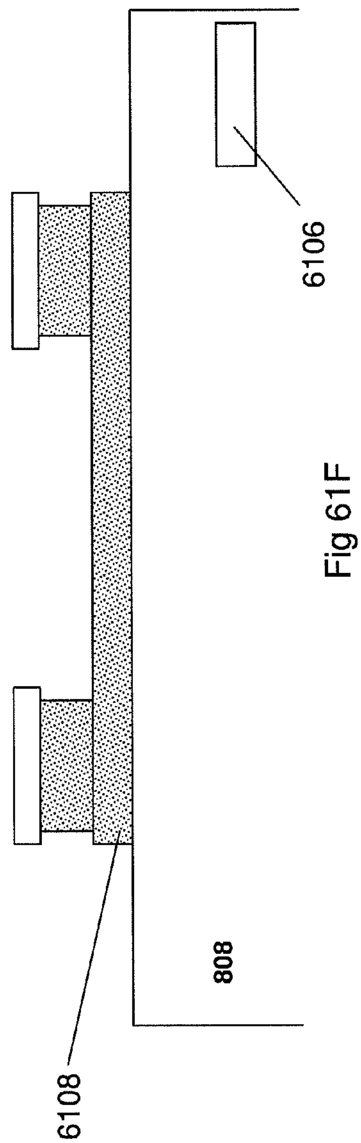
Figure 61G:
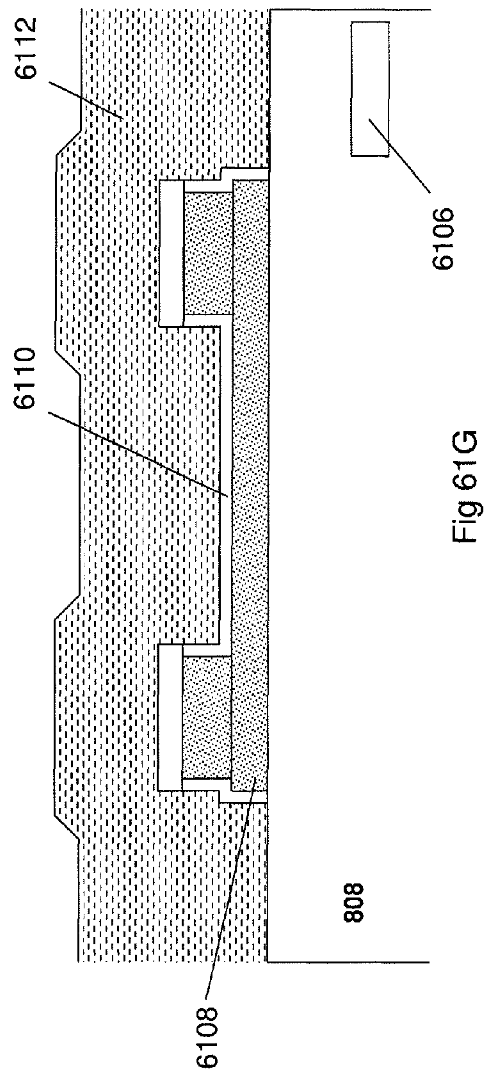
Figure 61H:
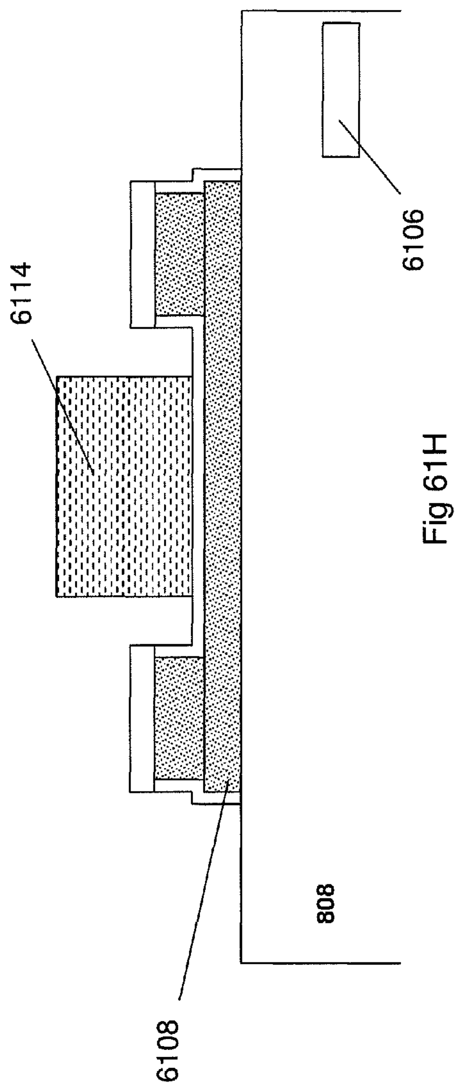
Figure 61I:
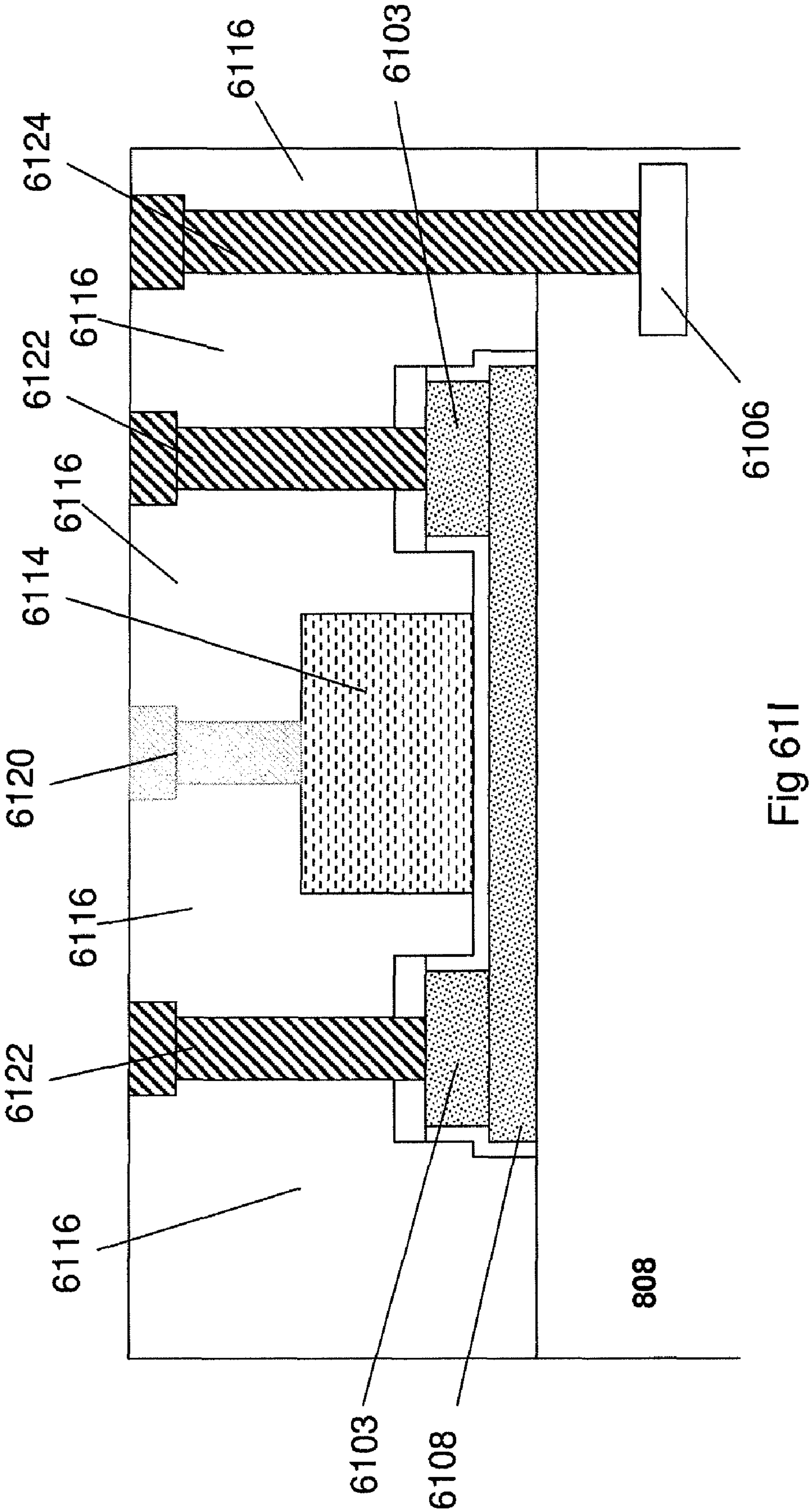

The source and drain connection areas may be masked, the silicon nitride 6105 layer may be etched, and the photoresist may be stripped. A partial or full silicon plasma etch may be performed, or a low temperature oxidation and then Hydrofluoric Acid etch of the oxide may be performed, to thin layer 6105. FIG. 61D illustrates where a two-layer channel, as described and simulated above, formed by thinning layer 6103 with the above etch process to almost complete removal, leaving some of layer 6103 remaining on top of 6104. A complete removal of the top channel layer may also be performed. This etch process may also be utilized to adjust for wafer-to-wafer CMP variations of the remaining donor wafer layers, such as 6100 and 6103, after the layer transfer cleave. FIG. 61E illustrates the photoresist definition of the source, drain, and channel of the junction-less transistor. The exposed silicon remaining on layer 6104, as illustrated in FIG. 61F, may be plasma etched and the photoresist may be removed. This process may provide for an isolation between devices and may define the channel width of the junction-less transistor channel 6108. A low temperature based Gate Dielectric may be deposited and densified to serve as the junction-less transistor gate oxide 6110 as illustrated in FIG. 61G. Alternatively, a low temperature microwave plasma oxidation of the silicon surfaces may provide the junction-less transistor gate oxide 6110. Then deposition of a low temperature gate material 6112, such as, for example, doped or undoped amorphous silicon, may be performed, as illustrated in FIG. 61G. Alternatively, a high-k metal gate structure may be formed as described previously. The gate material 6112 may then be masked and etched to define the top and side gates 6114 of the transistor channel elements 6108 in a crossing manner, generally orthogonally, as illustrated in FIG. 61H. Then the entire structure may be covered with a Low Temperature Oxide 6116, the oxide may be planarized by chemical mechanical polishing. Then contacts and metal interconnects may be masked and etched as illustrated FIG. 61I. The gate contact 6120 may be connected to the gate 6114. The two transistor channel terminal contacts 6122 may be independently connected to the heavier doped layer 6103 and then to transistor channel element 6108 on each side of the gate 6114. The thru via 6124 may connect the junction-less transistor layer metallization to the acceptor wafer or house 808 at interconnect 6106. This flow may enable the formation of fully crystallized two layer 3-gate sided junction-less transistor that may be formed and connected to the underlying multi-metal layer semiconductor device without exposing the underlying devices to a high temperature.

Figure 65A:
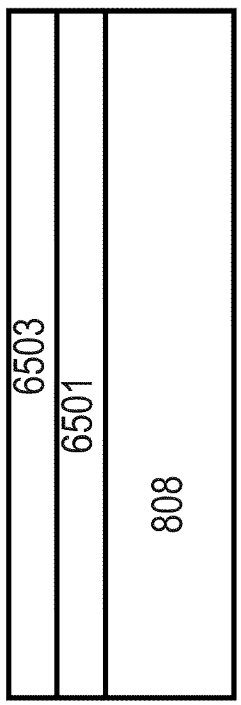
FIG. 65A-C are drawing illustrations of the formation of a junction-less transistor.
Figure 65B:
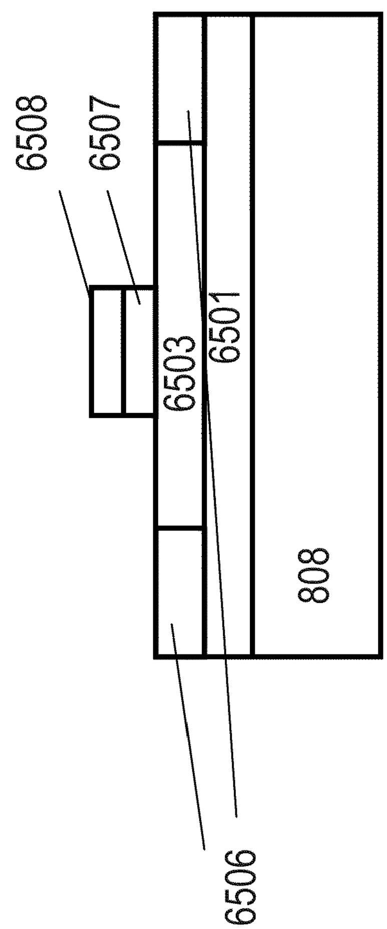
Figure 65C:
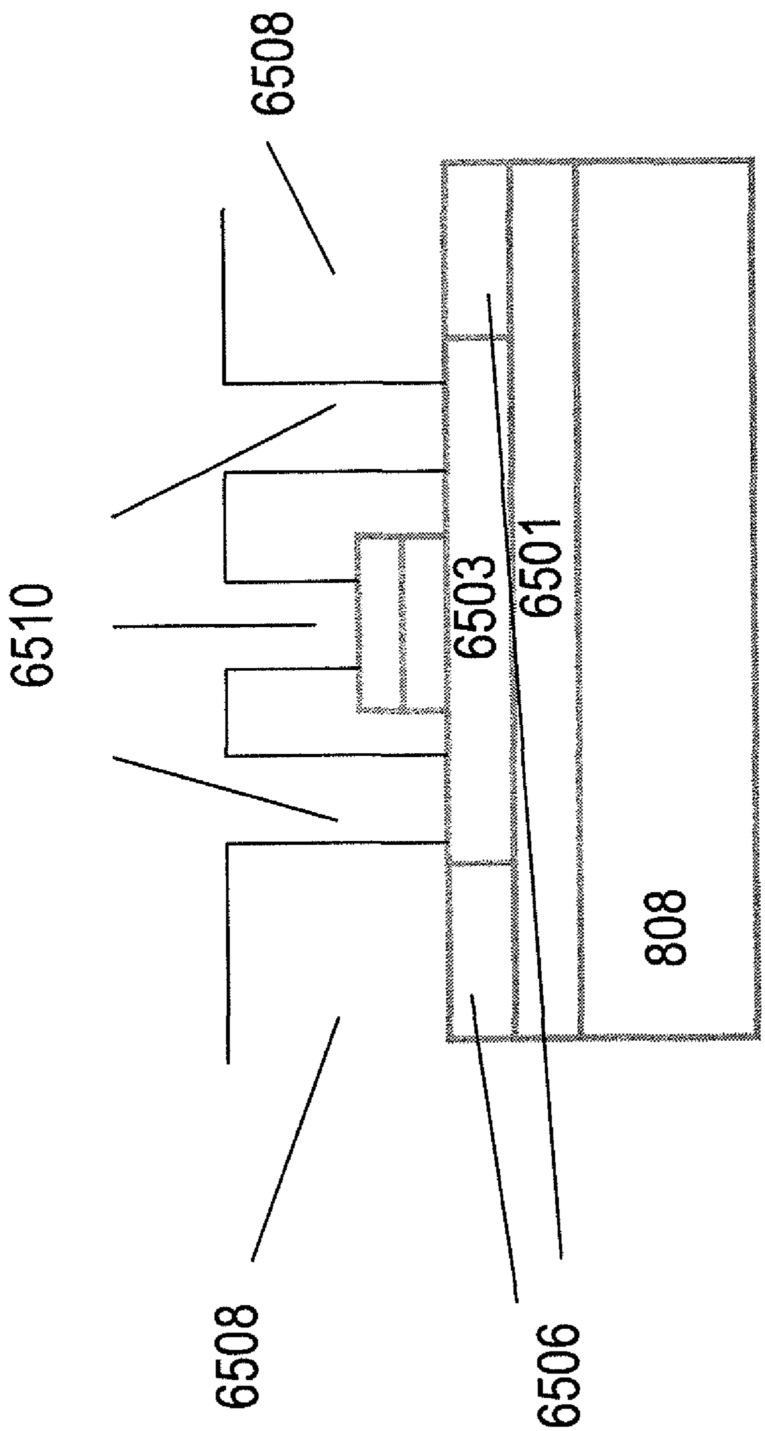

Alternatively, a 1-gate sided junction-less transistor can be constructed as shown in FIG. 65A-C. A thin layer of heavily doped silicon 6503 may be transferred on top of the acceptor wafer or house 808 using layer transfer techniques described previously wherein the donor wafer oxide layer 6501 may be utilized to form an oxide to oxide bond with the top of the acceptor wafer or house 808. The transferred doped layer 6503 may be N+ doped for an n-channel junction-less transistor or may be P+ doped for a p-channel junction-less transistor. Oxide isolation 6506 may be formed by masking and etching the N+ layer 6503 and subsequent deposition of a low temperature oxide which may be chemical mechanically polished to the channel silicon 6503 thickness. The channel thickness 6503 may also be adjusted at this step. As illustrated in FIG. 65 B, a low temperature gate dielectric 6504 and gate metal 6505 are deposited or grown as previously described and then photo-lithographically defined and etched. A low temperature oxide 6508 may then be deposited, which also may provide a mechanical stress on the channel for improved carrier mobility. Contact openings 6510 may then be opened to various terminals of the junction-less transistor as shown in FIG. 65.

A family of vertical devices can also be constructed as top transistors that are precisely aligned to the underlying pre-fabricated acceptor wafer or house 808. These vertical devices have implanted and annealed single crystal silicon layers in the transistor by utilizing the "SmartCut" layer transfer process that does not exceed the temperature limit of the underlying pre-fabricated structure. For example, vertical style MOSFET transistors, floating gate flash transistors, floating body DRAM, thyristor, bipolar, and Schottky gated JFET transistors, as well as memory devices, can be constructed. Junction-less transistors may also be constructed in a similar manner. The gates of the vertical transistors or resistors may be controlled by memory or logic elements such as MOSFET, DRAM, SRAM, floating flash, anti-fuse, floating body devices, etc. that are in layers above or below the vertical device, or in the same layer. As an example, a vertical gate-all-around n-MOSFET transistor construction is described below.

Figure 39A:
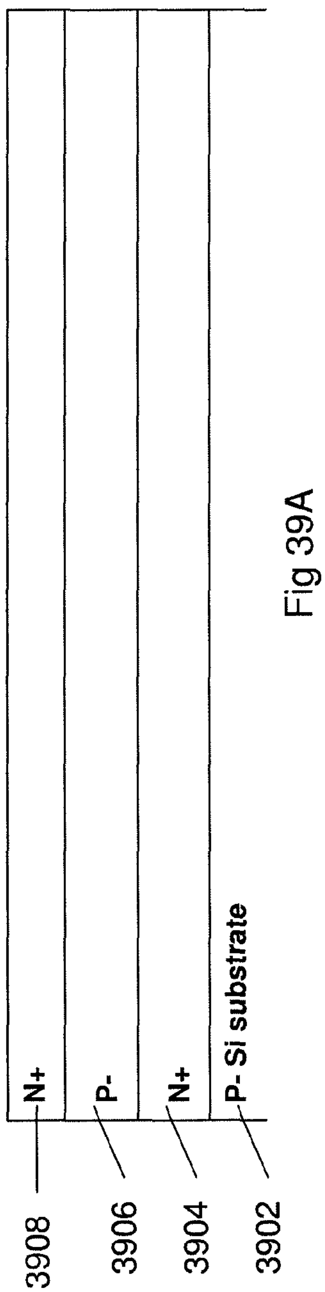
FIG. 39A-39C are drawing illustration of pre-processed wafers used for vertical transistors.
Figure 39B:
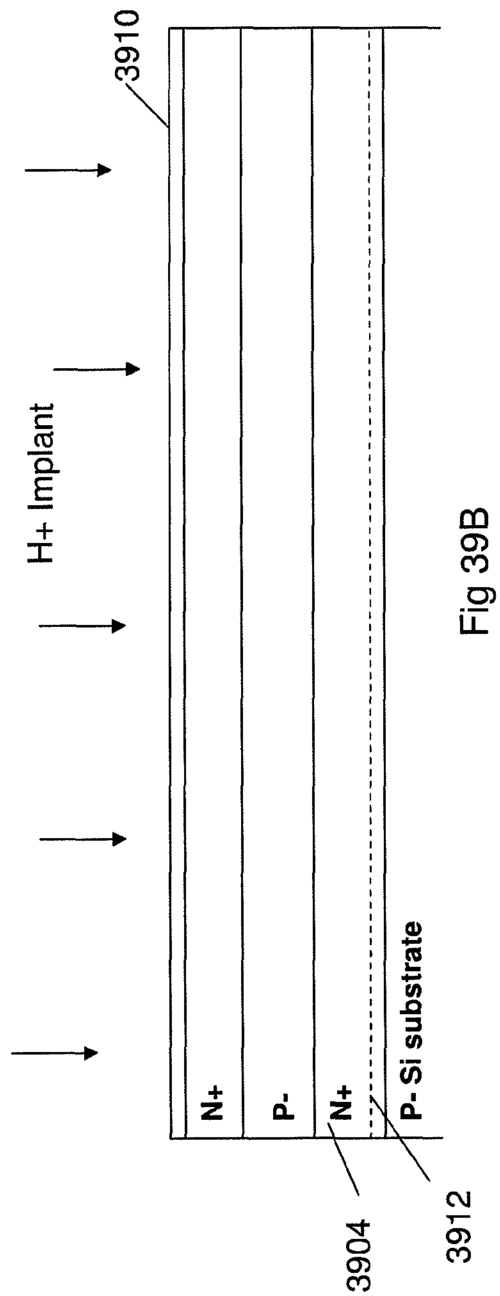
Figure 39C:
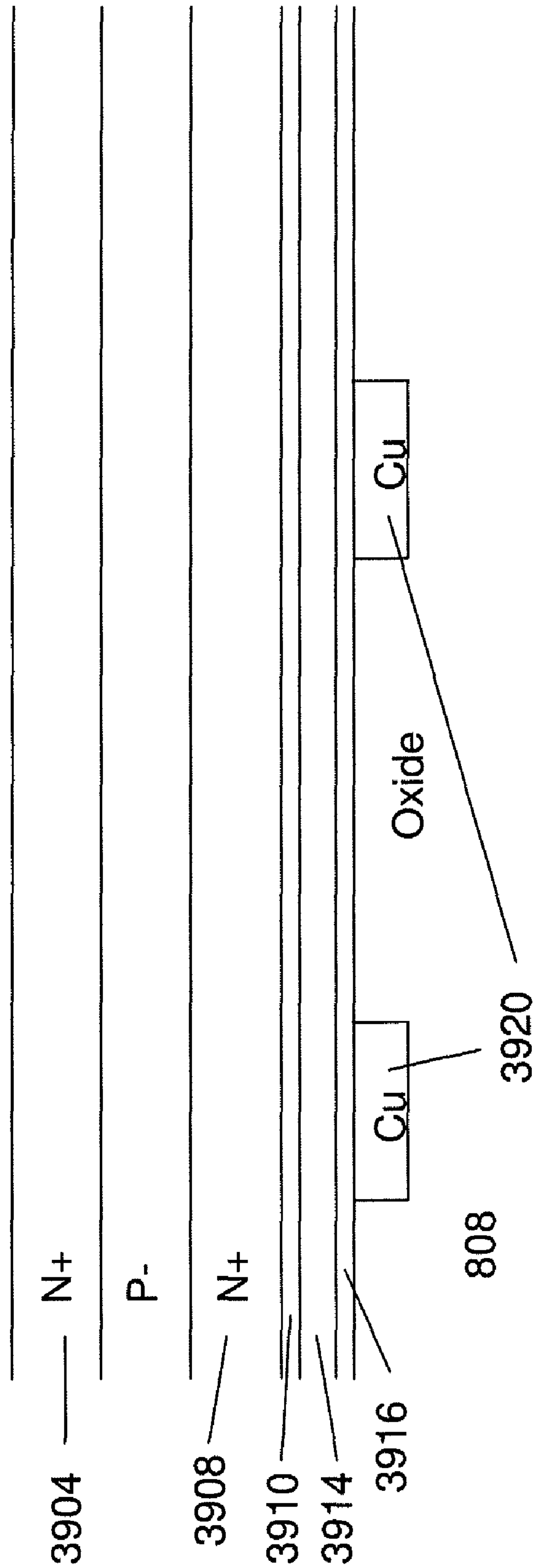

The donor wafer is preprocessed for the general layer transfer process 2006 of FIG. 20 is illustrated in FIG. 39. FIG. 39A is a drawing illustration of a pre-processed wafer used for a layer transfer. A P− wafer 3902 is processed to have a "buried" layer of N+ 3904, by implant and activation, or by shallow N+ implant and diffusion followed by an P− epi growth (epitaxial growth) 3906. An additional N+ layer 3908 is processed on top. This N+ layer 2510 could again be processed, by implant and activation, or by N+ epi growth. FIG. 39B is a drawing illustration of the pre-processed wafer made ready for a conductive bond layer transfer by a deposition of a conductive barrier layer 3910 such as TiN or TaN and by an implant of an atomic species, such as H+, preparing the SmartCut cleaving plane 3912 in the lower part of the N+ 3904 region. The acceptor wafer is also prepared with an oxide pre-clean and deposition of a conductive barrier layer 3916 and Al and Ge layers to form a Ge—Al eutectic bond 3914 during a thermo-compressive wafer to wafer bonding as part of the layer-transfer-flow, thereby transferring the pre-processed single crystal silicon with N+ and P− layers, on top of 808, as illustrated in FIG. 39C. Thus, a conductive path is made from the house 808 top metal layers 3920 to the now bottom N+ layer 3908 of the transferred donor wafer. Alternatively, the Al—Ge eutectic layer 3914 may be made with copper and a copper-to-copper or copper-to-barrier layer thermo-compressive bond is formed Likewise, a conductive path from donor wafer to house 808 may be made by house top metal lines 3920 of copper with barrier metal thermo-compressively bonded with the copper layer 3910 directly, where a majority of the bonded surface is donor copper to house oxide bonds and the remainder of the surface is donor copper to house 808 copper and barrier metal bonds.

Figure 40A:
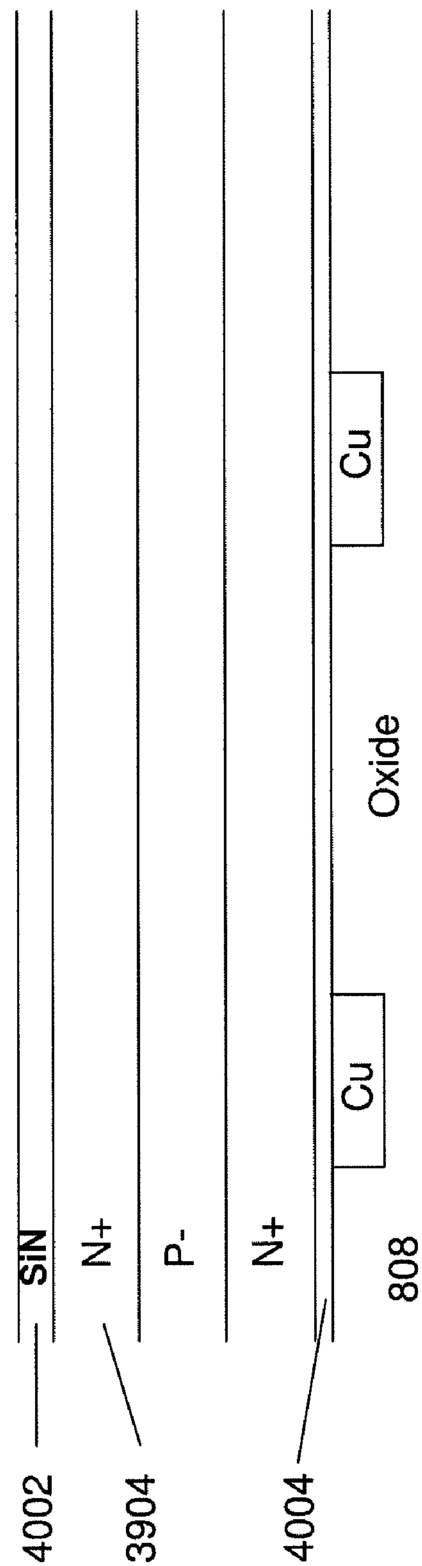
FIG. 40A-40I are drawing illustrations of a vertical n-MOSFET top transistor.
Figure 40B:
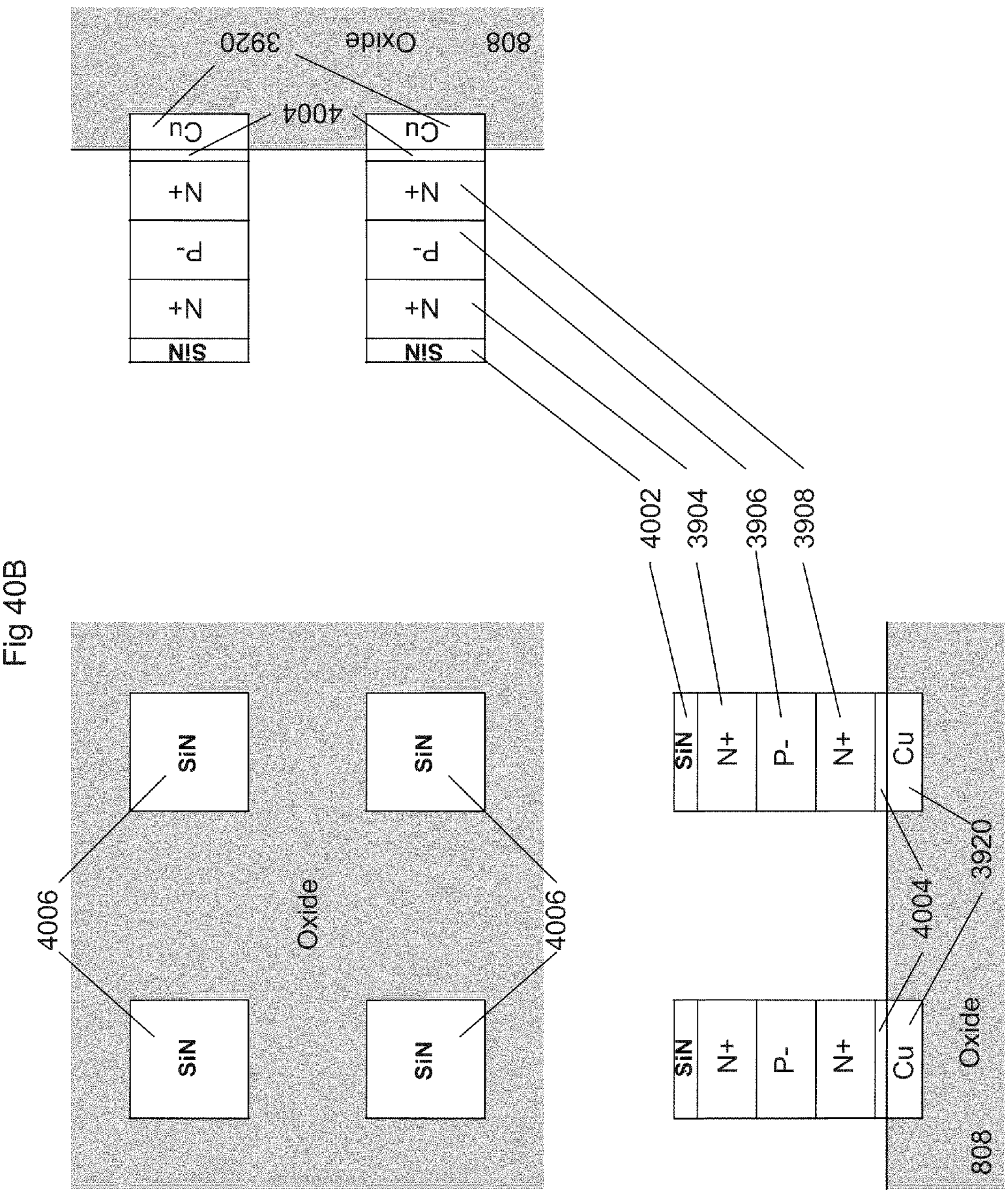
Figure 40C:
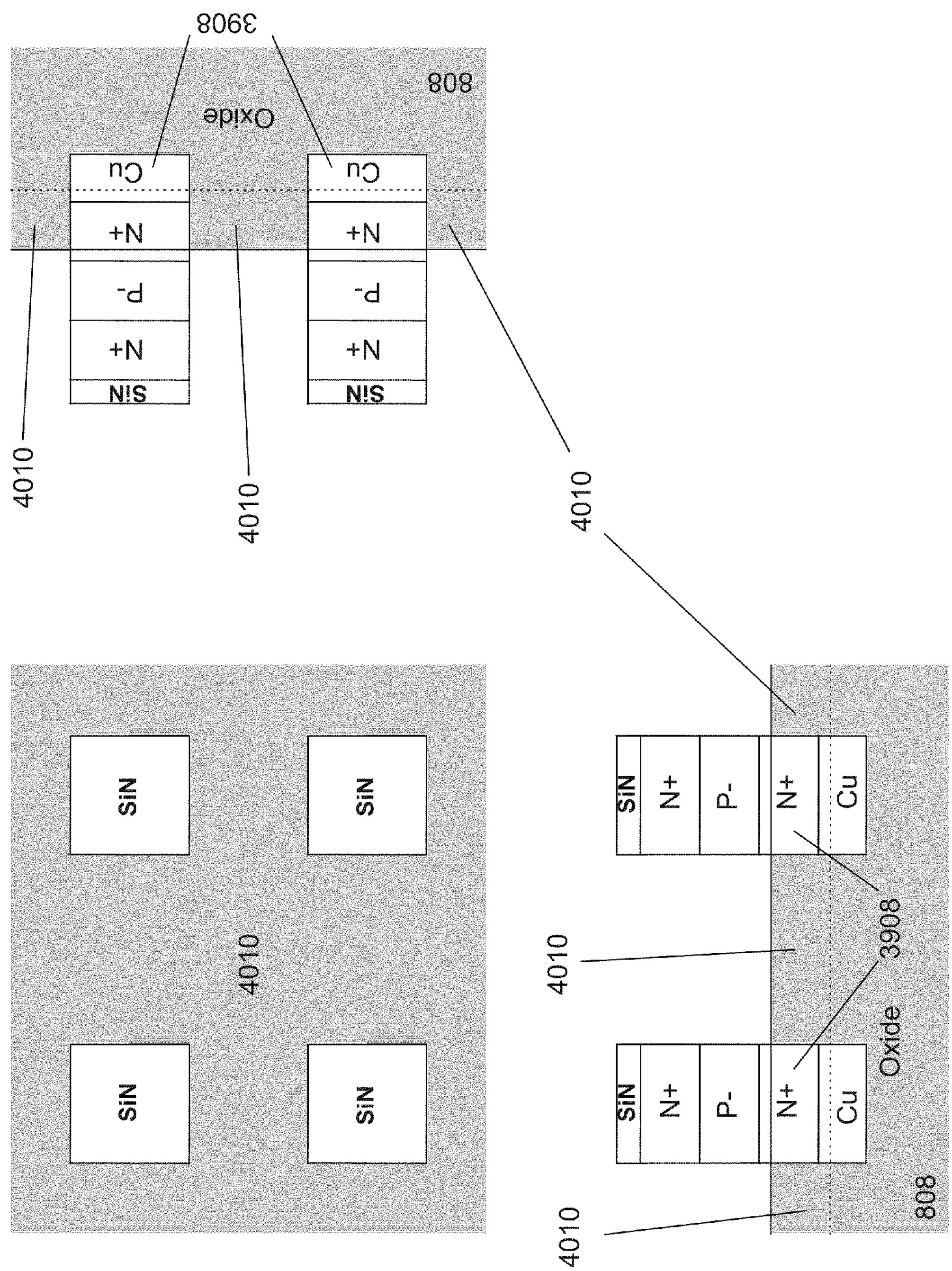
Figure 40D:
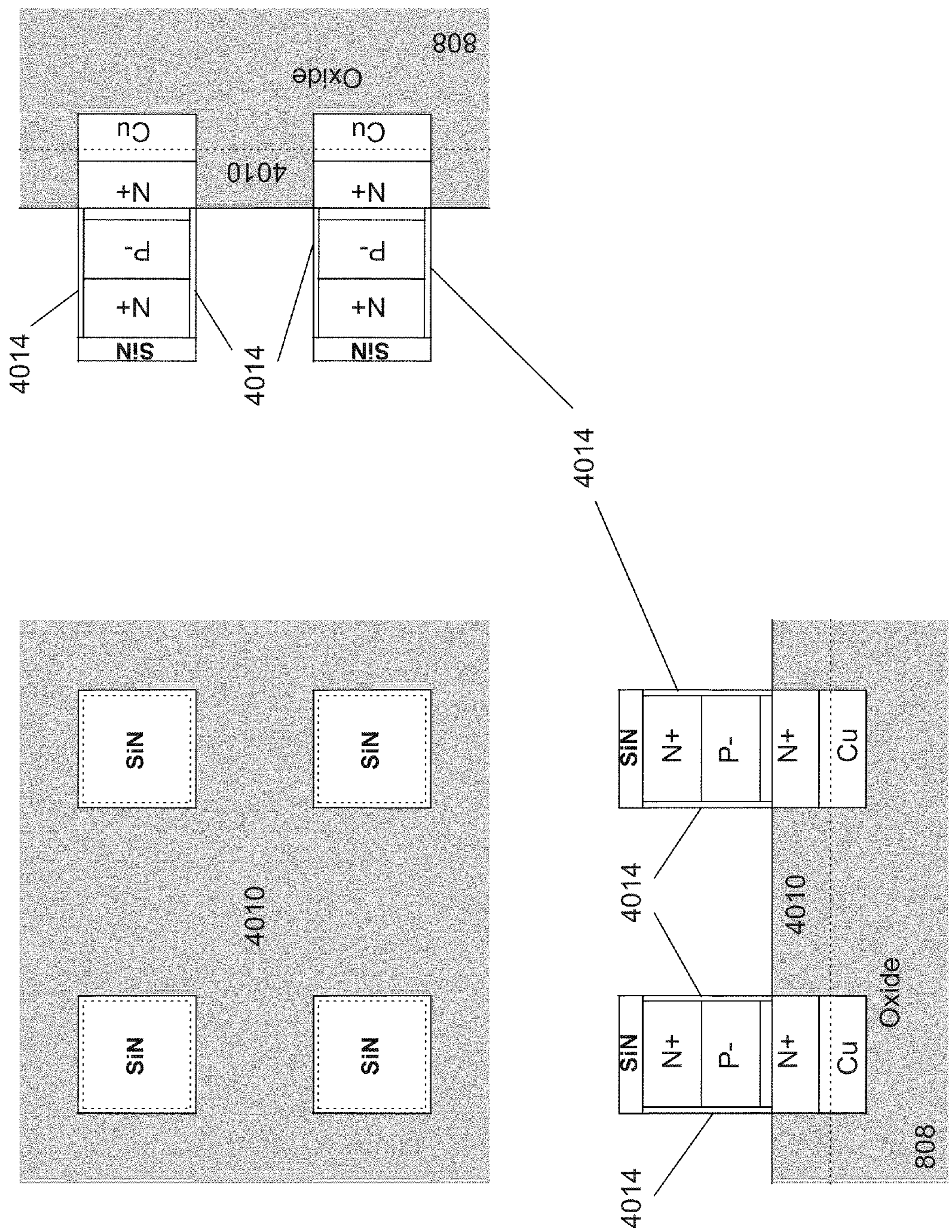
Figure 40E:
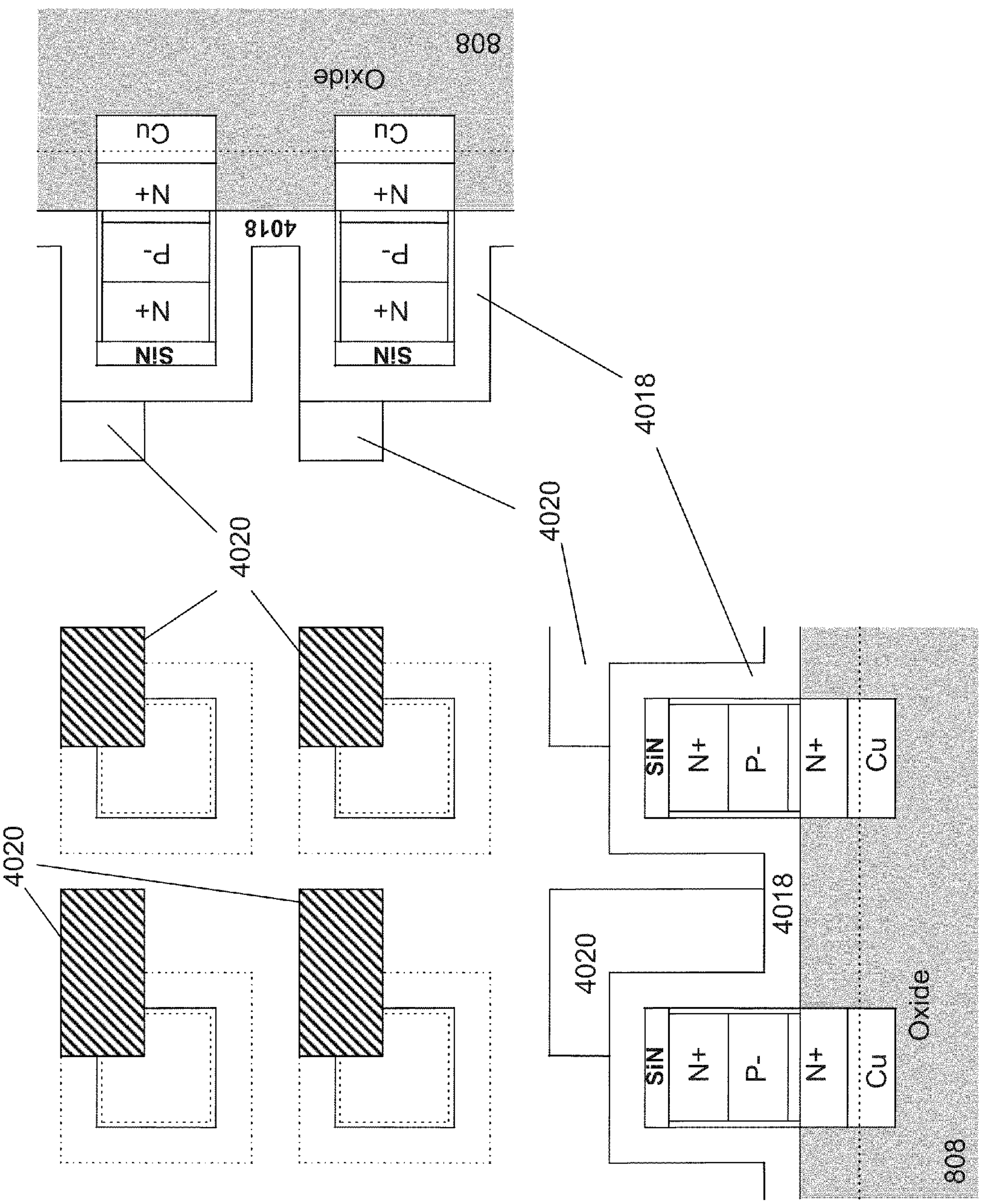
Figure 40F:
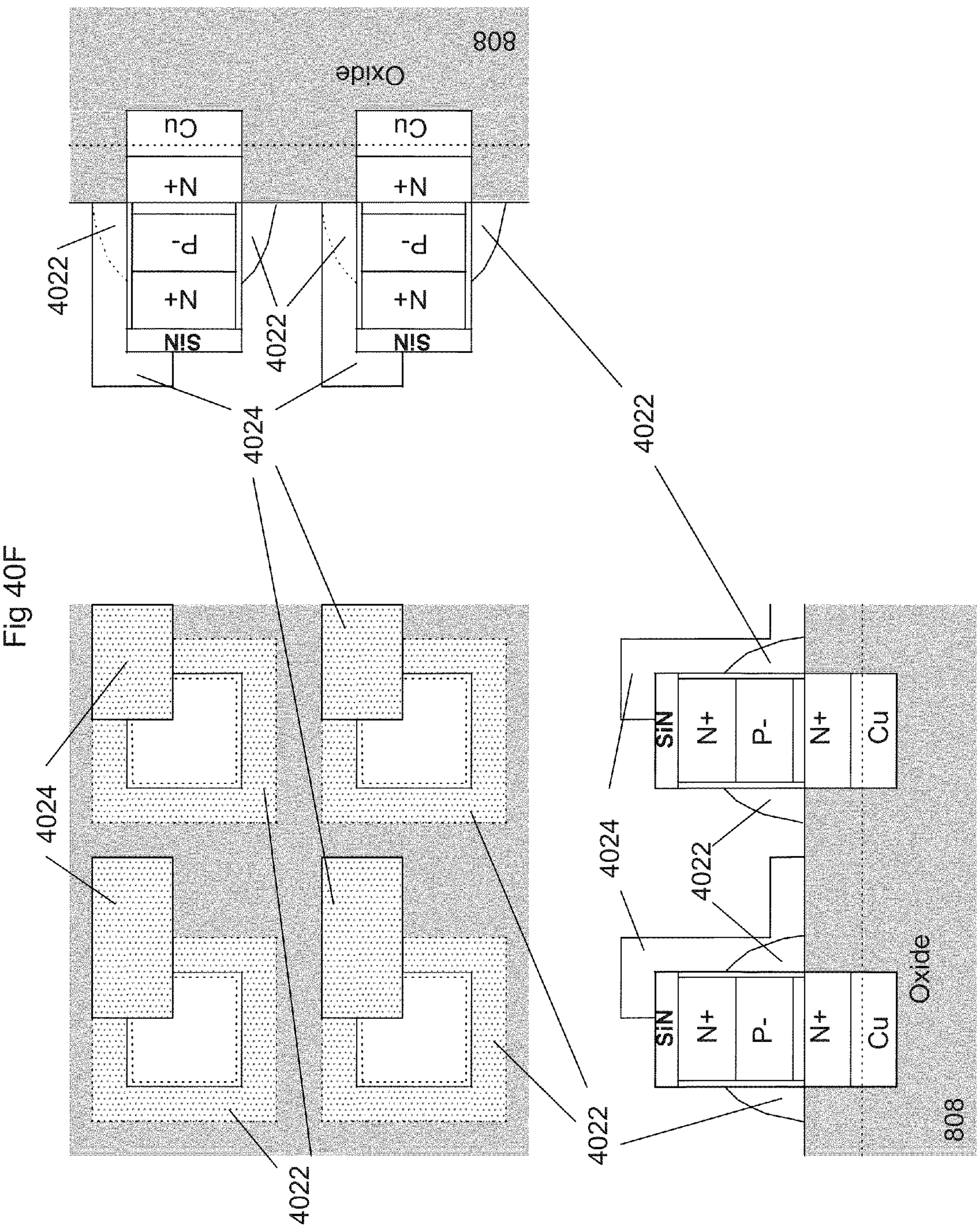
Figure 40G:
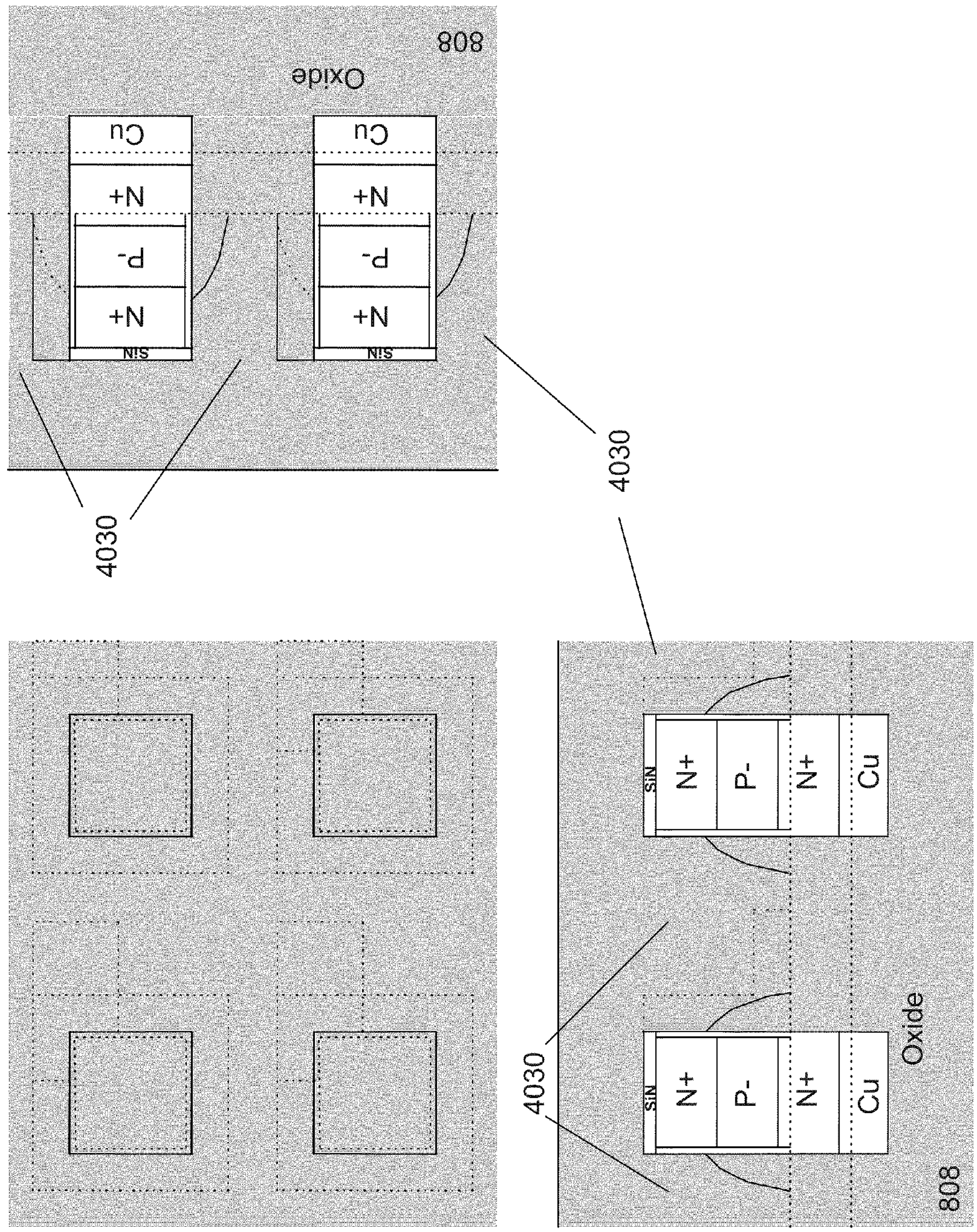
Figure 40H:
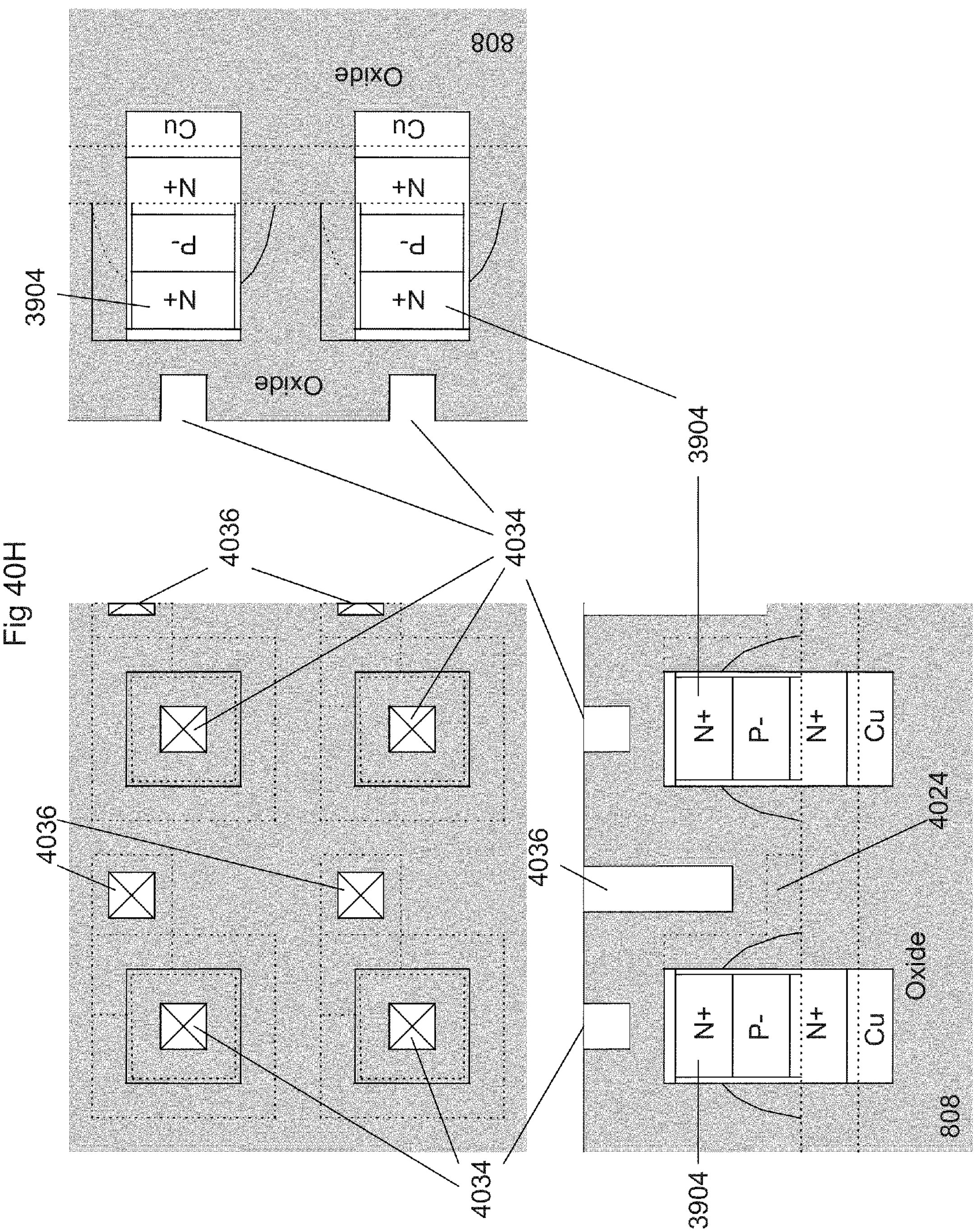
Figure 40I:
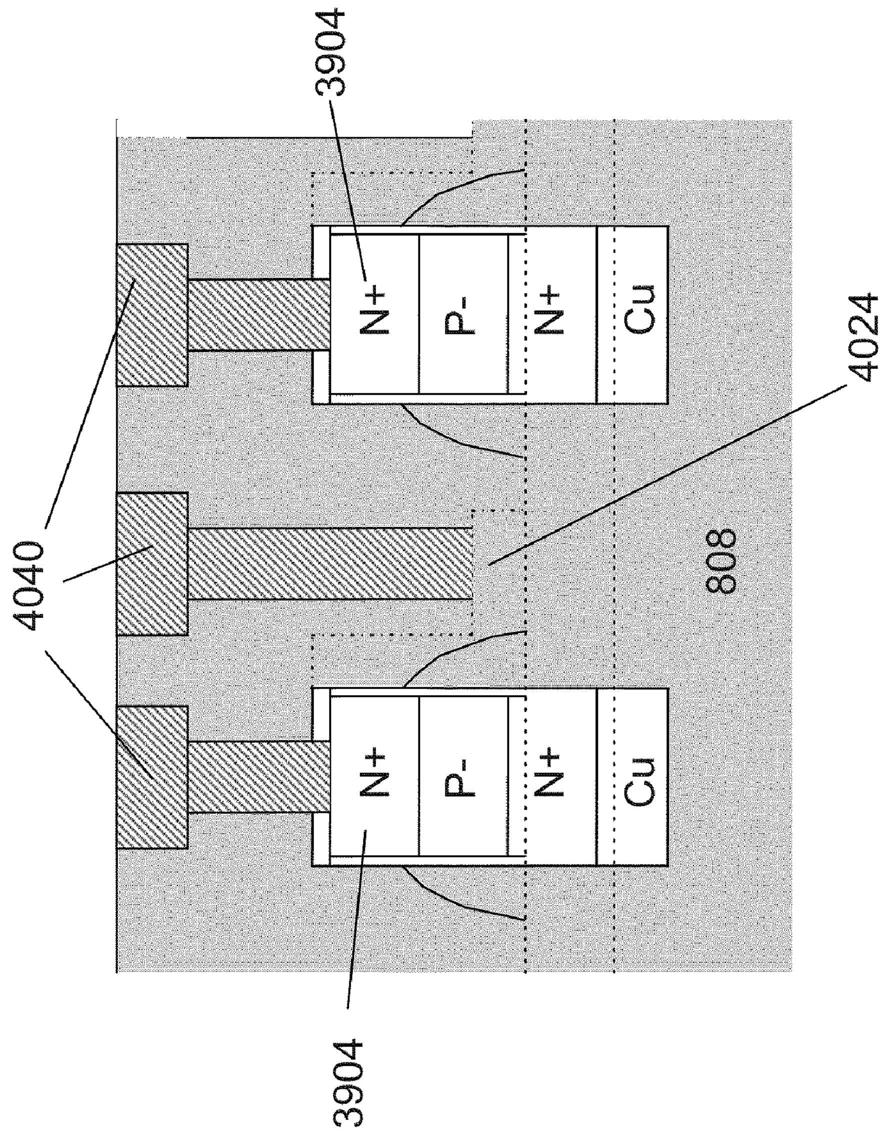

FIGS. 40A-40I are drawing illustrations of the formation of a vertical gate-all-around n-MOSFET top transistor. FIG. 40A illustrates the first step after the conductive path layer transfer described above of a deposition of a CMP and plasma etch stop layer 4002, such as low temperature SiN, on top of the top N+ layer 3904. For simplicity, the barrier clad Al—Ge eutectic layers 3910, 3914, and 3916 are represented by one illustrated layer 4004. Similarly, FIGS. 40B-H are drawn as an orthographic projection to illustrate some process and topographical details. The transistor illustrated is square shaped when viewed from the top, but may be constructed in various rectangular shapes to provide different transistor widths and gate control effects. In addition, the square shaped transistor illustrated may be intentionally formed as a circle when viewed from the top and hence form a vertical cylinder shape, or it may become that shape during processing subsequent to forming the vertical towers. The vertical transistor towers 4006 are mask defined and then plasma/Reactive-ion Etching (RIE) etched thru the Chemical Mechanical Polishing (CMP) stop layer 4004, N+ layers 3904 and 3908, the P− layer 3906, the metal bonding layer 4004, and into the house 808 oxide, and then the photoresist is removed as illustrated in FIG. 40B. This definition and etch now creates N-P-N stacks that are electrically isolated from each other yet the bottom N+ layer 3908 is electrically connected to the house metal layer 3920. The area between the towers is partially filled with oxide 4010 via a Spin On Glass (SPG) spin, cure, and etch back sequence as illustrated in FIG. 40C. Alternatively, a low temperature CVD gap fill oxide may be deposited, then Chemically Mechanically Polished (CMP'ed) flat, and then selectively etched back to achieve the same shape 4010 as shown in FIG. 40C. The level of the oxide 4010 is constructed such that a small amount of the bottom N+ tower layer 3908 is not covered by oxide. Alternatively, this step may also be accomplished by a conformal low temperature oxide CVD deposition and etch back sequence, creating a spacer profile coverage of the bottom N+ tower layer 3908. Next, the sidewall gate oxide 4014 is formed by a low temperature microwave oxidation technique, such as the TEL SPA (Tokyo Electron Limited Slot Plane Antenna) oxygen radical plasma, stripped by wet chemicals such as dilute HF, and grown again 4014 as illustrated in FIG. 40D. The gate electrode is then deposited, such as a conformal doped amorphous silicon layer 4018, and the gate mask photoresist 4020 may be defined as illustrated in FIG. 40E. The gate layer 4018 is etched such that a spacer shaped gate 4022 remains in regions not covered by the photoresist 4020, the full thickness gate layer 4024 remains under the resist, and the gate layer is also fully cleared from between the towers and then the photoresist is stripped as illustrated in FIG. 40F. This minimizes the gate to drain overlap and provides a clear contact connection to the gate electrode. The spaces between the towers are filled and the towers are covered with oxide 4030 by low temperature gap fill deposition and CMP as illustrated in FIG. 40G. In FIG. 40H, the via contacts 4034 to the tower N+ 3904 are masked and etched, and then the via contacts 4036 to the gate electrode poly 4024 are masked and etch. The metal lines 4040 are mask defined and etched, filled with barrier metals and copper interconnect, and CMP'd in a normal Dual Damascene interconnect scheme, thereby completing the contact via connections to the tower N+ 3904 and the gate electrode 4024 as illustrated in FIG. 40I.

This flow enables the formation of fully crystallized silicon top MOS transistors that are connected to the underlying multi-metal layer semiconductor device without exposing the underlying devices and interconnect metals to high temperature. These transistors could be used as programming transistors of the Antifuse on layer 808 or as a pass transistor for logic or FPGA use, or for additional uses in a 3D semiconductor device.

Figures 54A, 54B:
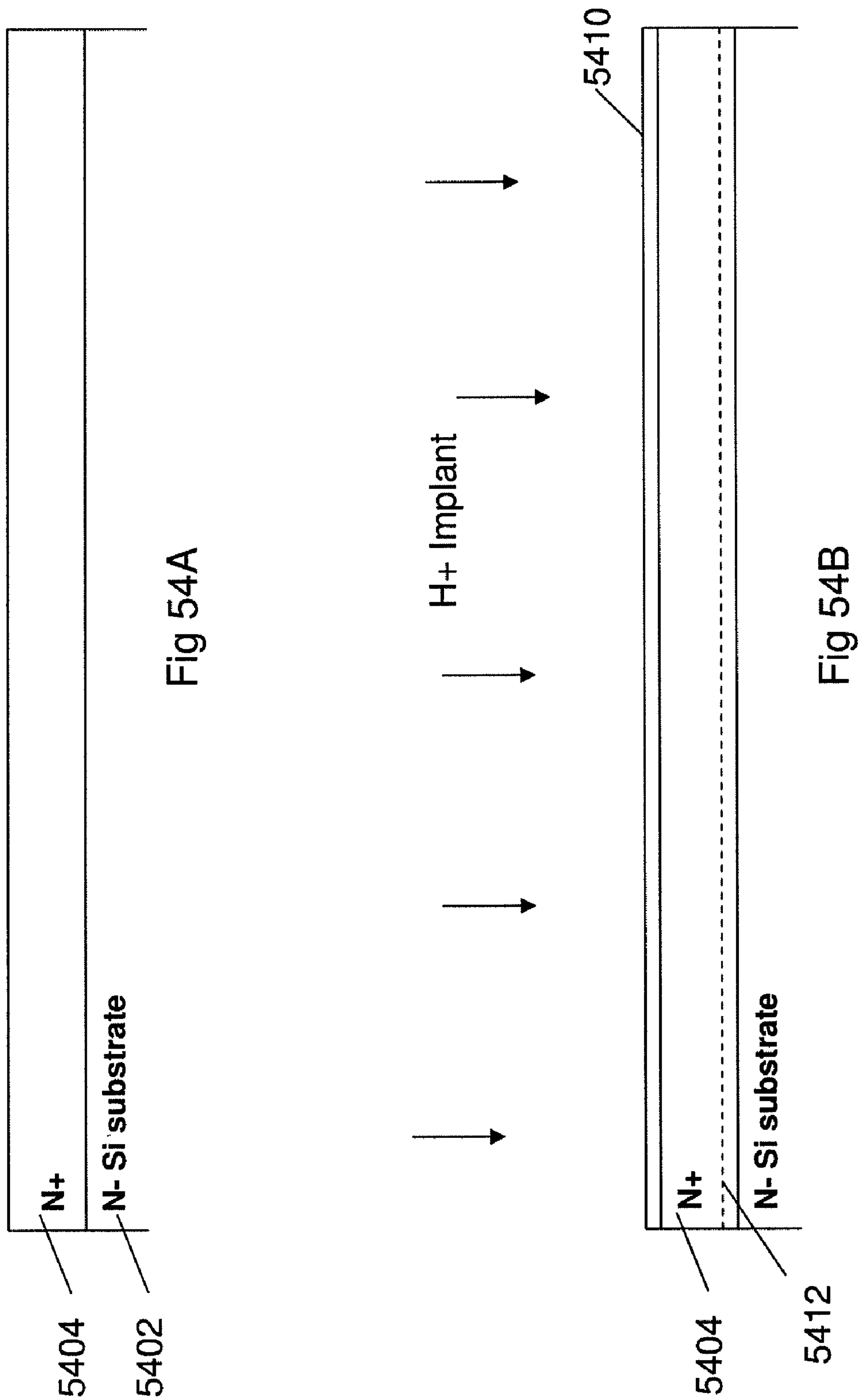
FIG. 54 A-C are drawing illustrations of the formation of a junction-less transistor.
Figure 54C:
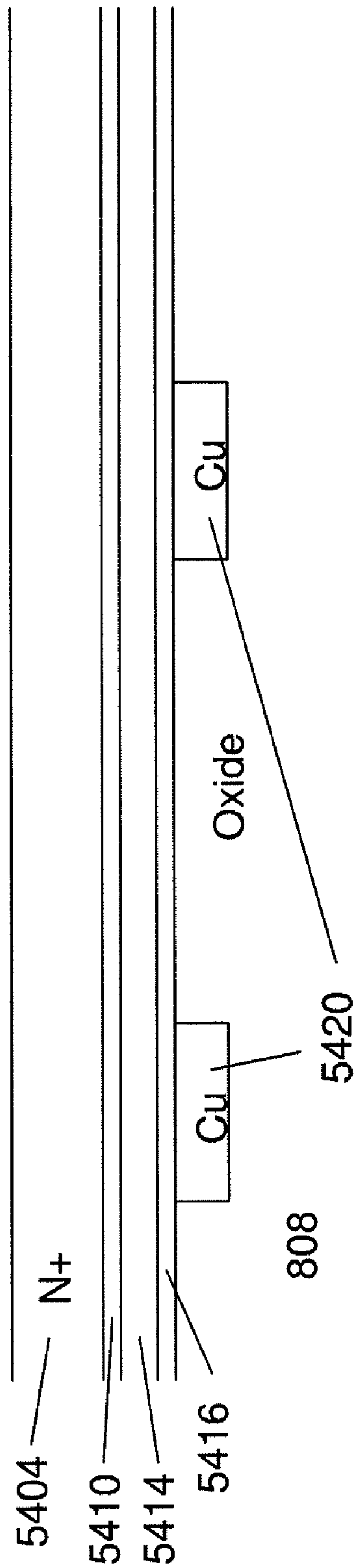

Additionally, a vertical gate all around junction-less transistor may be constructed as illustrated in FIGS. 54 and 55. The donor wafer is preprocessed for the general layer transfer process 2006 of FIG. 20 is illustrated in FIG. 54. FIG. 54A is a drawing illustration of a pre-processed wafer used for a layer transfer. An N− wafer 5402 is processed to have a layer of N+ 5404, by ion implantation and activation, or an N+ epitaxial growth. FIG. 54B is a drawing illustration of the pre-processed wafer made ready for a conductive bond layer transfer by a deposition of a conductive barrier layer 5410 such as TiN or TaN and by an implant of an atomic species, such as H+, preparing the SmartCut cleaving plane 5412 in the lower part of the N+ 5404 region. The acceptor wafer or house 808 is also prepared with an oxide pre-clean and deposition of a conductive barrier layer 5416 and Al and Ge layers to form a Ge—Al eutectic bond 5414 during a thermo-compressive wafer to wafer bonding as part of the layer-transfer-flow, thereby transferring the pre-processed single crystal silicon of FIG. 54B with an N+ layer 5404, on top of acceptor wafer or house 808, as illustrated in FIG. 54C. The N+ layer 5404 may be polished to remove damage from the cleaving procedure. Thus, a conductive path is made from the acceptor wafer or house 808 top metal layers 5420 to the N+ layer 5404 of the transferred donor wafer. Alternatively, the Al—Ge eutectic layer 5414 may be made with copper and a copper-to-copper or copper-to-barrier layer thermo-compressive bond is formed. Likewise, a conductive path from donor wafer to acceptor wafer or house 808 may be made by house top metal lines 5420 of copper with associated barrier metal thermo-compressively bonded with the copper layer 5410 directly, where a majority of the bonded surface is donor copper to house oxide bonds and the remainder of the surface is donor copper to acceptor wafer or house 808 copper and barrier metal bonds.

Figure 55A:
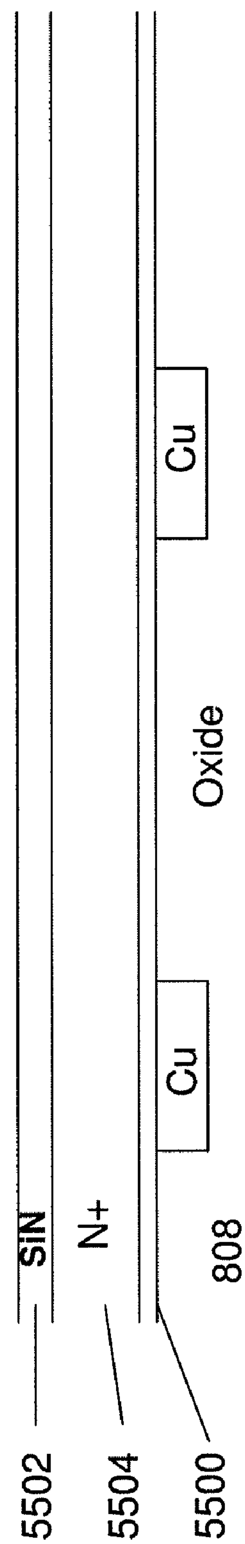
FIG. 55 A-I are drawing illustrations of the formation of a junction-less transistor.
Figure 55B:
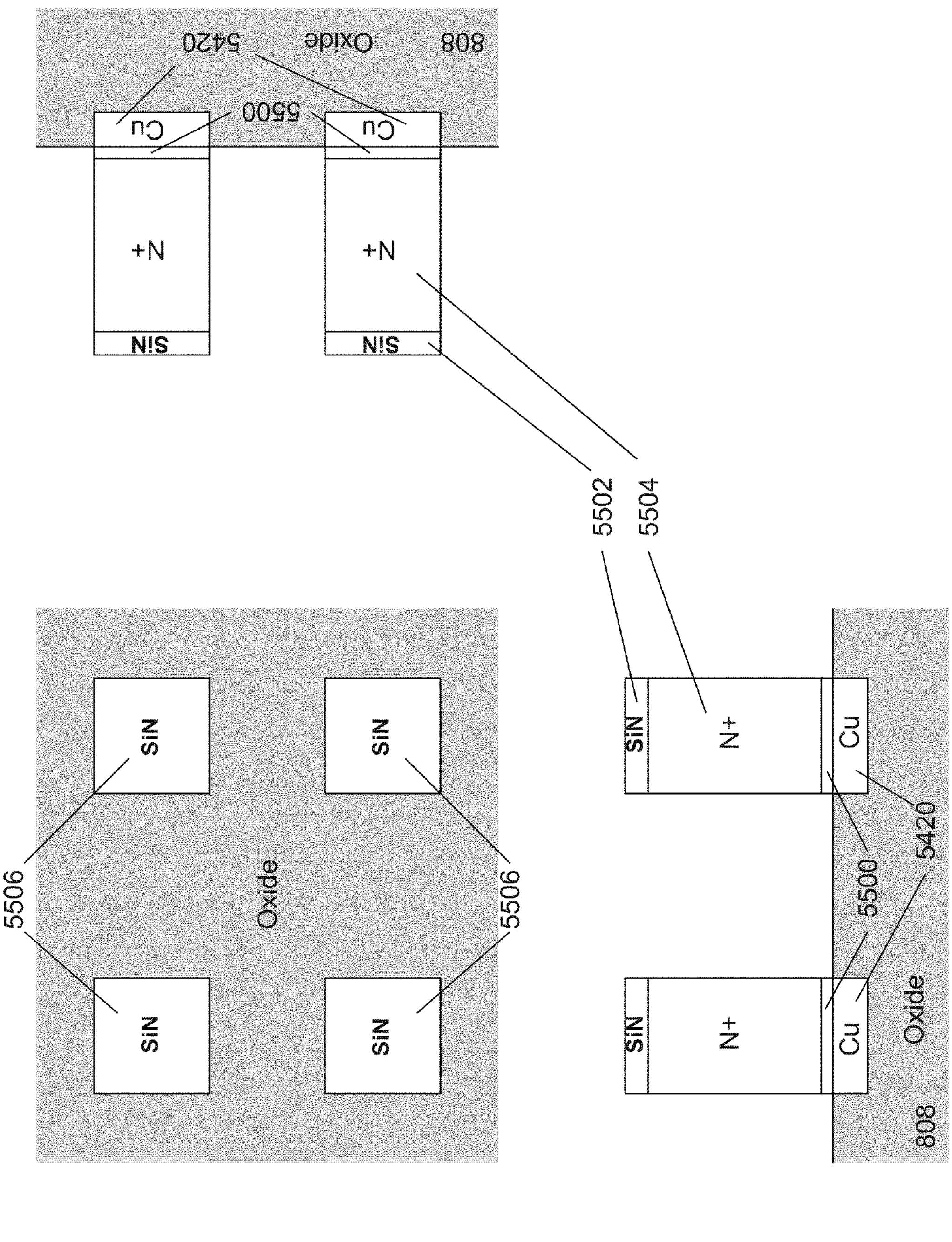
Figure 55C:
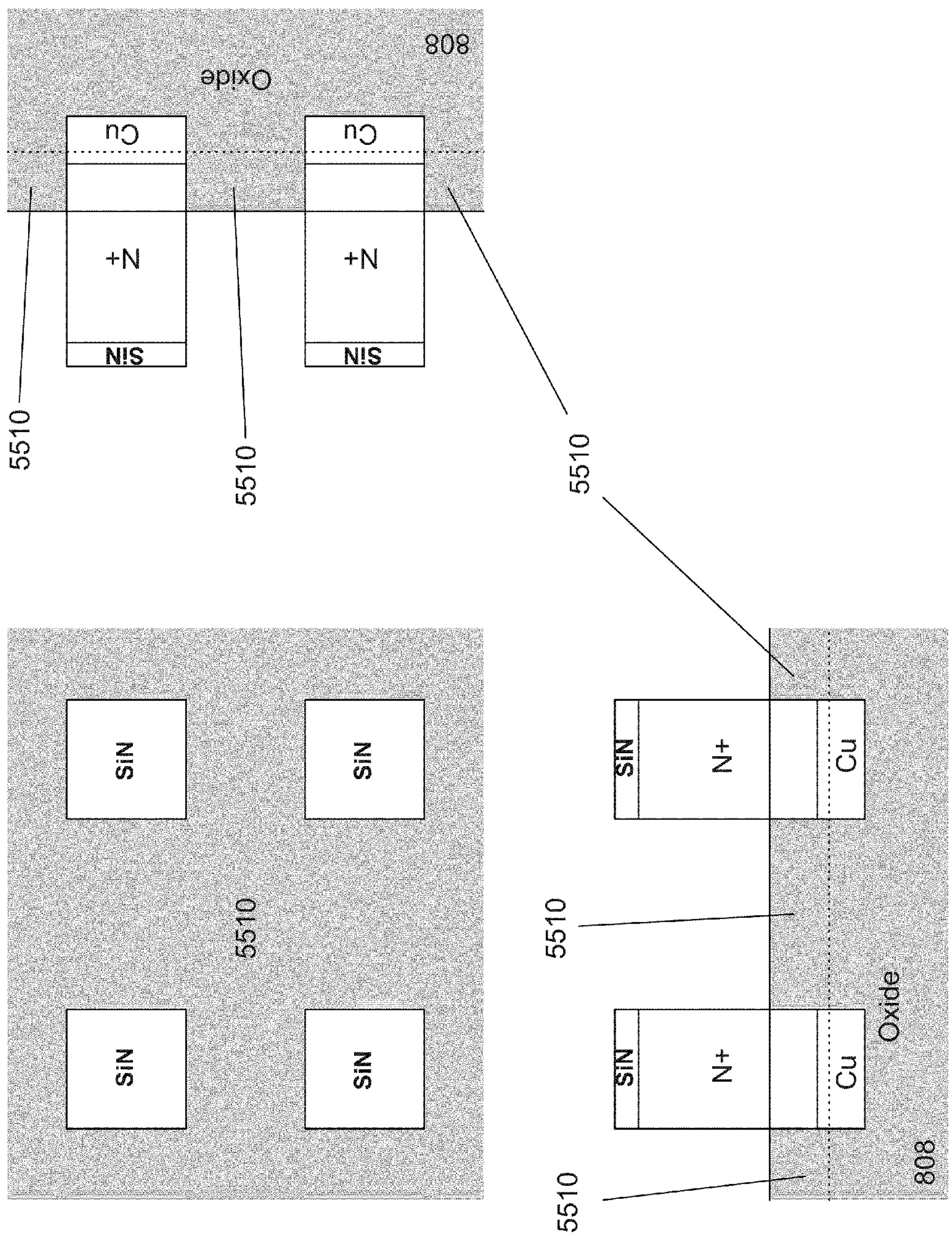
Figure 55D:
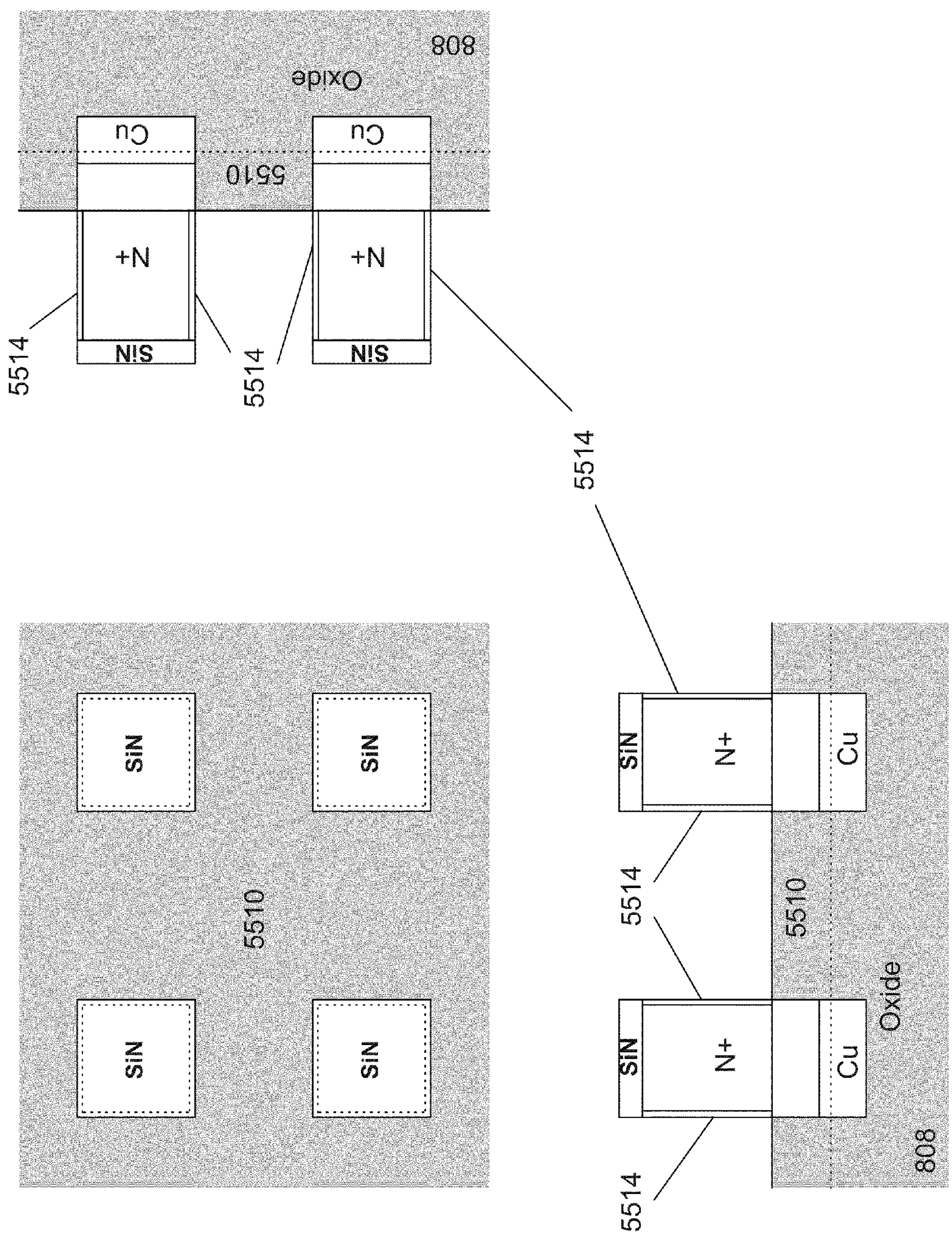
Figure 55E:
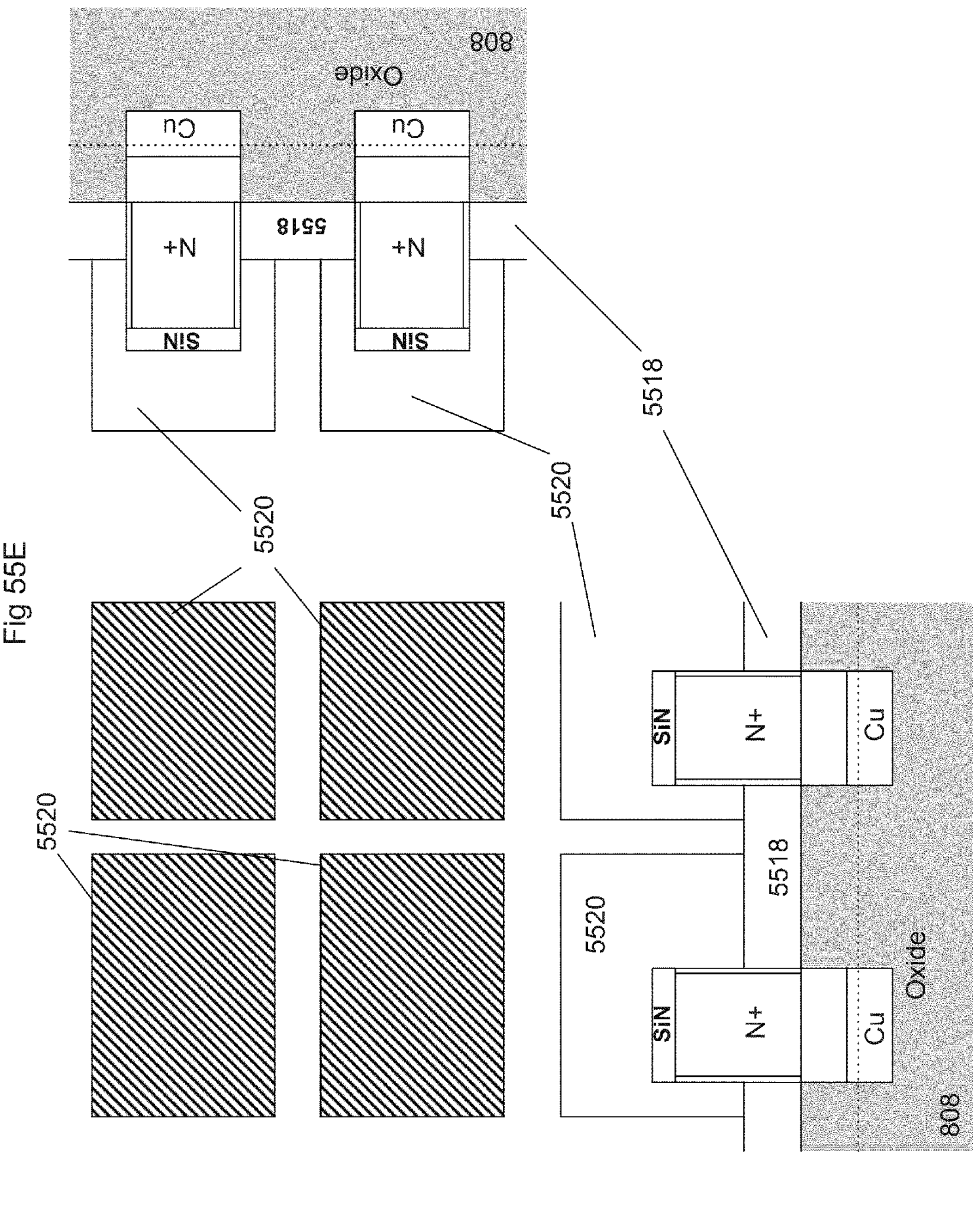
Figure 55F:
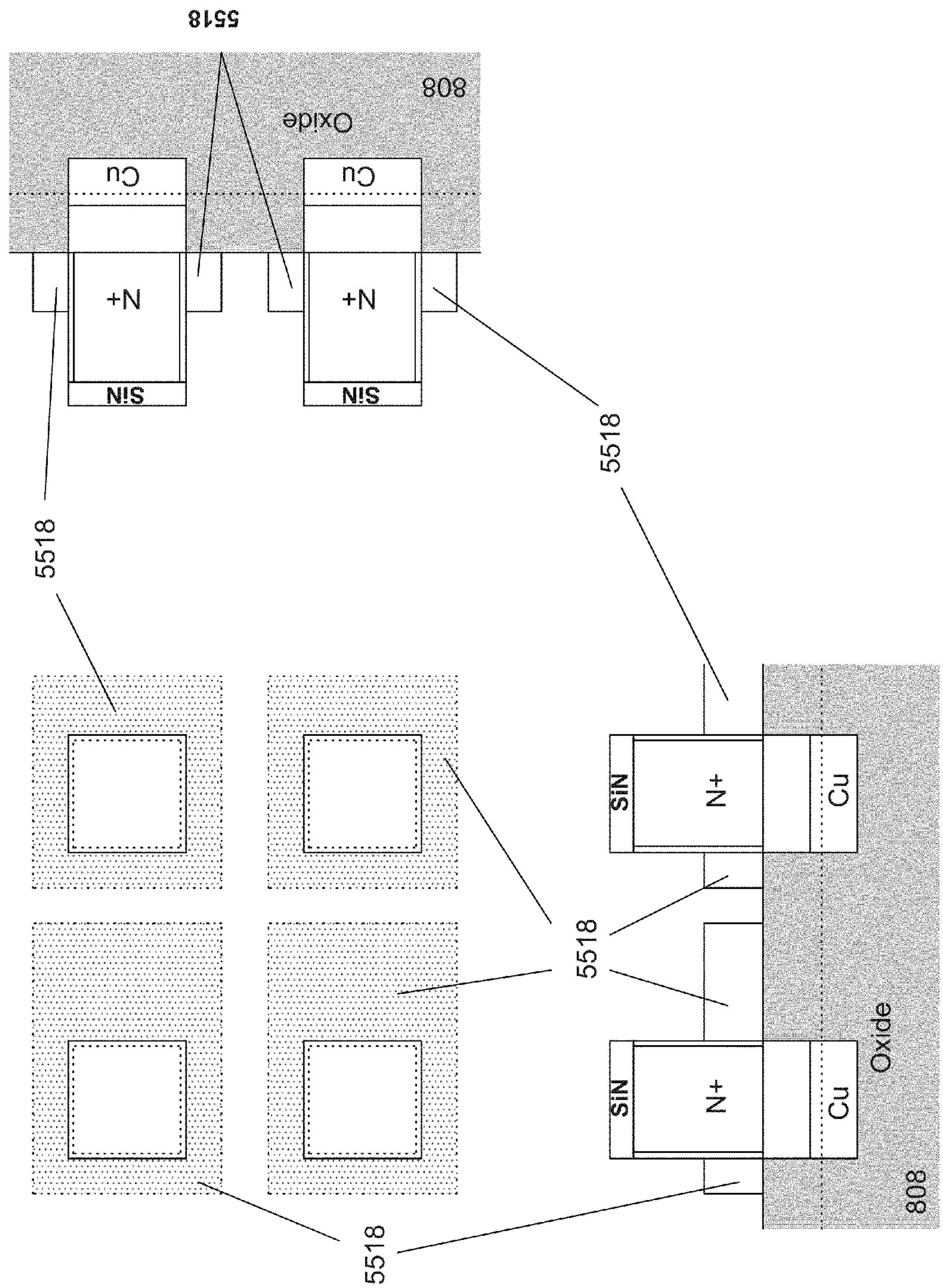
Figure 55G:
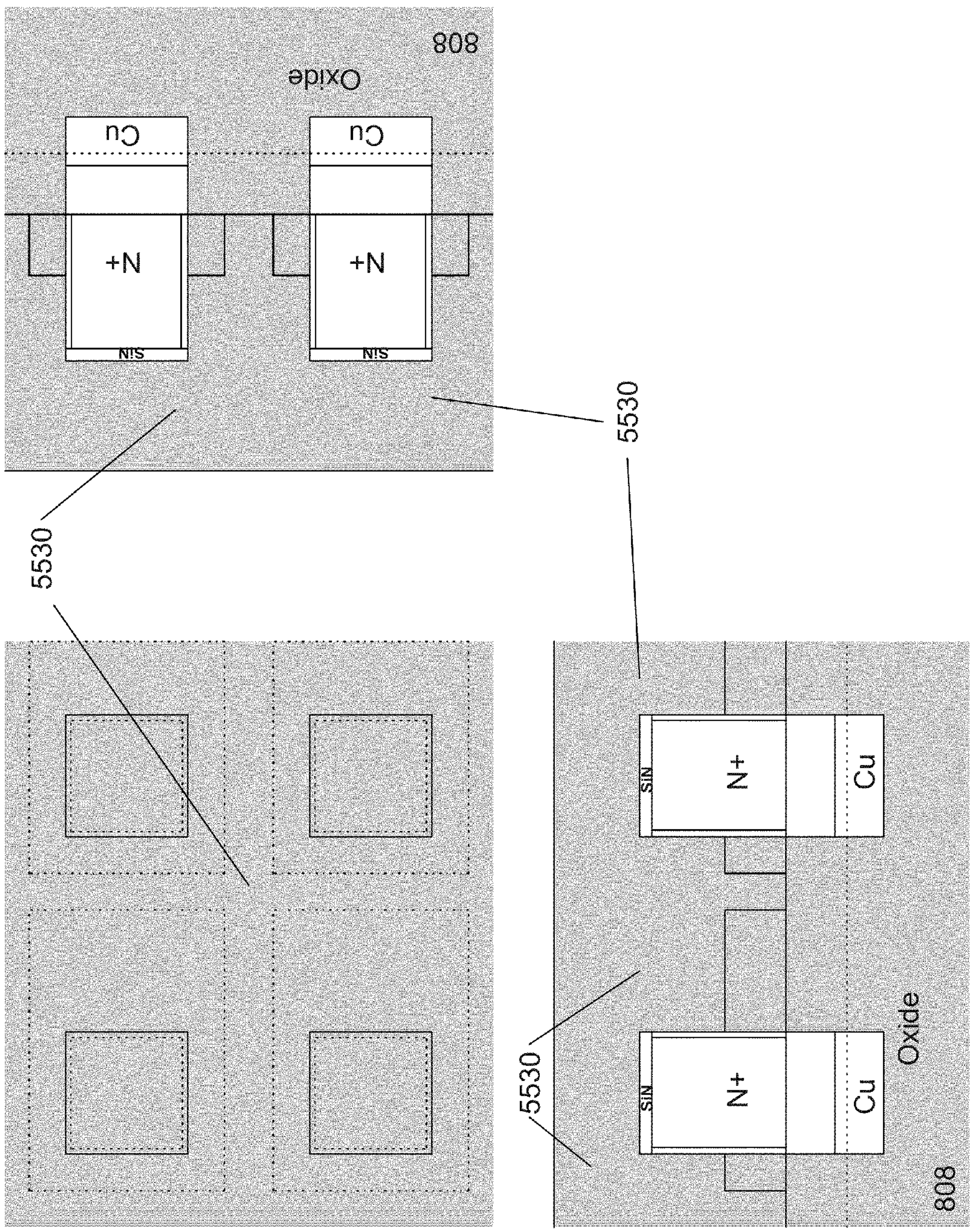
Figure 55H:
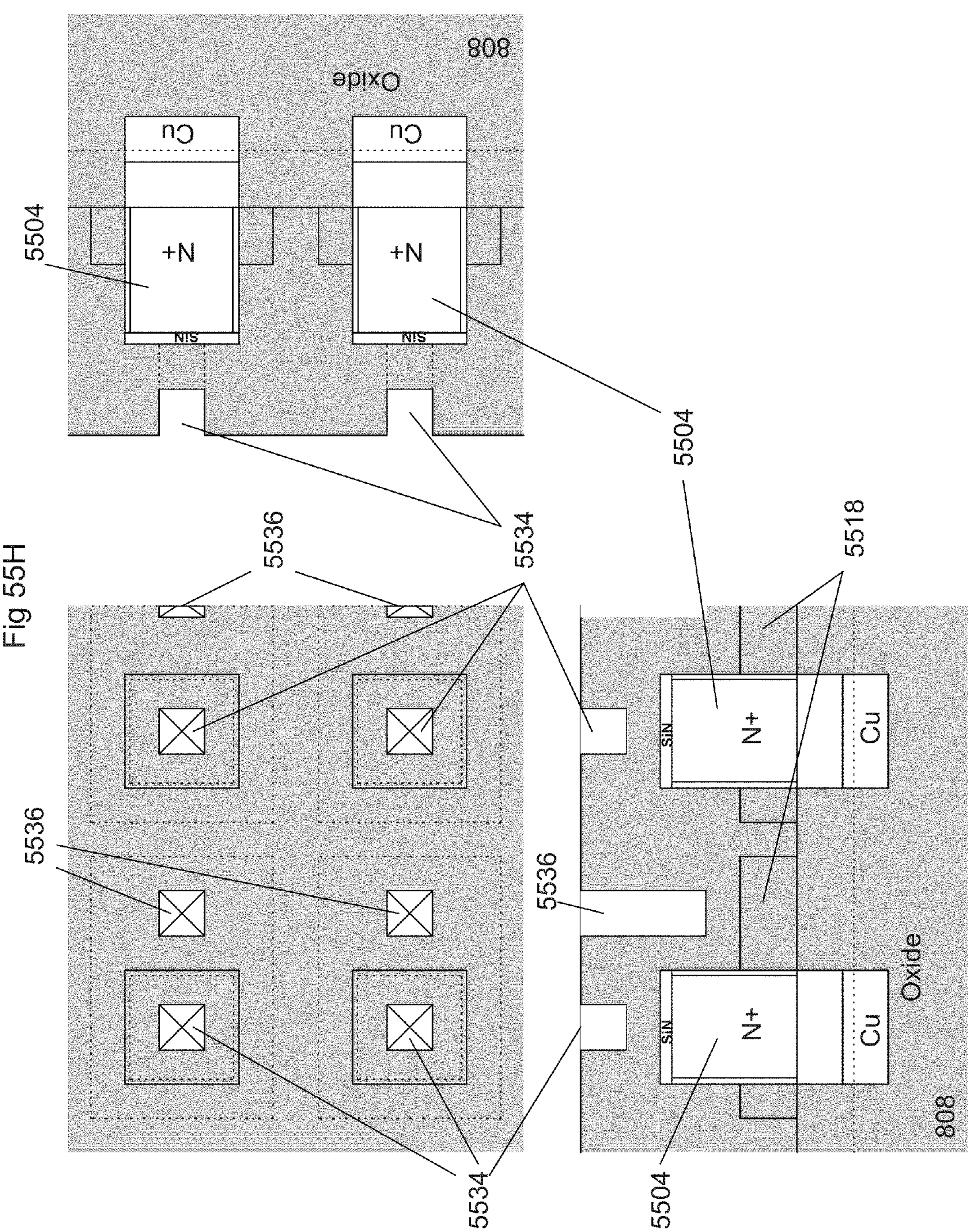
Figure 55I:
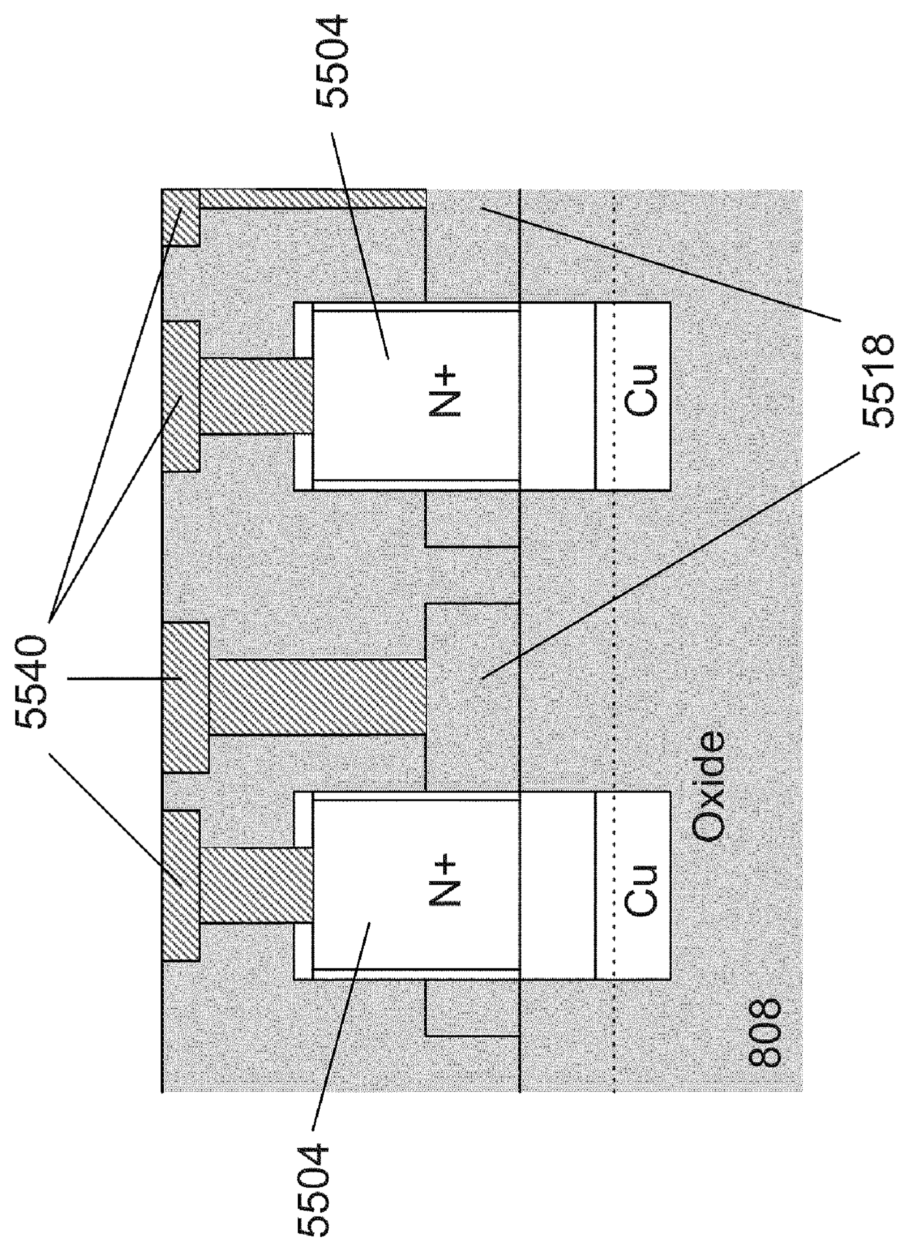

FIGS. 55A-55I are drawing illustrations of the formation of a vertical gate-all-around junction-less transistor utilizing the above preprocessed acceptor wafer or house 808 of FIG. 54C. FIG. 55A illustrates the deposition of a CMP and plasma etch stop layer 5502, such as low temperature SiN, on top of the N+ layer 5504. For simplicity, the barrier clad Al—Ge eutectic layers 5410, 5414, and 5416 of FIG. 54C are represented by one illustrated layer 5500. Similarly, FIGS. 55B-H are drawn as an orthographic projection to illustrate some process and topographical details. The junction-less transistor illustrated is square shaped when viewed from the top, but may be constructed in various rectangular shapes to provide different transistor channel thicknesses, widths, and gate control effects. In addition, the square shaped transistor illustrated may be intentionally formed as a circle when viewed from the top and hence form a vertical cylinder shape, or it may become that shape during processing subsequent to forming the vertical towers. The vertical transistor towers 5506 are mask defined and then plasma/Reactive-ion Etching (RIE) etched thru the Chemical Mechanical Polishing (CMP) stop layer 5502, N+ transistor channel layer 5504, the metal bonding layer 5500, and into the acceptor wafer or house 808 oxide, and then the photoresist is removed, as illustrated in FIG. 55B. This definition and etch now creates N+ transistor channel stacks that are electrically isolated from each other yet the bottom of N+ layer 5404 is electrically connected to the house metal layer 5420. The area between the towers is then partially filled with oxide 5510 via a Spin On Glass (SPG) spin, low temperature cure, and etch back sequence as illustrated in FIG. 55C. Alternatively, a low temperature CVD gap fill oxide may be deposited, then Chemically Mechanically Polished (CMP'ed) flat, and then selectively etched back to achieve the same shaped 5510 as shown in FIG. 55C. Alternatively, this step may also be accomplished by a conformal low temperature oxide CVD deposition and etch back sequence, creating a spacer profile coverage of the N+ resistor tower layer 5504. Next, the sidewall gate oxide 5514 is formed by a low temperature microwave oxidation technique, such as the TEL SPA (Tokyo Electron Limited Slot Plane Antenna) oxygen radical plasma, stripped by wet chemicals such as dilute HF, and grown again 5514 as illustrated in FIG. 55D. The gate electrode is then deposited, such as a P+ doped amorphous silicon layer 5518, then Chemically Mechanically Polished (CMP'ed) flat, and then selectively etched back to achieve the shape 5518 as shown in FIG. 55E, and then the gate mask photoresist 5520 may be defined as illustrated in FIG. 55E. The gate layer 5518 is etched such that the gate layer is fully cleared from between the towers and then the photoresist is stripped as illustrated in FIG. 55F. The spaces between the towers are filled and the towers are covered with oxide 5530 by low temperature gap fill deposition, CMP, then another oxide deposition as illustrated in FIG. 55G. In FIG. 55H, the contacts 5534 to the transistor channel tower N+ 5504 are masked and etched, and then the contacts 5518 to the gate electrode 5518 are masked and etch. The metal lines 5540 are mask defined and etched, filled with barrier metals and copper interconnect, and CMP'ed in a normal Dual Damascene interconnect scheme, thereby completing the contact via connections to the transistor channel tower N+ 5504 and the gate electrode 5518 as illustrated in FIG. 55I.

This flow enables the formation of fully crystallized silicon top vertical junction-less transistors that are connected to the underlying multi-metal layer semiconductor device without exposing the underlying devices and interconnect metals to high temperature. These junction-less transistors may be used as programming transistors of the Antifuse on acceptor wafer or house 808 or as a pass transistor for logic or FPGA use, or for additional uses in a 3D semiconductor device.

Figure 66:
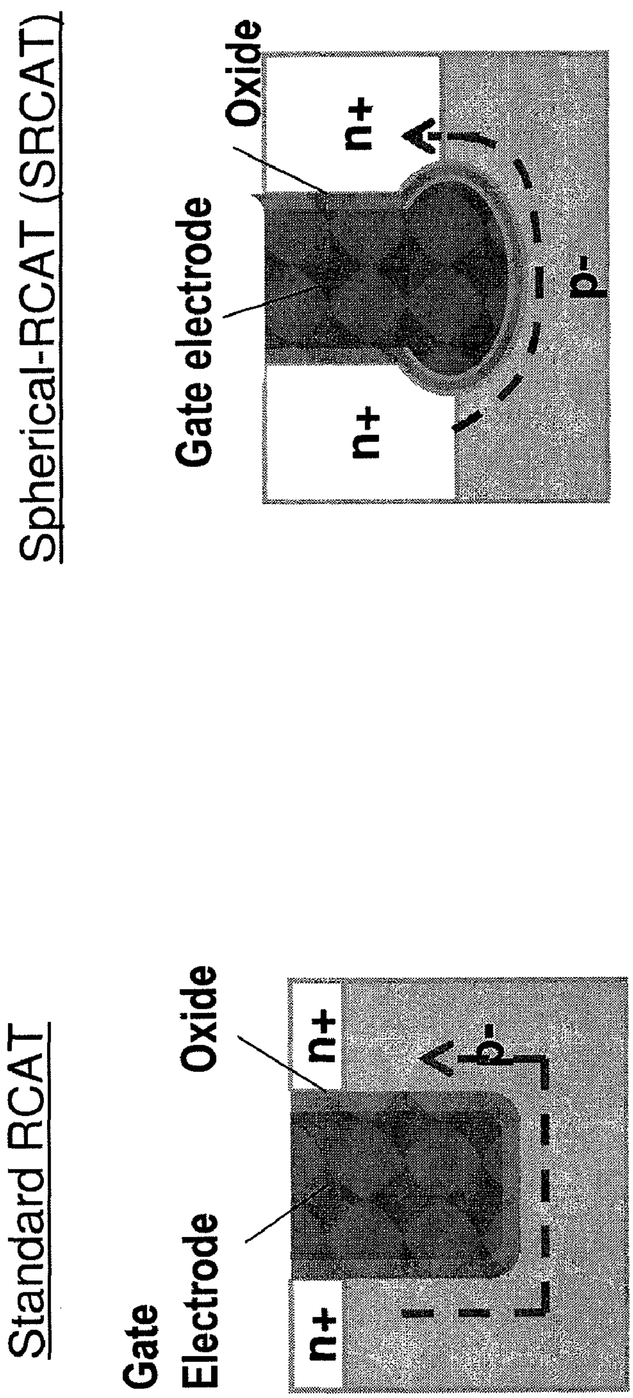
FIG. 66 are drawing illustrations of recessed channel array transistors.

Recessed Channel Array Transistors (RCATs) may be another transistor family that can utilize layer transfer and etch definition to construct a low-temperature monolithic 3D Integrated Circuit. Two types of RCAT device structures are shown in FIG. 66. These were described by J. Kim, et al. at the Symposium on VLSI Technology, in 2003 and 2005. Note that this prior art from Kim, et al. are for a single layer of transistors and did not use any layer transfer techniques. Their work also used high-temperature processes such as source-drain activation anneals, wherein the temperatures were above 400° C. In contrast, some embodiments of the current invention employ this transistor family in a two-dimensional plane.

Figure 67A:
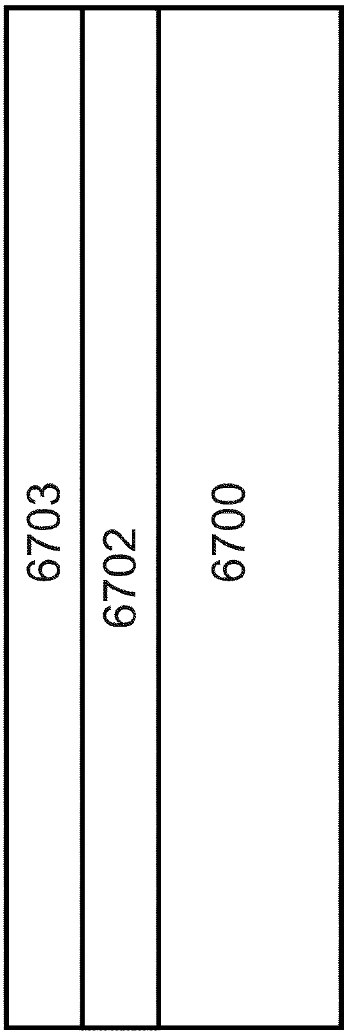
FIG. 67A-F are drawing illustrations of formation of recessed channel array transistors.
Figure 67B:
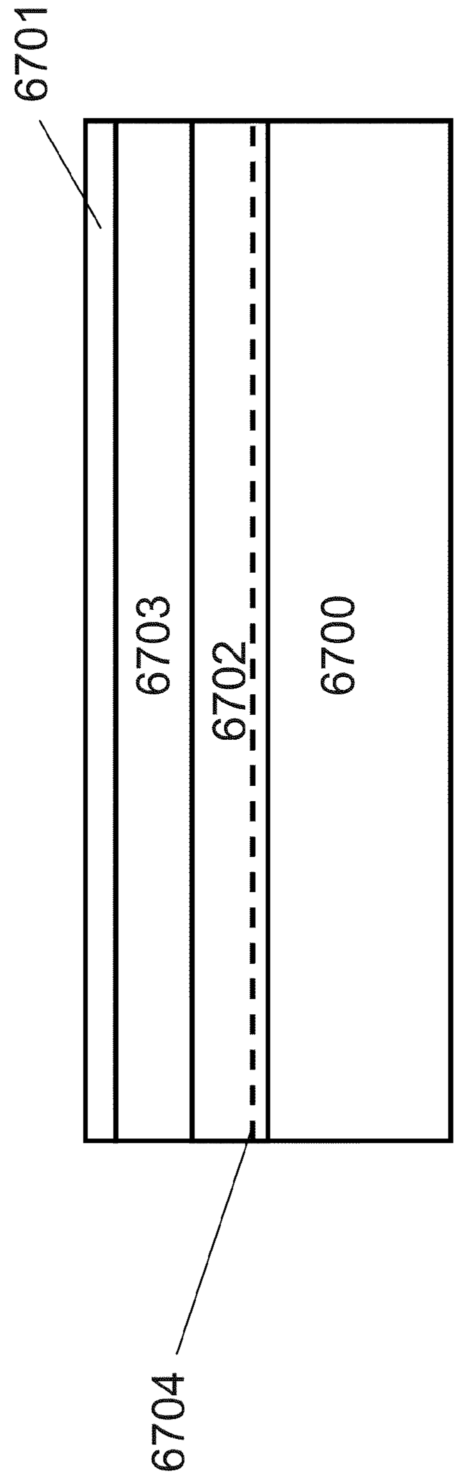
Figure 67C:
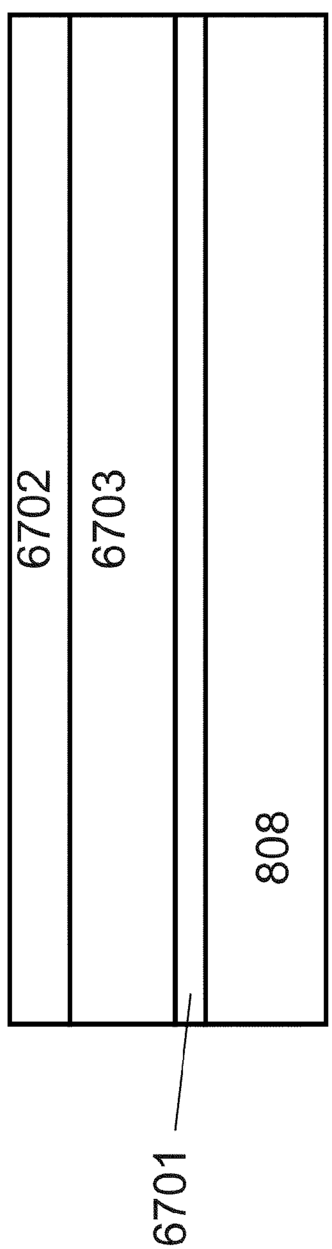
Figure 67D:
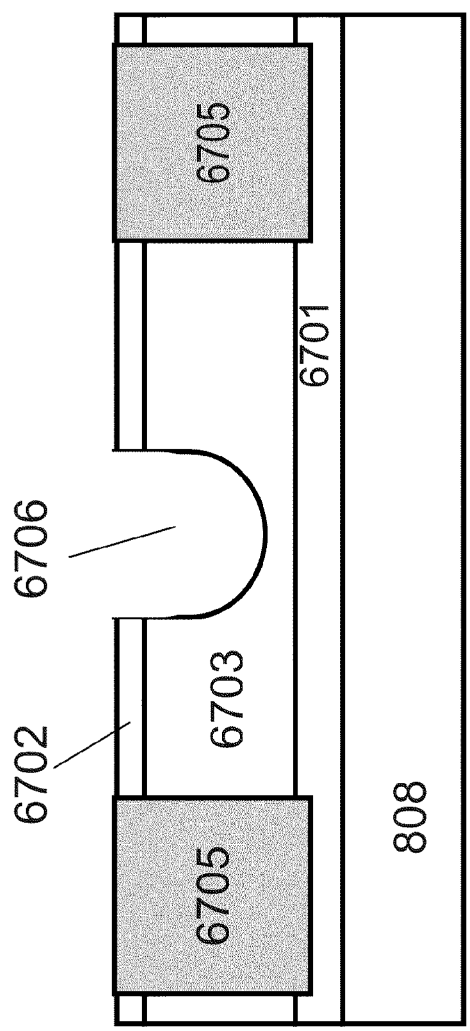
Figure 67E:
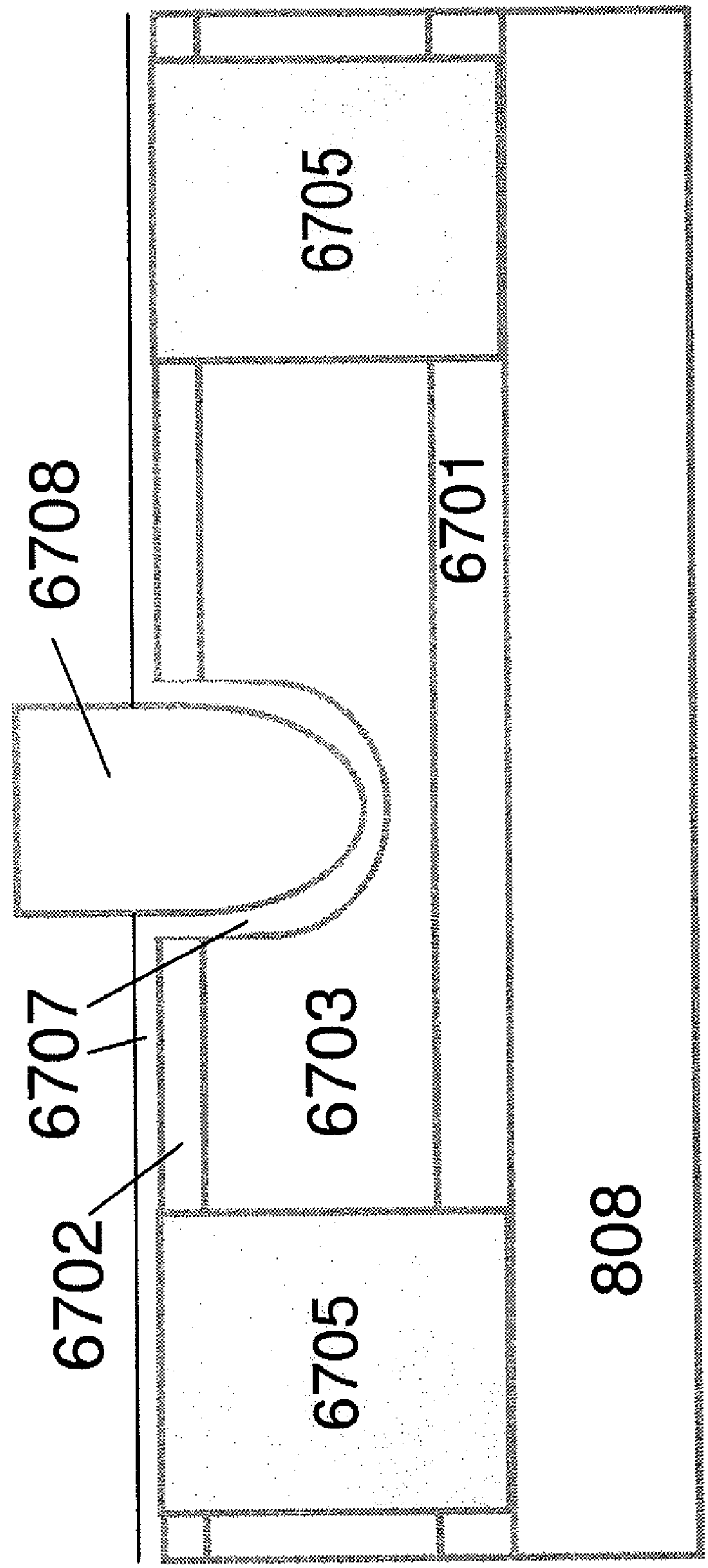
Figure 67F:
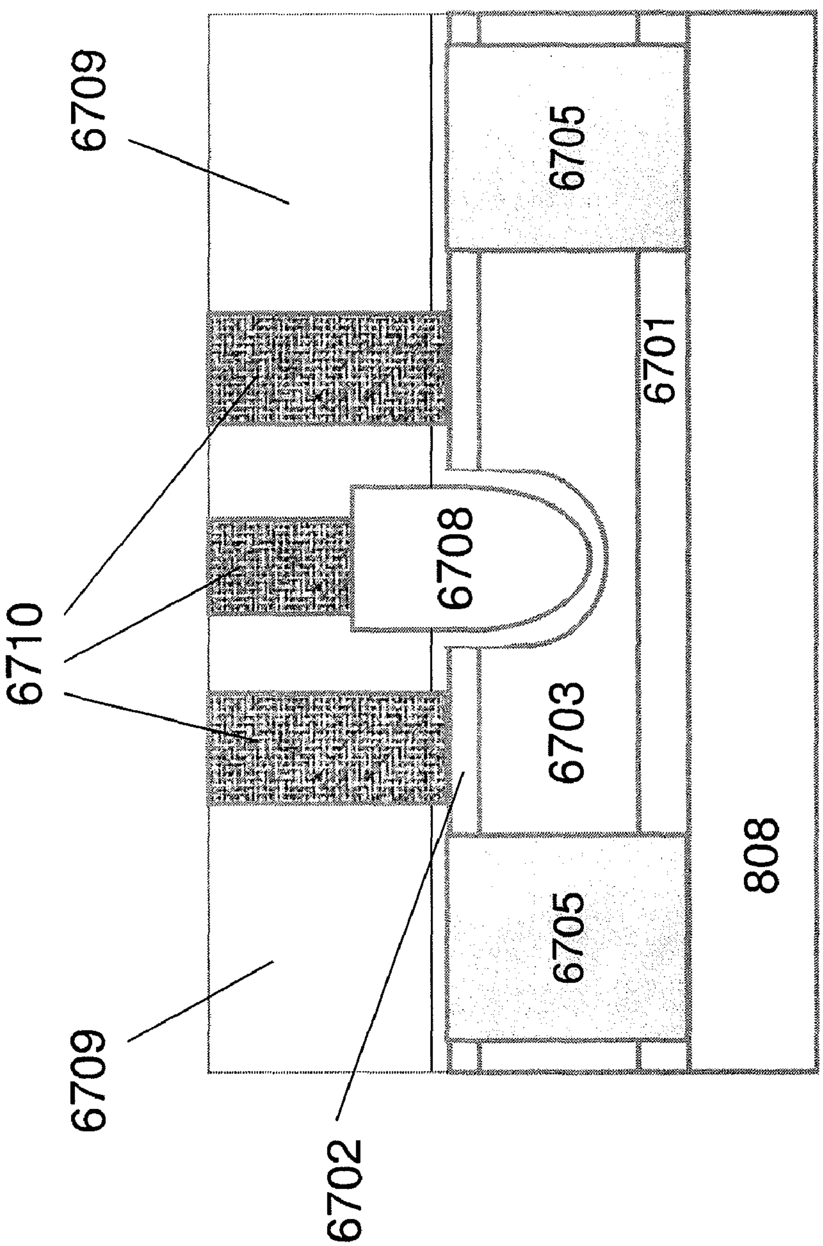

A layer stacking approach to construct 3D integrated circuits with standard RCATs is illustrated in FIG. 67A-F. For an n-channel MOSFET, a p− silicon wafer 6700 may be the starting point. A buried layer of n+ Si 6702 may then be implanted as shown in FIG. 67A, resulting in a layer of p− 6703 that is at the surface of the donor wafer. An alternative is to implant a shallow layer of n+ Si and then epitaxially deposit a layer of p− Si 6703. To activate dopants in the n+ layer 6702, the wafer may be annealed, with standard annealing procedures such as thermal, or spike, or laser anneal. An oxide layer 6701 may be grown or deposited, as illustrated in FIG. 67B. Hydrogen is implanted into the wafer 6704 to enable "smart cut" process, as indicated in FIG. 67B. A layer transfer process may be conducted to attach the donor wafer in FIG. 67B to a pre-processed circuits acceptor wafer 808 as illustrated in FIG. 67C. The implanted hydrogen layer 6704 may now be utilized for cleaving away the remainder of the wafer 6700. After the cut, chemical mechanical polishing (CMP) may be performed. Oxide isolation regions 6705 may be formed and an etch process may be conducted to form the recessed channel 6706 as illustrated in FIG. 67D. This etch process may be further customized so that corners are rounded to avoid high field issues. A gate dielectric 6707 may then be deposited, either through atomic layer deposition or through other low-temperature oxide formation procedures described previously. A metal gate 6708 may then be deposited to fill the recessed channel, followed by a CMP and gate patterning as illustrated in FIG. 67E. A low temperature oxide 6709 may be deposited and planarized by CMP. Contacts 6710 may be formed to connect to all electrodes of the transistor as illustrated in FIG. 67F. This flow enables the formation of a low temperature RCAT monolithically on top of pre-processed circuitry 808. A p-channel MOSFET may be formed with an analogous process. The p and n channel RCATs may be utilized to form a monolithic 3D CMOS circuit library as described later.

Figure 68A:
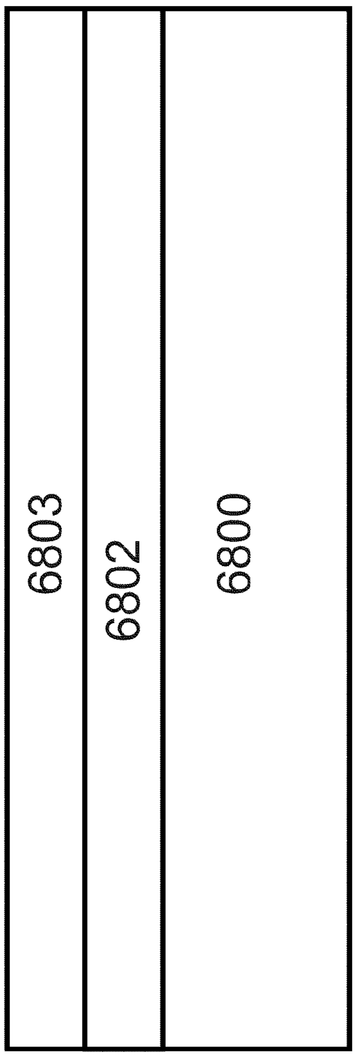
FIG. 68A-F are drawing illustrations of formation of spherical recessed channel array transistors.
Figure 68B:
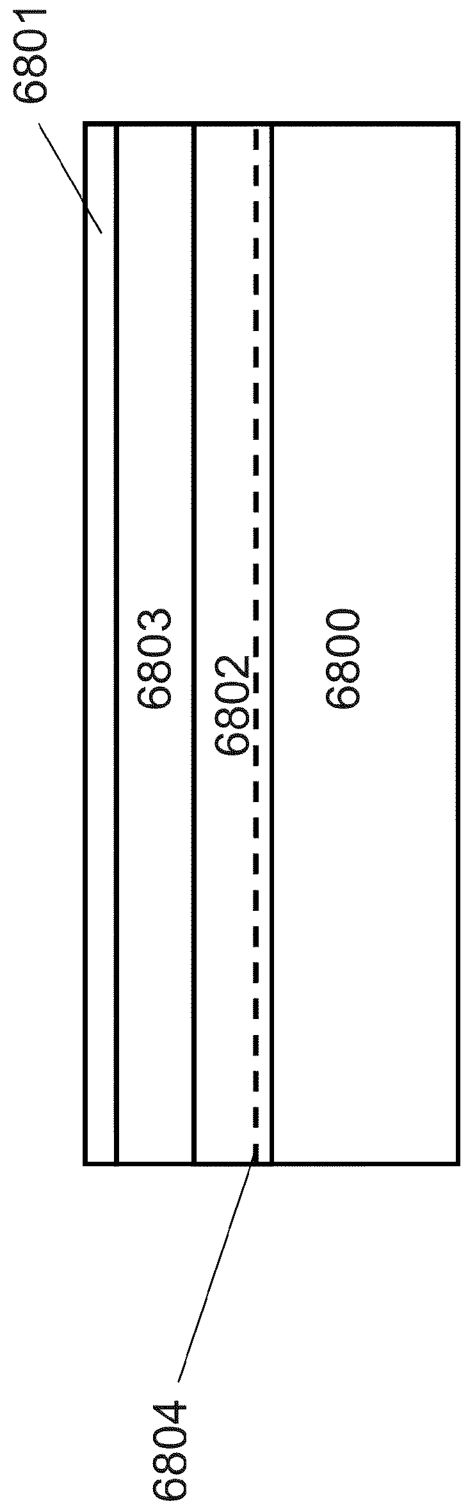
Figure 68C:
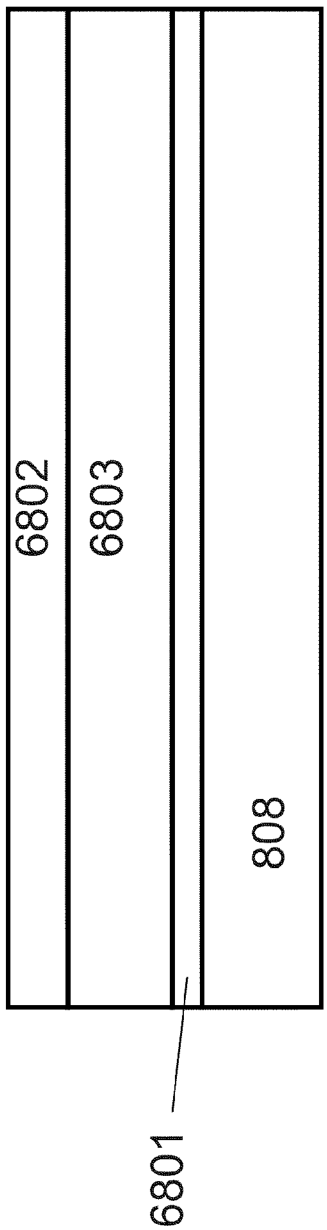
Figure 68D:
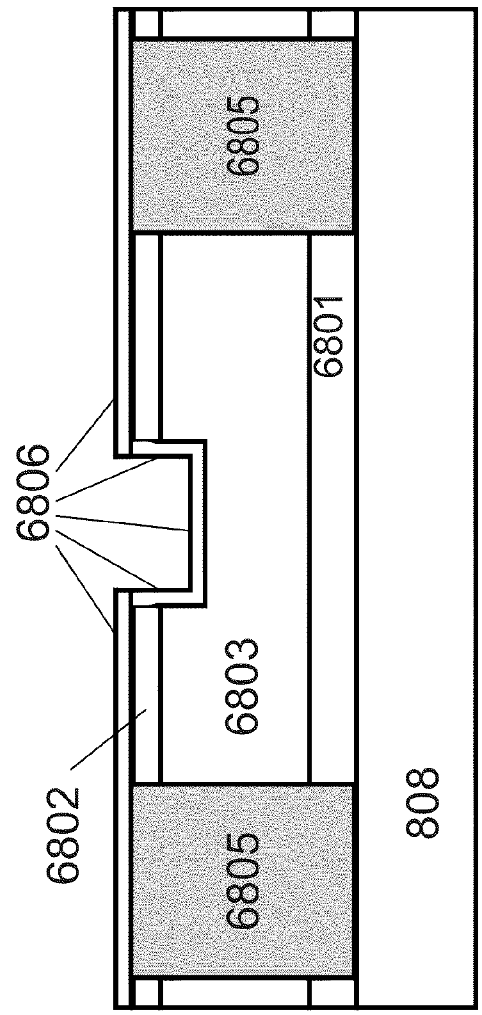
Figure 68E:
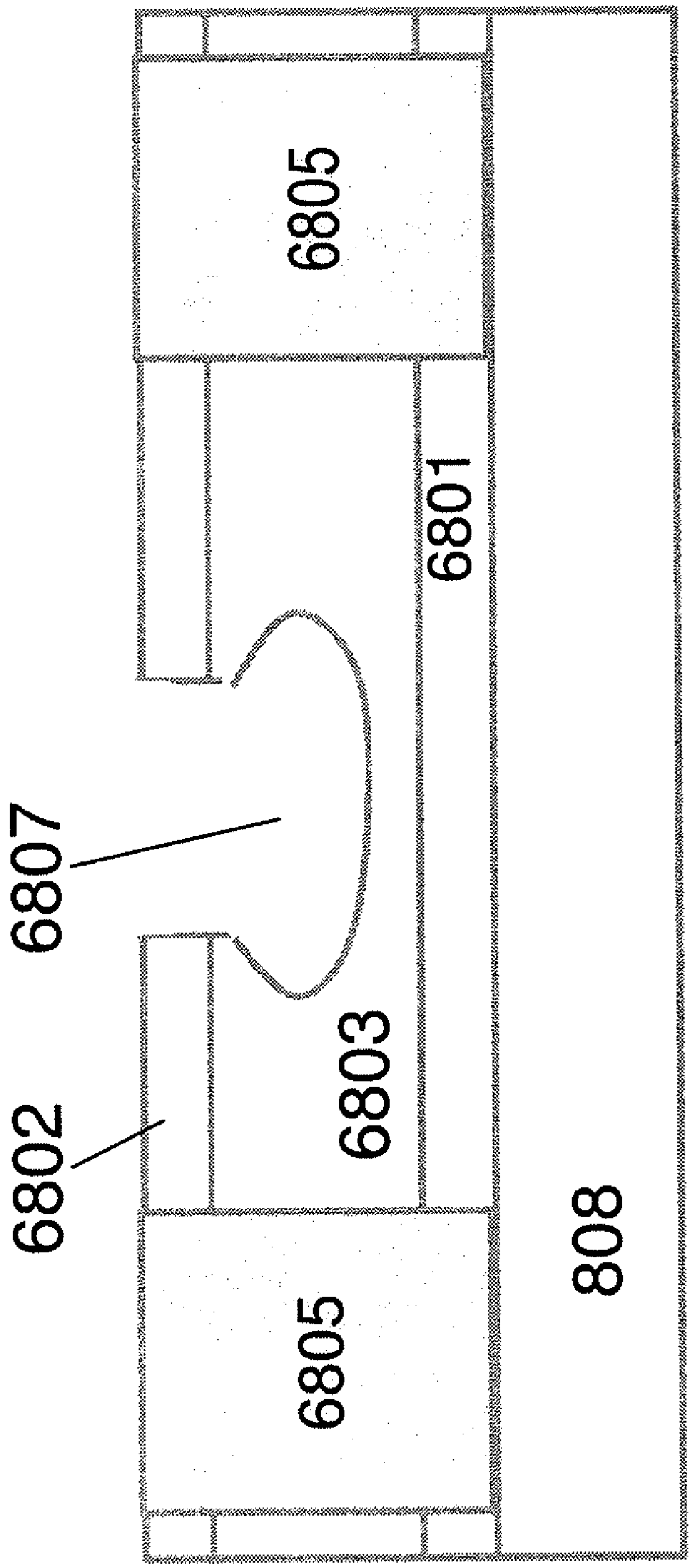
Figure 68F:
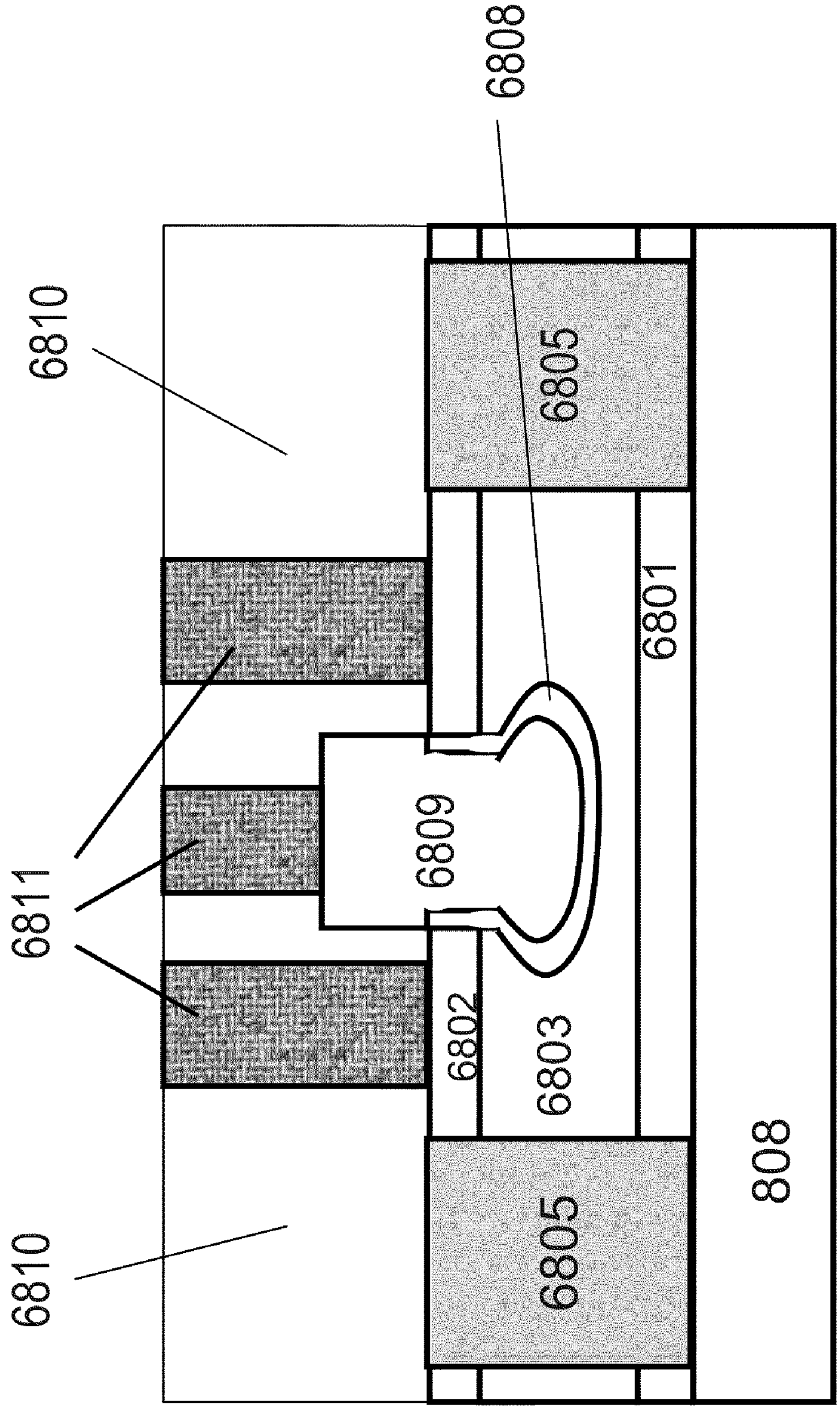

A layer stacking approach to construct 3D integrated circuits with spherical-RCATs (S-RCATs) is illustrated in FIG. 68A-F. For an n-channel MOSFET, a p− silicon wafer 6800 may be the starting point. A buried layer of n+ Si 6802 may then implanted as shown in FIG. 68A, resulting in a layer of p− 6803 at the surface of the donor wafer. An alternative is to implant a shallow layer of n+ Si and then epitaxially deposit a layer of p− Si 6803. To activate dopants in the n+ layer 6802, the wafer may be annealed, with standard annealing procedures such as thermal, or spike, or laser anneal. An oxide layer 6801 may be grown or deposited, as illustrated in FIG. 68B. Hydrogen may be implanted into the wafer 6804 to enable "smart cut" process, as indicated in FIG. 68B. A layer transfer process may be conducted to attach the donor wafer in FIG. 68B to a pre-processed circuits acceptor wafer 808 as illustrated in FIG. 68C. The implanted hydrogen layer 6804 may now be utilized for cleaving away the remainder of the wafer 6800. After the cut, chemical mechanical polishing (CMP) may be performed. Oxide isolation regions 6805 may be formed as illustrated in FIG. 68D. The eventual gate electrode recessed channel may be masked and partially etched, and a spacer deposition 6806 may be performed with a conformal low temperature deposition such as silicon oxide or silicon nitride or a combination. An anisotropic etch of the spacer may be performed to leave spacer material only on the vertical sidewalls of the recessed gate channel opening. An isotropic silicon etch may then be conducted to form the spherical recess 6807 as illustrated in FIG. 68E. The spacer on the sidewall may be removed with a selective etch. A gate dielectric 6808 may then be deposited, either through atomic layer deposition or through other low-temperature oxide formation procedures described previously. A metal gate 6809 may be deposited to fill the recessed channel, followed by a CMP and gate patterning as illustrated in FIG. 68F. A low temperature oxide 6810 may be deposited and planarized by the CMP. Contacts 6811 may be formed to connect to all electrodes of the transistor as illustrated in FIG. 68F. This flow enables the formation of a low temperature S-RCAT monolithically on top of pre-processed circuitry 808. A p-channel MOSFET may be formed with an analogous process. The p and n channel S-RCATs may be utilized to form a monolithic 3D CMOS circuit library as described later.

For the purpose of programming transistors, a single type of top transistor could be sufficient. Yet for logic type circuitry two complementing transistors might be helpful to allow CMOS type logic. Accordingly the above described various mono-type transistor flows could be performed twice. First perform all the steps to build the 'n' type, and than do an additional layer transfer to build the 'p' type on top of it.

Figure 30:
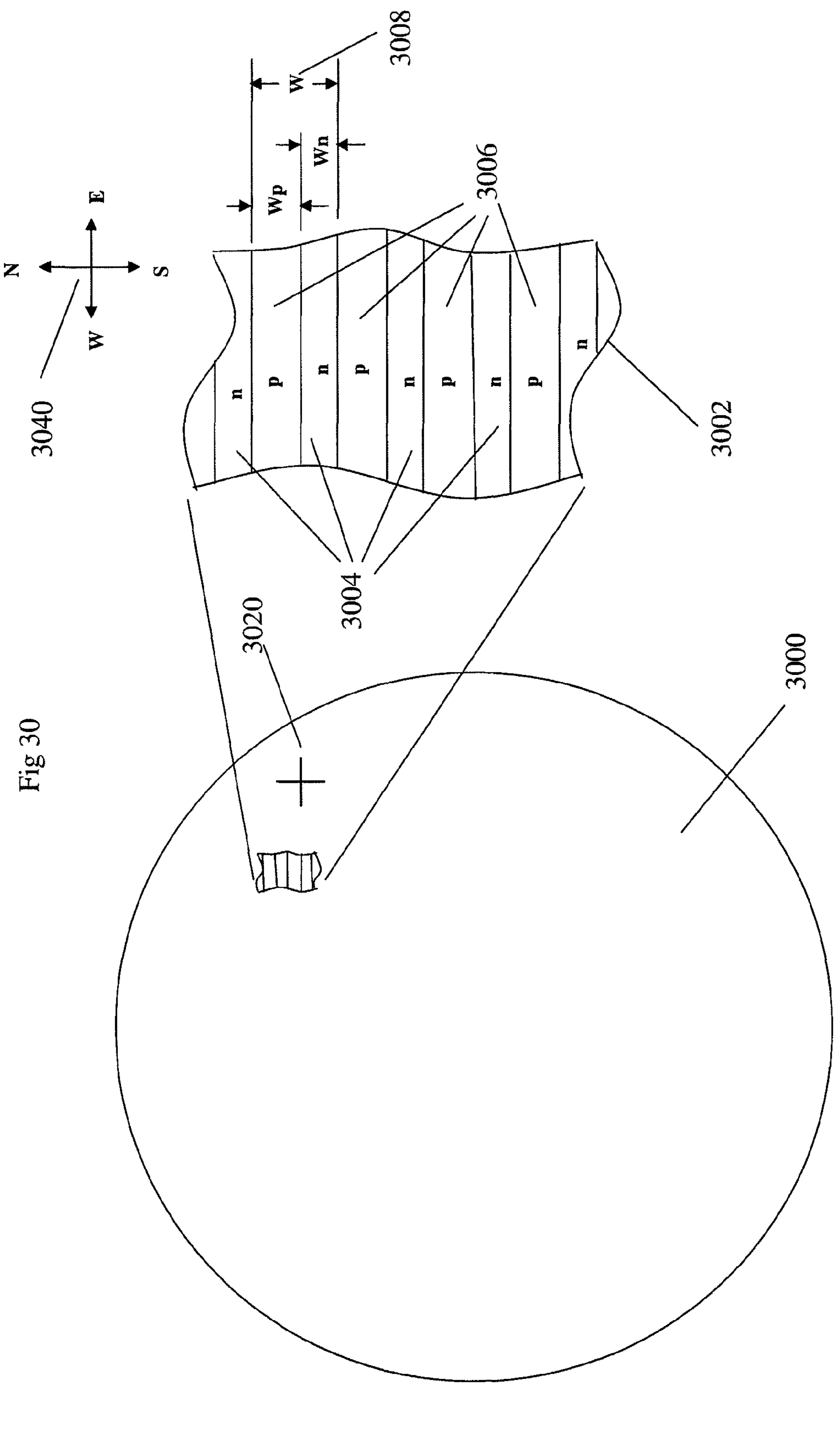
FIG. 30 is a drawing illustration of a donor wafer.

An additional alternative is to build both 'n' type and 'p' type transistors on the same layer. The challenge is to form these transistors aligned to the underlying layers 808. The innovative solution is described with the help of FIGS. 30 to 33. The flow could be applied to each of the transistor constructions described before as relating to FIGS. 21 to 29. The main difference is that now the donor wafer 2006 is pre-processed to build not just one transistor type but both types by comprising alternating rows throughout wafer 3000 for the build of 'n' type 3004 and 'p' type 3006 transistors as illustrated in FIG. 30. FIG. 30 also includes a four cardinal directions 3040 indicator, which will be used through FIG. 33 to assist the explanation. The width of the n-type rows 3004 is Wn and the width of the p-type rows 3006 is Wp and their sum W 3008 is the width of the repeating pattern. The rows traverse from East to West and the alternating repeats all the way from North to South. Wn and Wp could be set for the minimum width of the corresponding transistor plus its isolation in the selected process node. The wafer 3000 also has an alignment mark 3020 which is on the same layers of the donor wafer as the n 3004 and p 3006 rows and accordingly could be used later to properly align additional patterning and processing steps to said n 3004 and p 3006 rows.

Figure 31:
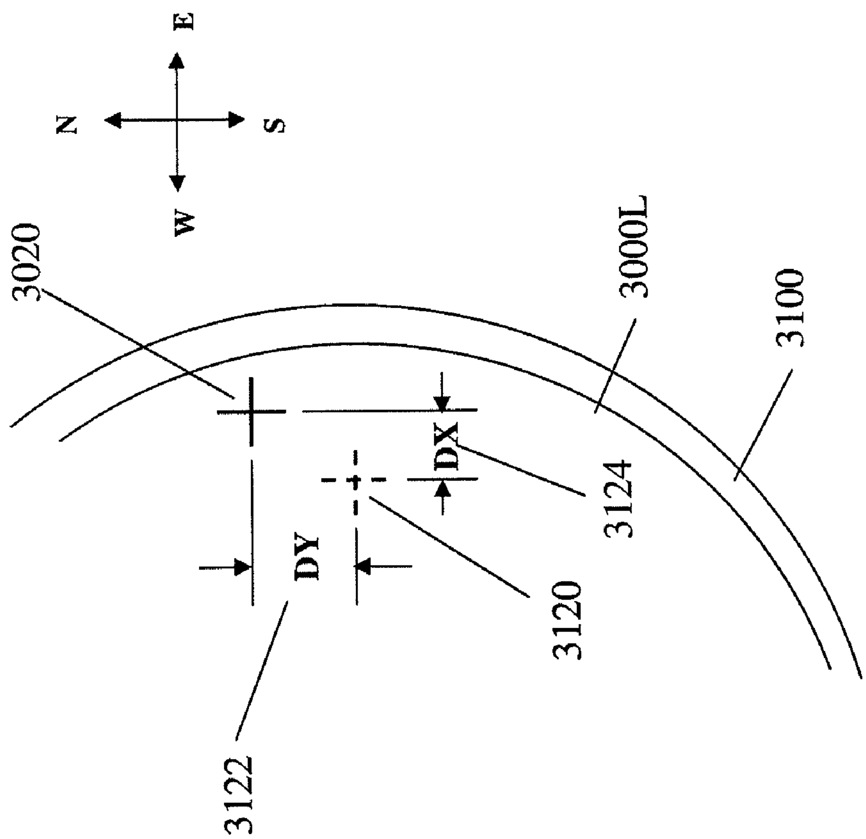
FIG. 31 is a drawing illustration of a transferred layer on top of a main wafer.

The donor wafer 3000 will be placed on top of the main wafer 2002 for a layer transfer as described previously in relation to FIG. 20. The state of the art allows for very good angular alignment of this bonding step but it is difficult to achieve a better than ~1 μm position alignment. FIG. 31 illustrates the main wafer 3100 with its alignment mark 3120 and the transferred layer 3000L of the donor wafer 3000 with its alignment mark 3020. The misalignment in the East-West direction is DX 3124 and the misalignment in the North-South direction is DY 3122. For simplicity of the following explanations we would assume that the alignment marks 3120 and 3020 are set so that the alignment mark of the transferred layer 3020 is always north of the alignment mark of the base wafer 3120. In addition, these alignment marks may be placed in only a few locations on each wafer, or within each step field, or within each die.

In the construction of this described monolithic 3D Integrated Circuits the objective is to connect structures built on layer 3000L to the underlying main wafer 3100 and to structures on 808 layers at about the same density and accuracy as the connections between layers in 808, which requires alignment accuracies on the order of tens of nm or better.

Figure 32:
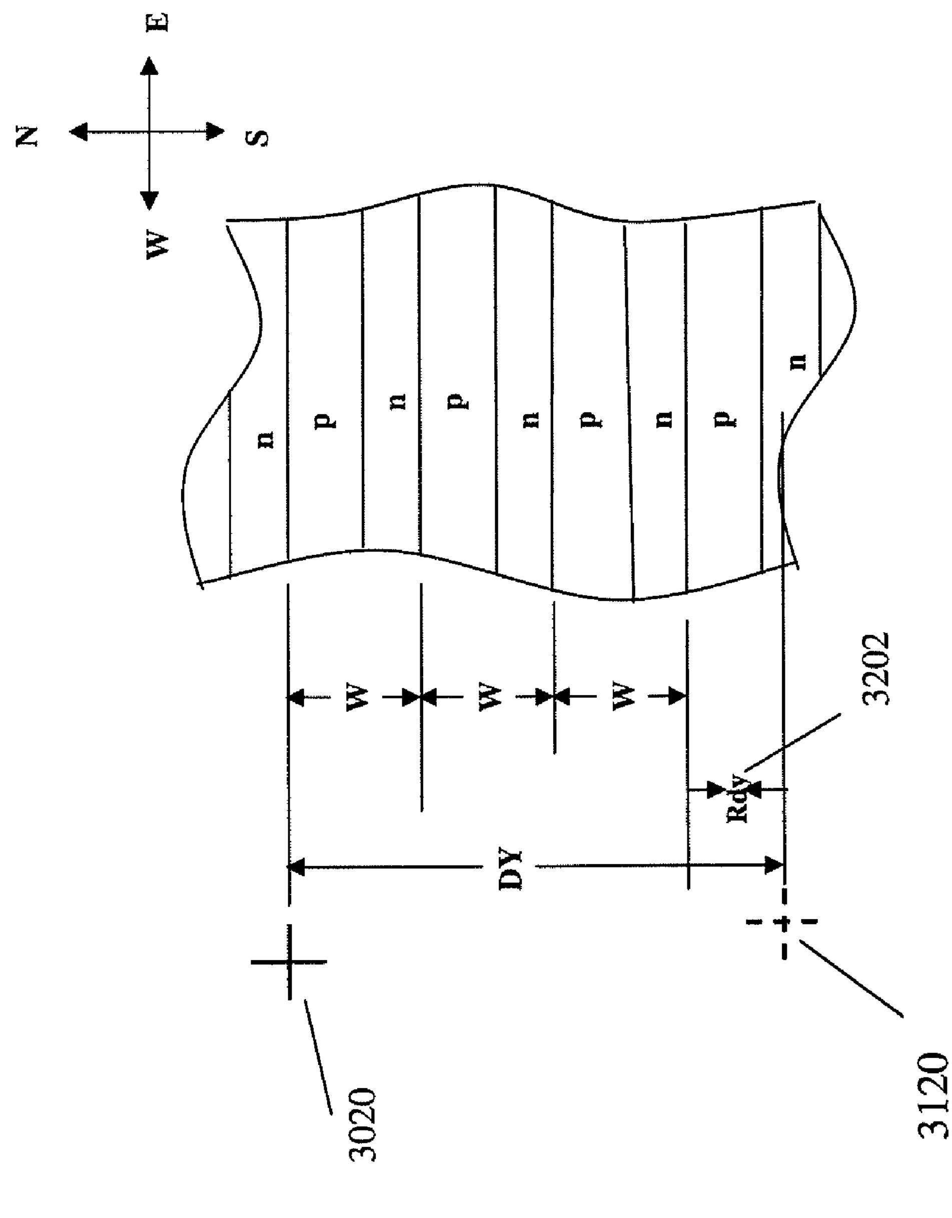
FIG. 32 is a drawing illustration of a measured alignment offset.

In the direction East-West the approach will be the same as was described before with respect to FIGS. 21 through 29. The pre-fabricated structures on the donor wafer 3000 are the same regardless of the misalignment DX 3124. Therefore just like before, the pre-fabricated structures may be aligned using the underlying alignment mark 3120 to form the transistors out of the 'n' 3004 and 'p' 3006 rows by etching and additional processes as described regardless of DX. In the North-South direction it is now different as the pattern does change. Yet the advantage of the proposed structure of the repeating pattern in the North-South direction of alternating rows illustrated in FIG. 30 arises from the fact that for every distance W 3008, the pattern repeats. Accordingly the effective alignment uncertainty may be reduced to W 3008 as the pattern in the North-South direction keeps repeating every W. So it may be calculated as to how many Ws—full patterns of 'n' 3004 and 'p' 3006 row pairs would fit in DY 3122 and what would be the residue Rdy 3202 (reminder of DY modulo W, 0<=Rdy<W) as illustrated in FIG. 32. Accordingly the North-South direction alignment will be to the underlying alignment mark 3120 offset by Rdy 3202 to properly align to the nearest n 3004 and p 3006.

Figure 33A:
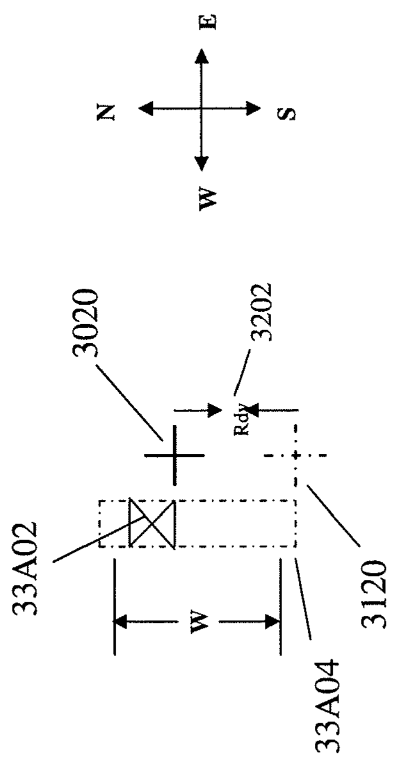
FIG. 33A, 33B is a drawing illustration of a connection strip.
Figure 33B:
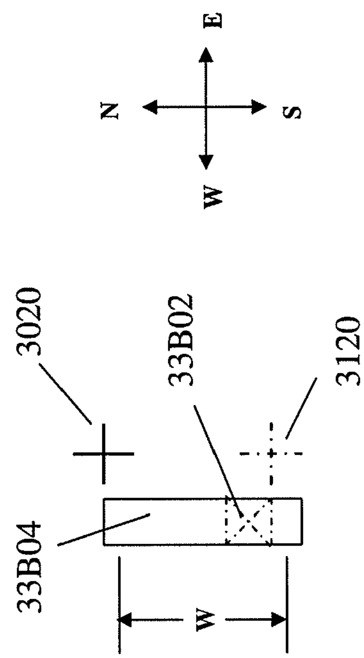

Each wafer that will be processed according through this flow will have a specific Rdy 3202 which will be subject to the actual misalignment DY 3122. But the masks used for patterning the various patterns need to be pre-designed and fabricated and remain the same for all wafers (processed for the same end-device) regardless of the actual misalignment. In order to improve the connection between structures on the transferred layer 3000L and the underlying main wafer 3100, the underlying wafer 3100 is designed to have a landing zone of a strip 33A04 going North-South of length W 3008 plus any extension required for the via design rules, as illustrated in FIG. 33A. The strip 33A04 is part of the base wafer 3100 and accordingly aligned to its alignment mark 3120. Via 33A02 going down and being part of a top layer 3000L pattern (aligned to the underlying alignment mark 3120 with Rdy offset) will be connected to the landing zone 33A04.

Alternatively a North-South strip 33B04 with at least W length, plus extensions per the via design rules, may be made on the upper layer 3000L and accordingly aligned to the underlying alignment mark 3120 with Rdy offset, thus connected to the via 33B02 coming 'up' and being part of the underlying pattern aligned to the underlying alignment mark 3120 (with no offset).

Figure 34A:
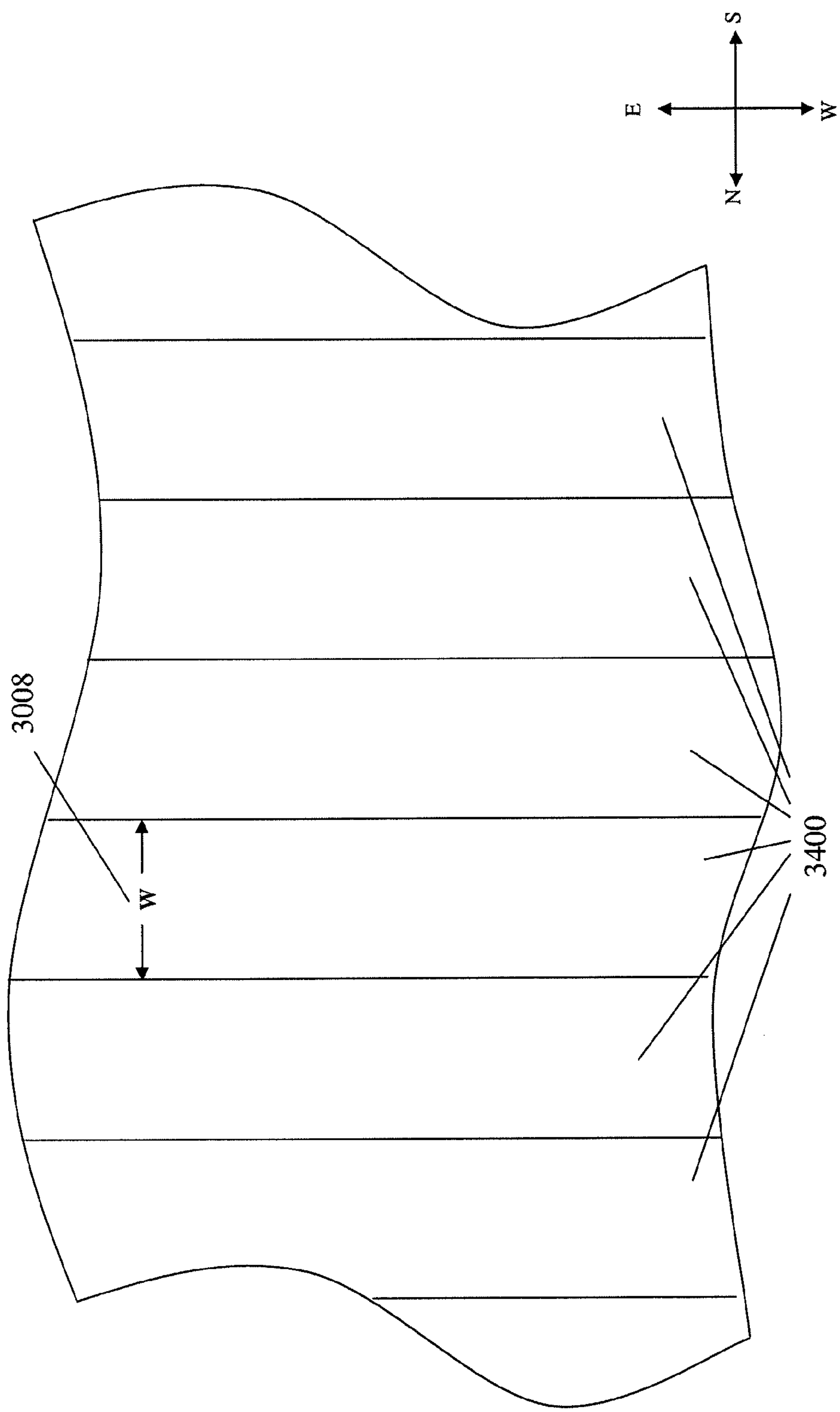
FIG. 34A-34E are drawing illustrations of pre-processed wafers used for a layer transfer.
Figure 34B:
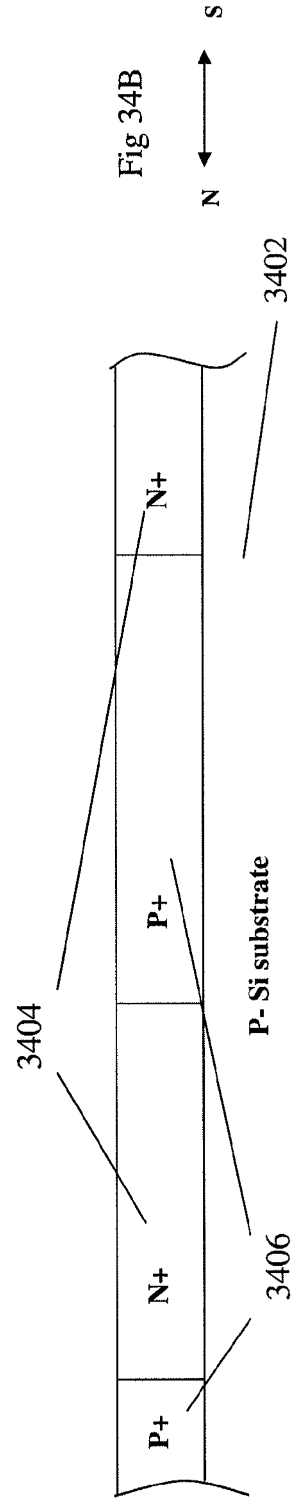
Figure 34C:
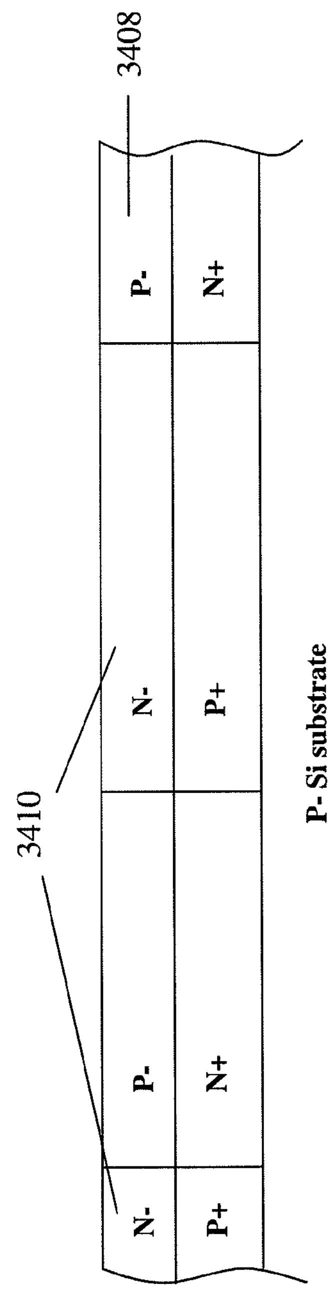
Figure 34D:
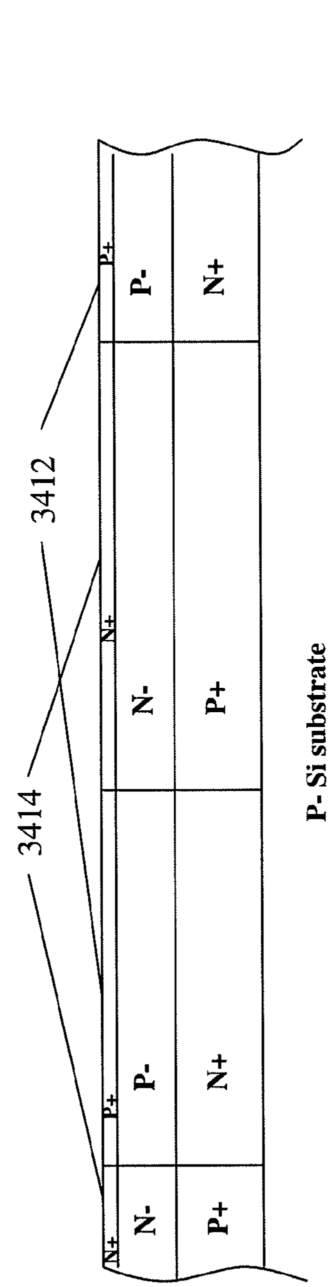
Figure 34E:
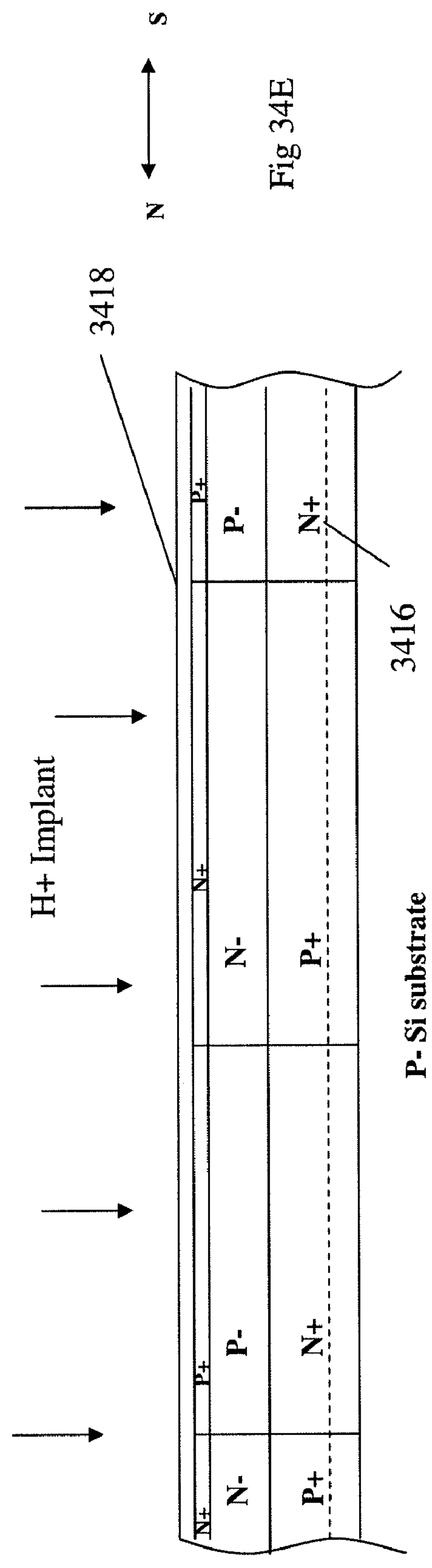
Figures 35A, 35B, 35C:
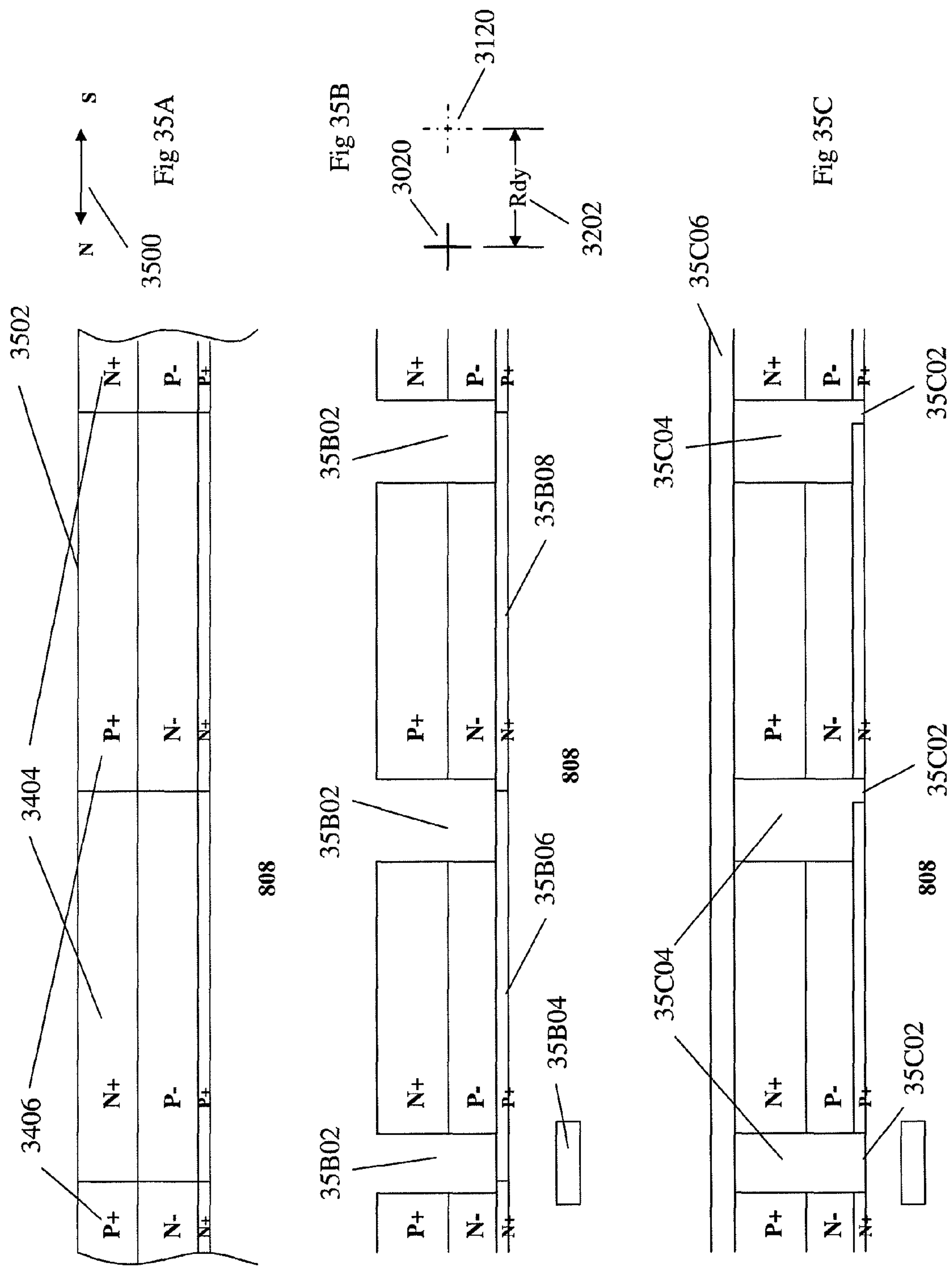
FIG. 35A-35G are drawing illustrations of formations of top planar transistors.

An example of a process flow to create complementary transistors on a single transferred layer for CMOS logic is as follows. First, a donor wafer is preprocessed to be prepared for the layer transfer 2006 as illustrated in FIG. 20. This complementary donor wafer is specifically processed to create wafer long repeating rows 3400 of p and n wells whereby their combined widths is W 3008 as illustrated in FIG. 34A. FIG. 34A is rotated 90 degrees with respect to FIG. 30 as indicated by the four cardinal directions indicator, to support the following description. FIG. 34B is a cross-sectional drawing illustration of a pre-processed wafer used for a layer transfer. Second, a P− wafer 3402 is processed to have a "buried" layer of N+ 3404 and of P+ 3406 by masking, ion implantation, and activation in repeated widths of W 3008. This is followed by a P− epi growth (epitaxial growth) 3408 and a mask, ion implantation, and anneal of N− 3410 in FIG. 34C. Third, a shallow P+ 3412 and N+ 3414 are formed by mask, shallow ion implantation, and RTA activation as shown in FIG. 34D. FIG. 34E is a drawing illustration of the pre-processed wafer for a layer transfer by an implant of an atomic species, such as H+, preparing the SmartCut "cleaving plane" 3416 in the lower part of the deep N+ & P+ regions. Fourthly, a thin layer of oxide 3418 is deposited or grown to facilitate the oxide-oxide bonding to the layer 808. This oxide 3418 may be deposited or grown before the H+implant, and may comprise differing thicknesses over the P+ 3412 and N+ 3414 regions so as to allow an even H+ implant range stopping to facilitate a level and continuous Smart Cut cleave plane 3416. Adjusting the depth of the H+ implant if needed could be achieved in other ways including different implant depth setting for the P+ 3412 and N+ 3414 regions. Now a layer-transfer-flow is performed, as illustrated in FIG. 20, to transfer the pre-processed striped multi-well single crystal silicon wafer on top of 808 as shown in FIG. 35A. The cleaved surface 3502 may or may not be smoothed by a combination of CMP and chemical polish techniques.

A variation of the p & n well stripe donor wafer preprocessing above is to also preprocess the well isolations with shallow trench etching, dielectric fill, and CMP prior to the layer transfer.

Figures 35D, 35E, 35F:
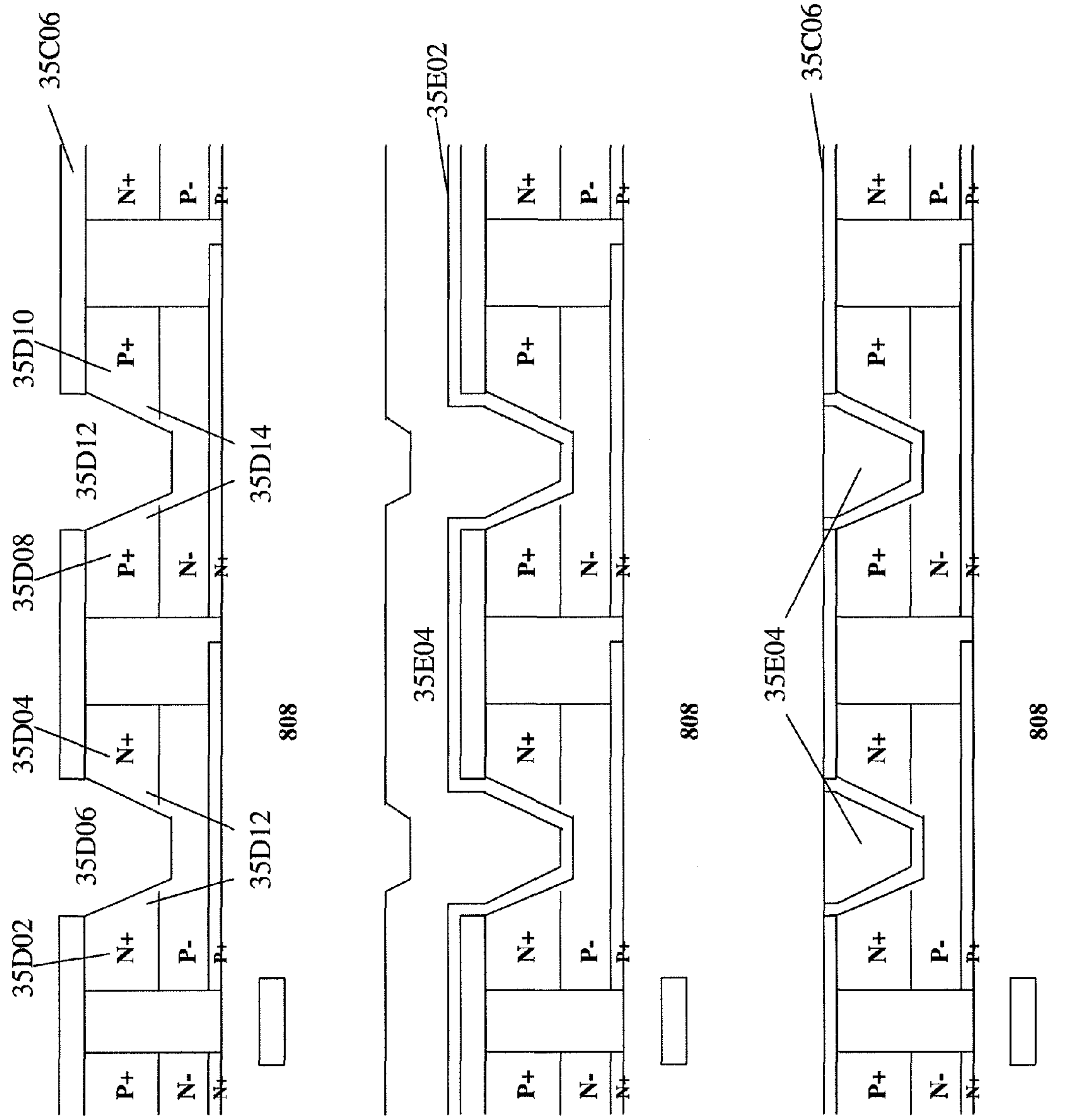

The step by step low temperature formation side views of the planar CMOS transistors on the complementary donor wafer (FIG. 34) is illustrated in FIGS. 35A to 35G. FIG. 35A illustrates the layer transferred on top of the second antifuse layer with its configurable interconnects 808 after the smart cut 3502 wherein the N+ 3404 & P+ 3406 are on top running in the East to West direction and repeating widths in the North to South direction as indicated by cardinal 3500. Then the substrate P+ 35B06 and N+ 35B08 source and 808 metal layer 35B04 access openings, as well as the transistor isolation 35B02 are masked and etched in FIG. 35B. This and all subsequent masking layers are aligned as described and shown above in FIG. 30-32 and is illustrated in FIG. 35B where the layer alignment mark 3020 is aligned with offset Rdy to the base wafer layer 808 alignment mark 3120. Utilizing an additional masking layer, the isolation region 35C02 is defined by etching all the way to the top of 808 to provide full isolation between transistors or groups of transistors in FIG. 35C. Then a Low-Temperature Oxide 35C04 is deposited and chemically mechanically polished. Then a thin polish stop layer 35C06 such as low temperature silicon nitride is deposited resulting in the structure illustrated in FIG. 35C. The n-channel source 35D02, drain 35D04 and self-aligned gate 35D06 are defined by masking and etching the thin polish stop layer 35C06 and then a sloped N+ etch as illustrated in FIG. 35D. The above is repeated on the P+ to form the p-channel source 35D08, drain 35D10 and self-aligned gate 35D12 to create the complementary devices and form Complimentary Metal Oxide Semiconductor (CMOS). Both sloped (35-90 degrees, 45 is shown) etches may be accomplished with wet chemistry or plasma etching techniques. This etch forms N+ angular source and drain extensions 35D12 and P+ angular source and drain extension 35D14. FIG. 35E illustrates the structure following deposition and densification of a low temperature based Gate Dielectric 35E02, or alternately a low temperature microwave plasma oxidation of the silicon surfaces, to serve as the n & p MOSFET gate oxide, and then deposition of a gate material 35E04, such as aluminum or tungsten. Alternatively, a high-k metal gate structure may be formed as follows. Following an industry standard HF/SC1/SC2 clean to create an atomically smooth surface, a high-k dielectric 35E02 is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing $N^+$ poly as the gate electrode needs to have a work function of ~4.2 eV for the device to operate properly and at the right threshold voltage. Alternatively, a metal replacing $P^+$ poly as the gate electrode needs to have a work function of ~5.2 eV to operate properly. The TiAl and TiAlN based family of metals, for example, could be used to tune the work function of the metal from 4.2 eV to 5.2 eV. The gate oxides and gate metals may be different between the n and p channel devices, and is accomplished with selective removal of one type and replacement of the other type.

Figure 35G:
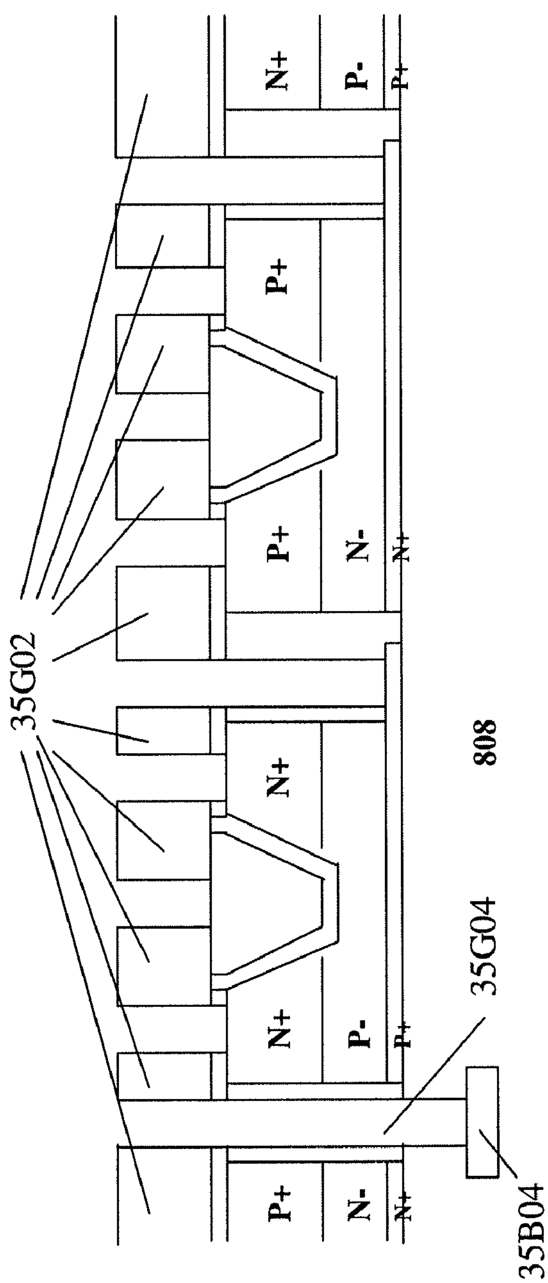

FIG. 35F illustrates the structure following a chemical mechanical polishing of the metal gate 35E04 utilizing the nitride polish stop layer 35C06. Finally a thick oxide 35G02 is deposited and contact openings are masked and etched preparing the transistors to be connected as illustrated in FIG. 35G. This figure also illustrates the layer transfer silicon via 35G04 masked and etched to provide interconnection of the top transistor wiring to the lower layer 808 interconnect wiring 35B04. This flow enables the formation of fully crystallized top CMOS transistors that could be connected to the underlying multi-metal layer semiconductor device without exposing the underlying devices and interconnects metals to high temperature. These transistors could be used as programming transistors of the antifuse on layer 808 or for other functions such as logic or memory in a 3D integrated circuit. An additional advantage of this flow is that the SmartCut H+, or other atomic species, implant step is done prior to the formation of the MOS transistor gates avoiding potential damage to the gate function.

The above flows, whether single type transistor donor wafer or complementary type transistor donor wafer, could be repeated multiple times to build a multi level 3D monolithic integrated system. It should be noted that the prior art shows alternatives for 3D devices. The most common technologies are, either the use of thin film transistors (TFT) constructing a monolithic 3D device, or the stacking of prefabricated wafers and using a through silicon via (TSV) to connect them. The first approach is limited with the performance of thin film transistors while the stacking approach is limited due to the relatively large misalignment between the stack layers and the relatively low density of the through silicon vias connecting them. As to misalignment performance, the best technology available could attain only to the 0.25 micro-meter range, which will limit the through silicon via pitch to about 2 micro-meters.

The alternative process flows presented in FIGS. 20 to 35, 40, 54 to 61, and 65 to 68 provides true monolithic 3D integrated circuits. It allows the use of layers of single crystal silicon transistors with the ability to have the upper transistors aligned to the underlying circuits as well as those layers aligned each to other; hence, only limited by the Stepper capabilities. Similarly the contact pitch between the upper transistors and the underlying circuits is compatible with the contact pitch of the underlying layers. While in the best current stacking approach the stack wafers are a few microns thick, the alternative process flow presented in FIGS. 20 to 35, 40, 54 to 61, and 65 to 68 suggests very thin layers of typically 100 nm but in recent work demonstrated layers that are 20 nm thin.

Accordingly the presented alternatives allow for true monolithic 3D devices. This monolithic 3D technology provides the ability to integrate with full density, and to be scaled to tighter features, at the same pace as the semiconductor industry.

Additionally, true monolithic 3D devices allow the formation of various sub-circuit structures in a spatially efficient configuration with higher performance than 2D. Illustrated below are some examples of how a 3D 'library' of cells may be constructed in the true monolithic 3D fashion.

Figure 42:
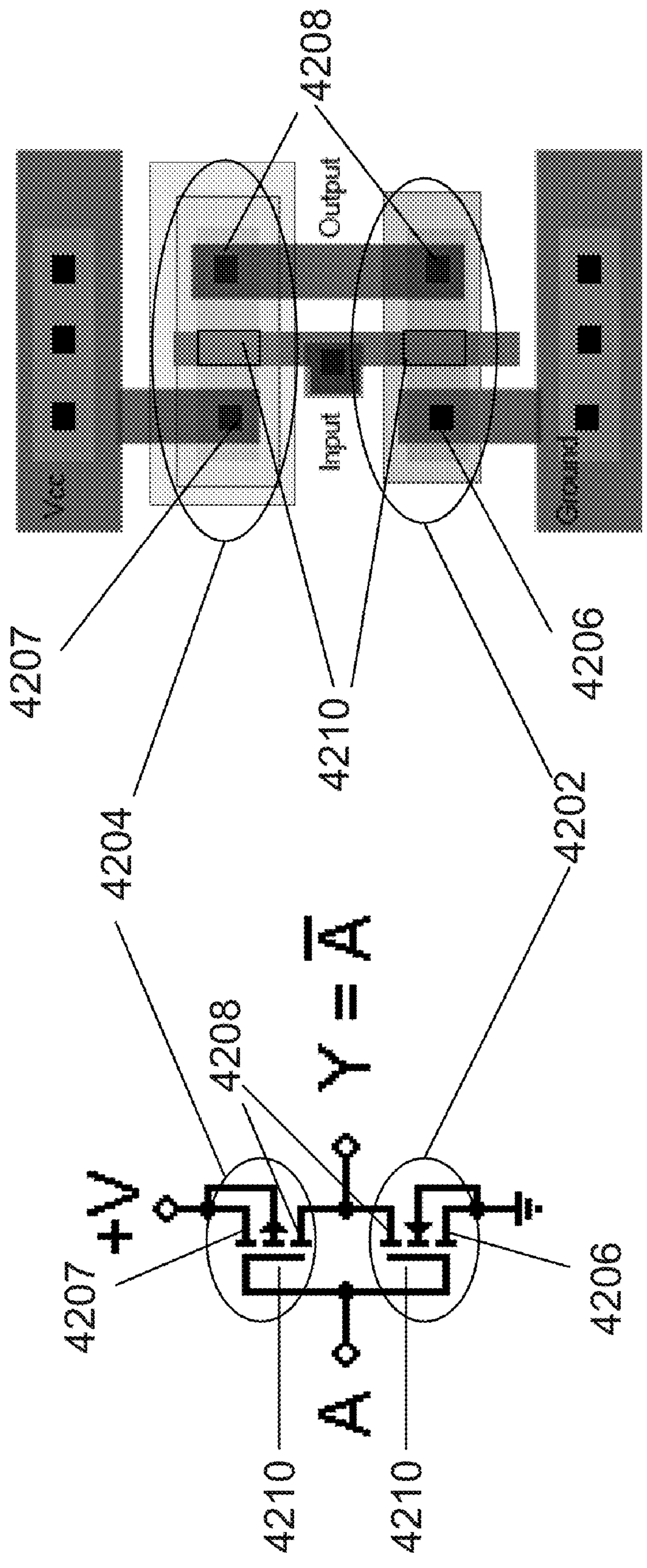
FIG. 42 is a drawing illustration of an inverter cell.

FIG. 42 illustrates a typical 2D CMOS inverter layout and schematic diagram where the NMOS transistor 4202 and the PMOS transistor 4204 are laid out side by side and are in differently doped wells. The NMOS source 4206 is typically grounded, the NMOS and PMOS drains 4208 are electrically tied together, the NMOS & PMOS gates 4210 are electrically tied together, and the PMOS 4207 source is tied to +Vdd. The structure built in 3D described below will take advantage of these connections in the $3^{rd}$ dimension.

Figure 43A:
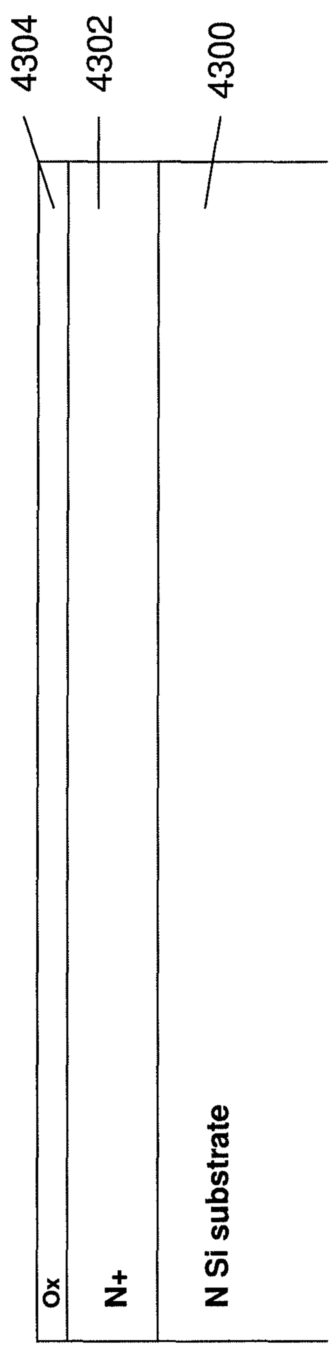
FIG. 43 A-C is a drawing illustration of preparation steps for formation of a 3D cell.
Figure 43B:
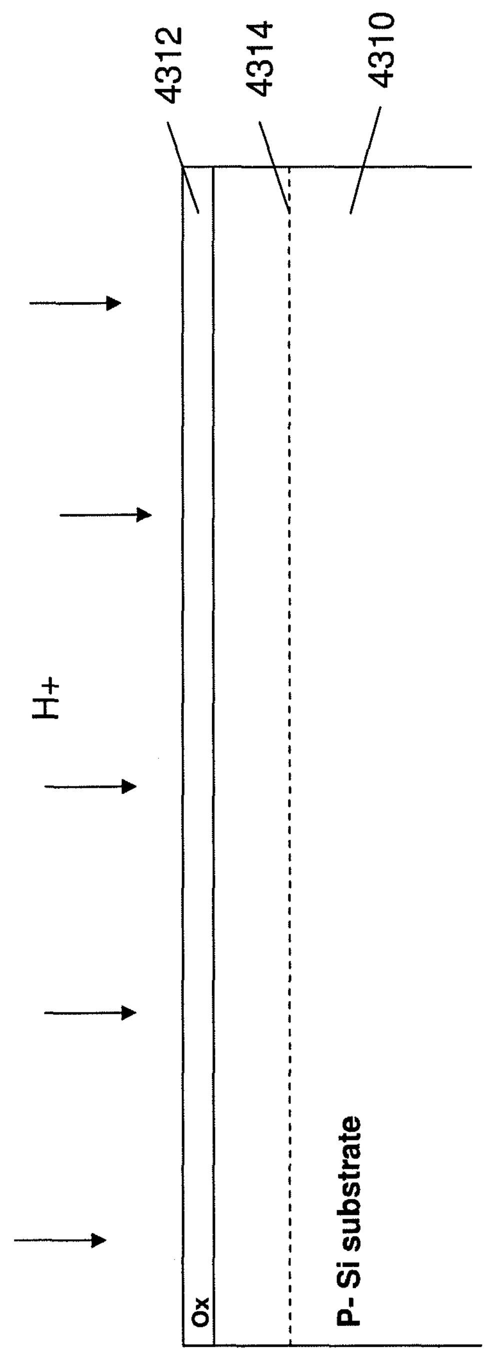
Figure 43C:
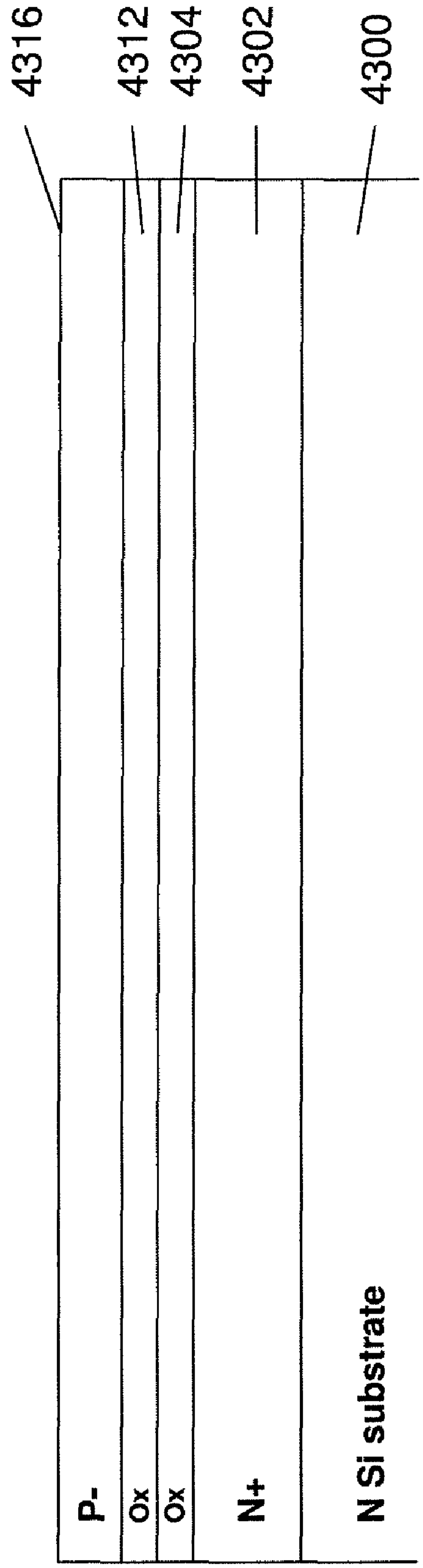

An acceptor wafer is preprocessed as illustrated in FIG. 43A. A heavily doped N single crystal silicon wafer 4300 may be implanted with a heavy dose of N+ species, and annealed to create an even lower resistivity layer 4302. Alternatively, a high temperature resistant metal such as Tungsten may be added as a low resistance interconnect layer, as a sheet layer or as a defined geometry metallization. An oxide 4304 is grown or deposited to prepare the wafer for bonding. A donor wafer is preprocessed to prepare for layer transfer 2006 of FIG. 20 as illustrated in FIG. 43B. FIG. 43B is a drawing illustration of the pre-processed donor wafer used for a layer transfer. A P− wafer 4310 is processed to make it ready for a layer transfer by a deposition or growth of an oxide 4312, surface plasma treatments, and by an implant of an implant species such as H+ preparing the SmartCut cleaving plane 4314. Now a layer-transfer-flow may be performed, as illustrated in FIG. 20, to transfer the pre-processed single crystal silicon donor wafer on top of the acceptor wafer as illustrated in FIG. 43C. The cleaved surface 4316 may or may not be smoothed by a combination of CMP, chemical polish, and epitaxial (EPI) smoothing techniques.

Figure 44A:
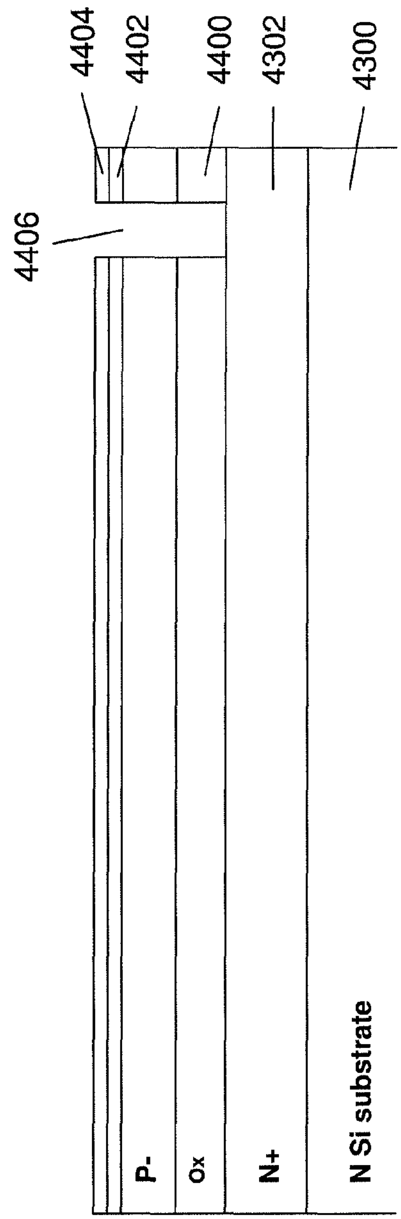
FIG. 44 A-F is a drawing illustration of steps for formation of a 3D cell.
Figure 44B:
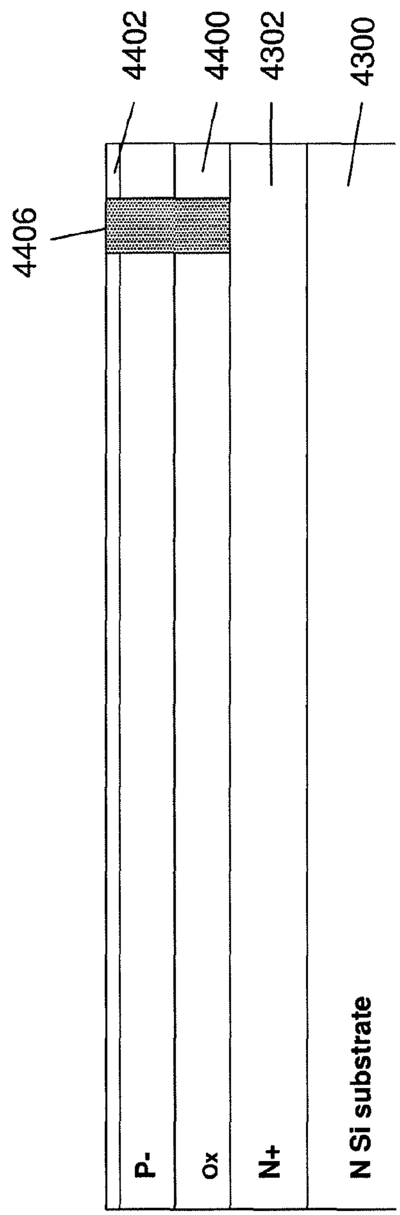
Figure 44C:
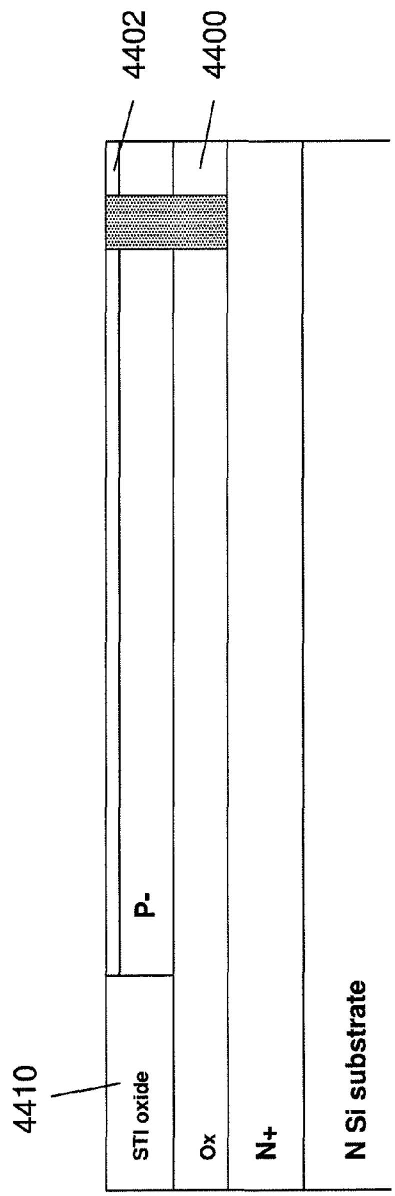
Figure 44D:
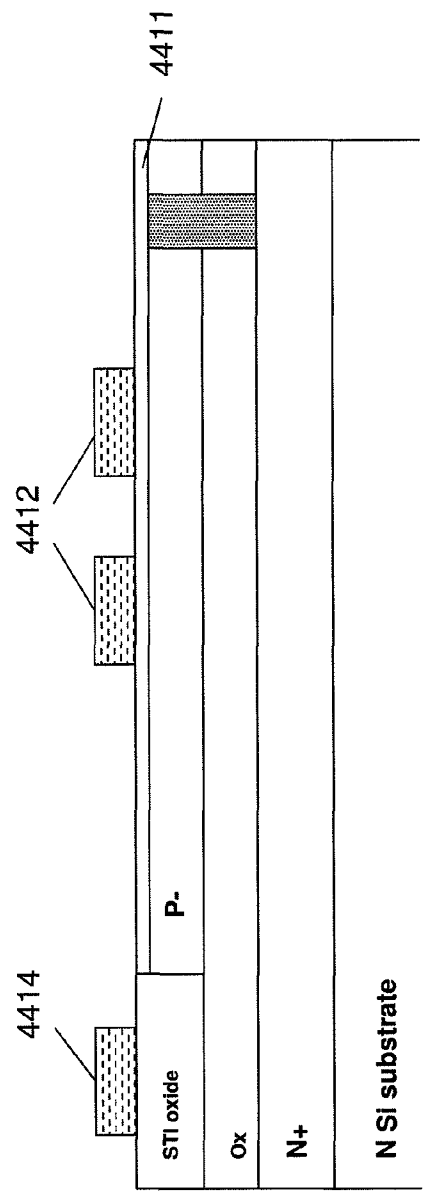
Figure 44E:
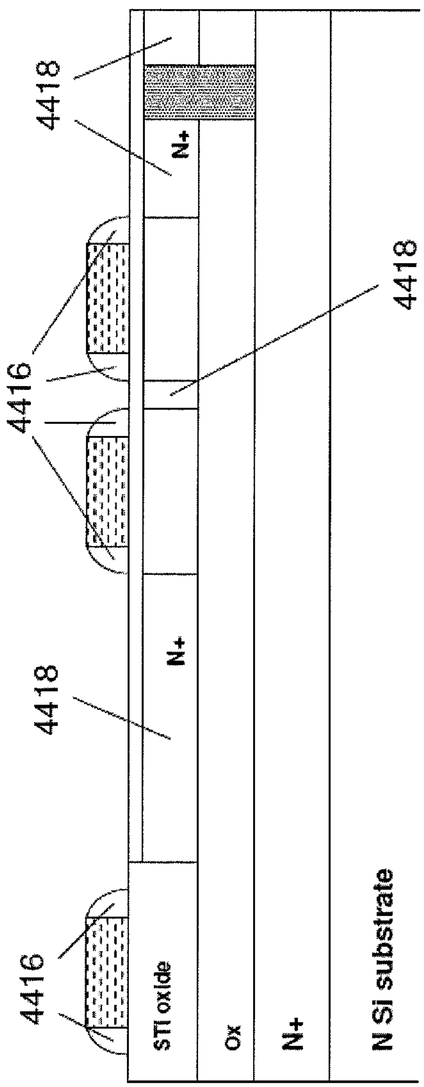
Figure 44F:
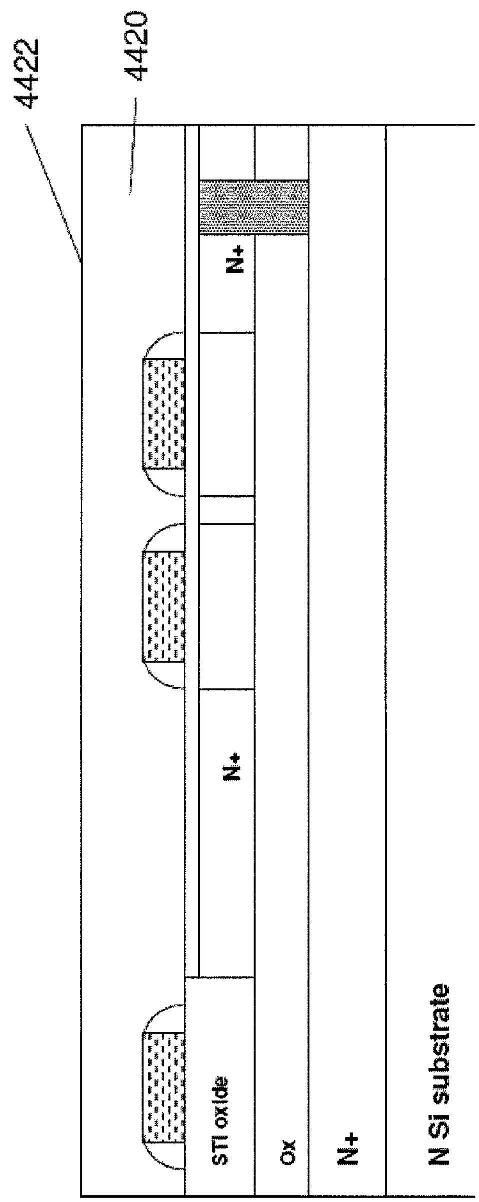

A process flow to create devices and interconnect to build the 3D library is illustrated in FIGS. 44A to F. As illustrated in FIG. 44A, a polish stop layer 4404, such as silicon nitride or amorphous carbon, may be deposited after a protecting oxide layer 4402. The NMOS source to ground connection 4406 is masked and etched to contact the heavily doped ground plane layer 4302. This may be done at typical contact layer size and precision. For the sake of clarity, the two oxide layers, 4304 from the acceptor and 4312 from the donor wafer, are combined and designated as 4400. The NMOS source to ground connection 4406 is filled with a deposition of heavily doped polysilicon or amorphous silicon, or a high melting point metal such as tungsten, and then chemically mechanically polished as illustrated in FIG. 44B to the level of the protecting oxide layer 4404. Now a standard NMOS transistor formation process flow is performed, with two exceptions. First, no photolithographic masking steps are used for an implant step that differentiates NMOS and PMOS devices, as only the NMOS devices are being formed now. Second, high temperature anneal steps may or may not be done during the NMOS formation, as some or all of the necessary anneals can be done after the PMOS formation described later. A typical shallow trench (STI) isolation region 4410 is formed between the eventual NMOS transistors by lithographic definition, plasma etching to the oxide layer 4400, depositing a gap-fill oxide, and chemical mechanically polishing flat as illustrated in FIG. 44C. Threshold adjust implants may or may not be performed at this time. The silicon surface is cleaned of remaining oxide with an HF (Hydrofluoric Acid) etch. A gate oxide 4411 is thermally grown and doped polysilicon is deposited to form the gate stack. The gate stack is lithographically defined and etched, creating NMOS gates 4412 and the poly on STI interconnect 4414 as illustrated in FIG. 44D. Alternatively, a high-k metal gate process sequence may be utilized at this stage to form the gate stacks 4412 and interconnect over STI 4414. Gate stack self aligned LDD (Lightly Doped Drain) and halo punch-thru implants may be performed at this time to adjust junction and transistor breakdown characteristics. FIG. 44E illustrates a typical spacer deposition of oxide and nitride and a subsequent etchback, to form implant offset spacers 4416 on the gate stacks and then a self aligned N+ source and drain implant is performed to create the NMOS transistor source and drain 4418. High temperature anneal steps may or may not be done at this time to activate the implants and set initial junction depths. A self aligned silicide may then be formed. Additionally, one or more metal interconnect layers with associated contacts and vias may be constructed utilizing standard semiconductor manufacturing processes. The metal layer may be constructed at lower temperature using such metals as Copper or Aluminum, or may be constructed with refractory metals such as Tungsten to provide high temperature utility at greater than 400 degrees Centigrade. A thick oxide 4420 may be deposited as illustrated in FIG. 44F and CMP'd (chemical mechanically polished) flat. The wafer surface 4422 may be treated with a plasma activation in preparation to be an acceptor wafer for the next layer transfer.

Figure 45A:
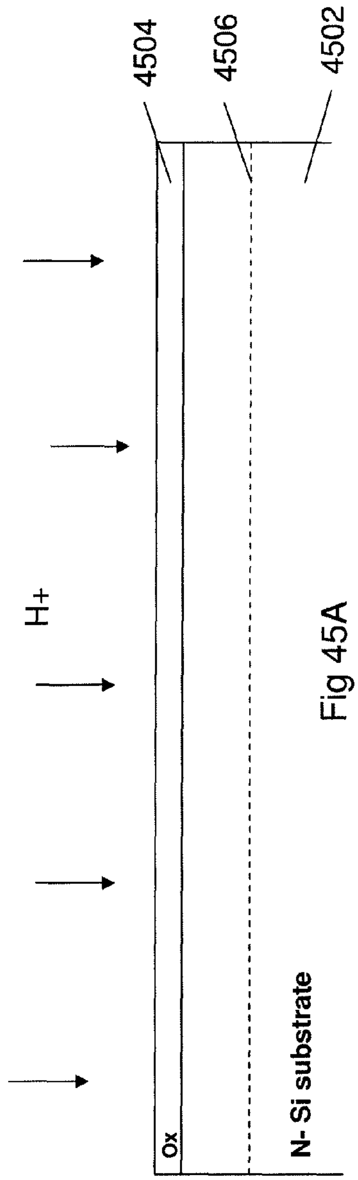
FIG. 45 A-G is a drawing illustration of steps for formation of a 3D cell.
Figure 45B:
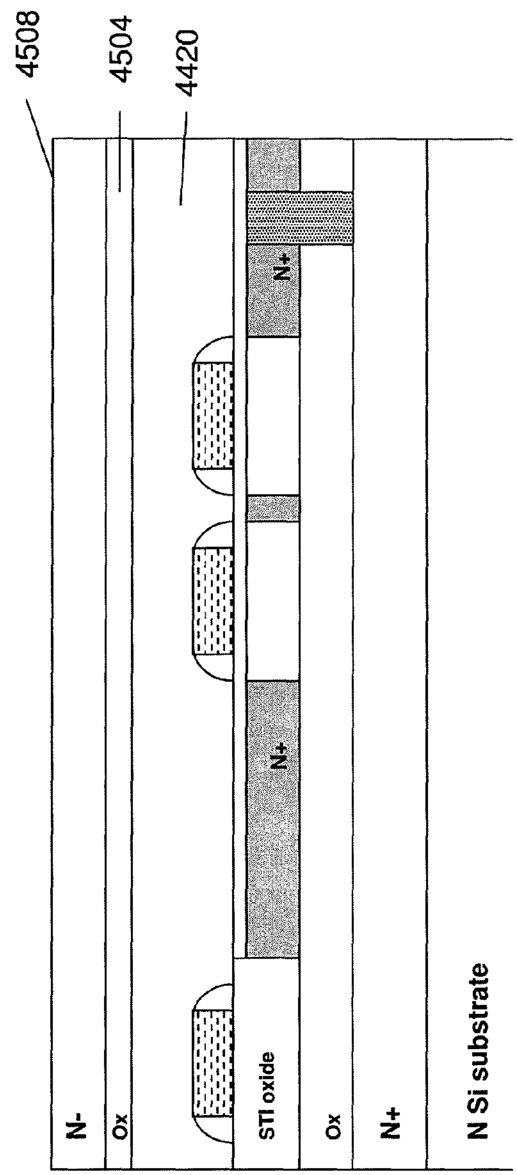

A donor wafer to create PMOS devices is preprocessed to prepare for layer transfer 2006 of FIG. 20 as illustrated in FIG. 45A. An N− wafer 4502 is processed to make it ready for a layer transfer by a deposition or growth of an oxide 4504, surface plasma treatments, and by an implant of an atomic species, such as H+, preparing the SmartCut cleaving plane 4506. Now a layer-transfer-flow may be performed, as illustrated in FIG. 20, to transfer the pre-processed single crystal silicon donor wafer on top of the acceptor wafer as illustrated in FIG. 45B, bonding the acceptor wafer oxide 4420 to the donor wafer oxide 4504. The cleaved surface 4508 may or may not be smoothed by a combination of CMP, chemical polish, and epitaxial (EPI) smoothing techniques.

To optimize the PMOS mobility, the donor wafer is rotated 90 degrees with respect to the acceptor wafer prior to bonding to now facilitate creation of the PMOS channel in the <110> silicon plane direction. For the sake of clarity, the two oxide layers, 4420 from the acceptor and 4504 from the donor wafer, are combined and designated as 4500. Now a standard PMOS transistor formation process flow is performed, with one exception. No photolithographic masking steps are used for the implant steps that differentiate NMOS and PMOS devices, as only the PMOS devices are being formed now. An advantage of this 3D cell structure is the independent formation of the PMOS transistors and the NMOS transistors. Therefore, each transistor formation may be optimized independently. This may be accomplished by the independent selection of the crystal orientation, various stress materials and techniques, such as, for example, doping profiles, material thicknesses and compositions, temperature cycles, and so forth.

Figure 45C:
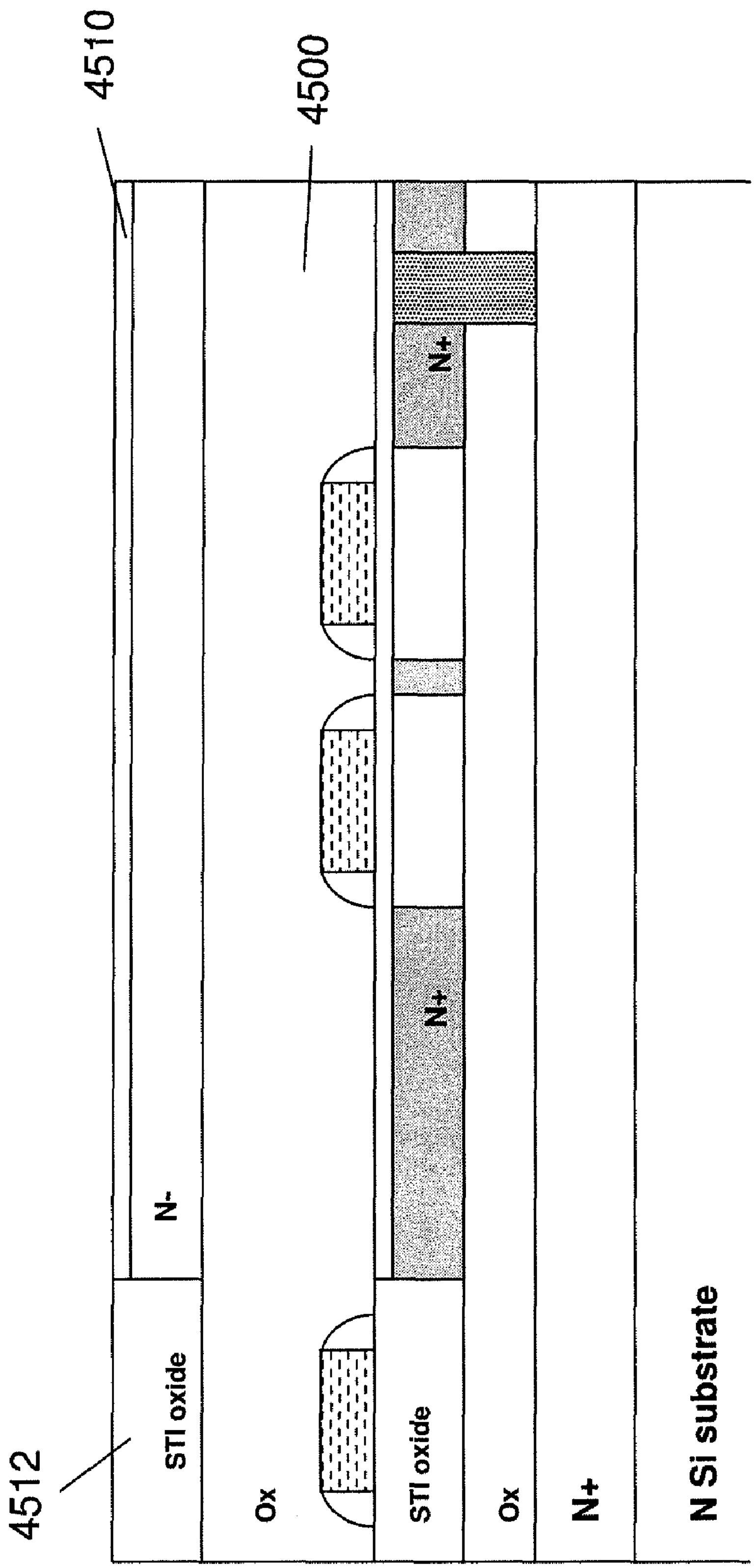
Figure 45D:
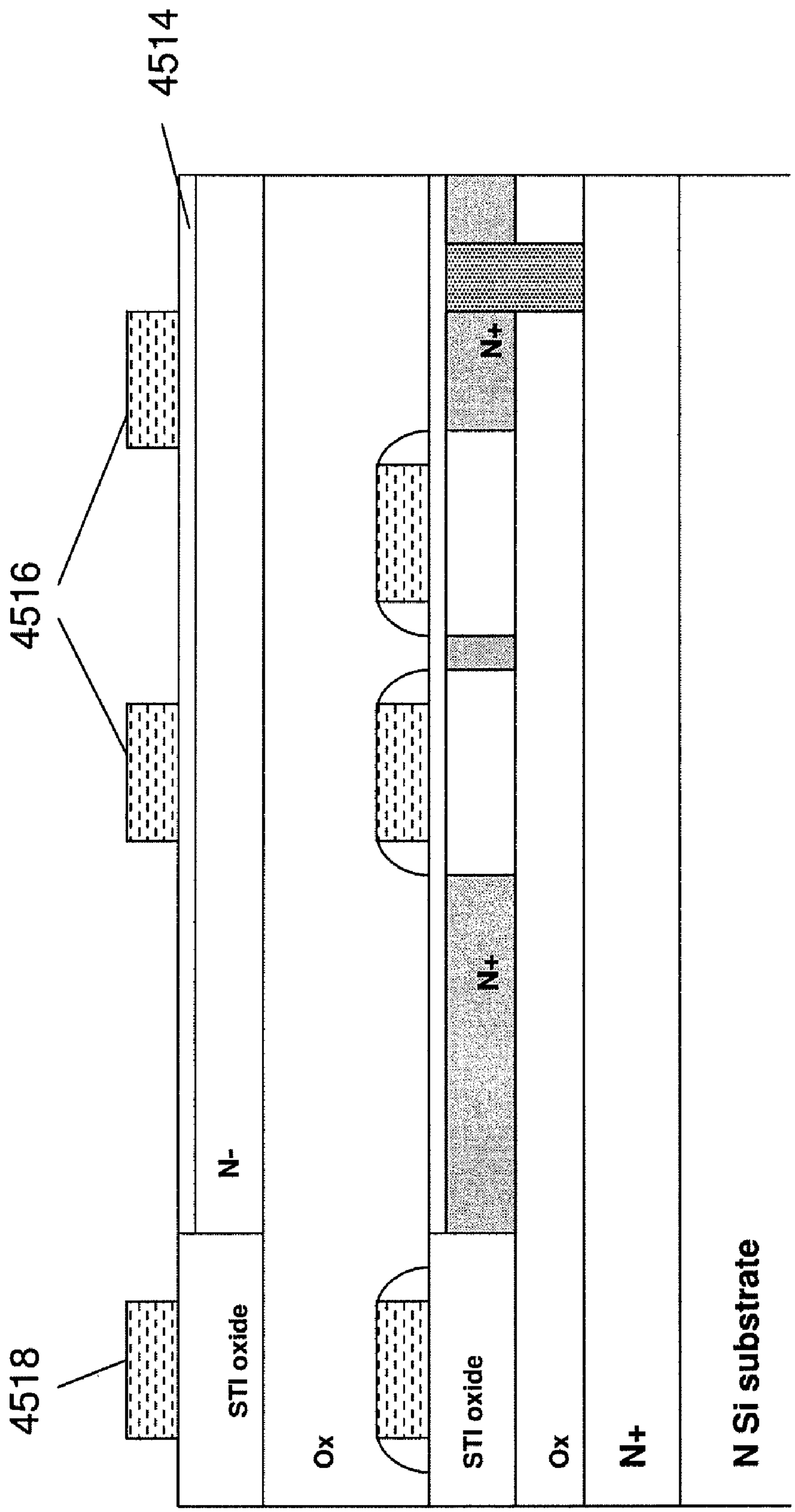
Figure 45E:
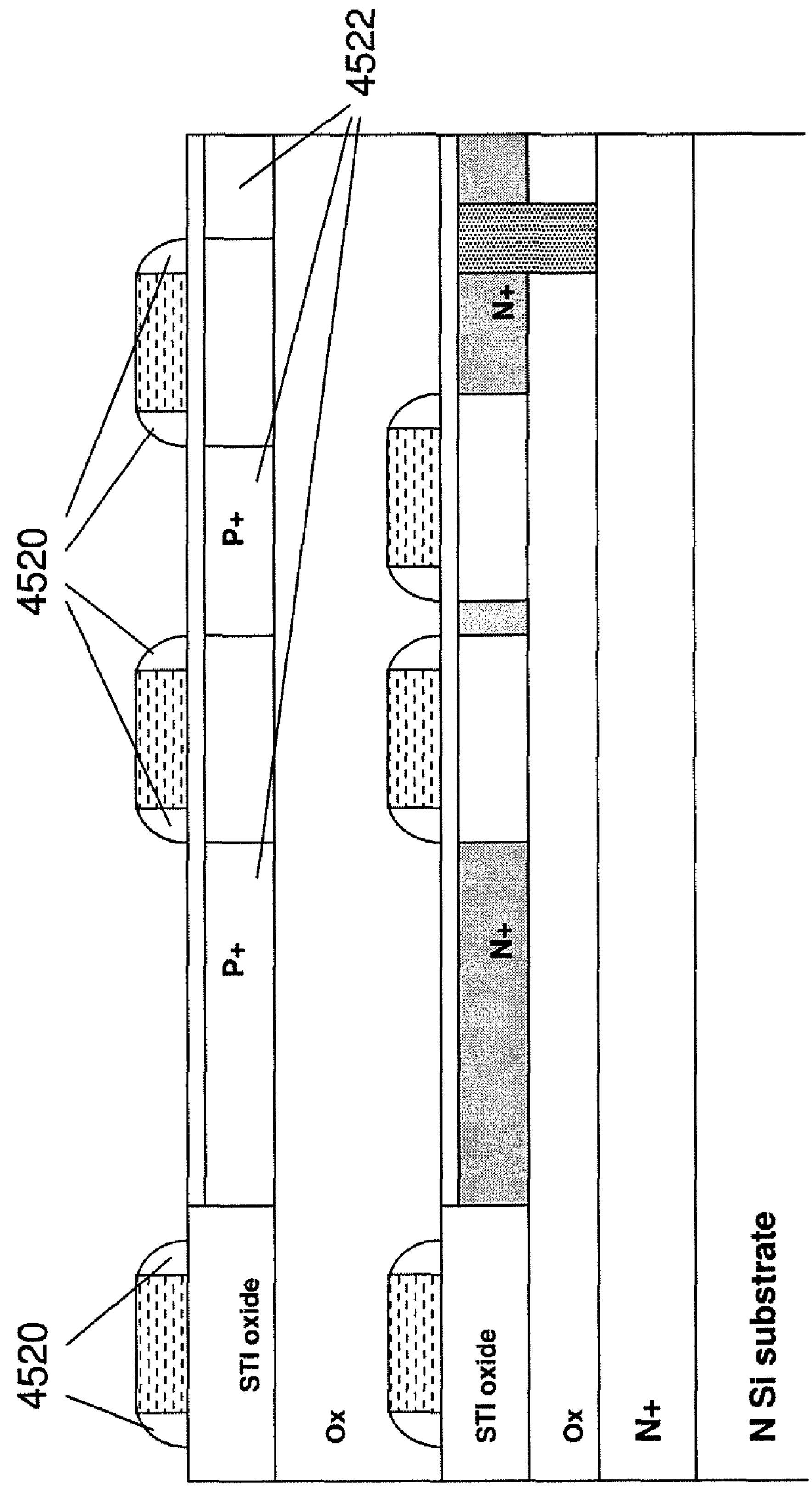
Figure 45F:
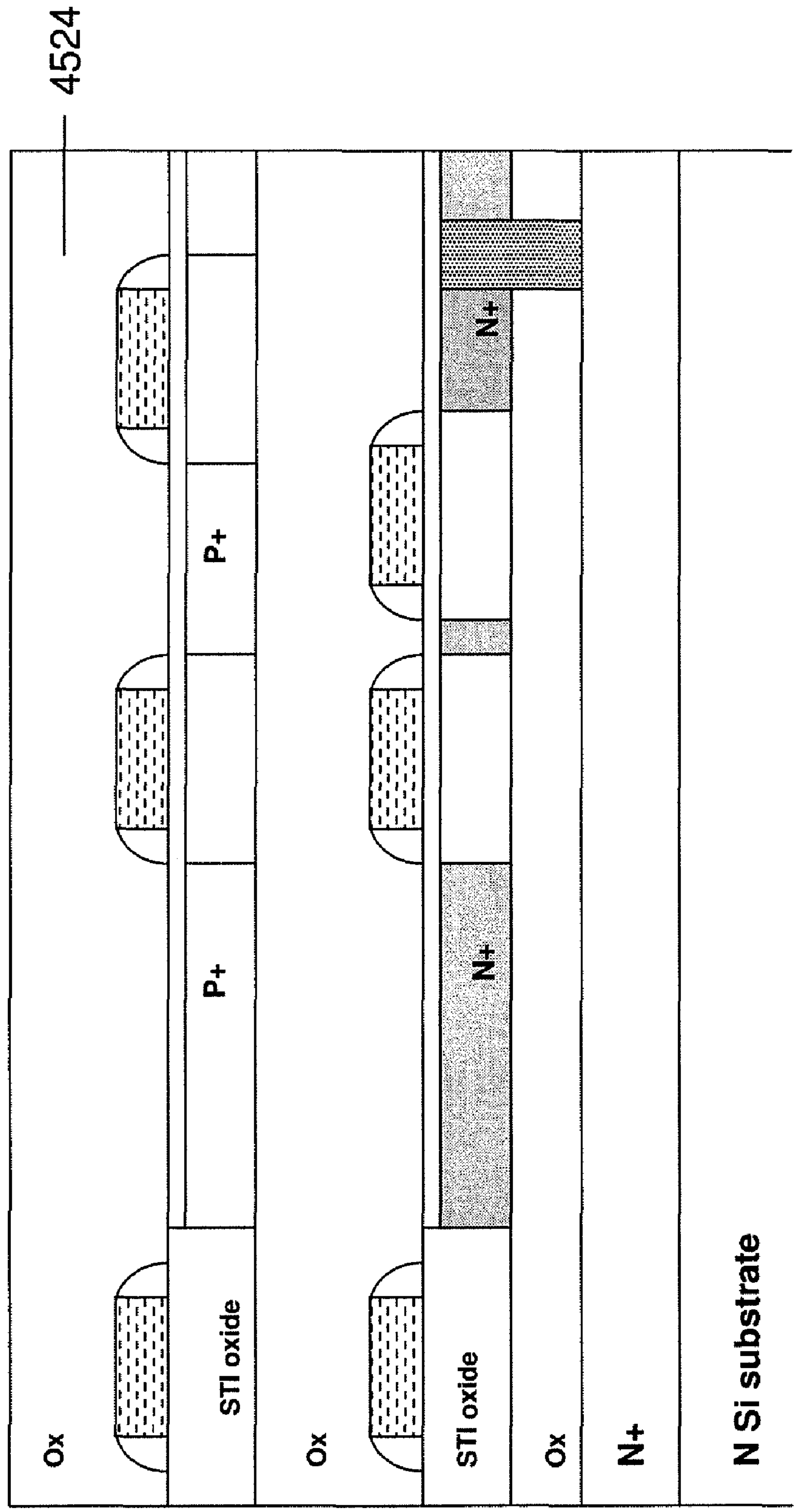

A polishing stop layer, such as silicon nitride or amorphous carbon, may be deposited after a protecting oxide layer 4510. A typical shallow trench (STI) isolation region 4512 is formed between the eventual PMOS transistors by lithographic definition, plasma etching to the oxide layer 4500, depositing a gap-fill oxide, and chemical mechanically polishing flat as illustrated in FIG. 45C. Threshold adjust implants may or may not be performed at this time. The silicon surface is cleaned of remaining oxide with an HF (Hydrofluoric Acid) etch. A gate oxide 4514 is thermally grown and doped polysilicon is deposited to form the gate stack. The gate stack is lithographically defined and etched, creating PMOS gates 4516 and the poly on STI interconnect 4518 as illustrated in FIG. 45D. Alternatively, a high-k metal gate process sequence may be utilized at this stage to form the gate stacks 4516 and interconnect over STI 4518. Gate stack self aligned LDD (Lightly Doped Drain) and halo punch-thru implants may be performed at this time to adjust junction and transistor breakdown characteristics. FIG. 45E illustrates a typical spacer deposition of oxide and nitride and a subsequent etchback, to form implant offset spacers 4520 on the gate stacks and then a self aligned P+ source and drain implant is performed to create the PMOS transistor source and drain 4522. Thermal anneals to activate implants and set junctions in both the PMOS and NMOS devices may be performed with RTA (Rapid Thermal Anneal) or furnace thermal exposures. Alternatively, laser annealing may be utilized after the NMOS and PMOS sources and drain implants to activate implants and set the junctions. Optically absorptive and reflective layers as described previously may be employed to anneal implants and activate junctions. A thick oxide 4524 is deposited as illustrated in FIG. 45F and CMP'ed (chemical mechanically polished) flat.

Figure 45G:
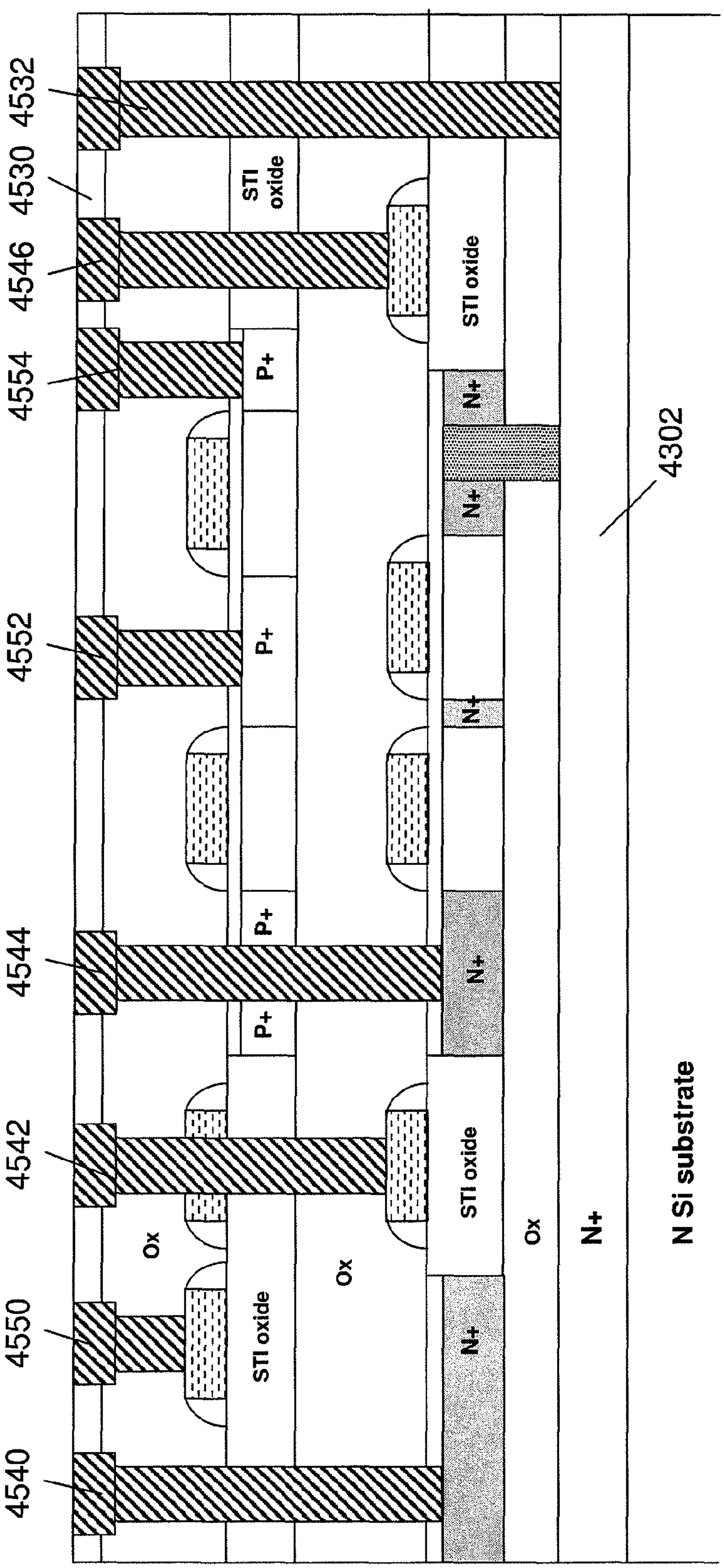

FIG. 45G illustrates the formation of the three groups of eight interlayer contacts. An etch stop and polishing stop layer or layers 4530 may be deposited, such as silicon nitride or amorphous carbon. First, the deepest contact 4532 to the N+ ground plane layer 4302, as well as the NMOS drain only contact 4540 and the NMOS only gate on STI contact 4546 are masked and etched. Then the NMOS & PMOS gate on STI interconnect contact 4542 and the NMOS and PMOS drain contact 4544 are masked and etched. Then the PMOS level contacts are masked and etched: the PMOS gate interconnect on STI contact 4550, the PMOS only source contact 4552, and the PMOS only drain contact 4554. Alternatively, the shallowest contacts may be masked and etched first, followed by the mid-level, and then the deepest contacts. The metal lines are mask defined and etched, filled with barrier metals and copper interconnect, and CMP'ed in a normal Dual Damascene interconnect scheme, thereby completing the eight types of contact connections.

Figure 46A:
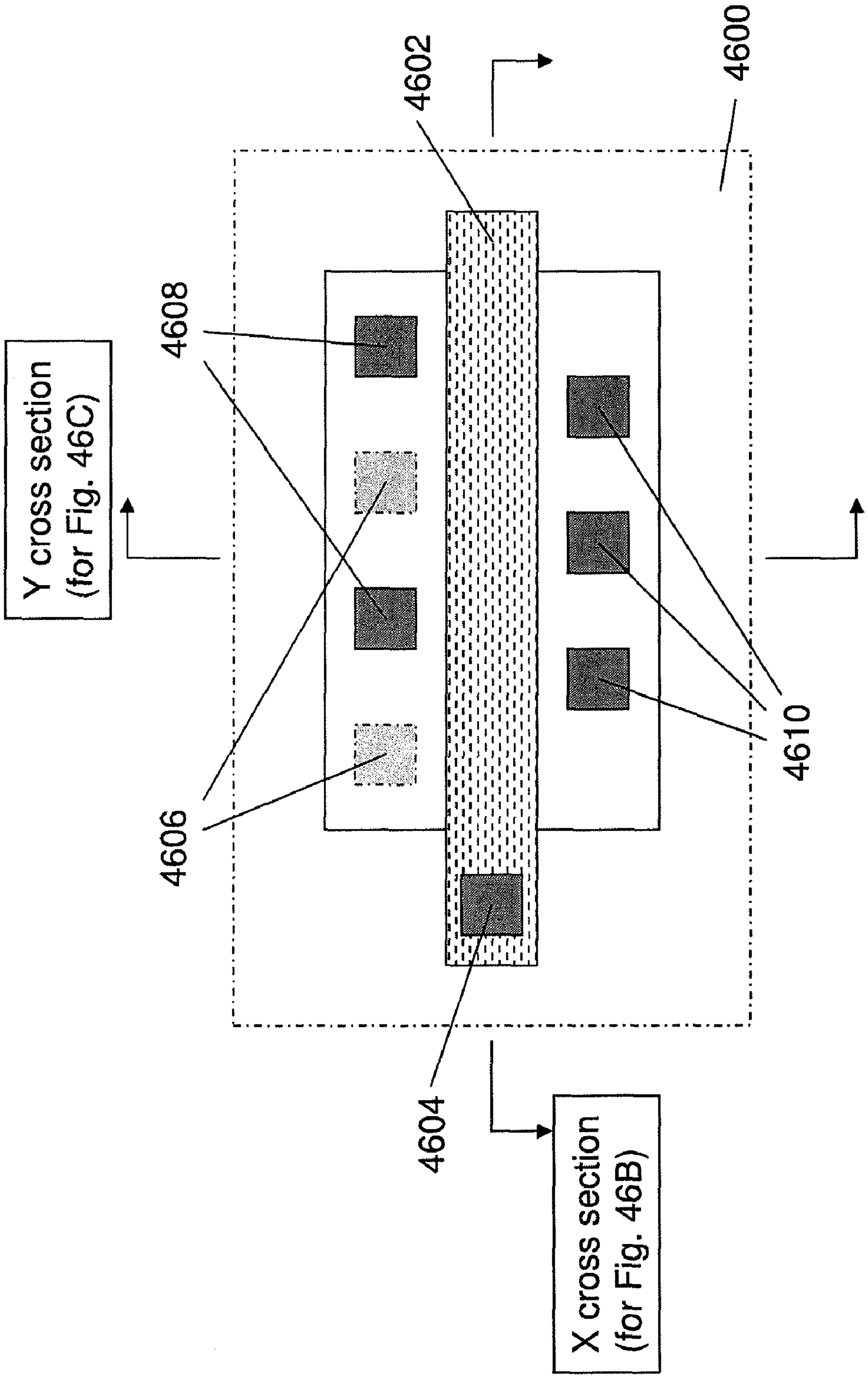
FIG. 46 A-C is a drawing illustration of a layout and cross sections of a 3D inverter cell.
Figure 46B:
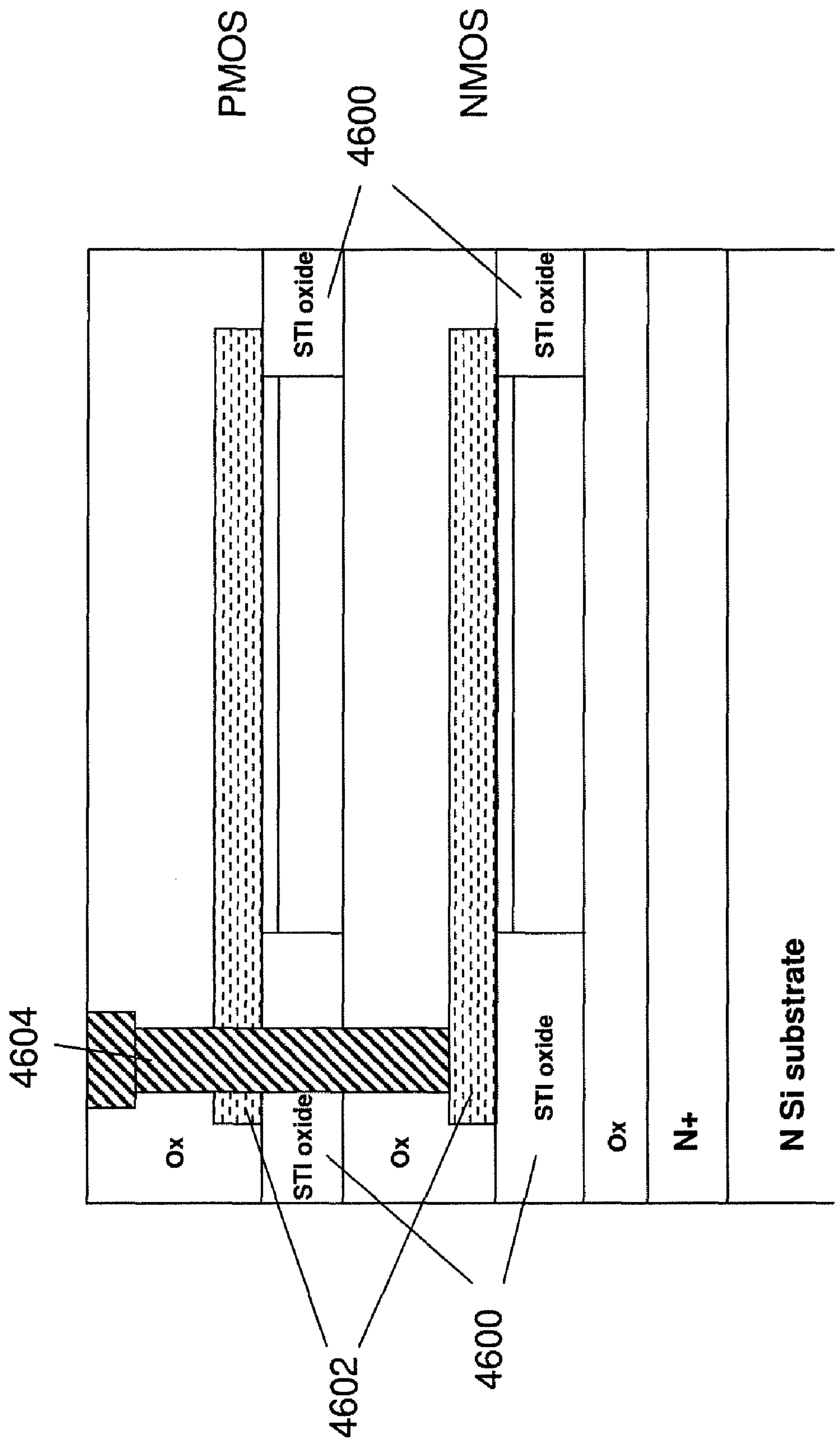
Figure 46C:
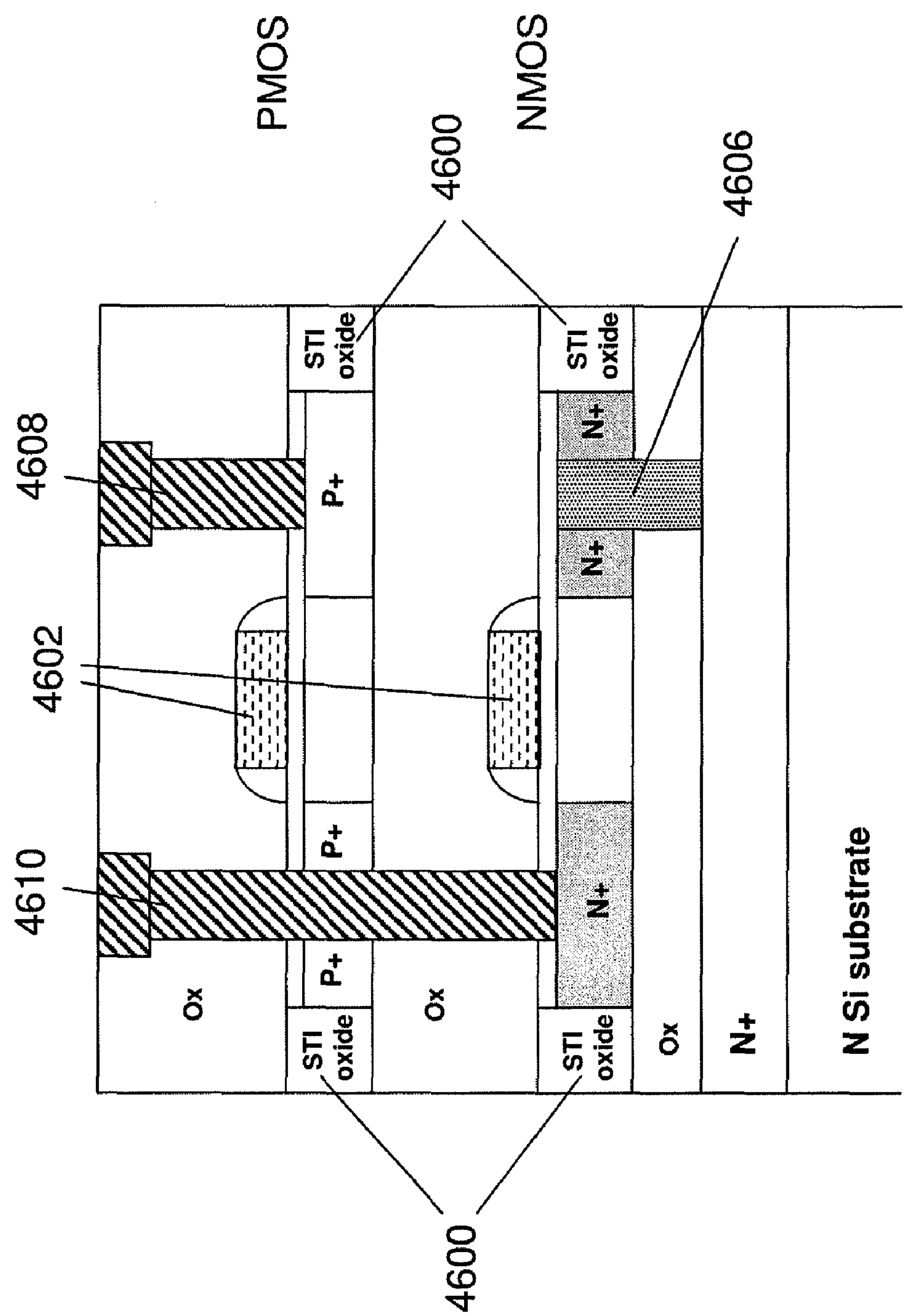

With reference to the 2D CMOS inverter cell schematic and layout illustrated in FIG. 42, the above process flow may be used to construct a compact 3D CMOS inverter cell example as illustrated in FIGS. 46A thru 46C. The topside view of the 3D cell is illustrated in FIG. 46A where the STI (shallow trench isolation) 4600 for both NMOS and PMOS is drawn coincident and the PMOS is on top of the NMOS. The cell X cross sectional view is illustrated in FIG. 46B and the Y cross sectional view is illustrated in FIG. 46C. The NMOS and PMOS gates 4602 are drawn coincident and stacked, and are connected by an NMOS gate on STI to PMOS gate on STI contact 4604, which is similar to contact 4542 in FIG. 45G. This is the connection for inverter input signal A as illustrated in FIG. 42. The N+ source contact to the ground plane 4606 in FIGS. 46A & C makes the NMOS source to ground connection 4206 illustrated in FIG. 42. The PMOS source contacts 4608, which are similar to contact 4552 in FIG. 45G, make the PMOS source connection to +V 4207 as shown in FIG. 42. The NMOS and PMOS drain shared contacts 4610, which are similar to contact 4544 in FIG. 45G, make the shared connection 4208 as the output Y in FIG. 42. The ground to ground plane contact, similar to contact 4532 in FIG. 45G, is not shown. This contact may not be needed in every cell and may be shared.

Figure 47:
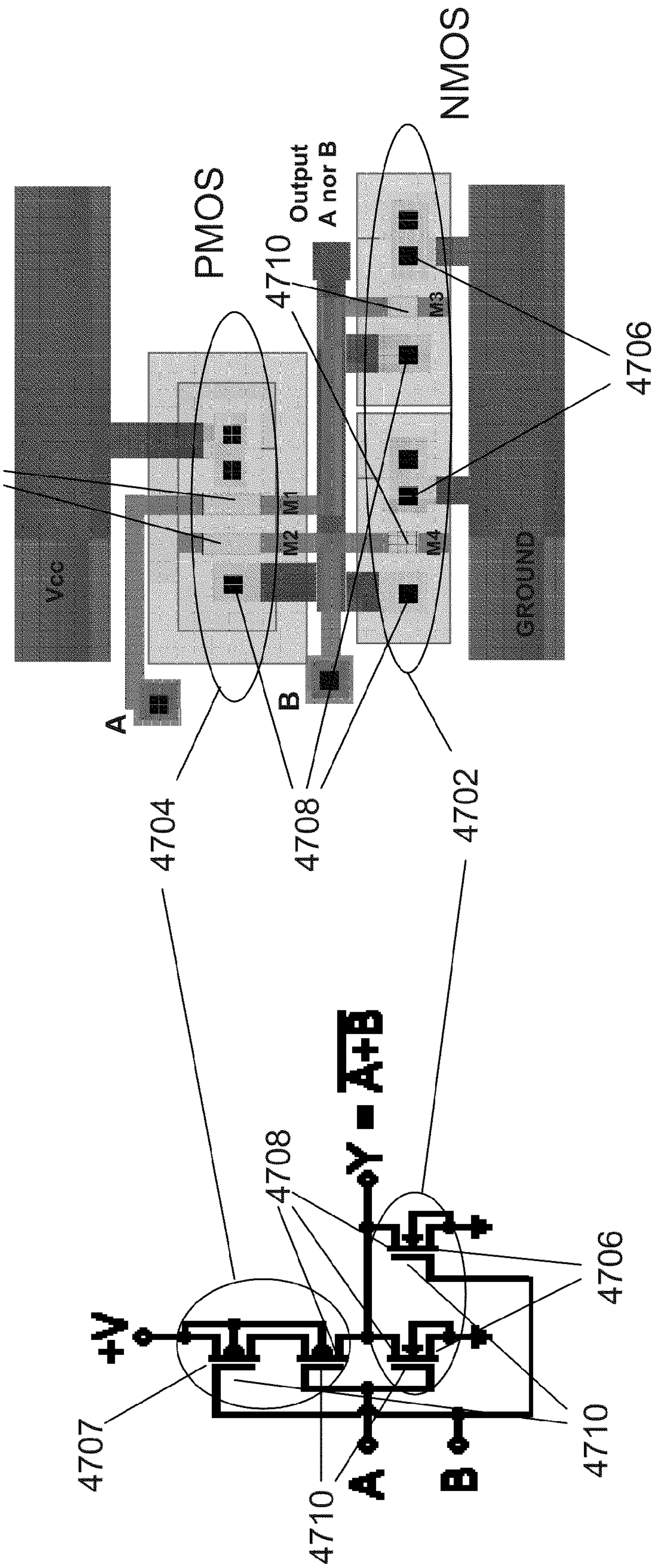
FIG. 47 is a drawing illustration of a 2-input NOR cell.

Other 3D logic or memory cells may be constructed in a similar fashion. An example of a typical 2D 2-input NOR cell schematic and layout is illustrated in FIG. 47. The NMOS transistors 4702 and the PMOS transistors 4704 are laid out side by side and are in differently doped wells. The NMOS sources 4706 are typically grounded, both of the NMOS drains and one of the PMOS drains 4708 are electrically tied together to generate the output Y, and the NMOS & PMOS gates 4710 are electrically paired together for input A or input B. The structure built in 3D described below will take advantage of these connections in the 3rd dimension.

Figure 48A:
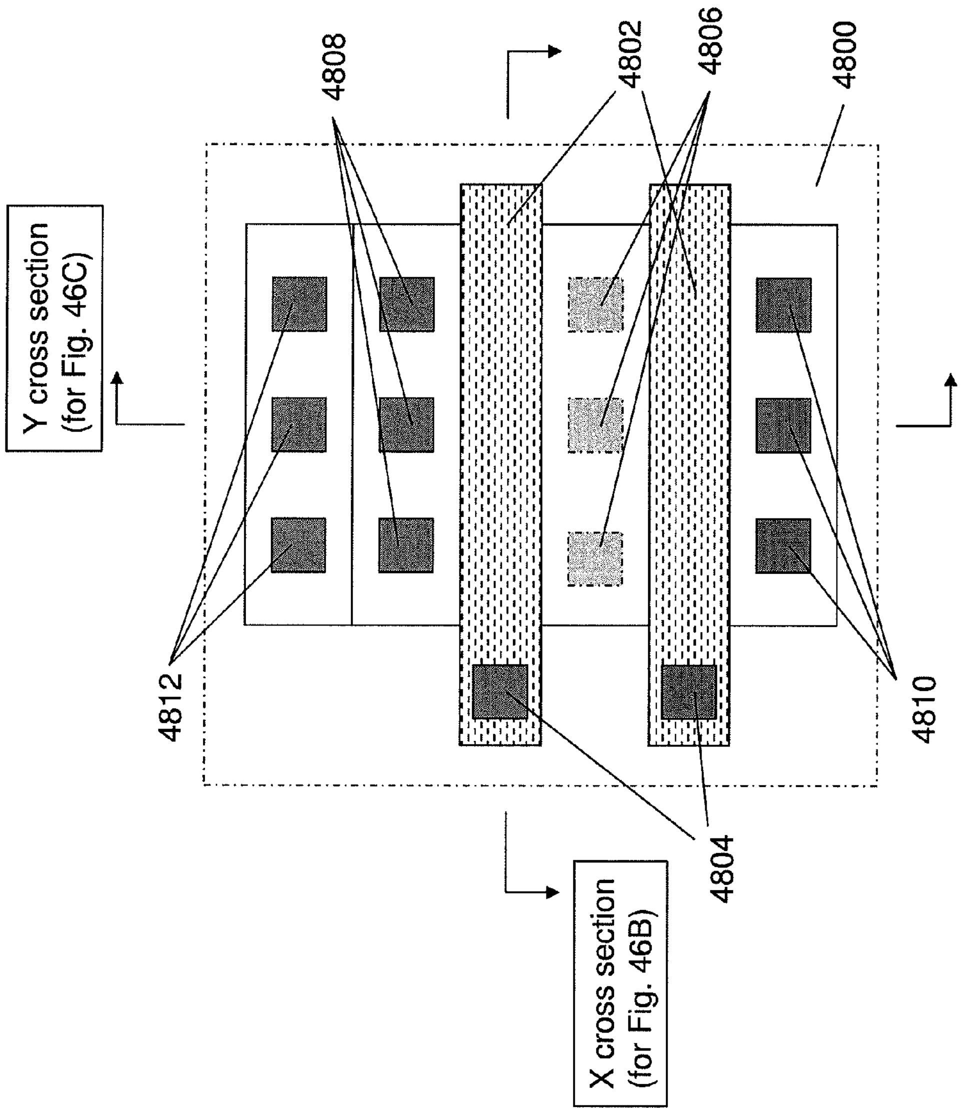
FIG. 48 A-C are drawing illustrations of a layout and cross sections of a 3D 2-input NOR cell.
Figure 48B:
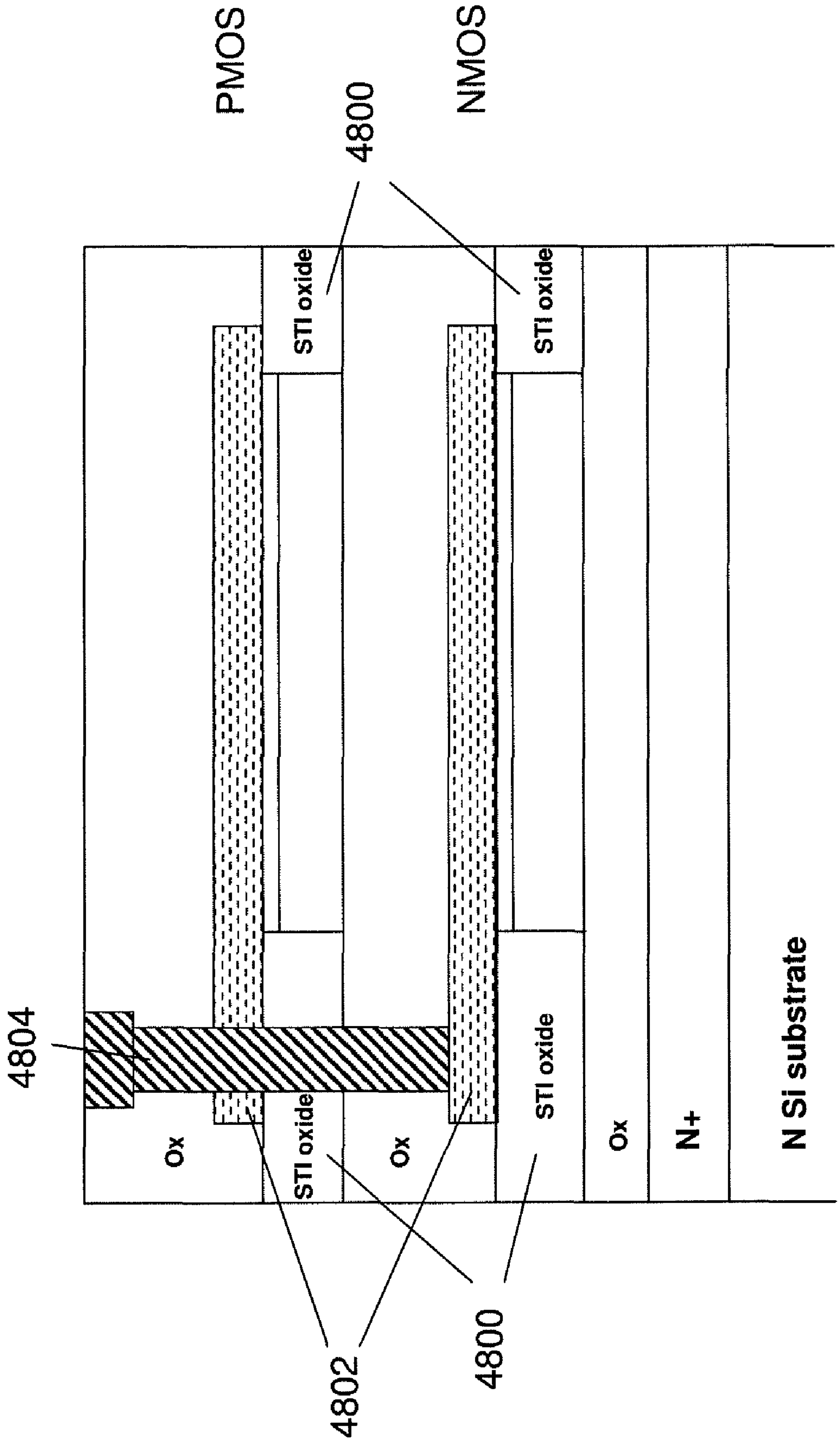
Figure 48C:
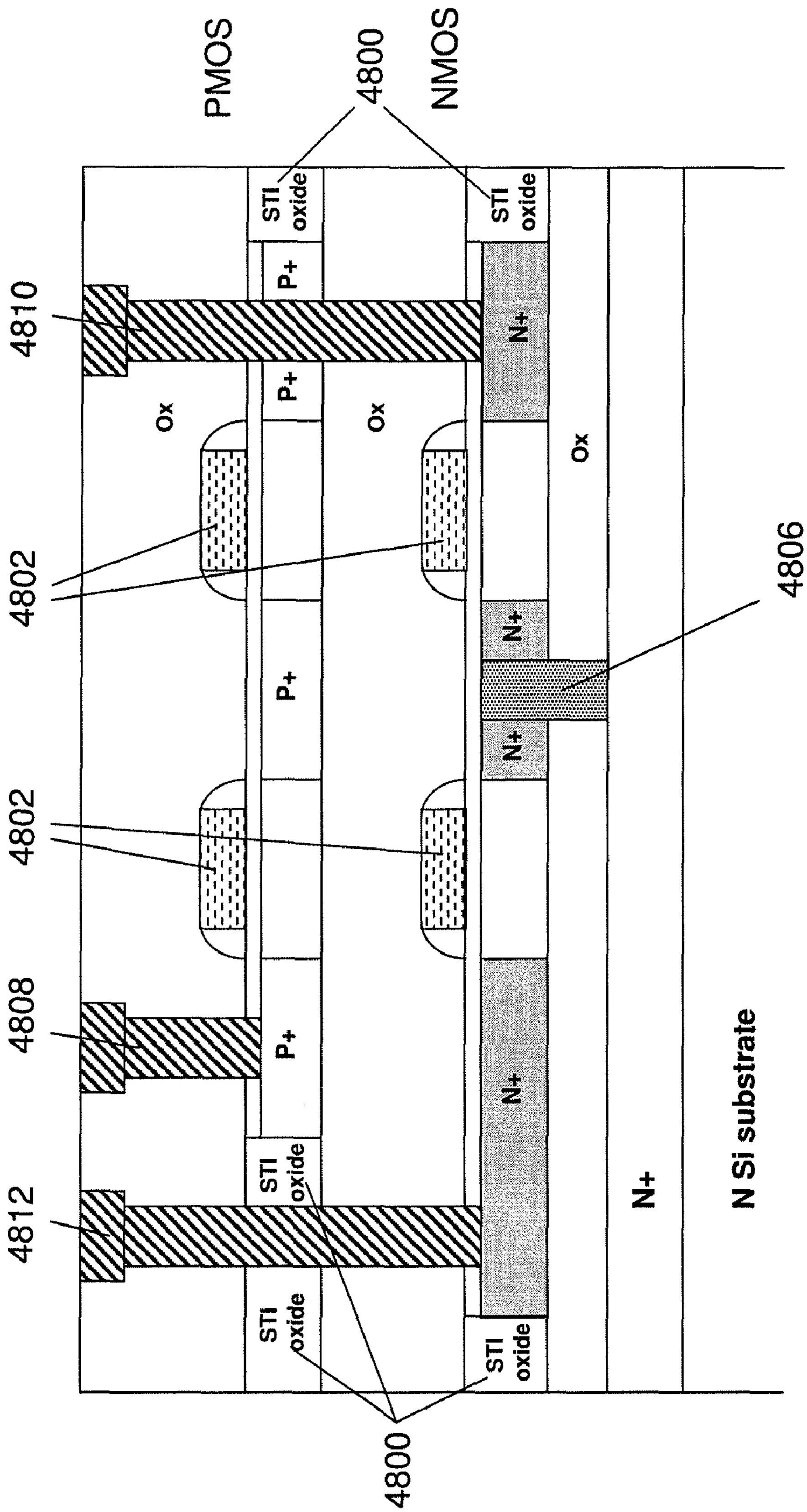

The above process flow may be used to construct a compact 3D 2-input NOR cell example as illustrated in FIGS. 48A thru 48C. The topside view of the 3D cell is illustrated in FIG. 48A where the STI (shallow trench isolation) 4800 for both NMOS and PMOS is drawn coincident on the bottom and sides, and not on the top silicon layer to allow NMOS drain only connections to be made. The cell X cross sectional view is illustrated in FIG. 48B and the Y cross sectional view is illustrated in FIG. 48C. The NMOS and PMOS gates 4802 are drawn coincident and stacked, and each are connected by a NMOS gate on STI to PMOS gate on STI contact 4804, which is similar to contact 4542 in FIG. 45G. These are the connections for input signals A & B as illustrated in FIG. 47. The N+ source contact to the ground plane 4806 in FIGS. 48A & C makes the NMOS source to ground connection 4706 illustrated in FIG. 47. The PMOS source contacts 4808, which are similar to contact 4552 in FIG. 45G, make the PMOS source connection to +V 4707 as shown in FIG. 47. The NMOS and PMOS drain shared contacts 4810, which are similar to contact 4544 in FIG. 45G, make the shared connection 4708 as the output Y in FIG. 47. The NMOS source contacts 4812, which are similar to contact 4540 in FIG. 45, make the NMOS connection to Output Y, which is connected to the NMOS and PMOS drain shared contacts 4810 with metal to form output Y in FIG. 47. The ground to ground plane contact, similar to contact 4532 in FIG. 45G, is not shown. This contact may not be needed in every cell and may be shared.

Figure 49A:
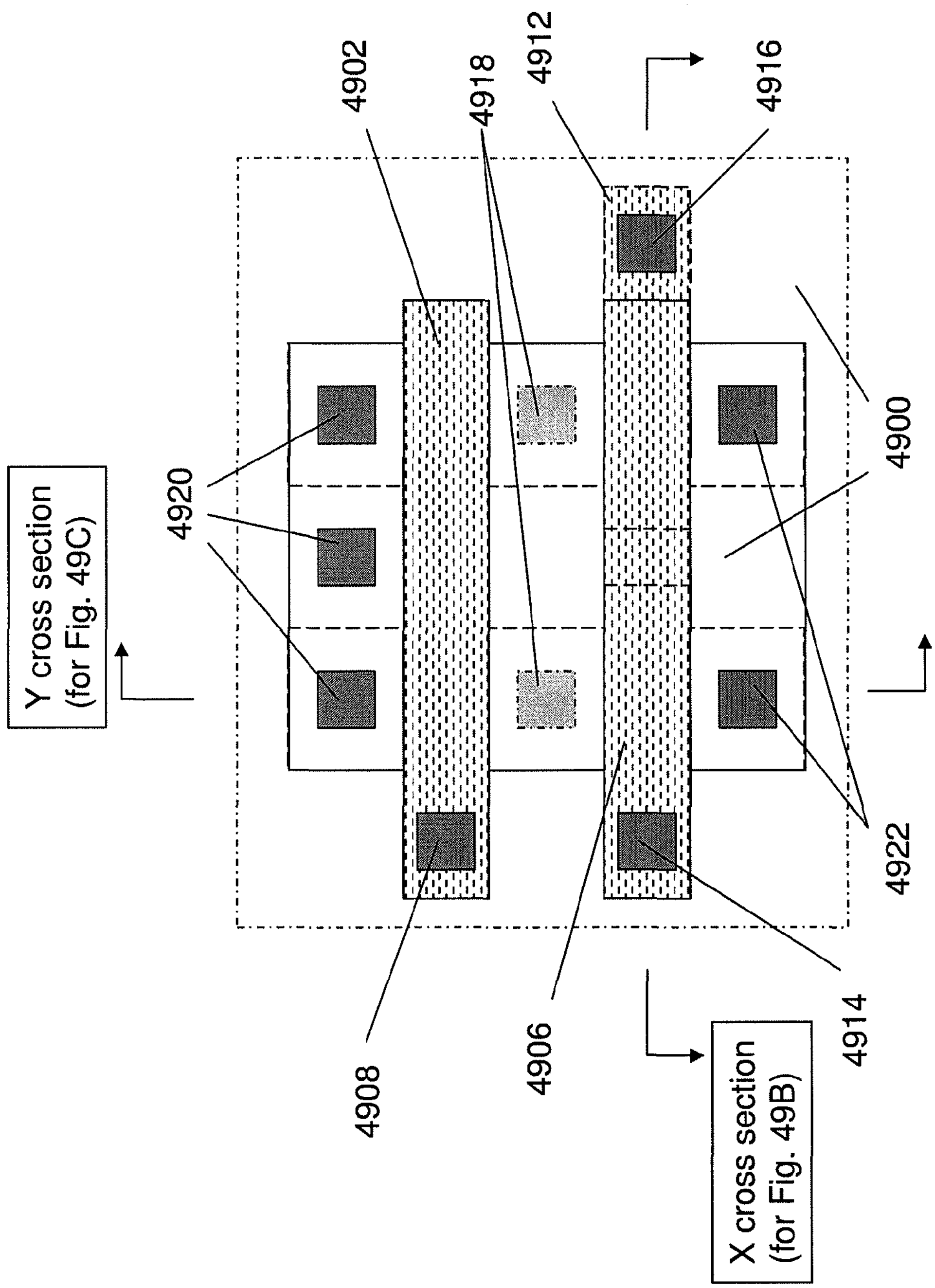
FIG. 49 A-C are drawing illustrations of a 3D 2-input NOR cell.
Figure 49B:
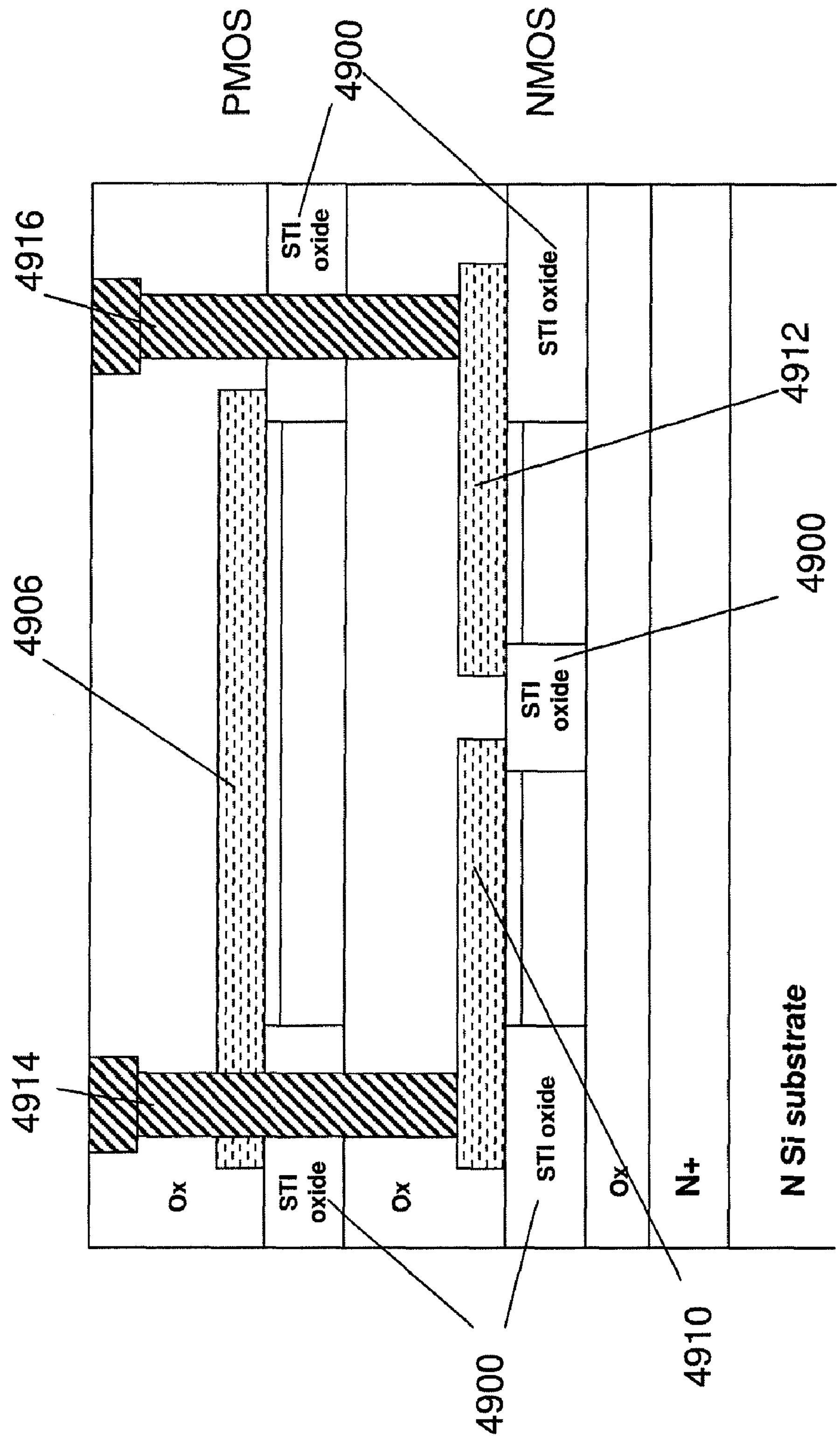
Figure 49C:
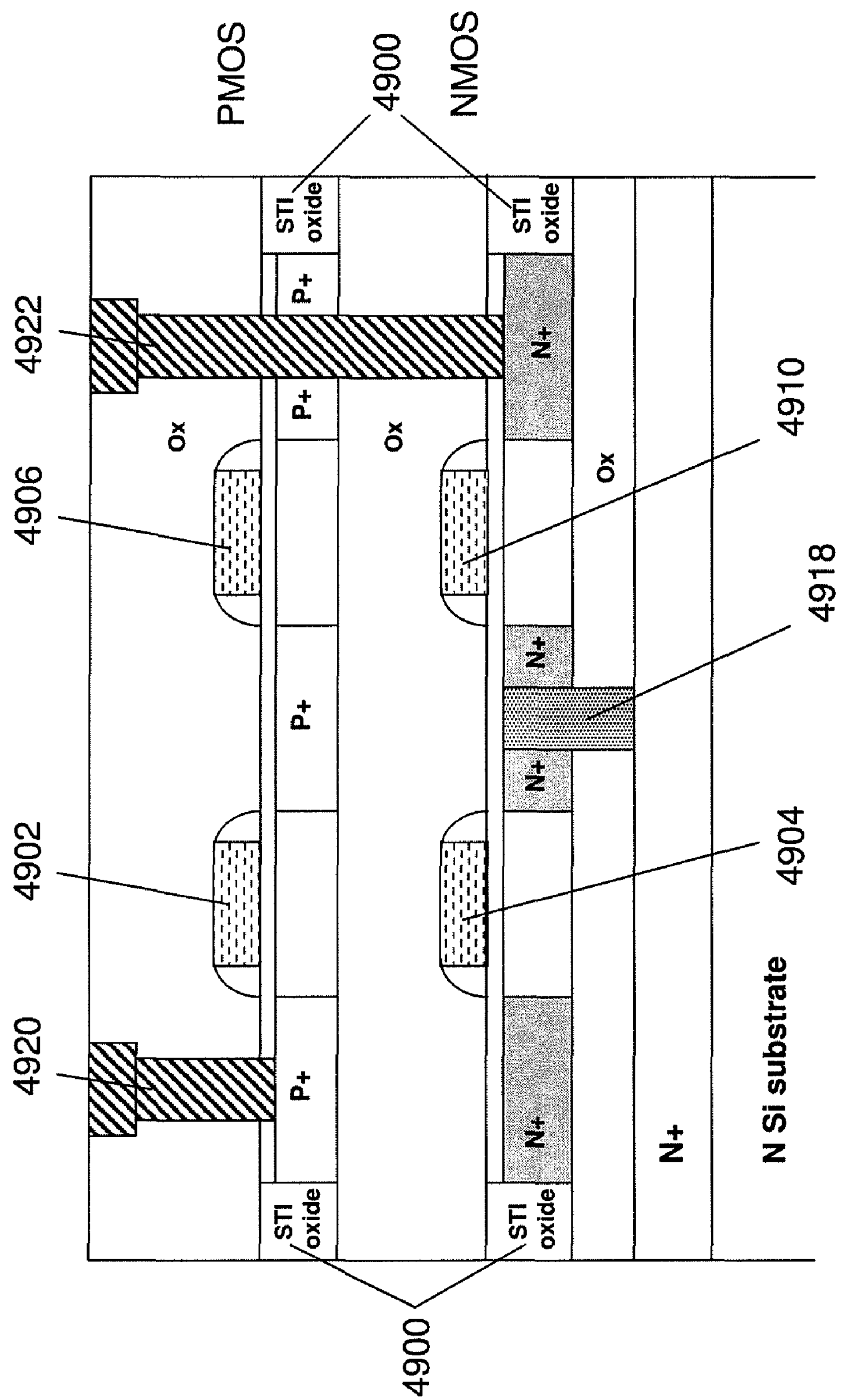

The above process flow may be used to construct an alternative compact 3D 2-input NOR cell example as illustrated in FIGS. 49A thru 49C. The topside view of the 3D cell is illustrated in FIG. 49A where the STI (shallow trench isolation) 4900 for both NMOS and PMOS may be drawn coincident on the top and sides, and not on the bottom silicon layer to allow isolation between the NMOS-A and NMOS-B transistors and allow independent gate connections. The NMOS or PMOS transistors referred to with the letter-A or -B identify which NMOS or PMOS transistor gate is connected to, either the A input or the B input, as illustrated in FIG. 47. The cell X cross sectional view is illustrated in FIG. 49B and the Y cross sectional view is illustrated in FIG. 49C. The PMOS-B gate 4902 may be drawn coincident and stacked with dummy gate 4904, and the PMOS-B gate 4902 is connected to input B by PMOS gate only on STI contact 4908. Both the NMOS-A gate 4910 and NMOS-B gate 4912 are drawn underneath the PMOS-A gate 4906. The NMOS-A gate 4910 and the PMOS-A gate 4912 are connected together and to input A by NMOS gate on STI to PMOS gate on STI contact 4914, which is similar to contact 4542 in FIG. 45G. The NMOS-B gate 4912 is connected to input B by a NMOS only gate on STI contact 4916, which is similar to contact 4546 illustrated in FIG. 45G. These are the connections for input signals A & B 4710 as illustrated in FIG. 47. The N+ source contact to the ground plane 4918 in FIGS. 49A & C makes the NMOS source to ground connection 4706 illustrated in FIG. 47. The PMOS-B source contacts 4920 to Vdd, which are similar to contact 4552 in FIG. 45G, make the PMOS source connection to +V 4707 as shown in FIG. 47. The NMOS-A&B and PMOS-B drain shared contacts 4922, which are similar to contact 4544 in FIG. 45G, make the shared connection 4708 as the output Y in FIG. 47. The ground to ground plane contact, similar to contact 4532 in FIG. 45G, is not shown. This contact may not be needed in every cell and may be shared.

Figure 50A:
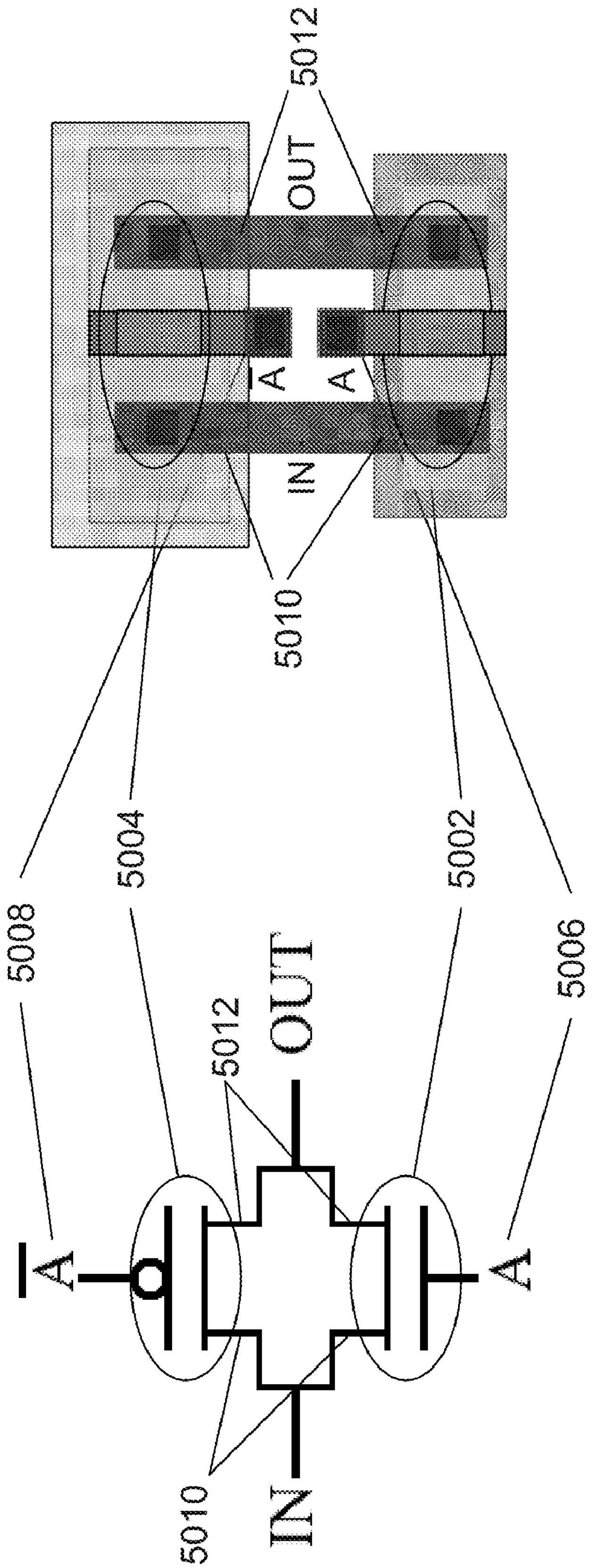
FIG. 50 A-D are drawing illustrations of a 3D CMOS Transmission cell.

The above process flow may also be used to construct a CMOS transmission gate. An example of a typical 2D CMOS transmission gate schematic and layout is illustrated in FIG. 50A. The NMOS transistor 5002 and the PMOS transistor 5004 are laid out side by side and are in differently doped wells. The control signal A as the NMOS gate input 5006 and its compliment $\overline{A}$ as the PMOS gate input 5008 allow a signal from the input to fully pass to the output when both NMOS and PMOS transistors are turned on (A=1, $\overline{A}$=0), and not to pass any input signal when both are turned off (A=0, $\overline{A}$=1). The NMOS and PMOS sources 5010 are electrically tied together and to the input, and the NMOS and PMOS drains 5012 are electrically tied together to generate the output. The structure built in 3D described below will take advantage of these connections in the 3rd dimension.

Figure 50B:
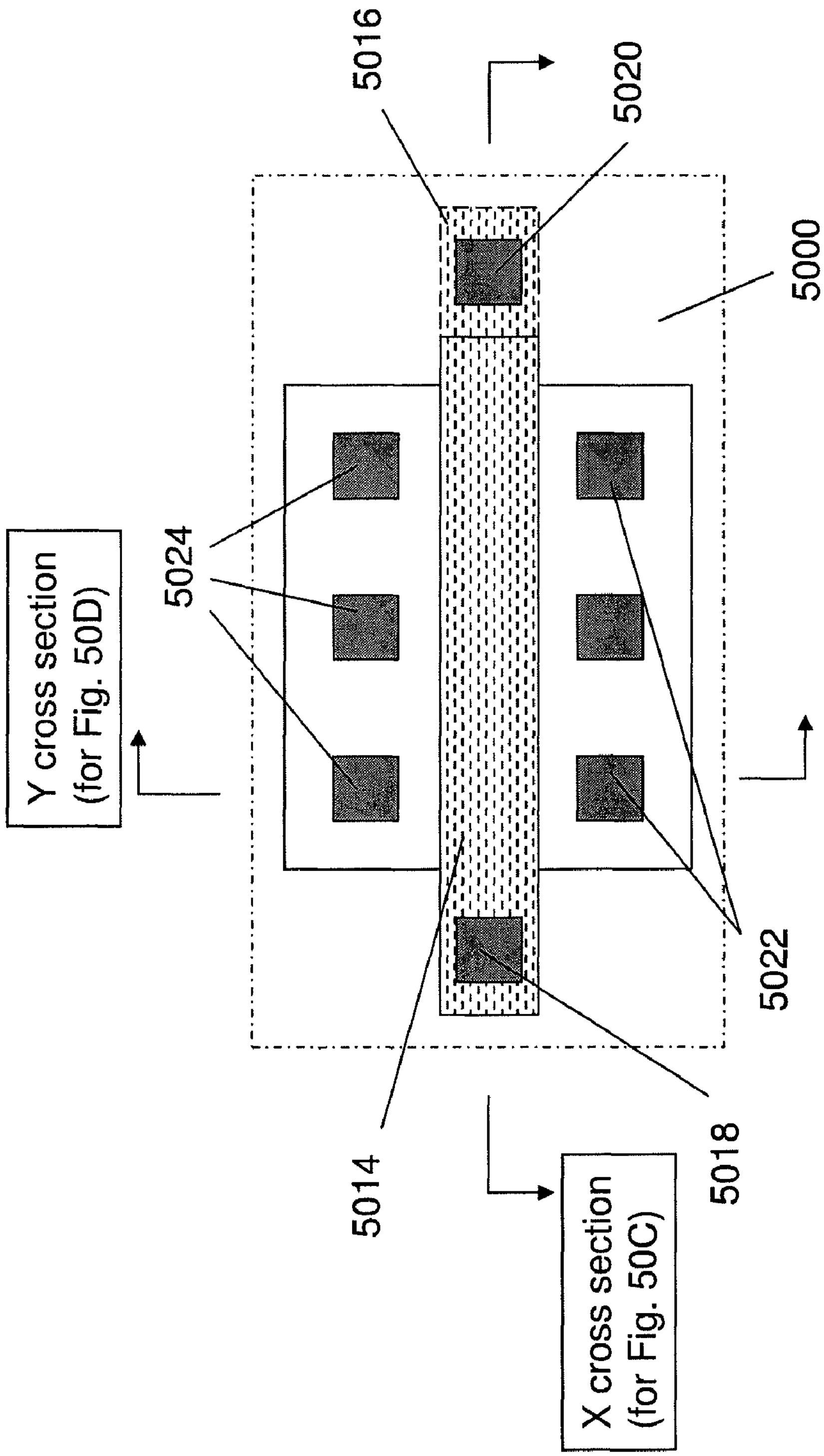
Figure 50C:
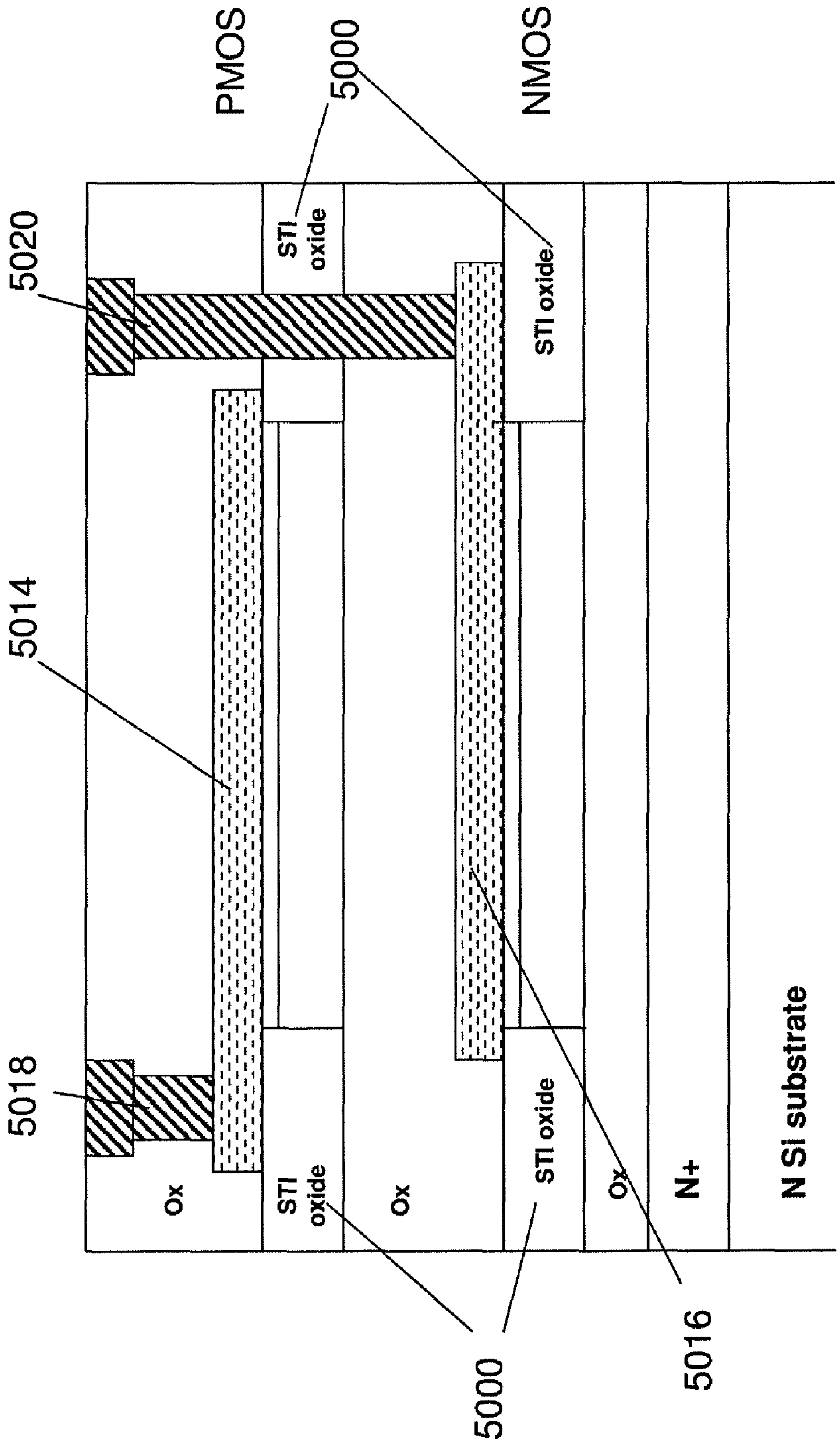
Figure 50D:
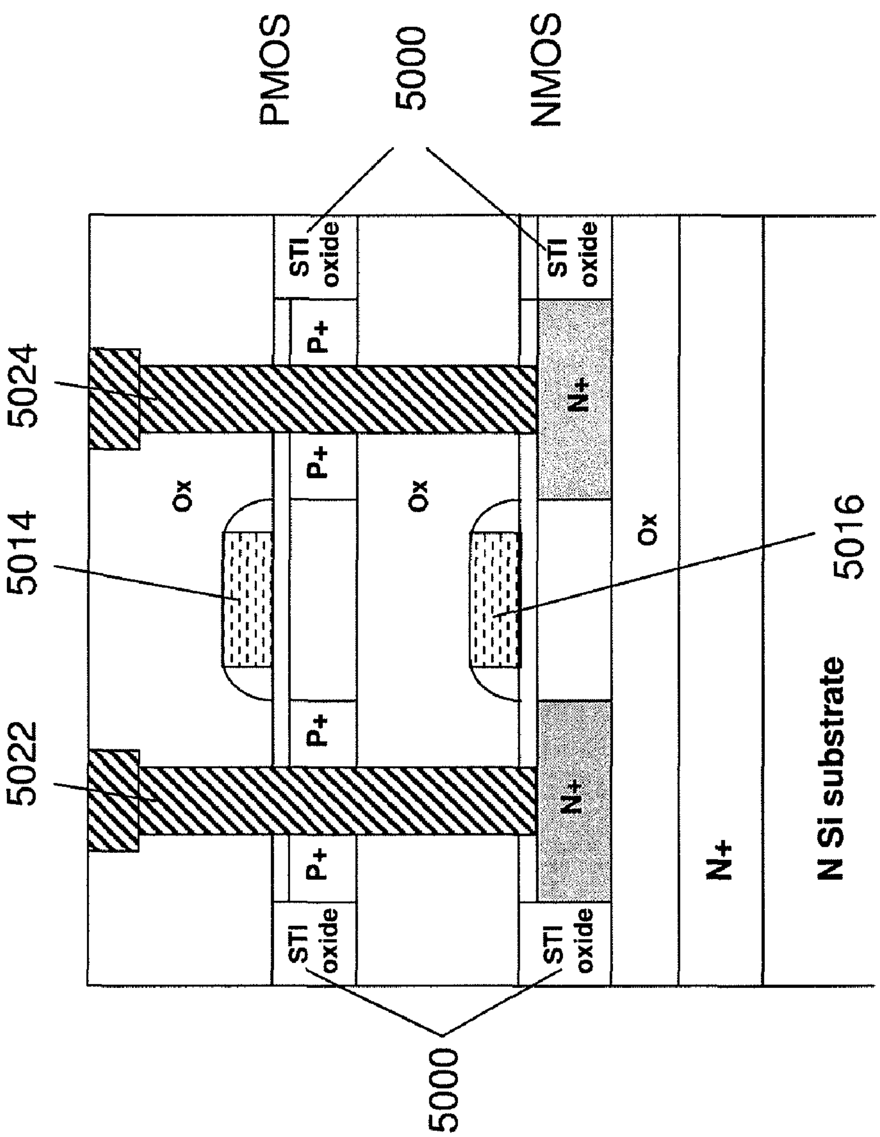

The above process flow may be used to construct a compact 3D CMOS transmission cell example as illustrated in FIGS. 50B thru 50D. The topside view of the 3D cell is illustrated in FIG. 50B where the STI (shallow trench isolation) 5000 for both NMOS and PMOS may be drawn coincident on the top and sides. The cell X cross sectional view is illustrated in FIG. 50C and the Y cross sectional view is illustrated in FIG. 50D. The PMOS gate 5014 may be drawn coincident and stacked with the NMOS gate 5016. The PMOS gate 5014 is connected to control signal $\overline{A}$ 5008 by PMOS gate only on STI contact 5018. The NMOS gate 5016 is connected to control signal A 5006 by NMOS gate only on STI contact 5020. The NMOS and PMOS source shared contacts 5022 make the shared connection 5010 for the input in FIG. 50A. The NMOS and PMOS drain shared contacts 5024 make the shared connection 5012 for the output in FIG. 50A.

Additional logic and memory cells, such as a 2-input NAND gate, a transmission gate, an MOS driver, a flip-flop, a 6T SRAM, a floating body DRAM, a CAM (Content Addressable Memory) array, etc. may be similarly constructed with this 3D process flow and methodology.

Another more compact 3D library may be constructed whereby one or more layers of metal interconnect may be allowed between the NMOS and PMOS devices. This methodology may allow more compact cell construction especially when the cells are complex; however, the top PMOS devices should now be made with a low-temperature layer transfer and transistor formation process as shown previously, unless the metals between the NMOS and PMOS layers are constructed with refractory metals, such as, for example, Tungsten.

Accordingly, the library process flow proceeds as described above for FIGS. 43 and 44. Then the layer or layers of conventional metal interconnect may be constructed on top of the NMOS devices, and then that wafer is treated as the acceptor wafer or 'House' wafer 808 and the PMOS devices may be layer transferred and constructed in one of the low temperature flows as shown in FIGS. 21, 22, 29, 39, and 40.

Figure 51A:
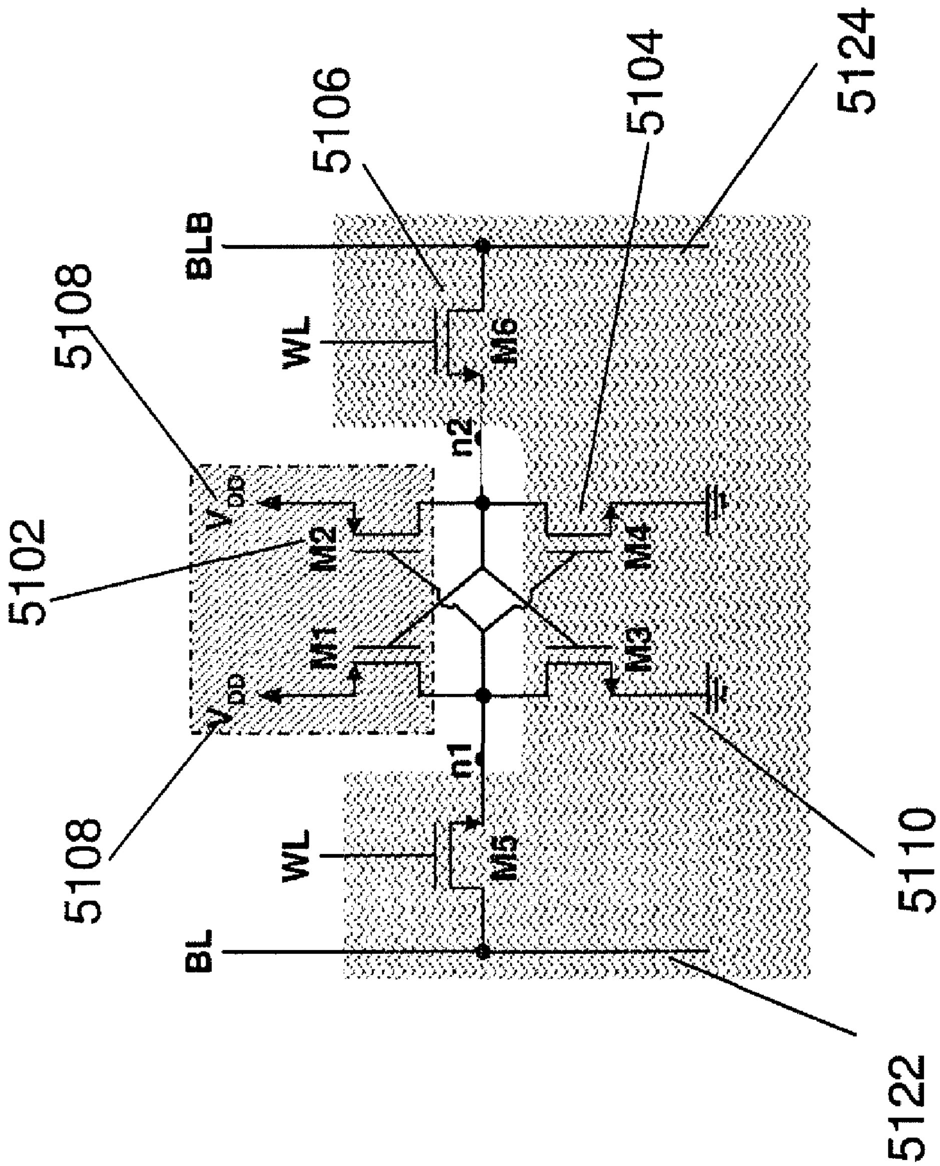
FIG. 51A-D are drawing illustrations of a 3D CMOS SRAM cell.

The above process flow may be used to construct, for example, a compact 3D CMOS 6-Transistor SRAM (Static Random Access Memory) cell as illustrated, for example, in FIGS. 51A thru 51D. The SRAM cell schematic is illustrated in FIG. 51A. Access to the cell is controlled by the word line transistors M5 and M6 where M6 is labeled as 5106. These access transistors control the connection to the bit line 5122 and the bit line bar line 5124. The two cross coupled inverters M1-M4 are pulled high to Vdd 5108 with M1 or M2 5102, and are pulled to ground 5110 thru transistors M3 or M4 5104.

Figure 51B:
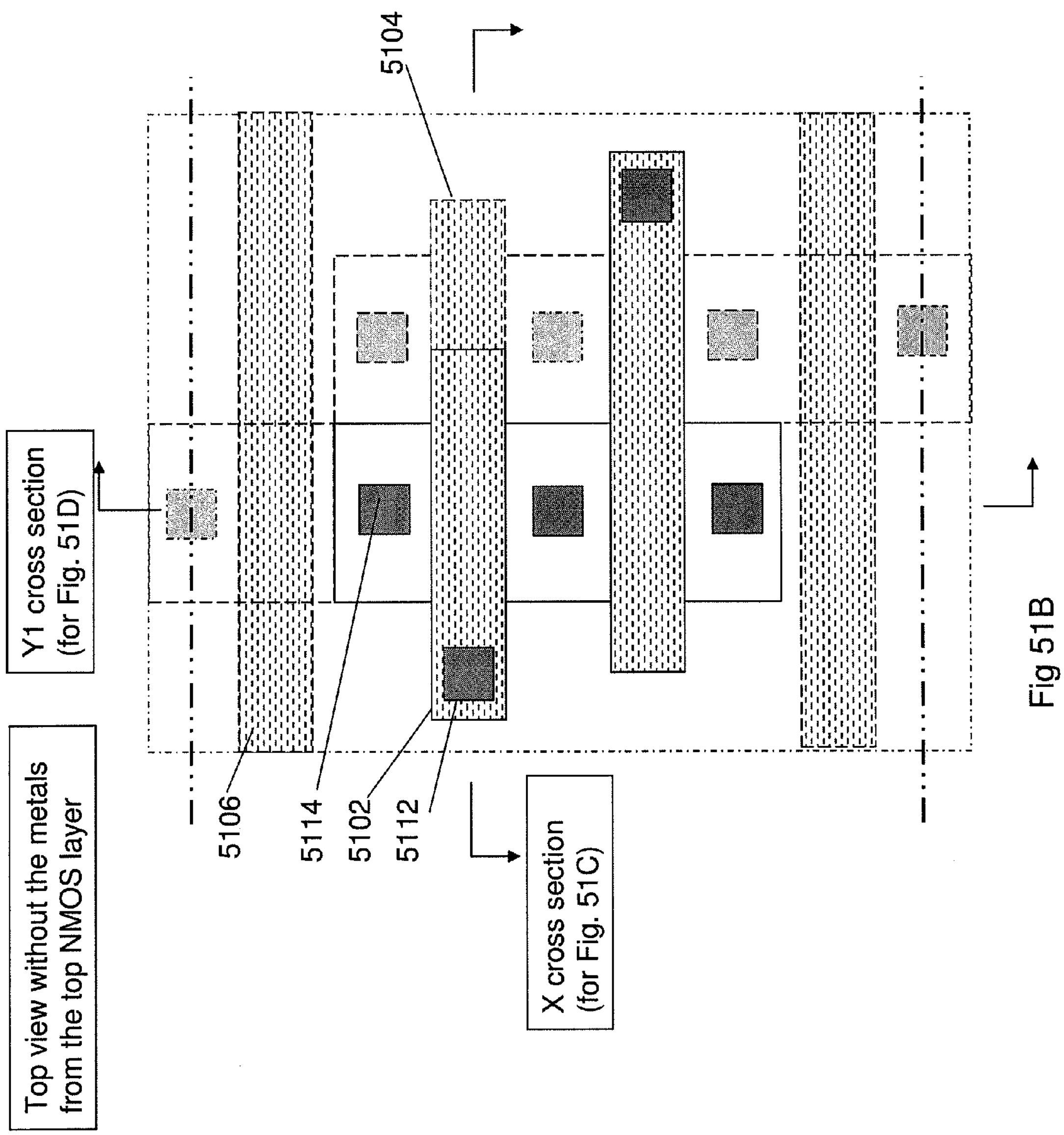
Figure 51C:
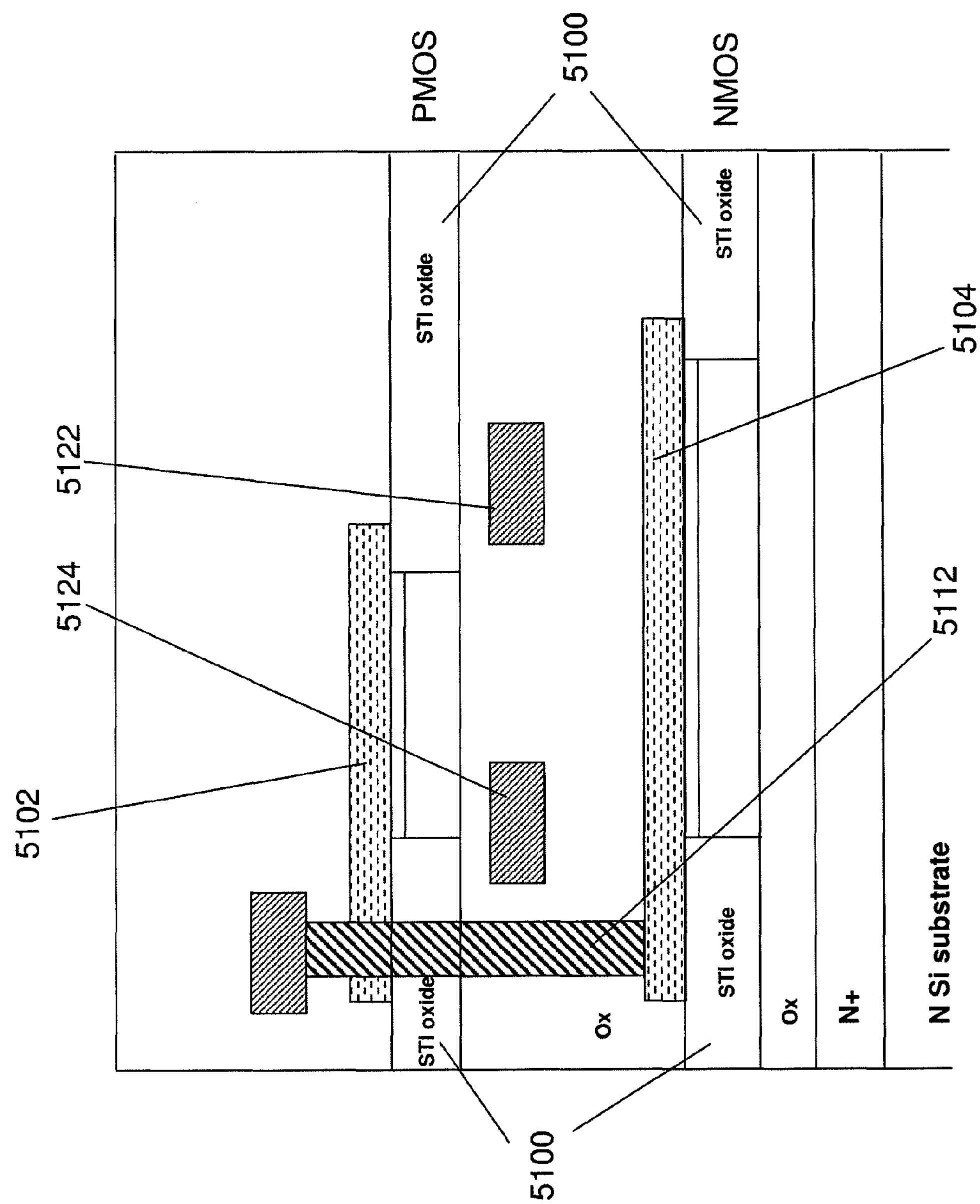
Figure 51D:
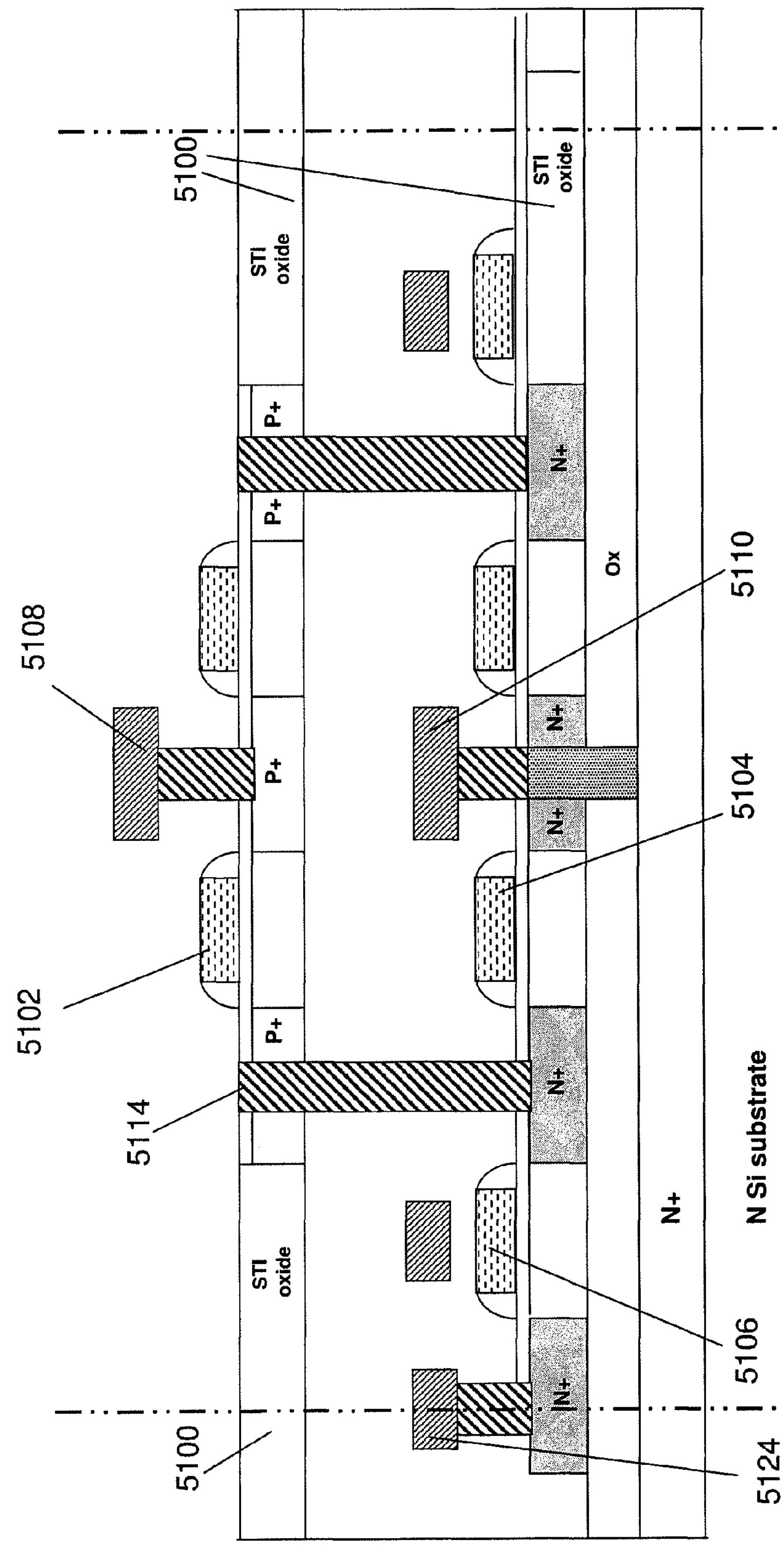

The topside NMOS, with no metal shown, view of the 3D SRAM cell is illustrated in FIG. 51B, the SRAM cell X cross sectional view is illustrated in FIG. 51C, and the Y cross sectional view is illustrated in FIG. 51D. NMOS word line access transistor M6 5106 is connected to the bit line bar 5124 with a contact to NMOS metal 1. The NMOS pull down transistor 5104 is connected to the ground line 5110 by a contact to NMOS metal 1 and to the back plane N+ ground layer. The bit line 5122 is in NMOS metal 1 and transistor isolation oxide 5100 are illustrated. The Vdd supply 5108 is brought into the cell on PMOS metal 1 and connected to M2 5102 thru a contact to P+. The PMOS poly on STI to NMOS poly on STI contact 5112 connects the gates of both M2 5102 and M4 5104 to illustrate the 3D cross coupling. The common drain connection of M2 and M4 to the bit bar access transistor M6 is made thru the PMOS P+ to NMOS N+ contact 5114.

Figure 62A:
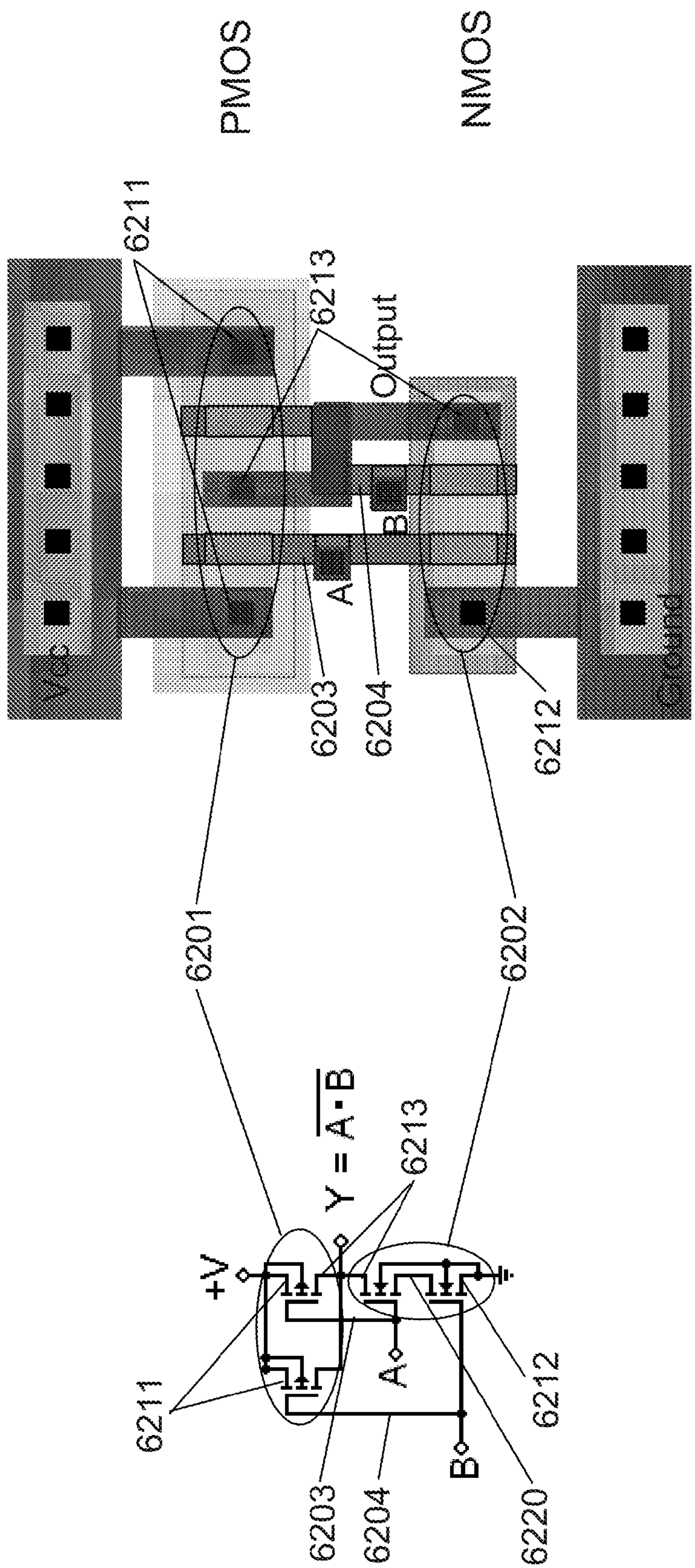
FIG. 62 A-D are drawing illustrations of a 3D NAND2 cell.

The above process flow may also be used to construct a compact 3D CMOS 2 Input NAND cell example as illustrated in FIGS. 62A thru 62D. The NAND-2 cell schematic and 2D layout is illustrated in FIG. 62A. The two PMOS transistor 6201 sources 6211 are tied together and to V+ supply and the PMOS drains are tied together and to one NMOS source 6213 and to the output Y. Input A is tied 6203 to one PMOS gate and one NMOS gate. Input B is tied 6204 to the other PMOS and NMOS gates. The NMOS A drain is tied 6220 to the NMOS B source, and the PMOS B drain 6212 is tied to ground. The structure built in 3D described below will take advantage of these connections in the 3$^{rd}$ dimension.

Figure 62B:
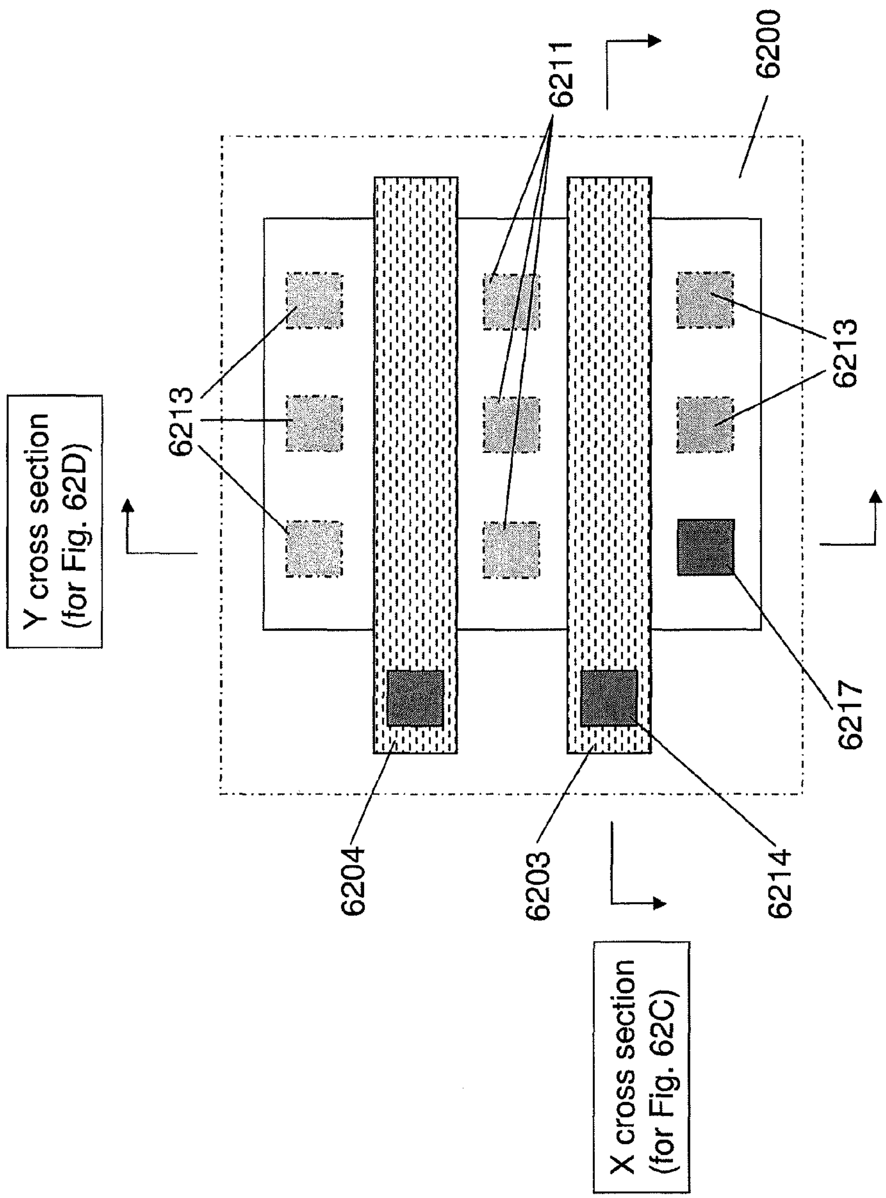
Figure 62C:
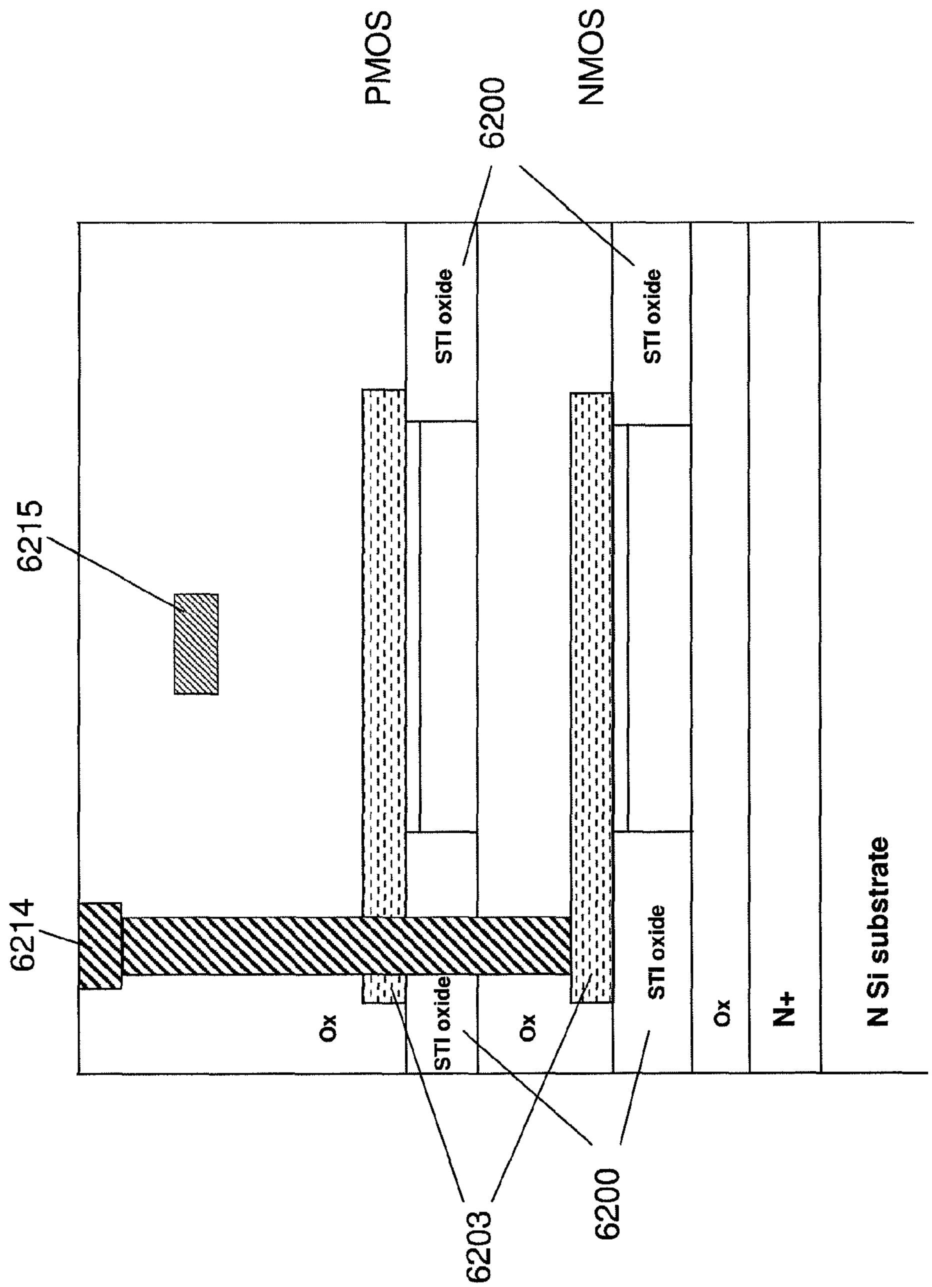
Figure 62D:
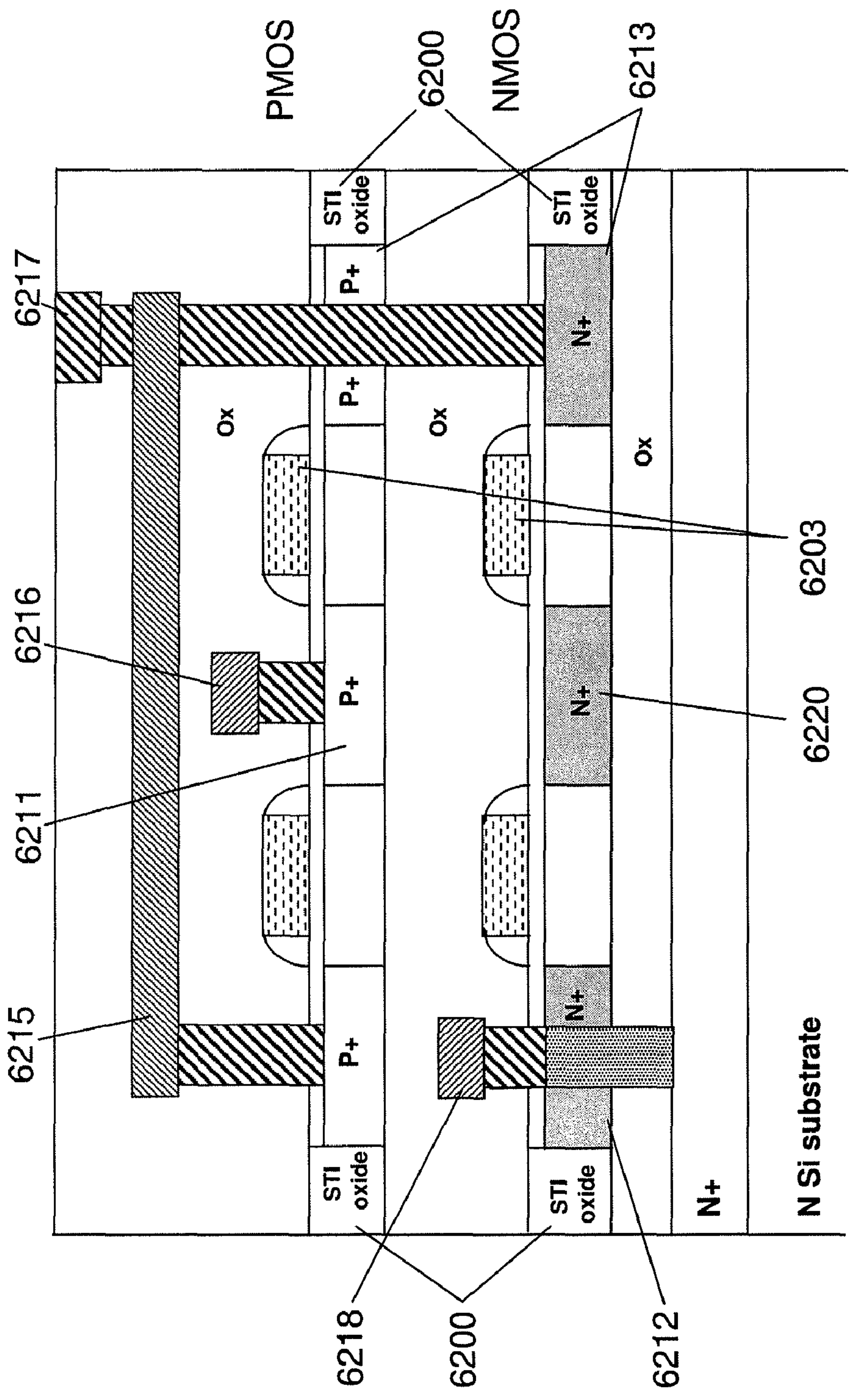

The topside view of the 3D NAND-2 cell, with no metal shown, is illustrated in FIG. 62B, the NAND-2 cell X cross sectional views is illustrated in FIG. 62C, and the Y cross sectional view is illustrated in FIG. 62D. The two PMOS sources 6211 are tied together in the PMOS silicon layer and to the V+ supply metal 6216 in the PMOS metal 1 layer thru a contact. The NMOS A drain and the PMOS A drain are tied 6213 together with a thru P+ to N+ contact and to the Output Y metal 6217 in PMOS metal 2, and also connected to the PMOS B drain contact thru PMOS metal 1 6215. Input A on PMOS metal 2 6214 is tied 6203 to both the PMOS A gate and the NMOS A gate with a PMOS gate on STI to NMOS gate on STI contact. Input B is tied 6204 to the PMOS B gate and the NMOS B using a P+ gate on STI to NMOS gate on STI contact. The NMOS A source and the NMOS B drain are tied together 6220 in the NMOS silicon layer. The NMOS B source 6212 is tied connected to the ground line 6218 by a contact to NMOS metal 1 and to the back plane N+ ground layer. The transistor isolation oxides 6200 are illustrated.

Another compact 3D library may be constructed whereby one or more layers of metal interconnect is allowed between more than two NMOS and PMOS device layers. This methodology allows a more compact cell construction especially when the cells are complex; however, devices above the first NMOS layer should now be made with a low temperature layer transfer and transistor formation process as shown previously.

Accordingly, the library process flow proceeds as described above for FIGS. 43 and 44. Then the layer or layers of conventional metal interconnect may be constructed on top of the NMOS devices, and then that wafer is treated as the acceptor wafer or house 808 and the PMOS devices may be layer transferred and constructed in one of the low temperature flows as shown in FIGS. 21, 22, 29, 39, and 40. And then this low temperature process may be repeated again to form another layer of PMOS or NMOS device, and so on.

Figure 53A:
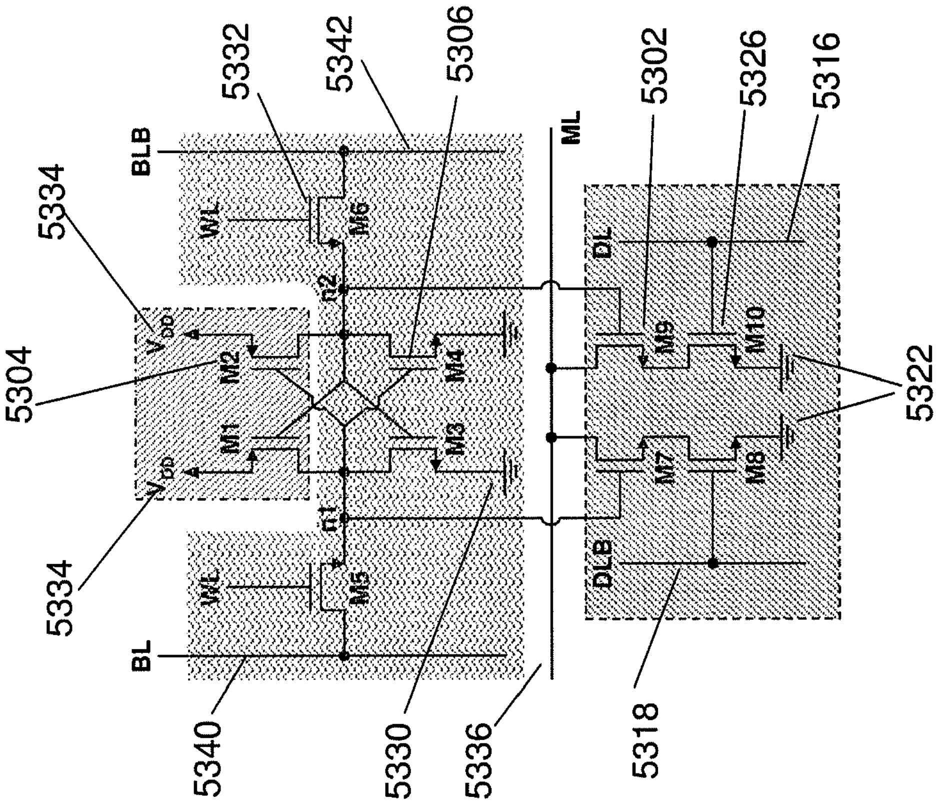
FIG. 53 A-E are drawing illustrations of a 3D CAM cell.

The above process flow may also be used to construct a compact 3D CMOS Content Addressable Memory (CAM) array as illustrated in FIGS. 53A to 53E. The CAM cell schematic is illustrated in FIG. 53A. Access to the SRAM cell is controlled by the word line transistors M5 and M6 where M6 is labeled as 5332. These access transistors control the connection to the bit line 5342 and the bit line bar line 5340. The two cross coupled inverters M1-M4 are pulled high to Vdd 5334 with M1 or M2 5304, and are pulled to ground 5330 thru transistors M3 or M4 5306. The match line 5336 delivers comparison circuit match or mismatch state to the match address encoder. The detect line 5316 and detect line bar 5318 select the comparison circuit cell for the address search and connect to the gates of the pull down transistors M8 and M10 5326 to ground 5322. The SRAM state read transistors M7 and M9 5302 gates are connected to the SRAM cell nodes n1 and n2 to read the SRAM cell state into the comparison cell. The structure built in 3D described below may take advantage of these connections in the 3$^{rd}$ dimension.

Figure 53B:
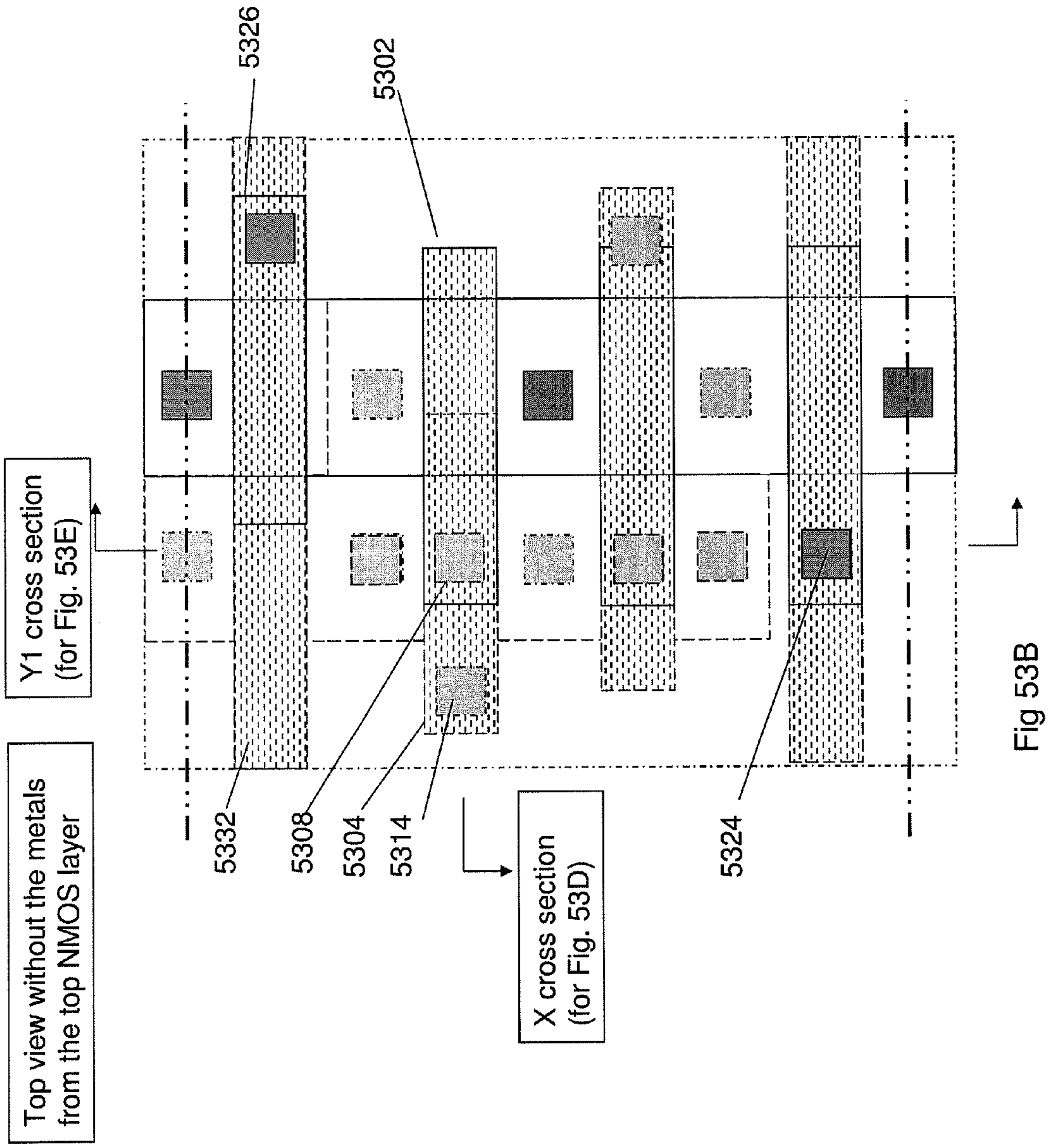
Figure 53C:
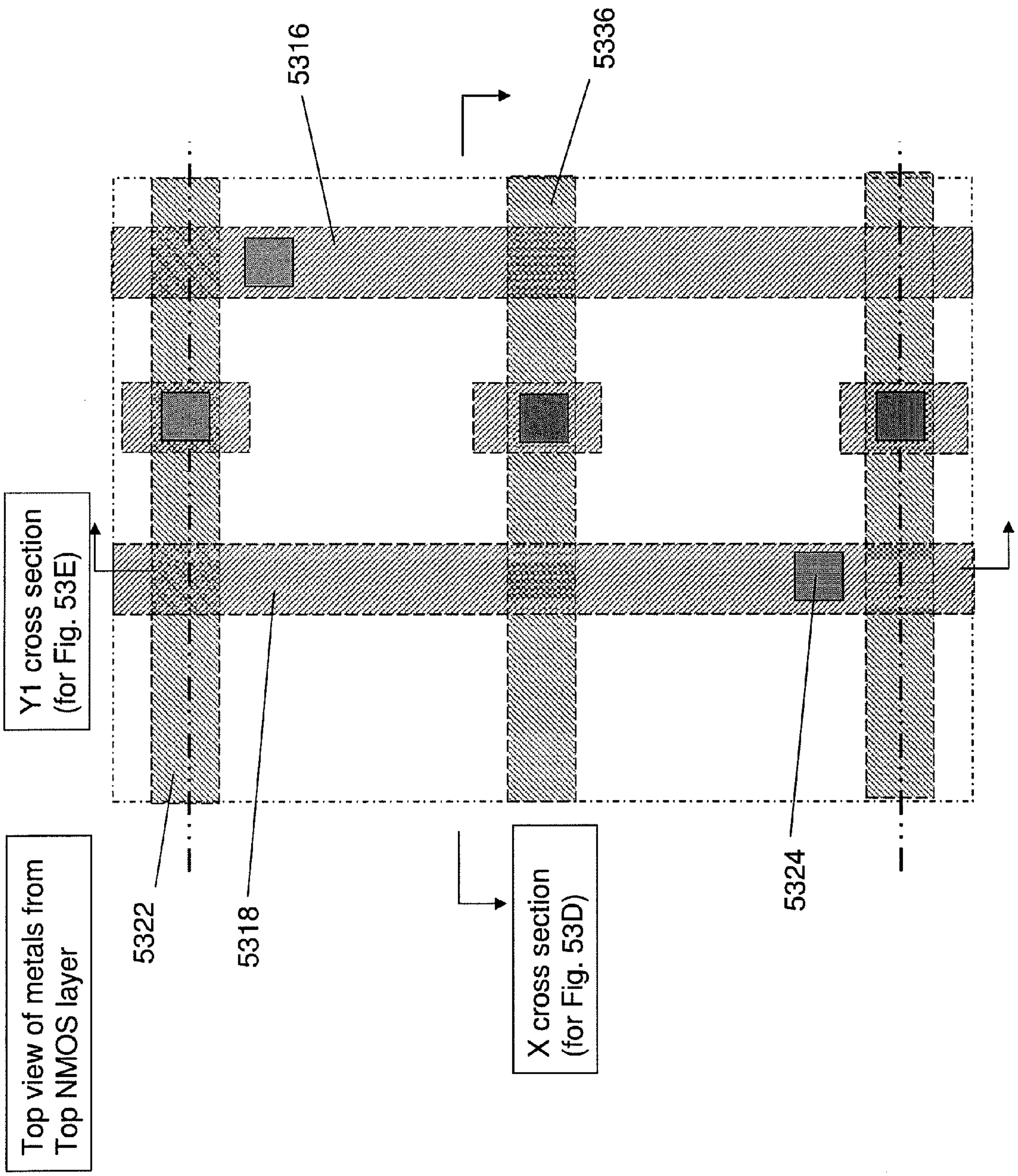
Figure 53D:
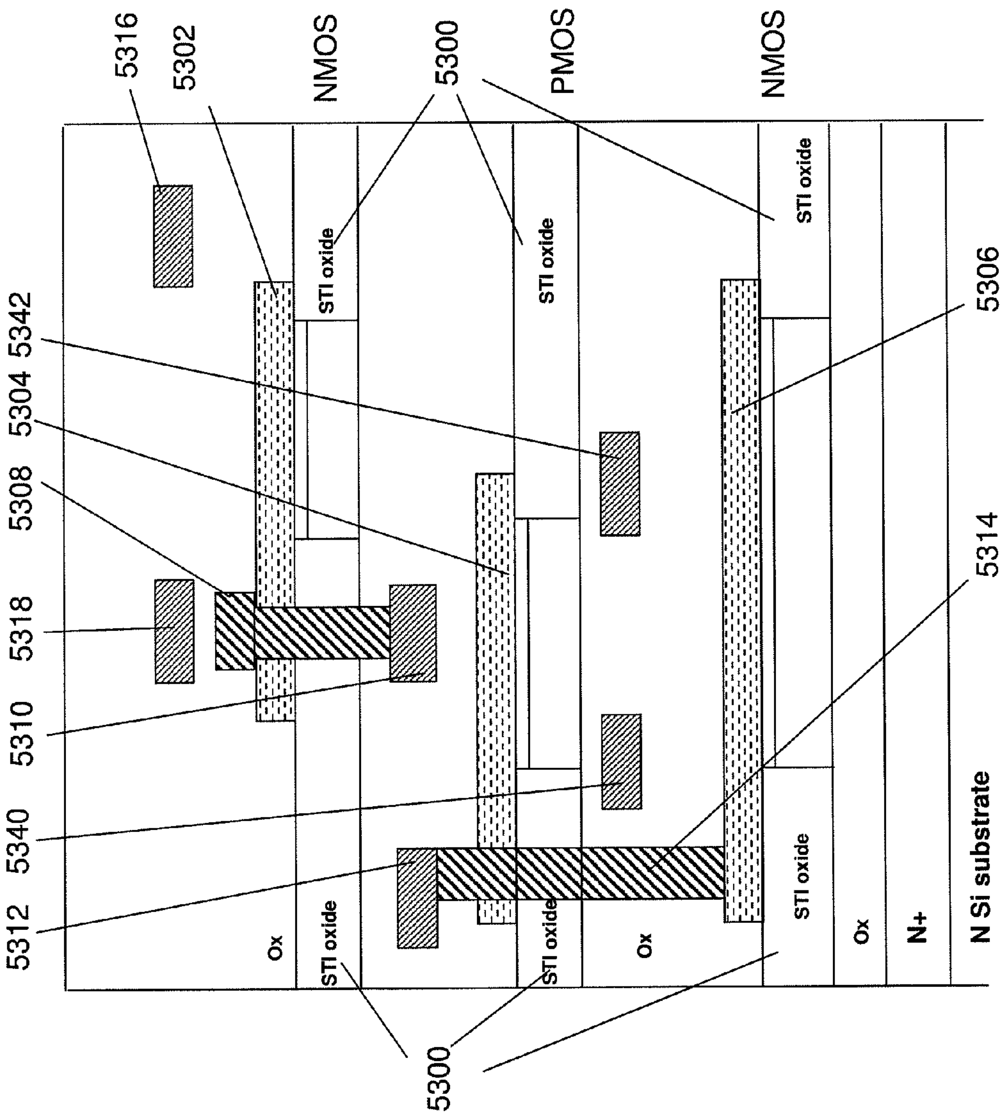
Figure 53E:
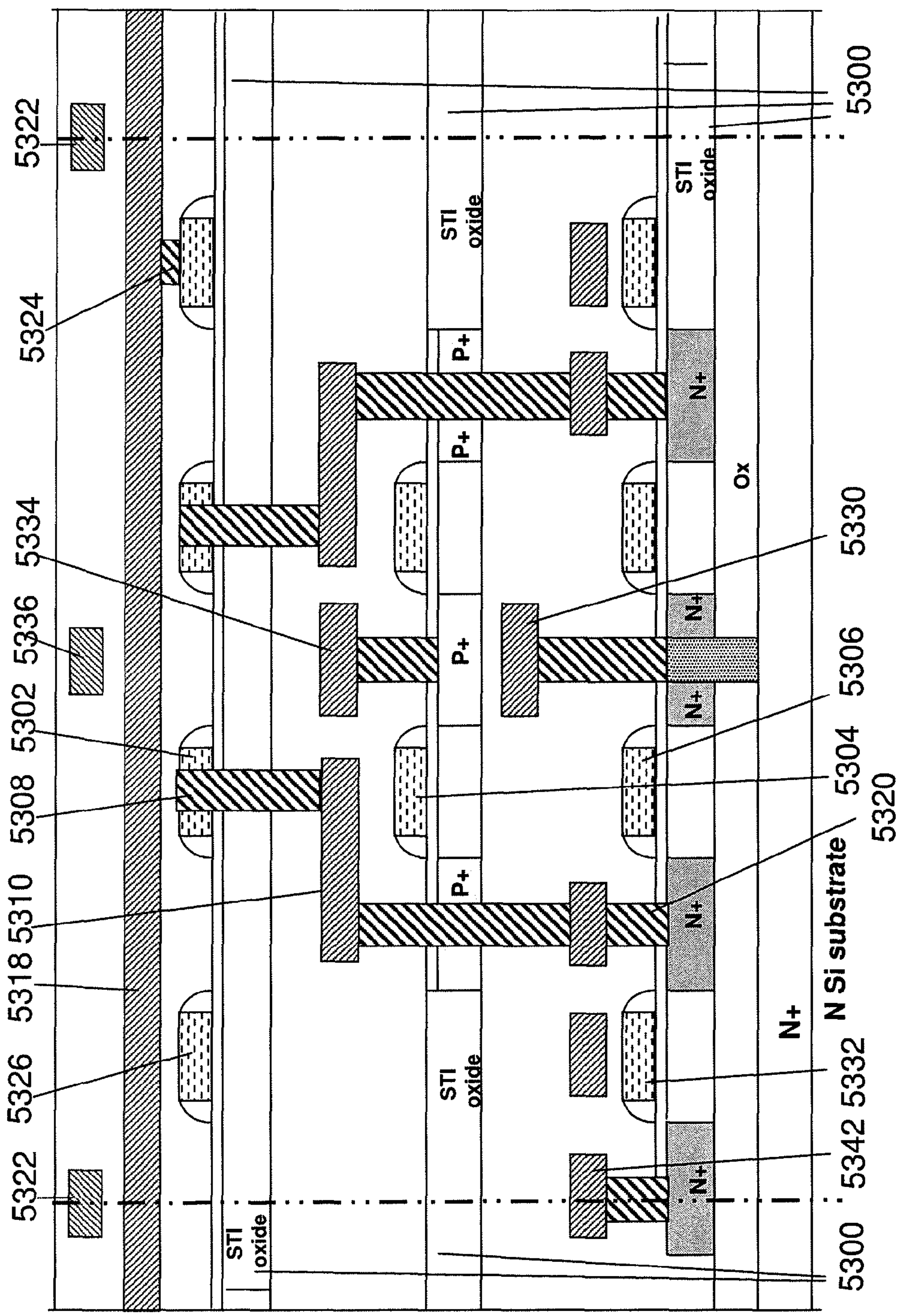

The topside top NMOS view of the 3D CAM cell, without metals shown, is illustrated in FIG. 53B, the topside top NMOS view of the 3D CAM cell, with metal shown, is illustrated in FIG. 53C, the 3DCAM cell X cross sectional view is illustrated in FIG. 53D, and the Y cross sectional view is illustrated in FIG. 53E. The bottom NMOS word line access transistor M6 5332 is connected to the bit line bar 5342 with an N+ contact to NMOS metal 1. The bottom NMOS pull down transistor 5306 is connected to the ground line 5330 by an N+ contact to NMOS metal 1 and to the back plane N+ ground layer. The bit line 5340 is in NMOS metal 1 and transistor isolation oxides 5300 are illustrated. The ground 5322 is brought into the cell on top NMOS metal-2. The Vdd supply 5334 is brought into the cell on PMOS metal-1 5334 and connects to M2 5304 thru a contact to P+. The PMOS poly on STI to bottom NMOS poly on STI contact 5314 connects the gates of both M2 5304 and M4 5306 to illustrate the SRAM 3D cross coupling and connects to the comparison cell node n1 thru PMOS metal-1 5312. The common drain connection of M2 and M4 to the bit bar access transistor M6 is made thru the PMOS P+ to NMOS N+ contact 5320 and connects node n2 to the M9 gate 5302 via PMOS metal-1 5310 and metal to gate on STI contact 5308. Top NMOS comparison cell ground pulldown transistor M10 gate 5326 is connected to detect line 5316 with a NMOS metal-2 to gate poly on STI contact. The detect line bar 5318 in top NMOS metal-2 connects thru contact 5324 to the gate of M8 in the top NMOS layer. The match line 5336 in top NMOS metal-2 connects to the drain side of M9 and M7.

Another compact 3D library may be constructed whereby one or more layers of metal interconnect is allowed between the NMOS and PMOS devices and one or more of the devices is constructed vertically.

Figure 63A:
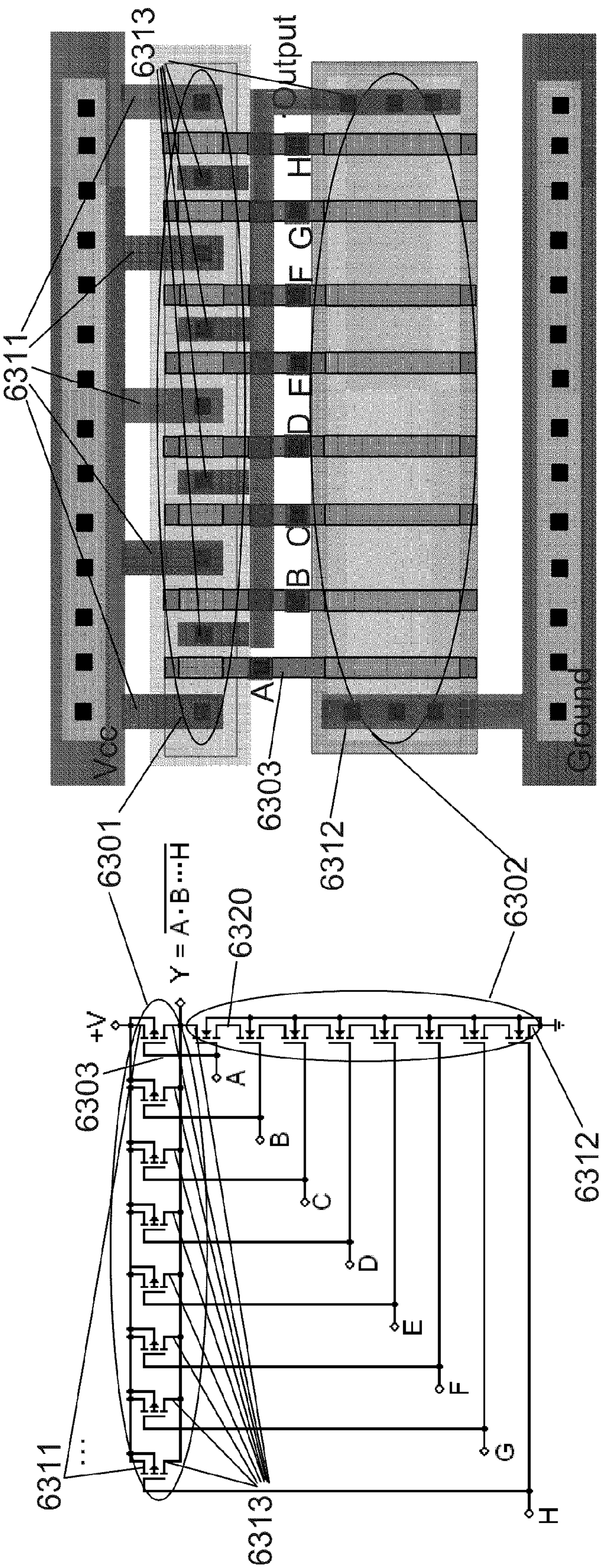
FIG. 63 A-G are drawing illustrations of a 3D NAND8 cell.

A compact 3D CMOS 8 Input NAND cell may be constructed as illustrated in FIGS. 63A thru 63G. The NAND-8 cell schematic and 2D layout is illustrated in FIG. 63A. The eight PMOS transistor 6301 sources 6311 are tied together and to V+ supply and the PMOS drains are tied together 6313 and to the NMOS A drain and to the output Y. Inputs A to H are tied to one PMOS gate and one NMOS gate. Input A is tied 6303 to the PMOS A gate and NMOS A gate. The NMOS A source is tied 6320 to the NMOS B drain, and the NMOS H source 6312 is tied to ground. The structure built in 3D described below will take advantage of these connections in the 3$^{rd}$ dimension.

Figure 63B:
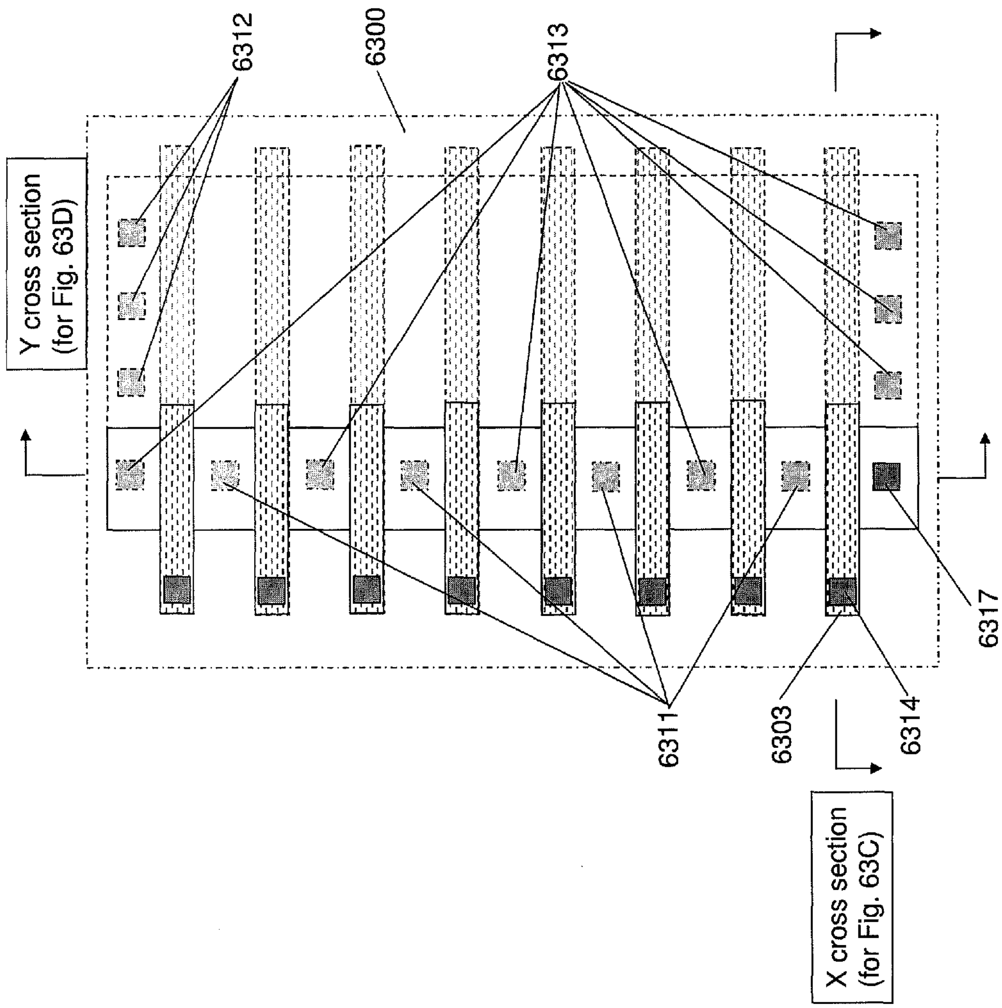
Figure 63C:
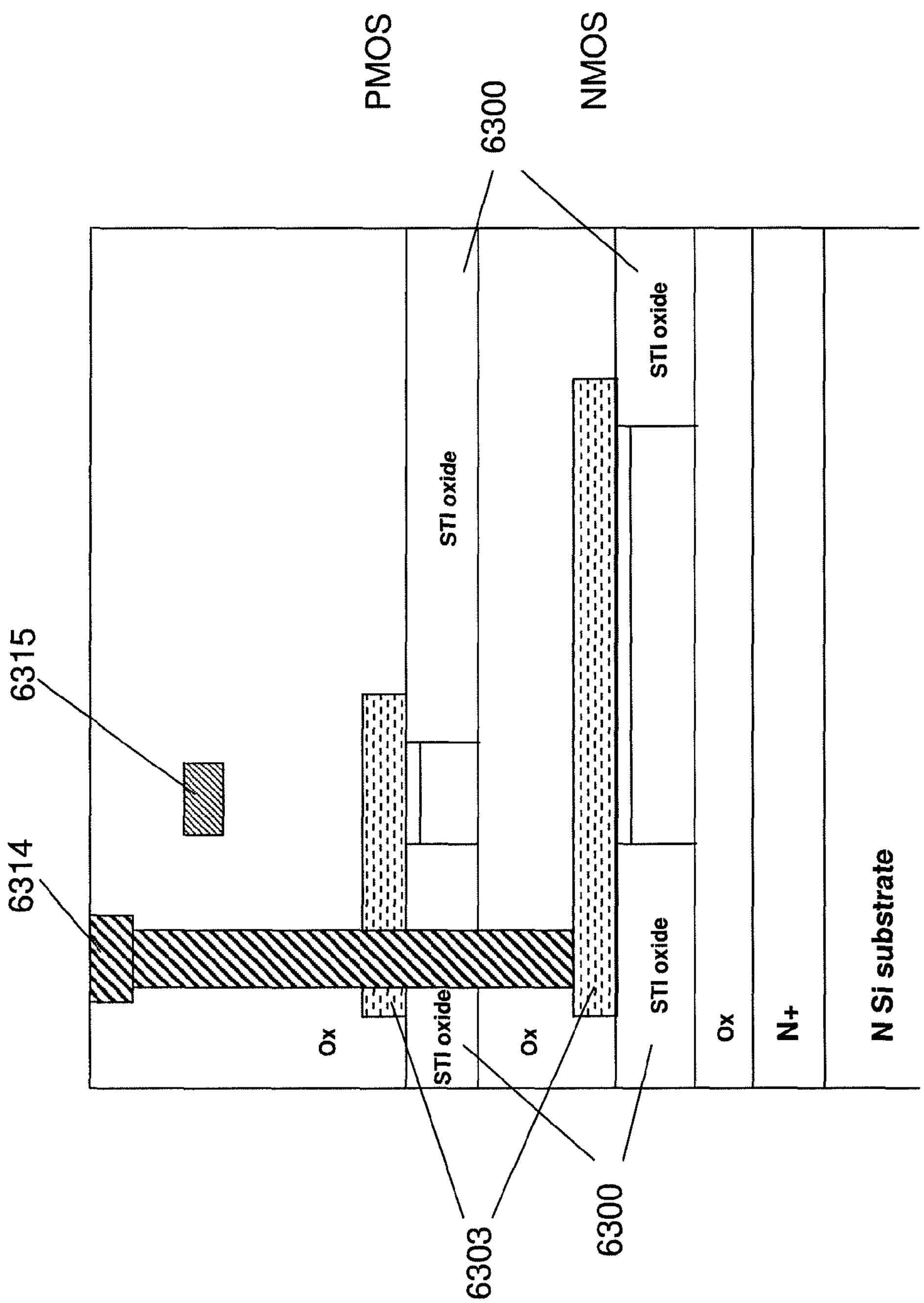
Figure 63D:
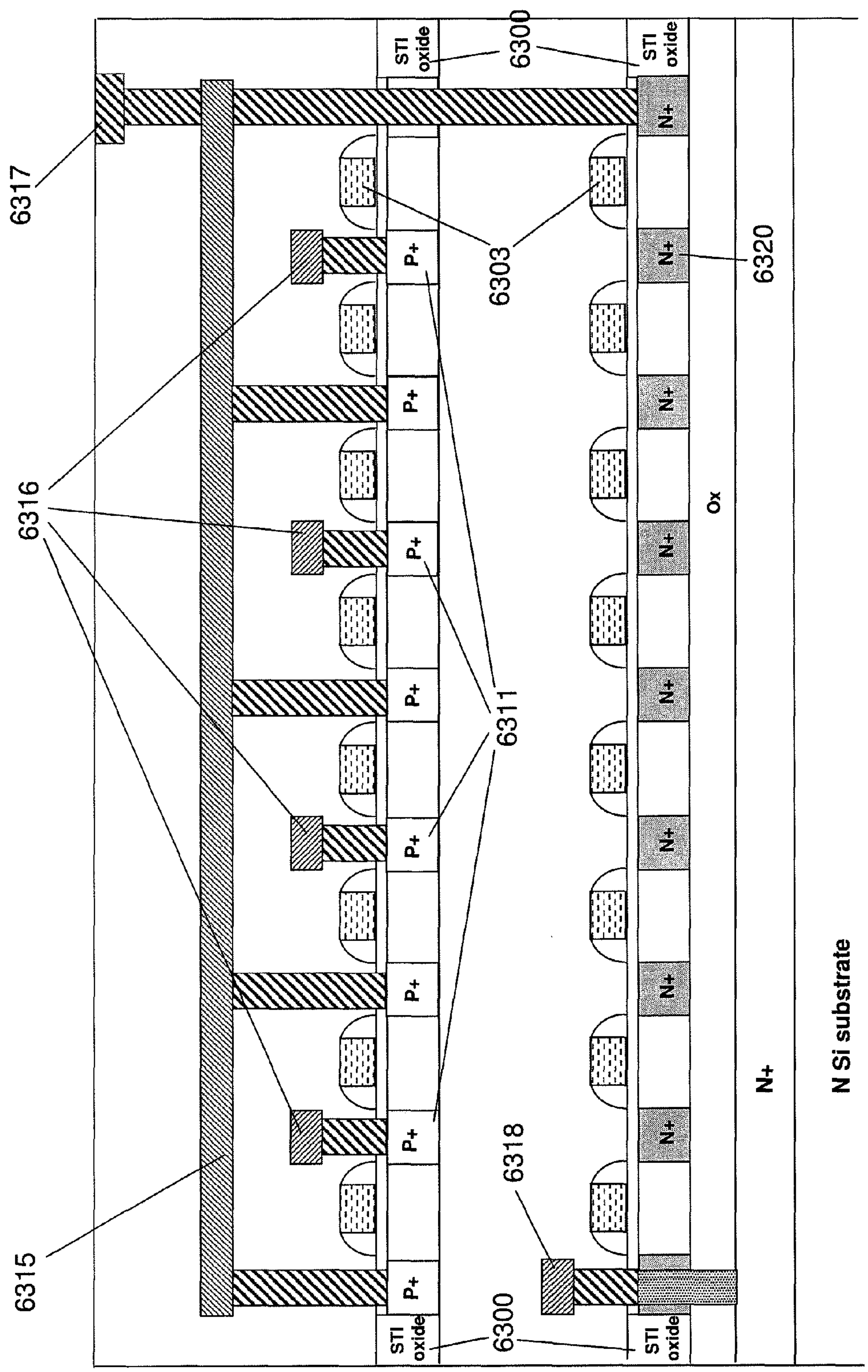
Figure 63E:
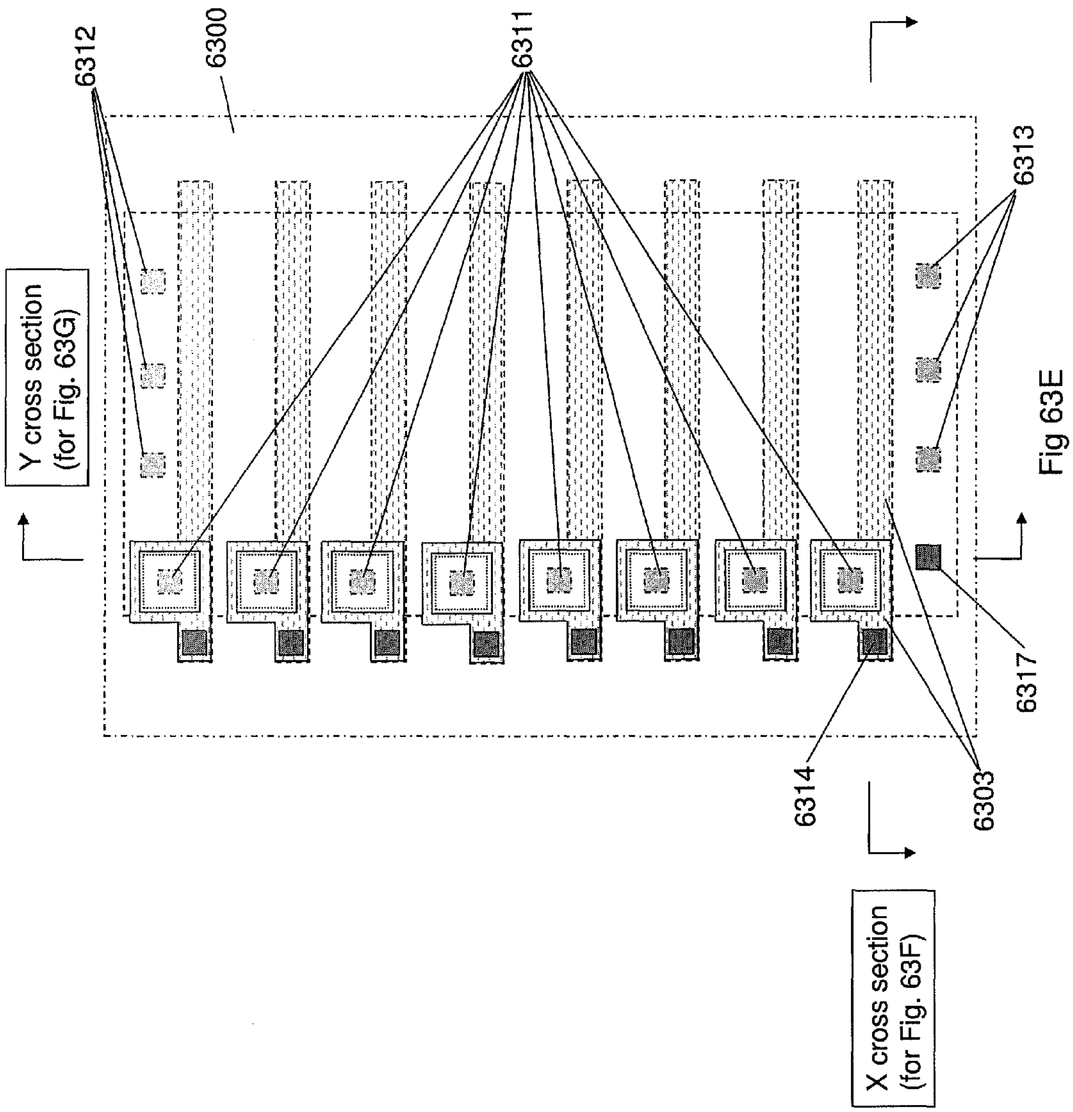
Figure 63F:
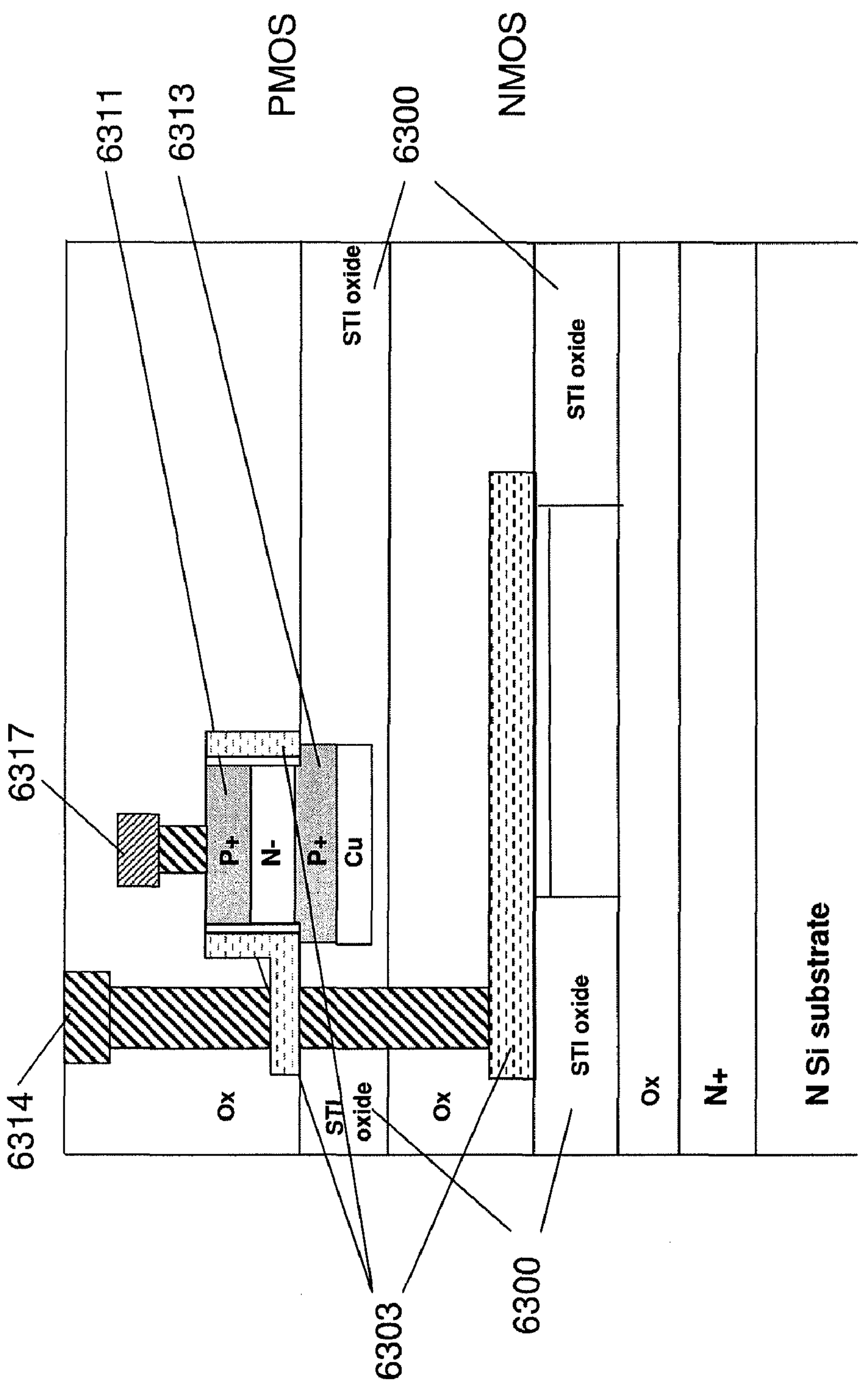
Figure 63G:
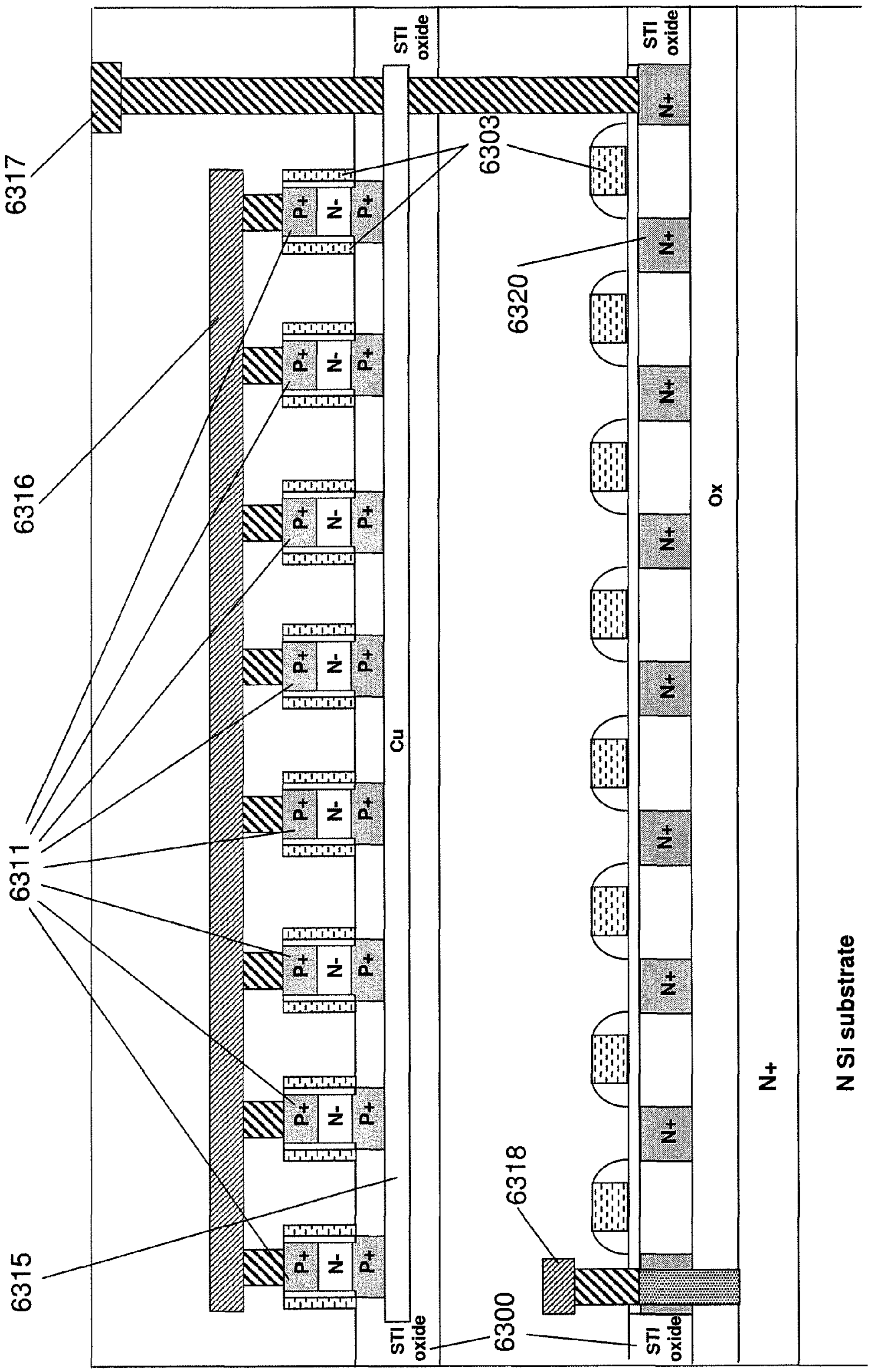

The topside view of the 3D NAND-8 cell, with no metal shown and with horizontal NMOS and PMOS devices, is illustrated in FIG. 63B, the cell X cross sectional views is illustrated in FIG. 63C, and the Y cross sectional view is illustrated in FIG. 63D. The NAND-8 cell with vertical PMOS and horizontal NMOS devices are shown in FIGS. 63E for topside view, 63F for the X cross section view, and 63H for the Y cross sectional view. The eight PMOS sources 6311 are tied together in the PMOS silicon layer and to the V+ supply metal 6316 in the PMOS metal 1 layer thru P+ to Metal contacts. The NMOS A drain and the PMOS A drain are tied 6313 together with a thru P+ to N+ contact 6317 and to the output Y supply metal 6315 in PMOS metal 2, and also connected to all of the PMOS drain contacts thru PMOS metal 1 6315. Input A on PMOS metal 2 6314 is tied 6303 to both the PMOS A gate and the NMOS A gate with a PMOS gate on STI to NMOS gate on STI contact. All the other inputs are tied to P and N gates in similar fashion. The NMOS A source and the NMOS B drain are tied together 6320 in the NMOS silicon layer. The NMOS H source 6232 is tied connected to the ground line 6318 by a contact to NMOS metal 1 and to the back plane N+ ground layer. The transistor isolation oxides 6300 are illustrated.

Figure 64A:
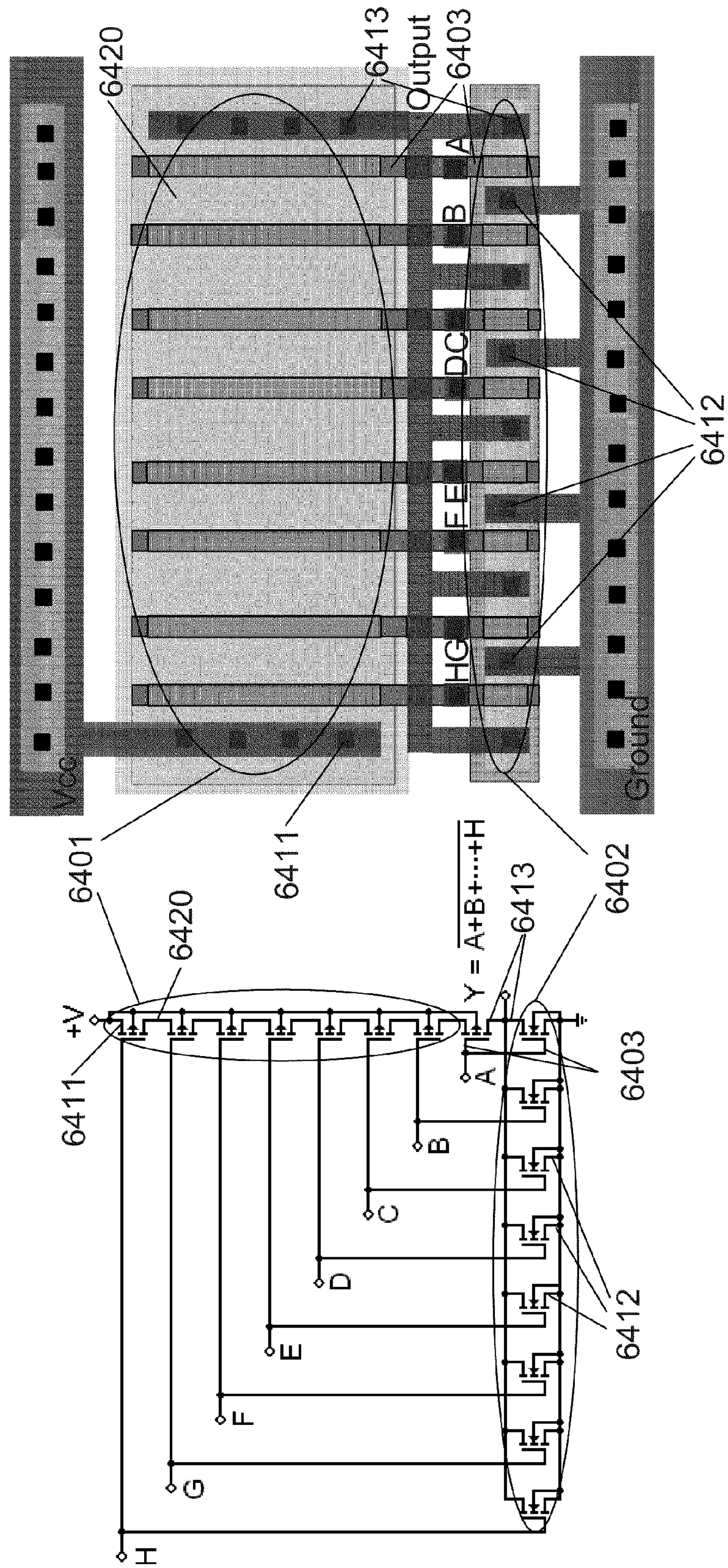
FIG. 64 A-G are drawing illustrations of a 3D NOR8 cell.

A compact 3D CMOS 8 Input NOR may be constructed as illustrated in FIGS. 64A thru 64G. The NOR-8 cell schematic and 2D layout is illustrated in FIG. 64A. The PMOS H transistor source 6411 may be tied to V+ supply. The NMOS drains are tied together 6413 and to the drain of PMOS A and to Output Y. Inputs A to H are tied to one PMOS gate and one NMOS gate. Input A is tied 6403 to the PMOS A gate and NMOS A gate. The NMOS sources are all tied 6412 to ground. The PMOS H drain is tied 6420 to the next PMOS source in the stack, PMOS G, and repeated so forth. The structure built in 3D described below will take advantage of these connections in the 3$^{rd}$ dimension.

Figure 64B:
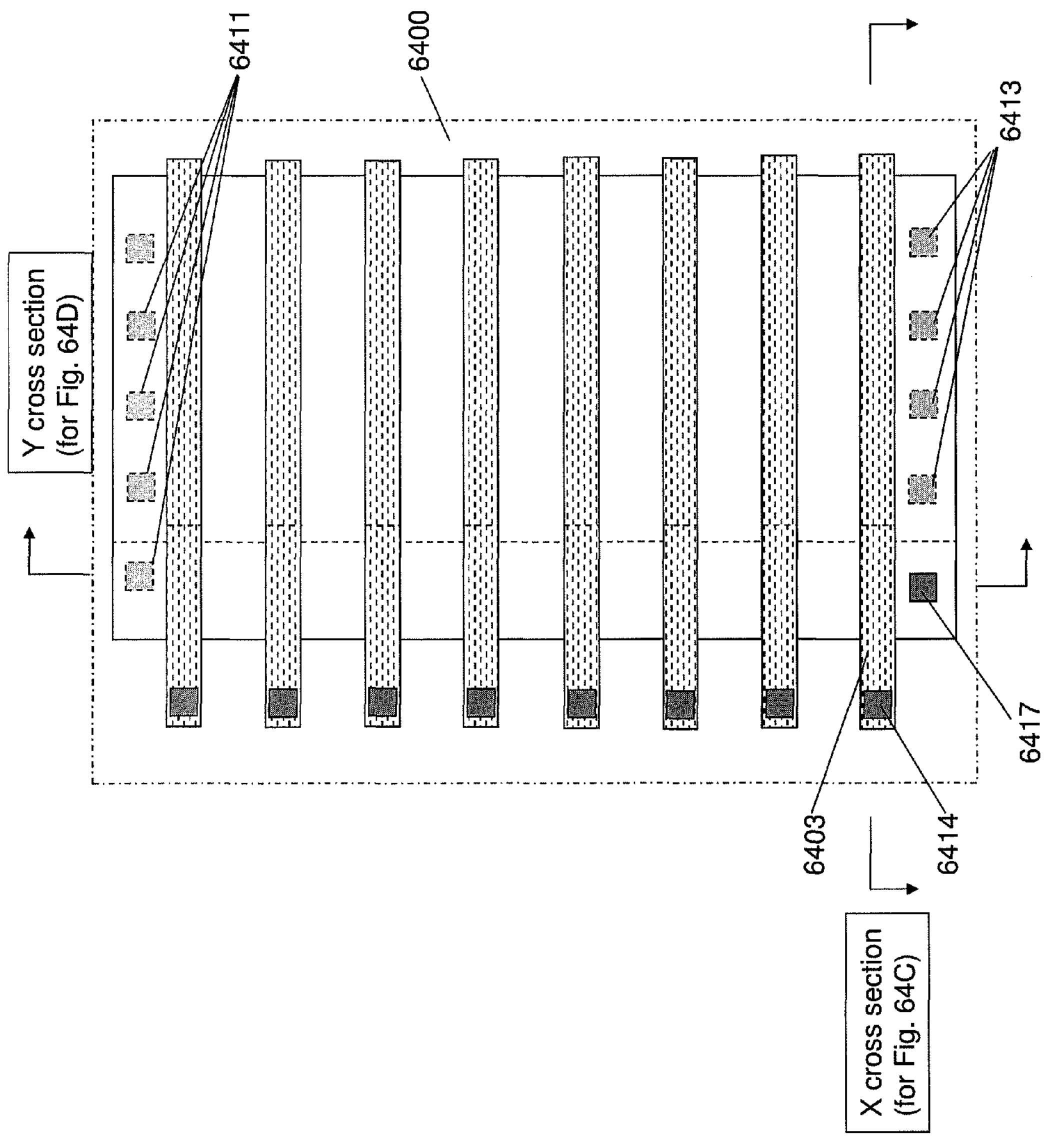
Figure 64C:
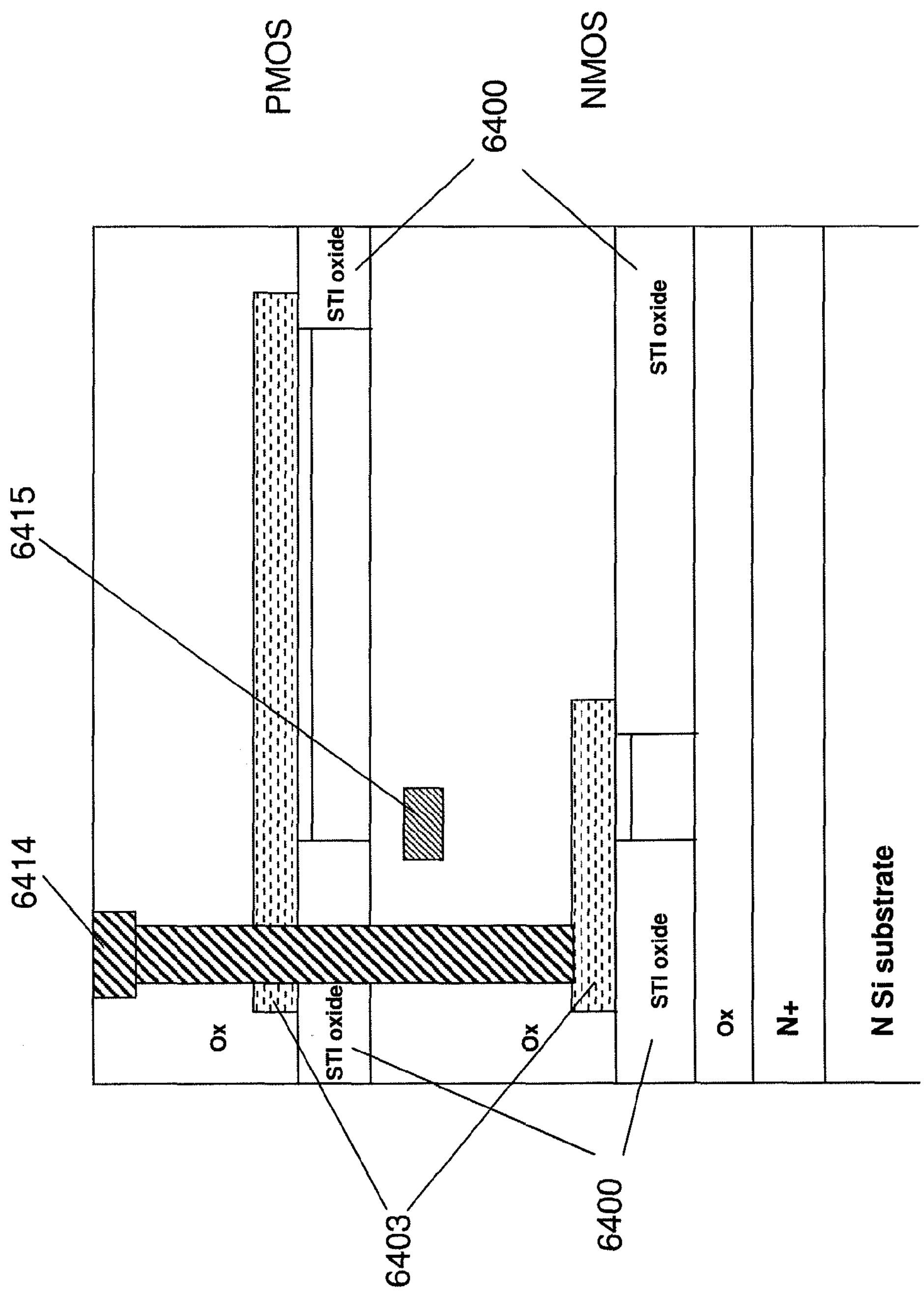
Figure 64D:
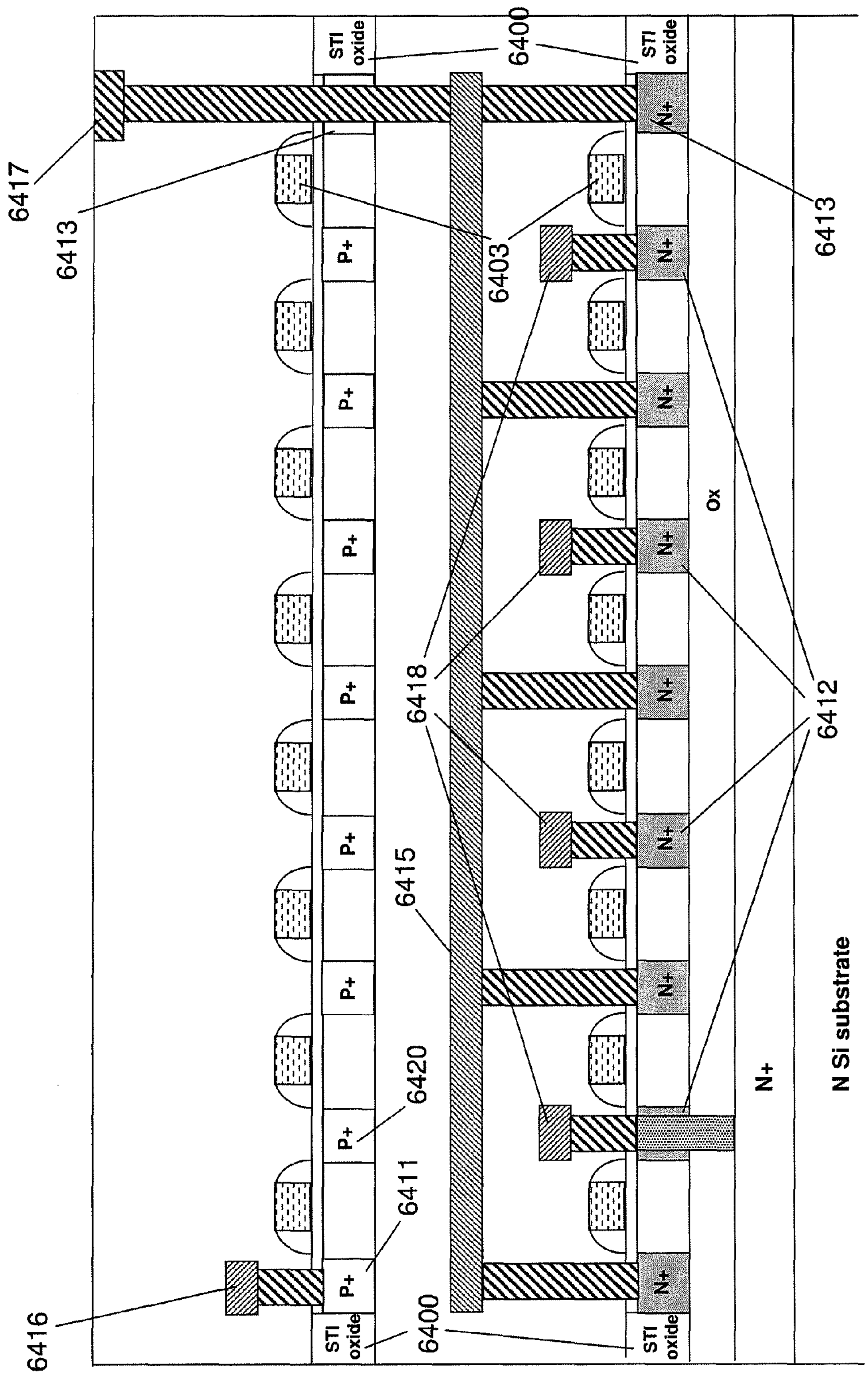
Figure 64E:
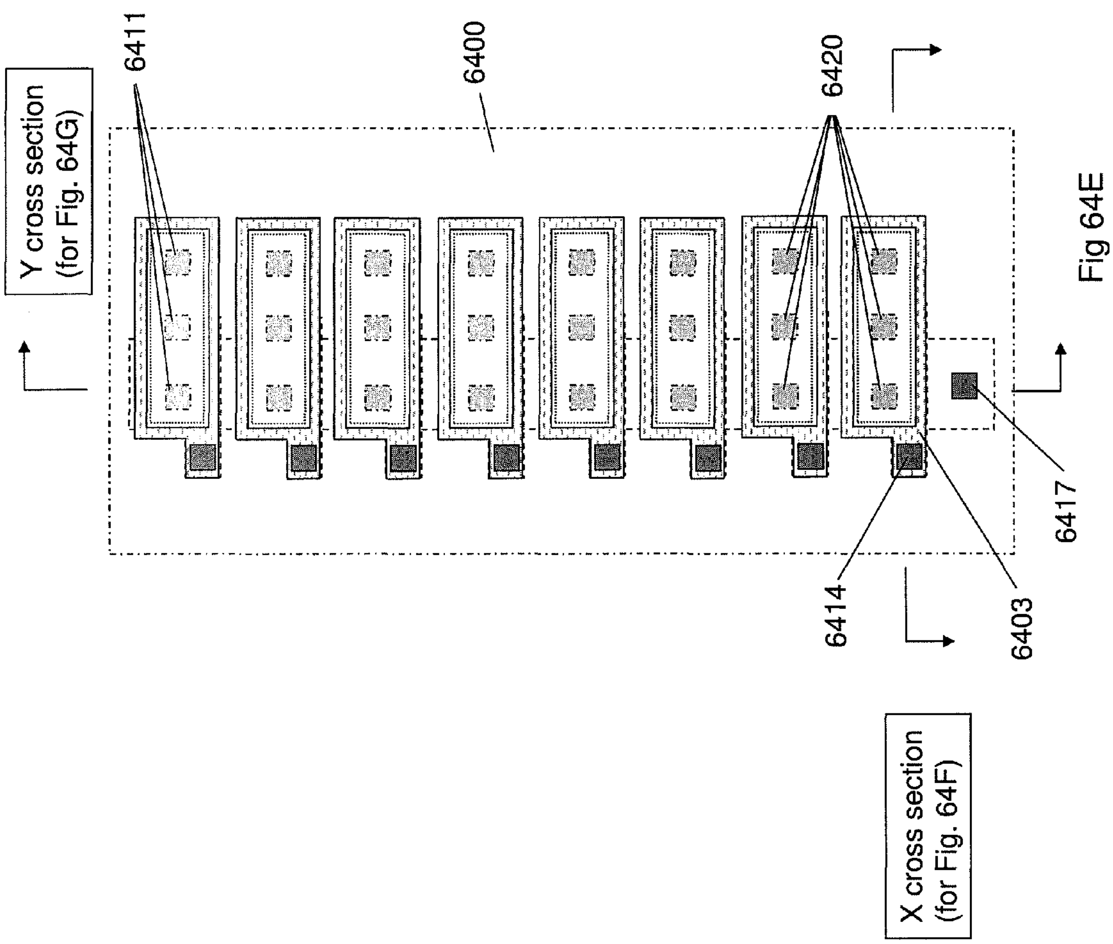
Figure 64F:
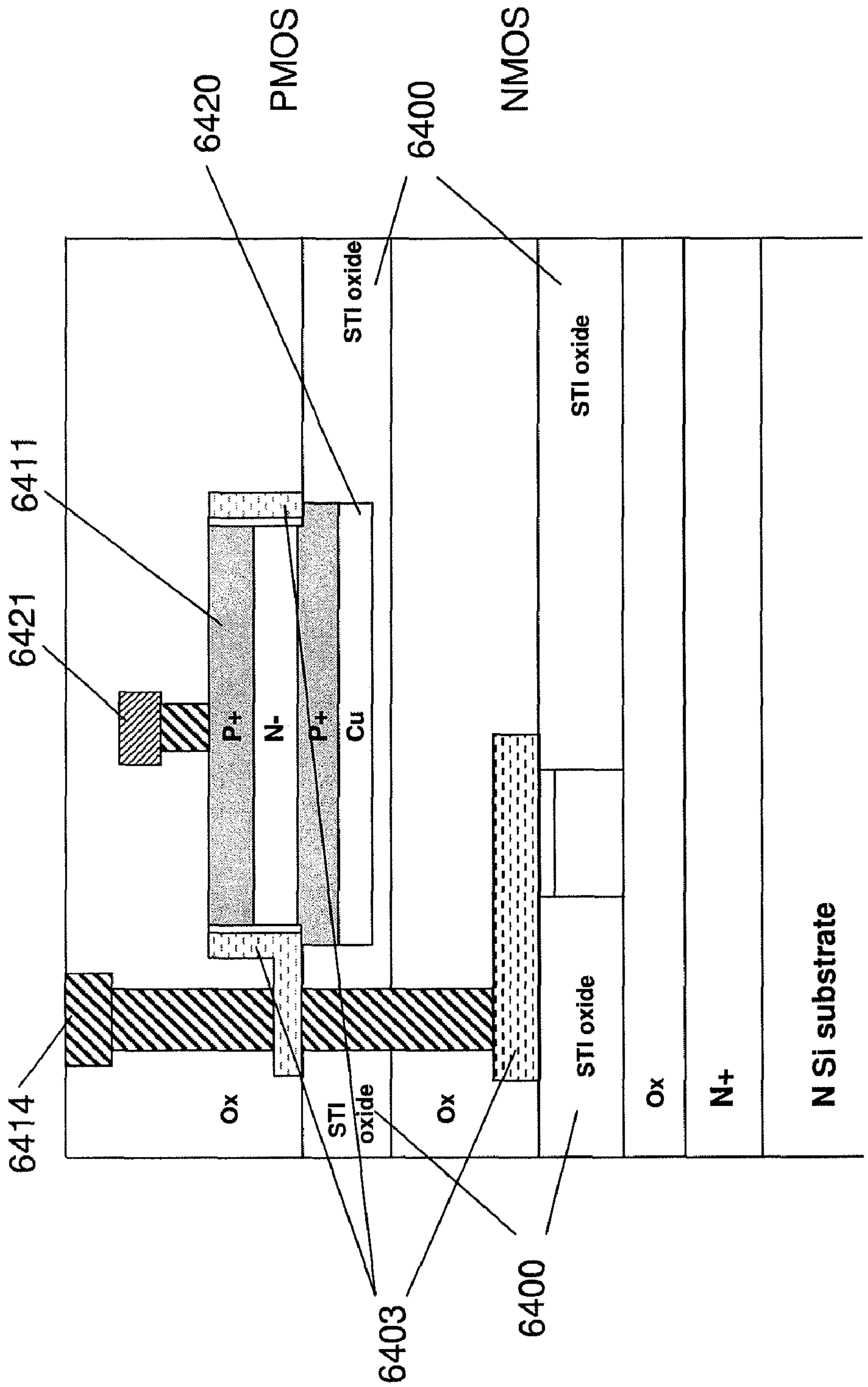
Figure 64G:
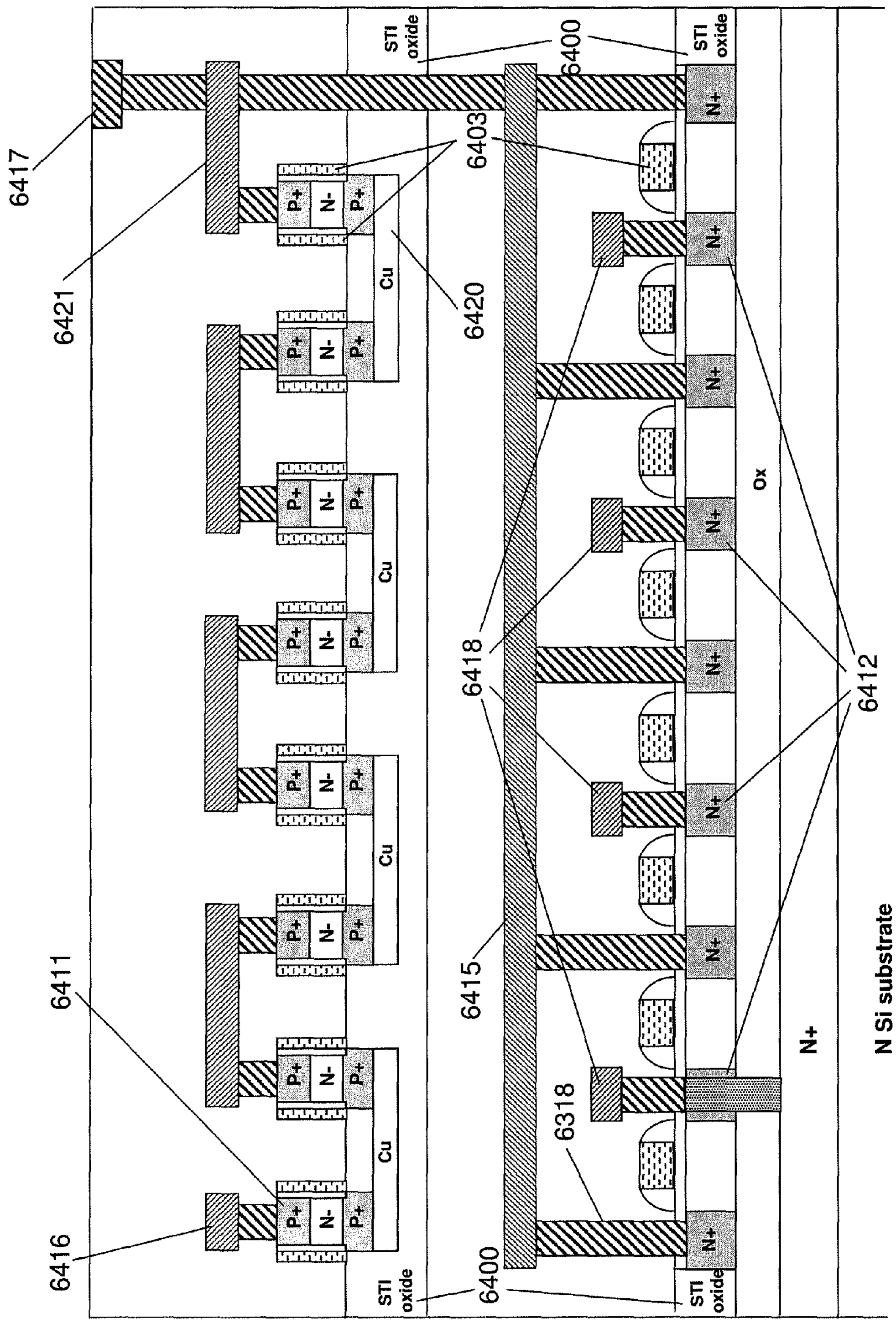

The topside view of the 3D NOR-8 cell, with no metal shown and with horizontal NMOS and PMOS devices, is illustrated in FIG. 64B, the cell X cross sectional views is illustrated in FIG. 64C, and the Y cross sectional view is illustrated in FIG. 64D. The NAND-8 cell with vertical PMOS and horizontal NMOS devices are shown in FIGS. 64E for topside view, 64F for the X cross section view, and 64G for the Y cross sectional view. The PMOS H source 6411 is tied to the V+ supply metal 6416 in the PMOS metal 1 layer thru a P+ to Metal contact. The PMOS H drain is tied 6420 to PMOS G source in the PMOS silicon layer. The NMOS sources 6412 are all tied to ground by N+ to NMOS metal-1 contacts to metal lines 6418 and to the backplane N+ ground layer in the N− substrate. Input A on PMOS metal-2 is tied to both PMOS and NMOS gates 6403 with a gate on STI to gate on STI contact 6414. The NMOS drains are all tied together with NMOS metal-2 6415 to the NMOS A drain and PMOS A drain 6413 by the P+ to N+ to PMOS metal-2 contact 6417, which is tied to output Y. FIG. 64G illustrates the use of vertical PMOS transistors to compactly tie the stack sources and drain, and make a very compact area cell shown in FIG. 64E. The transistor isolation oxides 6400 are illustrated.

Accordingly a CMOS circuit may be constructed where the various circuit cells are built on two silicon layers achieving a smaller circuit area and shorter intra and inter transistor interconnects. As interconnects become dominating for power and speed, packing circuits in a smaller area would result in a lower power and faster speed end device.

Figure 59:
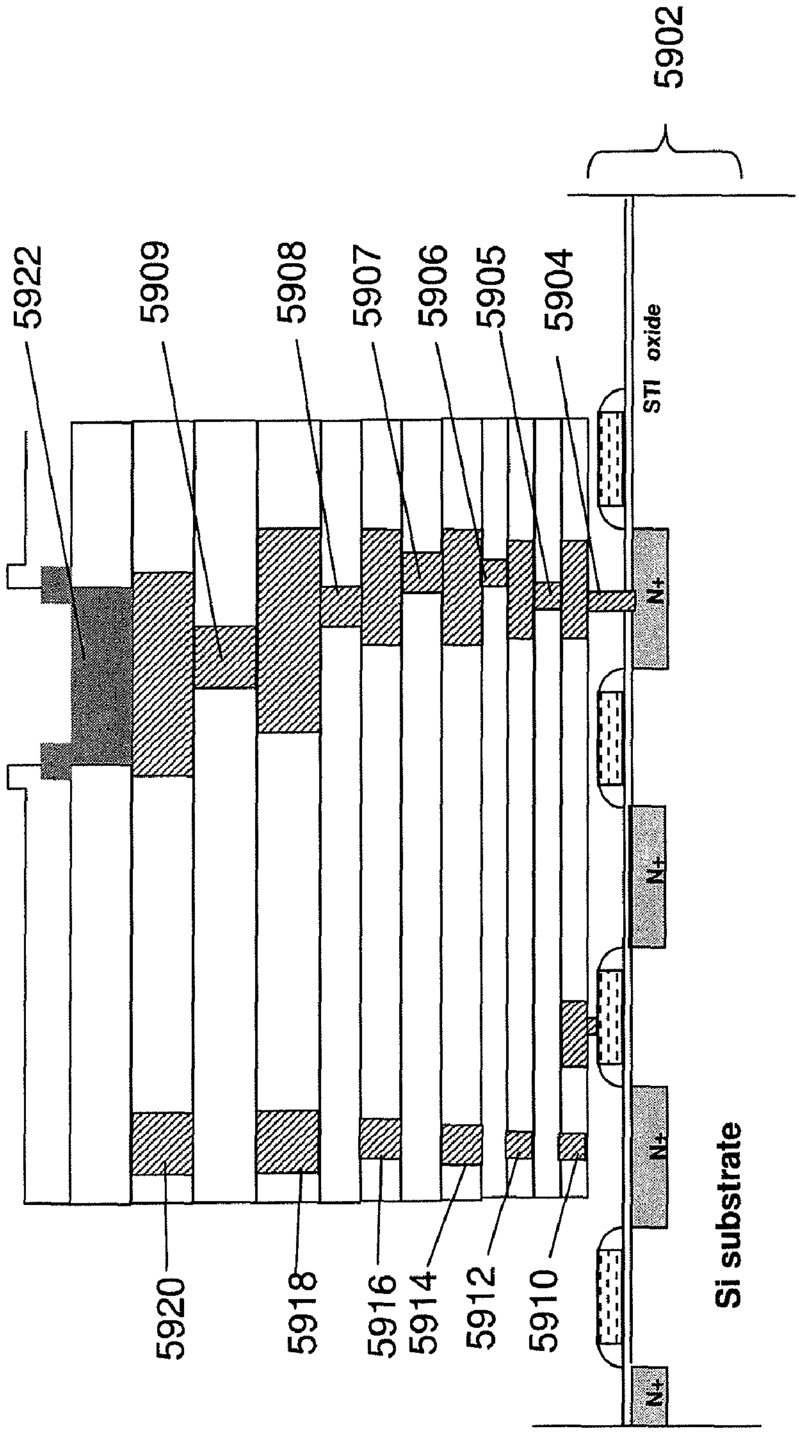
FIG. 59 is a drawing illustration of a metal interconnect stack prior art.

Additionally, when circuit cells are built on two or more layers of thin silicon as shown above, and enjoy the dense vertical thru silicon via interconnections, the metallization layer scheme to take advantage of this dense 3D technology may be improved as follows. FIG. 59 illustrates the prior art of silicon integrated circuit metallization schemes. The conventional transistor silicon layer 5902 is connected to the first metal layer 5910 thru the contact 5904. The dimensions of this interconnect pair of contact and metal lines generally are at the minimum line resolution of the lithography and etch capability for that technology process node. Traditionally, this is called a "1×" design rule metal layer. Usually, the next metal layer is also at the "1×" design rule, the metal line 5912 and via below 5905 and via above 5906 that connects metals 5912 with 5910 or with 5914 where desired. Then the next few layers are often constructed at twice the minimum lithographic and etch capability and called '2×' metal layers, and have thicker metal for current carrying capability. These are illustrated with metal line 5914 paired with via 5907 and metal line 5916 paired with via 5908 in FIG. 59. Accordingly, the metal via pairs of 5918 with 5909, and 5920 with bond pad opening 5922, represent the '4×' metallization layers where the planar and thickness dimensions are again larger and thicker than the 2× and 1× layers. The precise number of 1× or 2× or 4× layers may vary depending on interconnection needs and other requirements; however, the general flow is that of increasingly larger metal line, metal space, and via dimensions as the metal layers are farther from the silicon transistors and closer to the bond pads.

Figure 60:
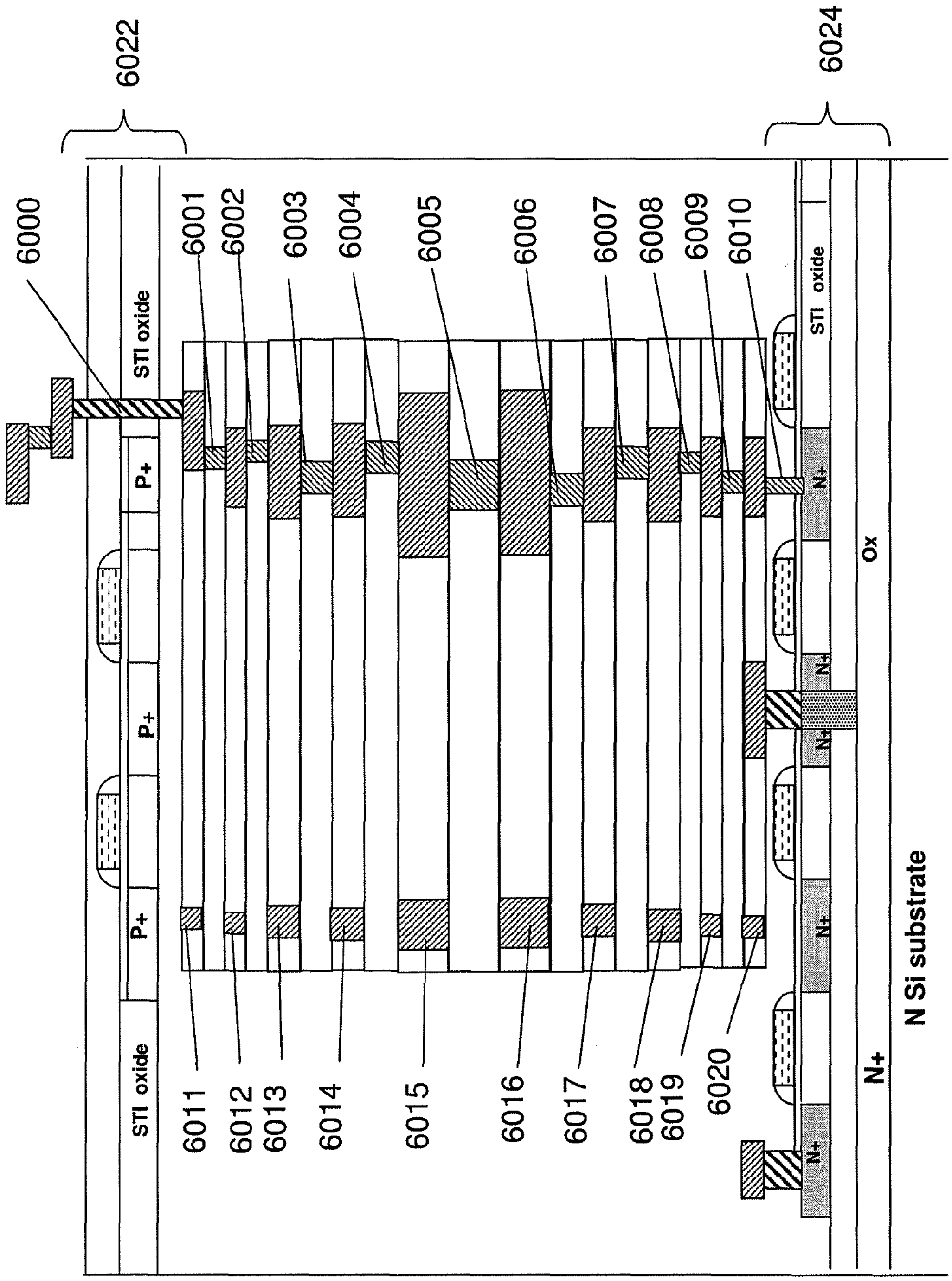
FIG. 60 is a drawing illustration of a metal interconnect stack.

The metallization layer scheme may be improved for 3D circuits as illustrated in FIG. 60. The first crystallized silicon device layer 6024 is illustrated as the NMOS silicon transistor layer from the above 3D library cells, but may also be a conventional logic transistor silicon substrate or layer. The '1×' metal layers 6020 and 6019 are connected with contact 6010 to the silicon transistors and vias 6008 and 6009 to each other or metal line 6018. The 2× layer pairs metal 6018 with via 6007 and metal 6017 with via 6006. The 4× metal layer 6016 is paired with via 6005 and metal 6015, also at 4×. However, now via 6004 is constructed in 2× design rules to enable metal line 6014 to be at 2×. Metal line 6013 and via 6003 are also at 2× design rules and thicknesses. Vias 6002 and 6001 are paired with metal lines 6012 and 6011 at the 1× minimum design rule dimensions and thickness. The thru silicon via 6000 of the illustrated PMOS layer transferred silicon 6022 may then be constructed at the 1× minimum design rules and provide for maximum density of the top layer. The precise numbers of 1× or 2× or 4× layers may vary depending on circuit area and current carrying metallization requirements and tradeoffs. The layer transferred top transistor layer 6022 may be any of the low temperature devices illustrated herein.

As well, the independent formation of each transistor layer enables the use of materials other than silicon to construct transistors. For example, a thin III-V compound quantum well channel such as InGaAs and InSb may be utilized on one or more of the 3D layers described above by direct layer transfer or deposition and the use of buffer compounds such as GaAs and InAlAs to buffer the silicon and III-V lattice mismatches. This enables high mobility transistors that can be optimized independently for p and n-channel use, solving the integration difficulties of incorporating n and p III-V transistors on the same substrate, and also the difficulty of integrating the III-V transistors with conventional silicon transistors on the same substrate. For example, the first layer silicon transistors and metallization generally cannot be exposed to temperatures higher than 400° C. The III-V compounds, buffer layers, and dopings generally require processing temperatures above that 400° C. threshold. By use of the pre deposited, doped, and annealed layer donor wafer formation and subsequent donor to acceptor wafer transfer techniques described above and illustrated in FIGS. 14, 20 to 29, and 43 to 45, III-V transistors and circuits may be constructed on top of silicon transistors and circuits without damaging said underlying silicon transistors and circuits. As well, any stress mismatches between the dissimilar materials desired to be integrated, such as silicon and III-V compounds, may be mitigated by the oxide layers, or specialized buffer layers, that are vertically in-between the dissimilar material layers. Additionally, this now enables the integration of optoelectronic elements, communication, and data path processing with conventional silicon logic and memory transistors and silicon circuits. Another example of a material other than silicon that the independent formation of each transistor layer enables is Germanium.

It should be noted that this 3D technology could be used for many applications. As an example the various structures presented in FIGS. 15 to 19 having been constructed in the relation to FIGS. 21 to 35.

Figure 36:
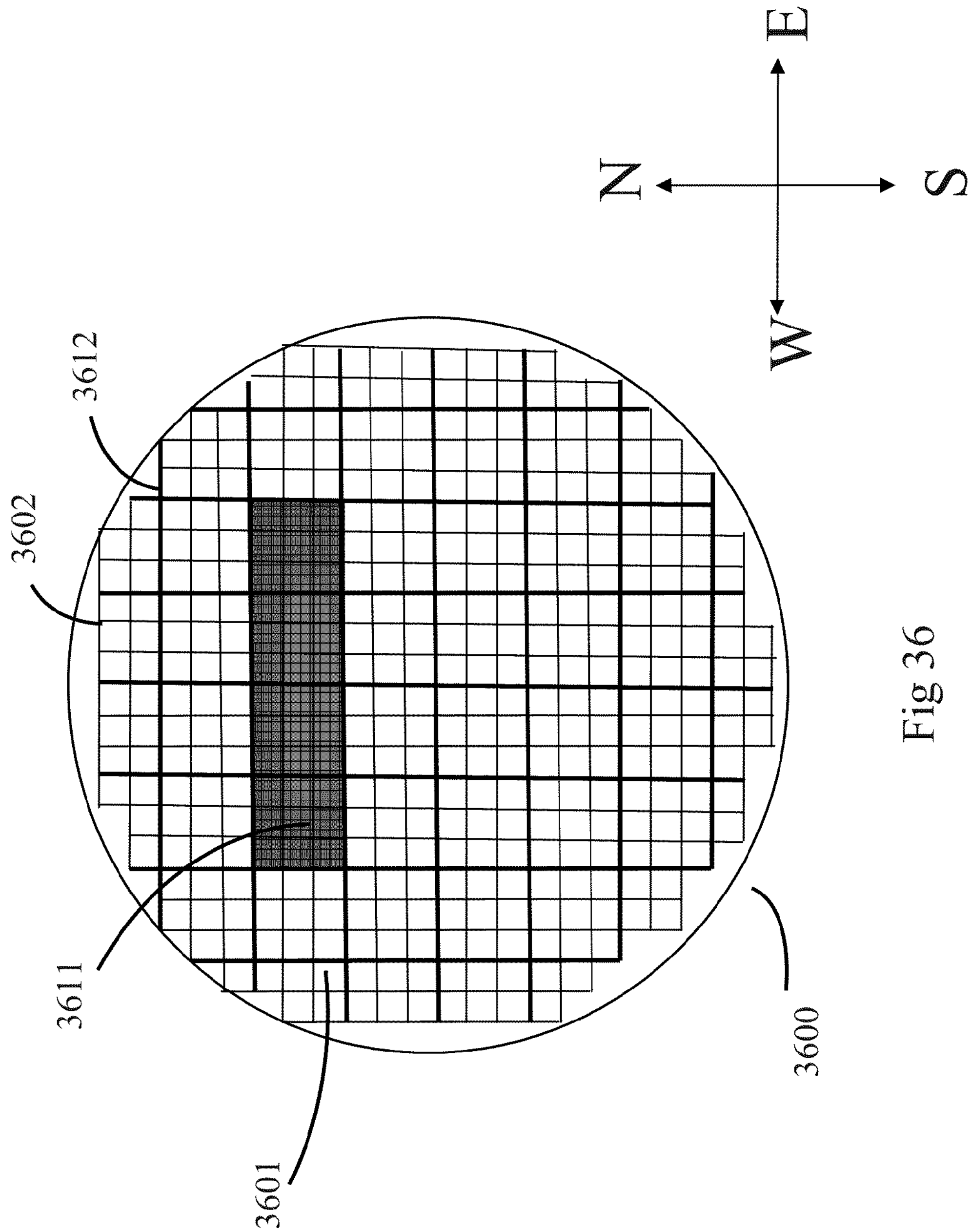
FIG. 36 is a drawing illustration of a tile array wafer.

It also should be noted that the 3D programmable system, where the logic fabric is sized by dicing a wafer of tiled array as illustrated in FIG. 36, could utilize the 'monolithic' 3D techniques related to FIG. 14 in respect to the 'Foundation', or to FIGS. 21 through 35 in respect to the Attic, to add IO or memories as presented in FIG. 11. So while in many cases constructing a 3D programmable system using TSV could be preferable there might be cases where it will be better to use the 'Foundation' or 'Attic".

FIGS. 9A through 9C illustrates alternative configurations for three-dimensional—3D integration of multiple dies constructing IC system and utilizing Through Silicon Via. FIG. 9A illustrates an example in which the Through Silicon Via is continuing vertically through all the dies constructing a global cross-die connection. FIG. 9B provides an illustration of similar sized dies constructing a 3D system. 9B shows that the Through Silicon Via 404 is at the same relative location in all the dies constructing a standard interface.

FIG. 9C illustrates a 3D system with dies having different sizes. FIG. 9C also illustrates the use of wire bonding from all three dies in connecting the IC system to the outside.

Figure 10A:
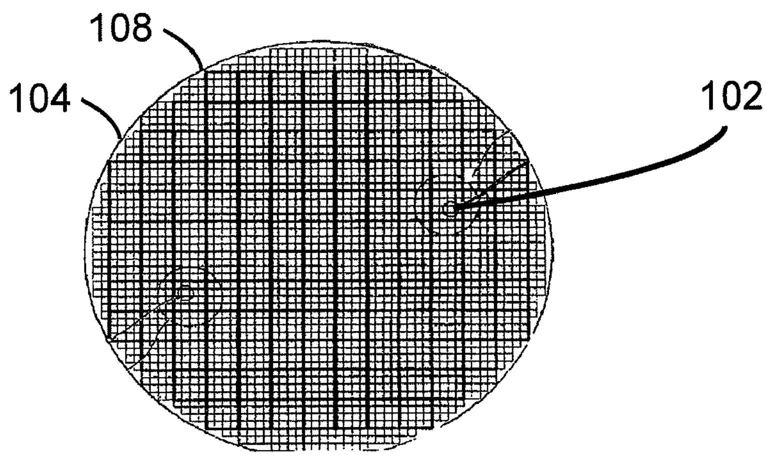
FIG. 10A is a drawing illustration of continuous array wafer of a prior art.
Figure 10B:
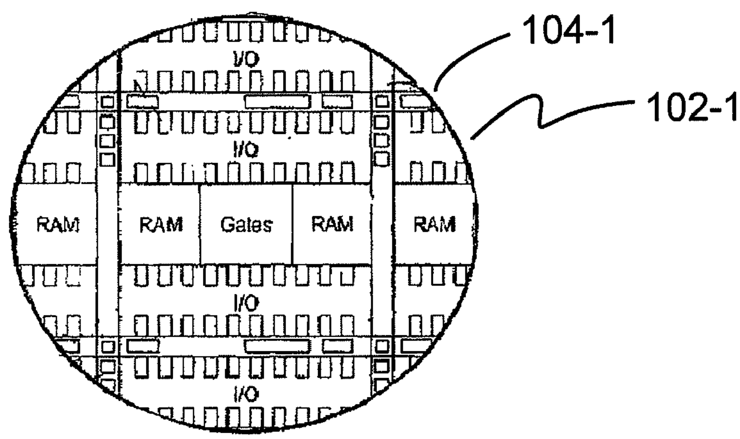
FIG. 10B is a drawing illustration of continuous array portion of wafer of a prior art.
Figure 10C:
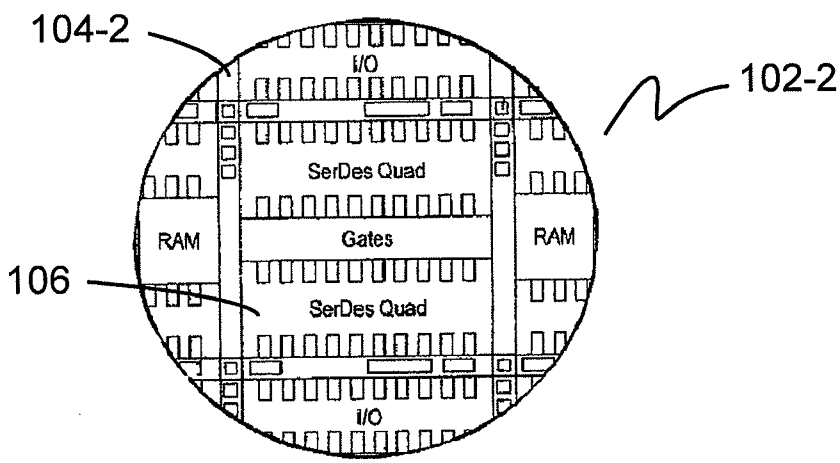
FIG. 10C is a drawing illustration of continuous array portion of wafer of a prior art.

FIG. 10A is a drawing illustration of a continuous array wafer of a prior art U.S. Pat. No. 7,337,425. The bubble 102 shows the repeating tile of the continuous array, 104 are the horizontal and vertical potential dicing lines. The tile 102 could be constructed as in FIG. 10B 102-1 with potential dicing line 104-1 or as in FIG. 10C with SerDes Quad 106 as part of the tile 102-2 and potential dicing lines 104-2.

In general logic devices comprise varying quantities of logic elements, varying amounts of memories, and varying amounts of I/O. The continuous array of the prior art allows defining various die sizes out of the same wafers and accordingly varying amounts of logic, but it is far more difficult to vary the three-way ratio between logic, I/O, and memory. In addition, there exists different types of memories such as SRAM, DRAM, Flash, and others, and there exist different types of I/O such as SerDes. Some applications might need still other functions like processor, DSP, analog functions, and others.

Embodiments of the current invention may enable a different approach. Instead of trying to put all of these different functions onto one programmable die, which will require a large number of very expensive mask sets, it uses Through-Silicon Via to construct configurable systems. The technology of "Package of integrated circuits and vertical integration" has been described in U.S. Pat. No. 6,322,903 issued to Oleg Siniaguine and Sergey Savastiouk on Nov. 27, 2001.

Accordingly embodiments of the current invention may suggest the use of a continuous array of tiles focusing each one on a single, or very few types of, function. Then, it constructs the end-system by integrating the desired amount from each type of tiles, in a 3D IC system.

Figure 11A:
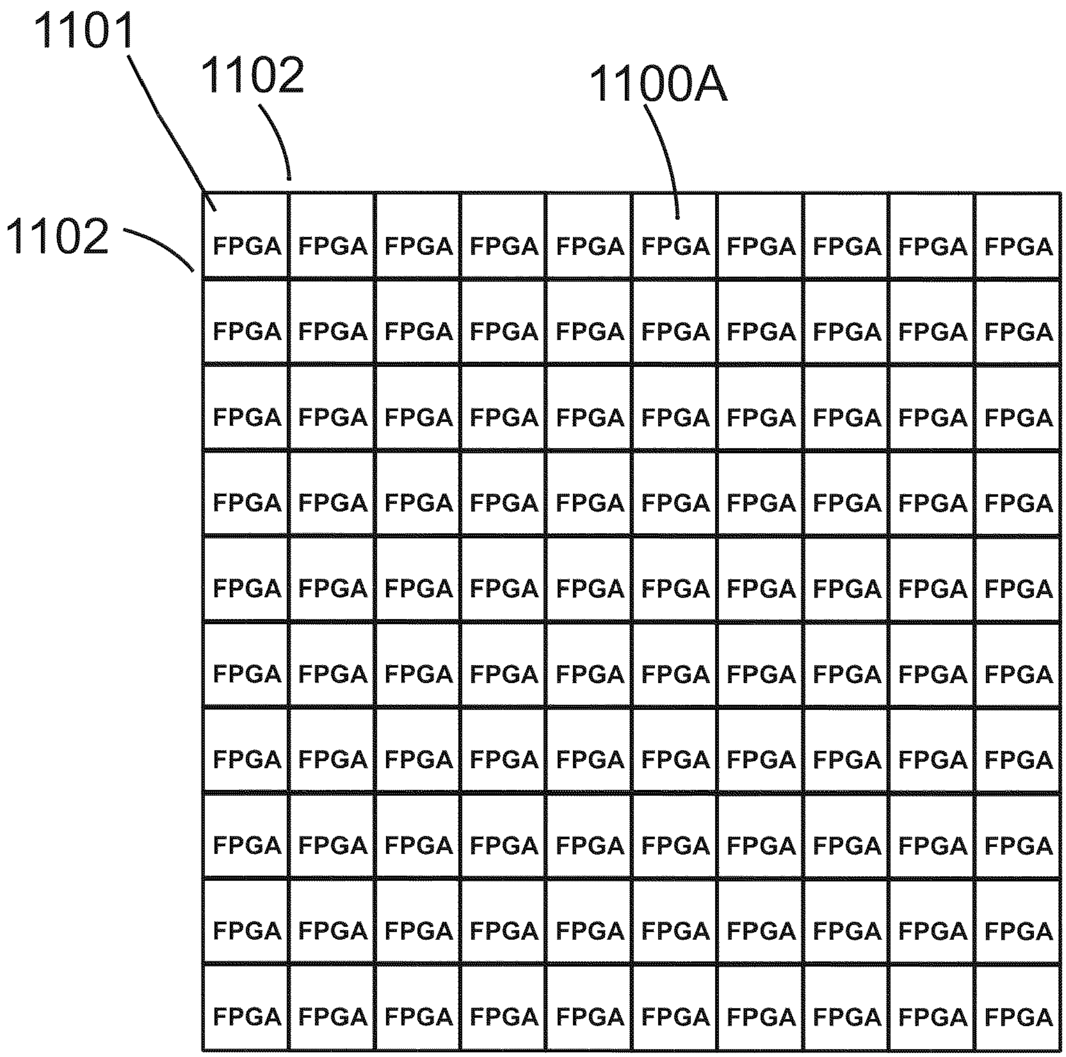
FIG. 11A through 11F are a drawing illustration of one reticle site on a wafer.

FIG. 11A is a drawing illustration of one reticle site on a wafer comprising tiles of programmable logic 1100A denoted FPGA. Such wafer is a continuous array of programmable logic. 1102 are potential dicing lines to support various die sizes and the amount of logic to be constructed from one mask set. This die could be used as a base 1202A, 1202B, 1202C or 1202D of the 3D system as in FIG. 12. In one alternative of this invention these dies may carry mostly logic, and the desired memory and I/O may be provided on other dies, which may be connected by means of Through-Silicon Via. It should be noted that in some cases it will be desired not to have metal lines, even if unused, in the dicing streets 108. In such case, at least for the logic dies, one may use dedicated masks to allow connection over the unused potential dicing lines to connect the individual tiles according to the desire die size. The actual dicing lines are also called streets.

It should be noted that in general the lithography over the wafer is done by repeatedly projecting what is named reticle over the wafer in a "step-and-repeat" manner. In some cases it might be preferable to consider differently the separation between repeating tile 102 within a reticle image vs. tiles that relate to two projections. For simplicity this description will use the term wafer but in some cases it will apply only to tiles with one reticle.

The repeating tile 102 could be of various sizes. For FPGA applications it may be reasonable to assume tile 1101 to have an edge size between 0.5 mm to 1 mm which allows good balance between the end-device size and acceptable relative area loss due to the unused potential dice lines 1102.

There are many advantages for a uniform repeating tile structure of FIG. 11A where a programmable device could be constructed by dicing the wafer to the desired size of programmable device. Yet it is still helpful that the end-device act as a complete integrated device rather than just as a collection of individual tiles 1101. FIG. 36 illustrates a wafer carrying an array of tiles 3601 with potential dice lines 3602 to be diced along actual dice lines 3612 to construct an end-device 3611 of 3×3 tiles.

Figure 37:
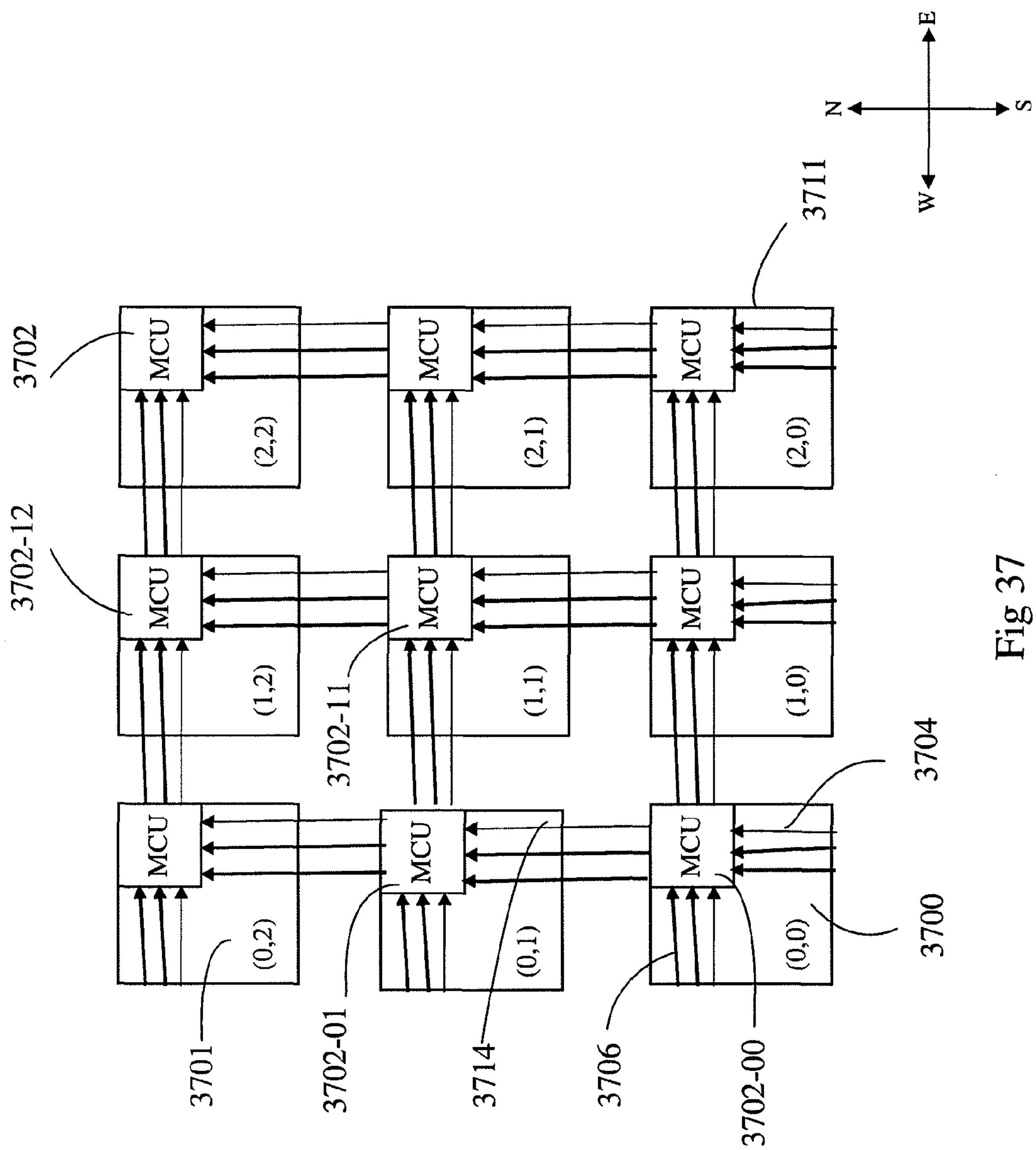
FIG. 37 is a drawing illustration of a programmable end device.

FIG. 37 is a drawing illustration of an end-device 3611 comprising 9 tiles 3701 such as 3601. Each tile 3701 contains a tiny micro control unit—MCU 3702. The micro control unit could have a common architecture such as an 8051 with its own program memory and data memory. The MCUs in each tile will be used to load the FPGA tile 3701 with its programmed function and all its required initialization for proper operation of the device. The MCU of each tile is connected so to be controlled by the tile west of it or the tile south of it, in that order of priority. So, for example, the MCU 3702-11 will be controlled by MCU 3702-01. The MCU 3702-01 has no MCU west of it so it will be controlled by the MCU south of it 3702-00. Accordingly the MCU 3702-00 which is in south-west corner has no tile MCU to control it and it will therefore be the master control unit of the end-device.

Figure 38:
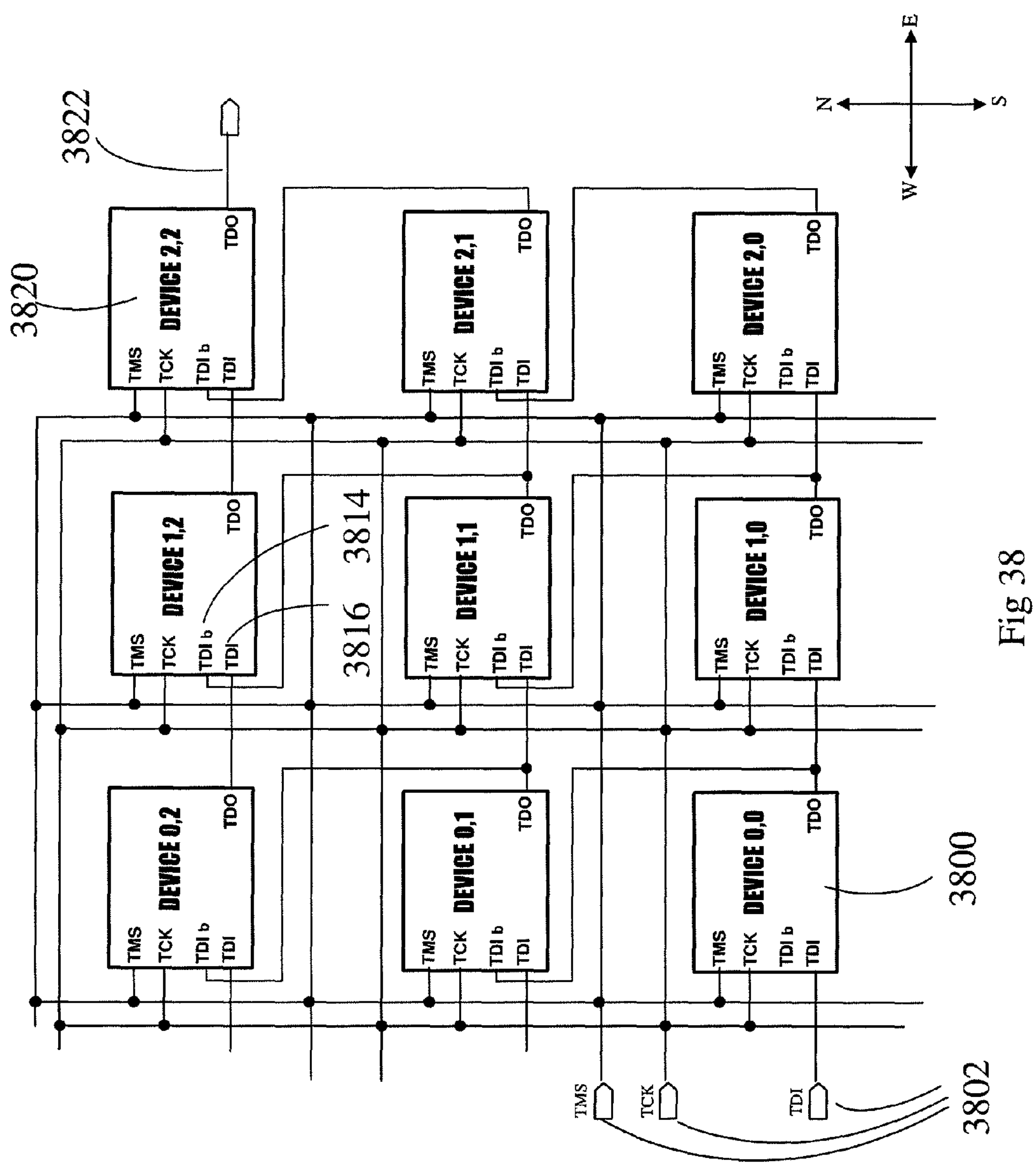
FIG. 38 is a drawing illustration of modified JTAG connections.

FIG. 38 illustrates a simple control connectivity utilizing a slightly modified Joint Test Action Group (JTAG)—based MCU architecture to support such a tiling approach. Each MCU has two Time-Delay-Integration (TDI) inputs, TDI 3816 from the device on its west side and TDIb 3814 from the MCU on its south side. As long as the input from its west side TDI 3816 is active it will be the controlling input, otherwise the TDIb 3814 from the south side will be the controlling input. Again in this illustration the Tile at the south-west corner 3800 will take control as the master. Its control inputs 3802 would be used to control the end-device and through this MCU 3800 it will spread to all other tiles. In the structure illustrated in FIG. 38 the outputs of the end-device 3611 are collected from the MCU of the tile at the north-east corner 3820 at the TDO output 3822. These MCUs and their connectivity would be used to load the end-device functions, initialize it, test it, debug it, program its clocks, and all other desired control functions. Once the end-device has completed its set up or other control and initialization functions such as testing or debugging, these MCUs could be then utilized for user functions as part of the end-device operation.

An additional advantage for this construction of a tiled FPGA array with MCUs is in the construction of an SoC with embedded FPGA function. A single tile 3601 could be connected to an SoC using Through Silicon Vias-TSVs and accordingly provides a self-contained embedded FPGA function.

Clearly, the same scheme can be modified to use the East/North (or any other combination of orthogonal directions) to encode effectively an identical priority scheme.

Figure 11B:
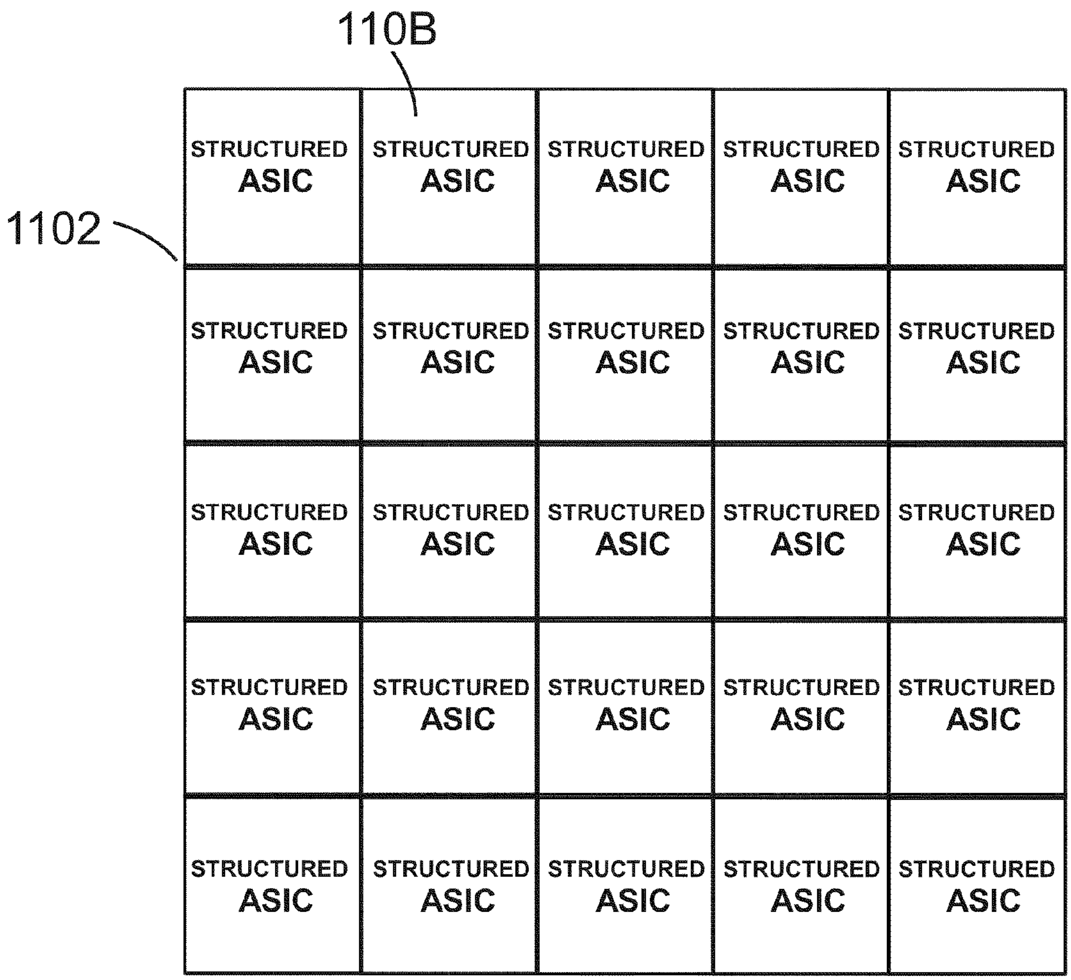

FIG. 11B is a drawing illustration of an alternative reticle site on a wafer comprising tiles of Structured ASIC 1100B. Such wafer may be, for example, a continuous array of configurable logic. 1102 are potential dicing lines to support various die sizes and the amount of logic to be constructed. This die could be used as a base 1202A, 1202B, 1202C or 1202D of the 3D system as in FIG. 12.

Figure 11C:
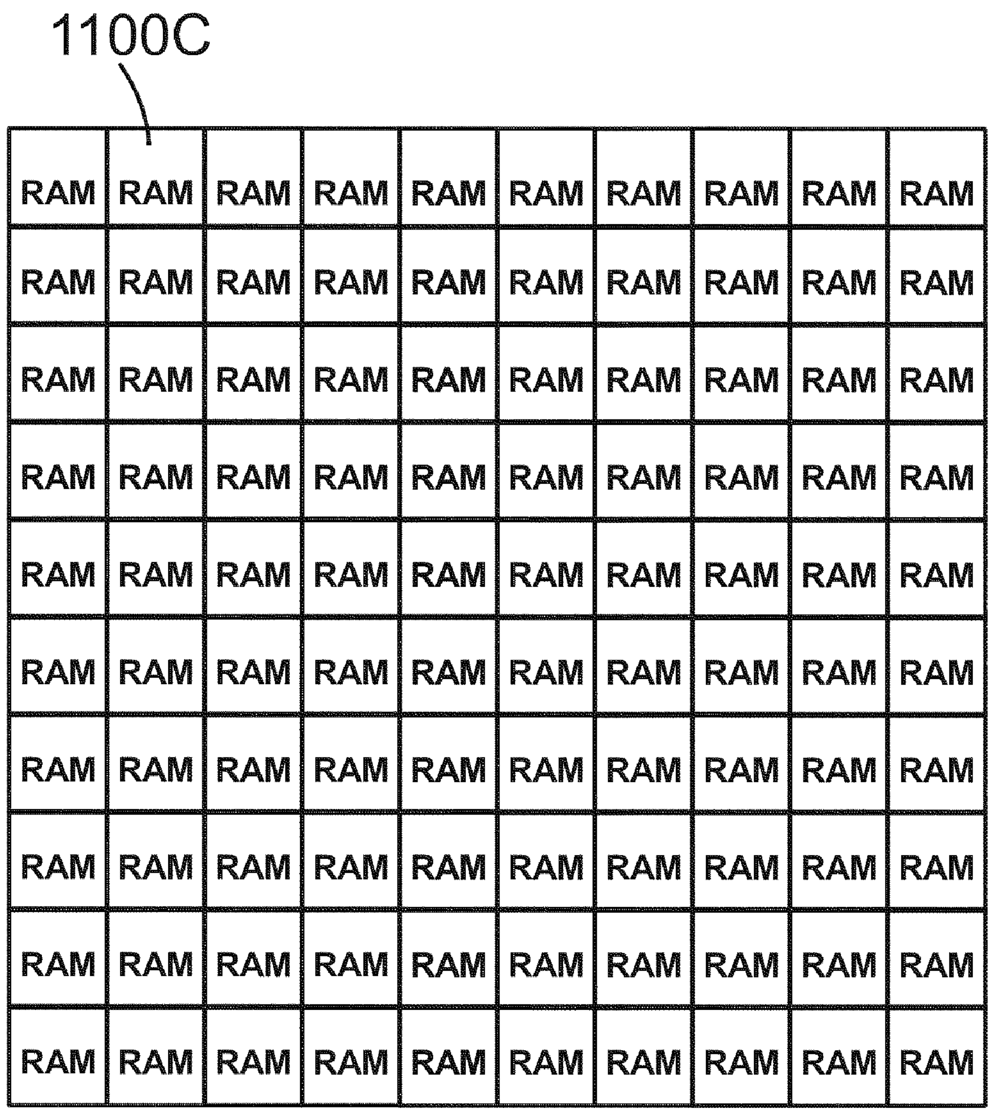

FIG. 11C is a drawing illustration of another reticle site on a wafer comprising tiles of RAM 1100C. Such wafer may be a continuous array of memories. The die diced out of such wafer may be a memory die component of the 3D integrated system. It might include an antifuse layer or other form of configuration technique to function as a configurable memory die. Yet it might be constructed as a multiplicity of memories connected by a multiplicity of Through—Silicon Vias to the configurable die, which may also be used to configure the raw memories of the memory die to the desired function in the configurable system.

Figure 11D:
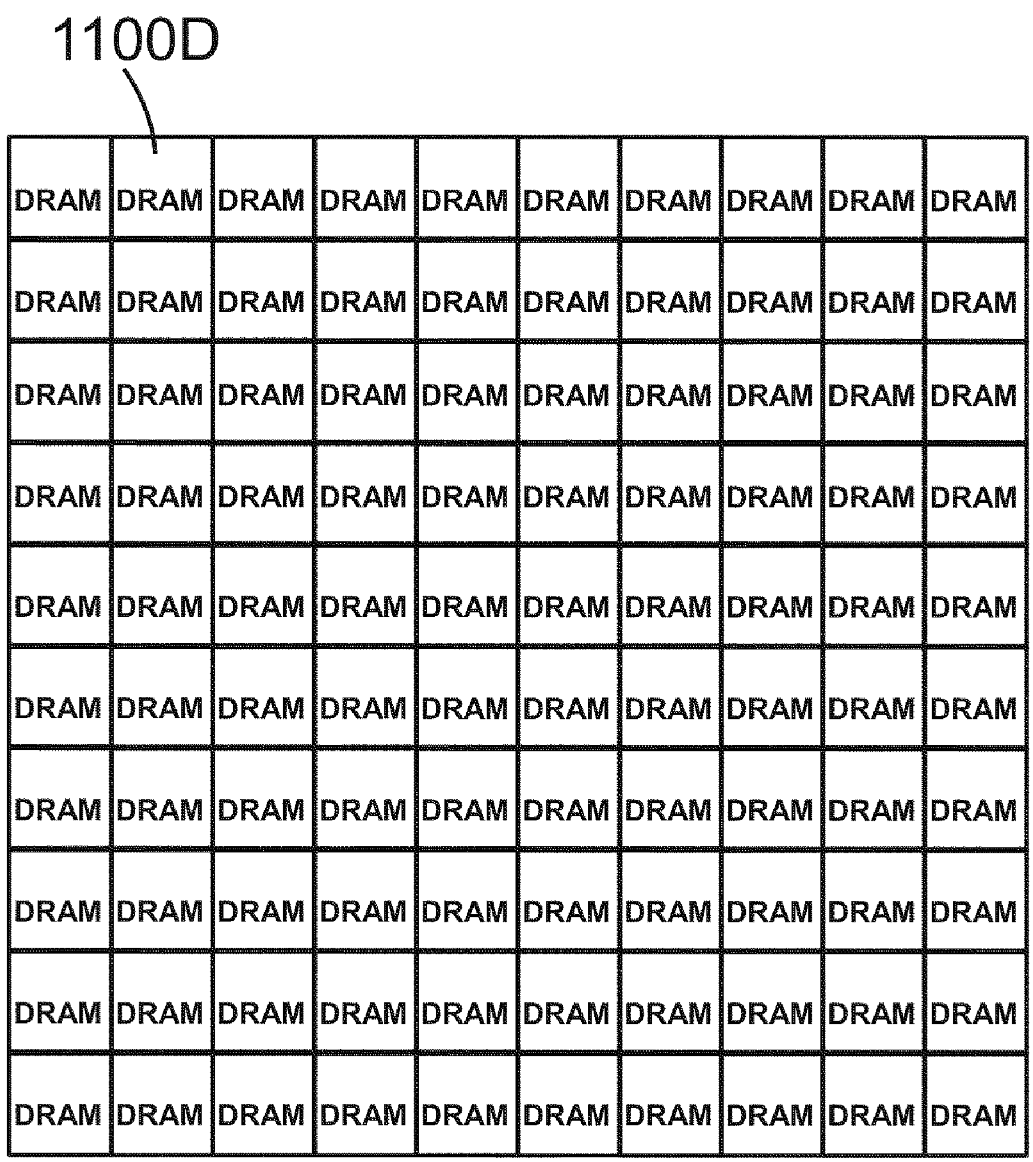

FIG. 11D is a drawing illustration of another reticle site on a wafer comprising tiles of DRAM 1100D. Such wafer may be a continuous array of DRAM memories.

Figure 11E:
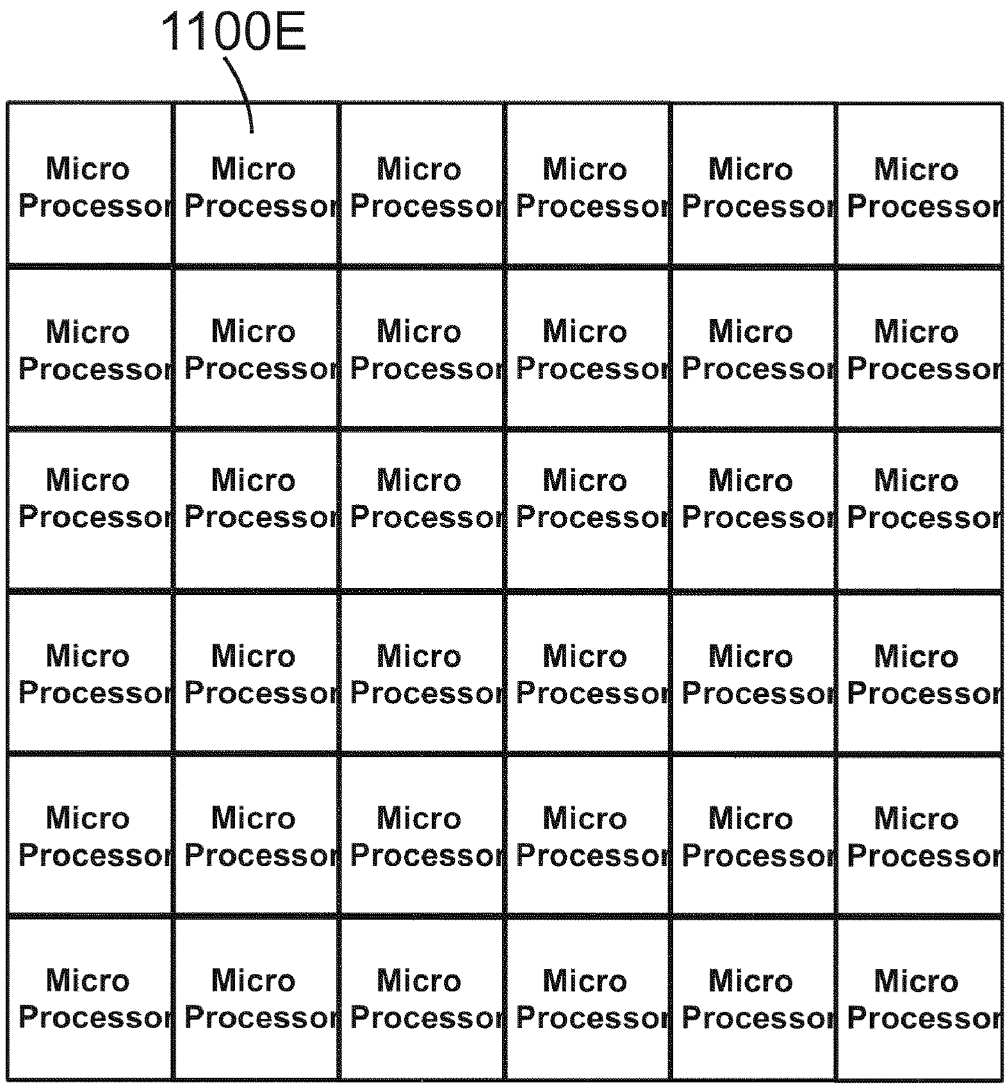

FIG. 11E is a drawing illustration of another reticle site on a wafer comprising tiles of microprocessor or microcontroller cores 1100E. Such wafer may be a continuous array of Processors.

Figure 11F:
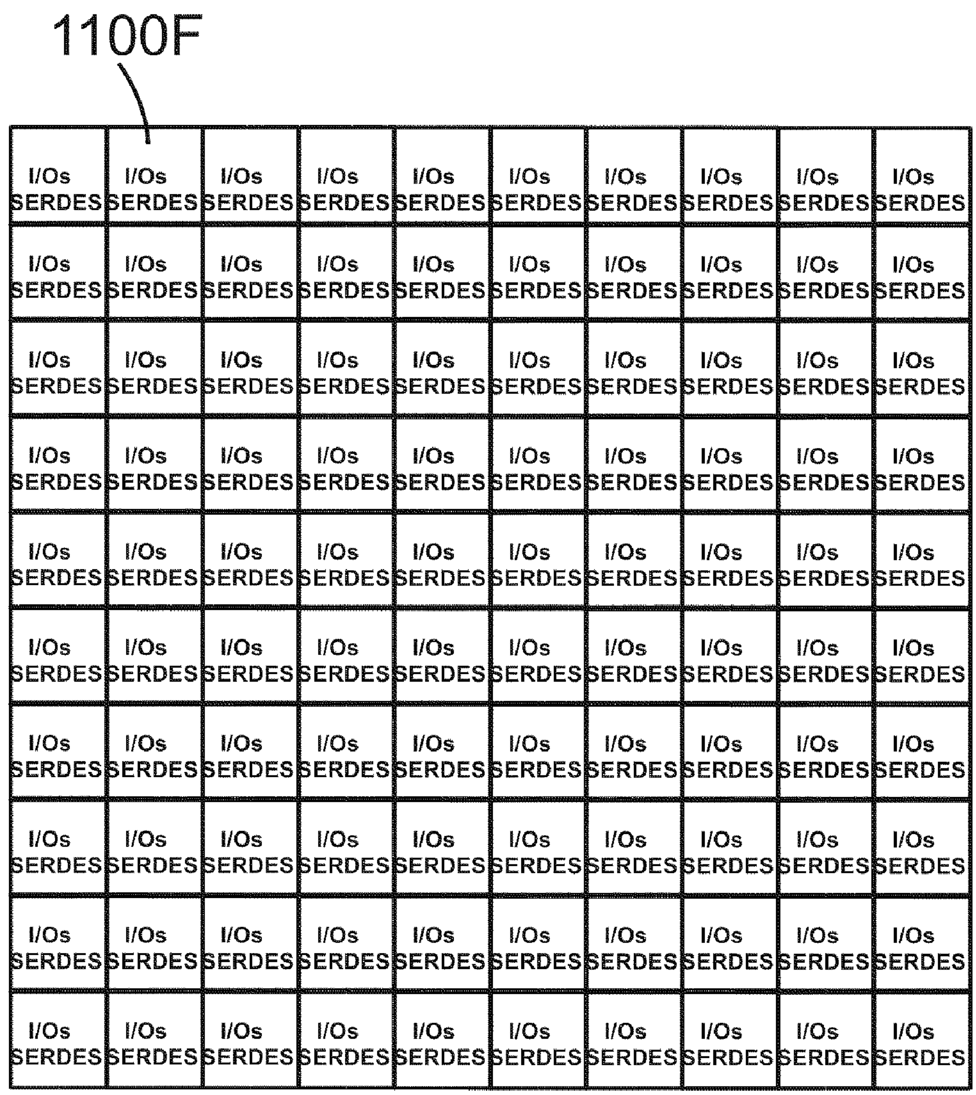

FIG. 11F is a drawing illustration of another reticle site on a wafer comprising tiles of I/Os 1100F. This could include groups of SerDes. Such a wafer may be a continuous tile of I/Os. The die diced out of such wafer may be an I/O die component of a 3D integrated system. It could include an antifuse layer or other form of configuration technique such as SRAM to configure these I/Os of the configurable I/O die to their function in the configurable system. Yet it might be constructed as a multiplicity of I/O connected by a multiplicity of Through-Silicon Vias to the configurable die, which may also be used to configure the raw I/Os of the I/O die to the desired function in the configurable system.

I/O circuits are a good example of where it could be advantageous to utilize an older generation process. Usually, the process drivers are SRAM and logic circuits. It often takes longer to develop the analog function associated with I/O circuits, SerDes circuits, PLLs, and other linear functions. Additionally, while there may be an advantage to using smaller transistors for the logic functionality, I/O may require stronger drive and relatively larger transistors. Accordingly, using an older process may be more cost effective, as the older process wafer might cost less while still performing effectively.

An additional function that it might be advantageous to pull out of the programmable logic die and onto one of the other dies in the 3D system, connected by Through-Silicon-Vias, may be the Clock circuits and their associated PLL, DLL, and control. Clock circuits and distribution. These circuits may often be area consuming and may also be challenging in view of noise generation. They also could in many cases be more effectively implemented using an older process. The Clock tree and distribution circuits could be included in the I/O die. Additionally the clock signal could be transferred to the programmable die using the Through-Silicon-Vias (TSVs) or by optical means. A technique to transfer data between dies by optical means was presented for example in U.S. Pat. No. 6,052,498 assigned to Intel Corp.

Alternatively an optical clock distribution could be used. There are new techniques to build optical guides on silicon or other substrates. An optical clock distribution may be utilized to minimize the power used for clock signal distribution and would enable low skew and low noise for the rest of the digital system. Having the optical clock constructed on a different die and than connected to the digital die by means of Through-Silicon-Vias or by optical means make it very practical, when compared to the prior art of integrating optical clock distribution with logic on the same die.

Alternatively the optical clock distribution guides and potentially some of the support electronics such as the conversion of the optical signal to electronic signal could be integrated by using layer transfer and smart cut approaches as been described before in FIGS. 14 and 20. The optical clock distribution guides and potentially some of the support electronics could be first built on the 'Foundation' wafer 1402 and then a thin layer 1404 may be transferred on top of it using the 'smart cut' flow, so all the following construction of the primary circuit would take place afterward. The optical guide and its support electronics would be able to withstand the high temperatures required for the processing of transistors on layer 1404.

And as related to FIG. 20, the optical guide, and the proper semiconductor structures on which at a later stage the support electronics would be processed, could be pre-built on layer 2019. Using the 'smart cut' flow it would be then transferred on top of a fully processed wafer 808. The optical guide should be able to withstand the ion implant 2008 required for the 'smart cut' while the support electronics would be finalized in flows similar to the ones presented in FIGS. 21 to 35, and 39 to 40. This means that the landing target for the clock signal will need to accommodate the ~1 micron misalignment of the transferred layer 2004 to the prefabricated—primary circuit and its upper layer 808. Such misalignment could be acceptable for many designs. Alternatively only the base structure for the support electronics would be pre-fabricated on layer 2019 and the optical guide will be constructed after the layer transfer along with finalized flows of the support electronics using flows similar to the ones presented in relating to FIGS. 21-35, and 39 to 40. Alternatively, the support electronics could be fabricated on top of a fully processed wafer 808 by using flows similar to the ones presented in relating to FIGS. 21-35, and 39 to 40. Then an additional layer transfer on top of the support electronics would be utilized to construct the optical wave guides at low temperature.

Having wafers dedicated to each of these functions may support high volume generic product manufacturing. Then, similar to Lego® blocks, many different configurable systems could be constructed with various amounts of logic memory and I/O. In addition to the alternatives presented in FIG. 11A through 11F there many other useful functions that could be built and that could be incorporated into the 3D Configurable System. Examples of such may be image sensors, analog, data acquisition functions, photovoltaic devices, non-volatile memory, and so forth.

An additional function that would fit well for 3D systems using TSVs, as described, is a power control function. In many cases it is desired to shut down power at times to a portion of the IC that is not currently operational. Using controlled power distribution by an external die connected by TSVs is advantageous as the power supply voltage to this external die could be higher because it is using an older process. Having a higher supply voltage allows easier and better control of power distribution to the controlled die.

Those components of configurable systems could be built by one vendor, or by multiple vendors, who agree on a standard physical interface to allow mix-and-match of various dies from various vendors.

The construction of the 3D Programmable System could be done for the general market use or custom-tailored for a specific customer.

Another advantage of some embodiments of this invention may be an ability to mix and match various processes. It might be advantageous to use memory from a leading edge process, while the I/O, and maybe an analog function die, could be used from an older process of mature technology (e.g., as discussed above).

Figure 12A:
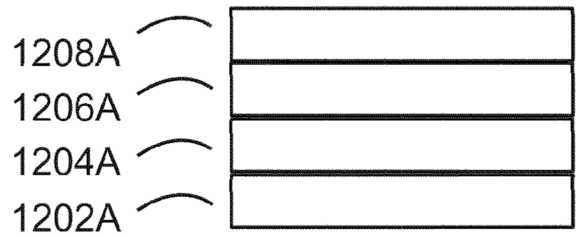
FIG. 12A through 12E are a drawing illustration of Configurable system.
Figure 12B:
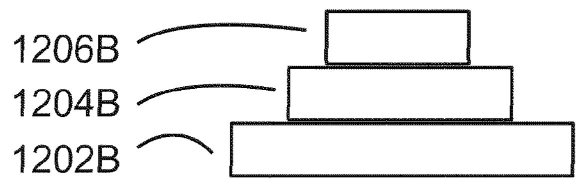
Figure 12C:
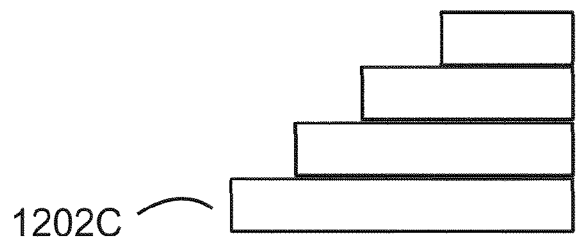
Figure 12D:
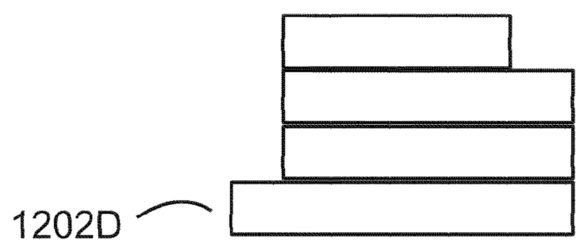
Figure 12E:
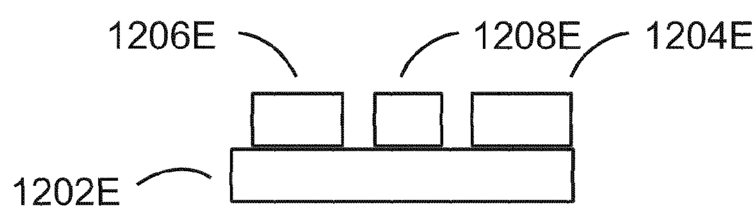

FIGS. 12A through 12E illustrates integrated circuit systems. An integrated circuit system that comprises configurable die could be called a Configurable System. FIG. 12A through 12E are drawings illustrating integrated circuit systems or Configurable Systems with various options of die sizes within the 3D system and alignments of the various dies. FIG. 12E presents a 3D structure with some lateral options. In such case a few dies 1204E, 1206E, 1208E are placed on the same underlying die 1202E allowing relatively smaller die to be placed on the same mother die. For example die 1204E could be a SerDes die while die 1206E could be an analog data acquisition die. It could be advantageous to fabricate these die on different wafers using different process and than integrate them in one system. When the dies are relatively small then it might be useful to place them side by side (such as FIG. 12E) instead of one on top of the other (FIGS. 12A-D).

The Through Silicon Via technology is constantly evolving. In the early generations such via would be 10 microns in diameter. Advanced work is now demonstrating Through Silicon Via with less than a 1-micron diameter. Yet, the density of connections horizontally within the die may typically still be far denser than the vertical connection using Through Silicon Via.

In another alternative of the present invention the logic portion could be broken up into multiple dies, which may be of the same size, to be integrated to a 3D configurable system. Similarly it could be advantageous to divide the memory into multiple dies, and so forth, with other function.

Recent work on 3D integration shows effective ways to bond wafers together and then dice those bonded wafers. This kind of assembly may lead to die structures like FIG. 12A or FIG. 12D. Alternatively for some 3D assembly techniques it may be better to have dies of different sizes. Furthermore, breaking the logic function into multiple vertically integrated dies may be used to reduce the average length of some of the heavily loaded wires such as clock signals and data buses, which may, in turn, improve performance.

Figure 13:
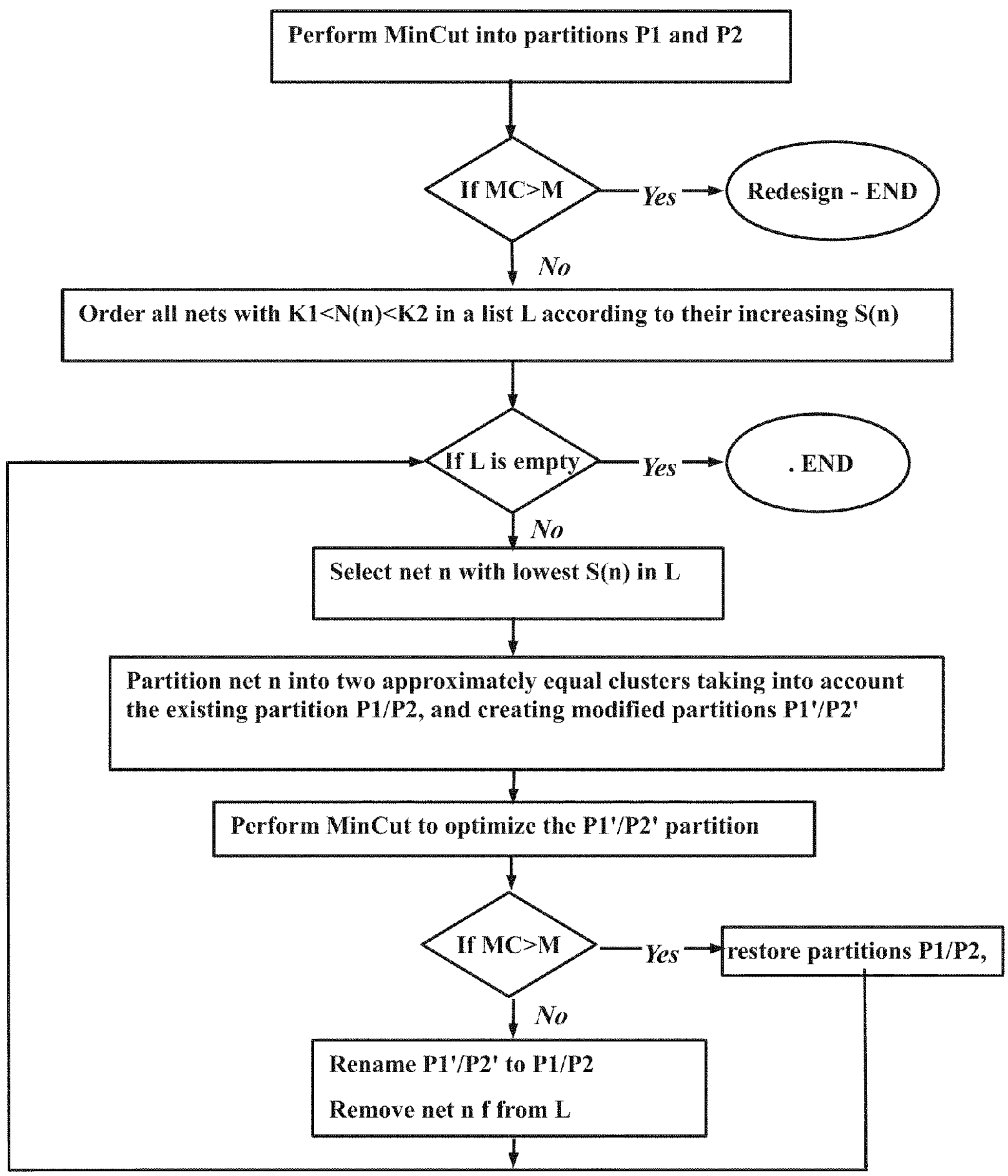
FIG. 13 a drawing illustration of a flow chart for 3D logic partitioning.

FIG. 13 is a flow-chart illustration for 3D logic partitioning. The partitioning of a logic design to two or more vertically connected dies presents a different challenge for a Place and Route—P&R—tool. The common layout flow starts with planning the placement followed by routing. But the design of the logic of vertically connected dies may give priority to the much-reduced frequency of connections between dies and may create a need for a special design flow. In fact, a 3D system might merit planning some of the routing first as presented in the flows of FIG. 13.

The flow chart of FIG. 13 uses the following terms:

M—The number of TSVs available for logic;

N(n)—The number of nodes connected to net n;

S(n)—The median slack of net n;

MinCut—a known algorithm to partition logic design (netlist) to two pieces about equal in size with a minimum number of nets (MC) connecting the pieces;

MC—number of nets connecting the two partitions;

K1, K2—Two parameters selected by the designer.

One idea of the proposed flow of FIG. 13 is to construct a list of nets in the logic design that connect more than K1 nodes and less than K2 nodes. K1 and K2 are parameters that could be selected by the designer and could be modified in an iterative process. K1 should be high enough so to limit the number of nets put into the list. The flow's objective is to assign the TSVs to the nets that have tight timing constraints—critical nets. And also have many nodes whereby having the ability to spread the placement on multiple die help to reduce the overall physical length to meet the timing constraints. The number of nets in the list should be close but smaller than the number of TSVs. Accordingly K1 should be set high enough to achieve this objective. K2 is the upper boundary for nets with the number of nodes N(n) that would justify special treatment.

Critical nets may be identified usually by using static timing analysis of the design to identify the critical paths and the available "slack" time on these paths, and pass the constraints for these paths to the floor planning, layout, and routing tools so that the final design is not degraded beyond the requirement.

Once the list is constructed it is priority-ordered according to increasing slack, or the median slack, S(n), of the nets. Then, using a partitioning algorithm, such as, but not limited to, MinCut, the design may be split into two parts, with the highest priority nets split about equally between the two parts. The objective is to give the nets that have tight slack a better chance to be placed close enough to meet the timing challenge. Those nets that have higher than K1 nodes tend to get spread over a larger area, and by spreading into three dimensions we get a better chance to meet the timing challenge.

The Flow of FIG. 13 suggests an iterative process of allocating the TSVs to those nets that have many nodes and are with the tightest timing challenge, or smallest slack.

Clearly the same Flow could be adjusted to three-way partition or any other number according to the number of dies the logic will be spread on.

Constructing a 3D Configurable System comprising antifuse based logic also provides features that may implement yield enhancement through utilizing redundancies. This may be even more convenient in a 3D structure of embodiments of the current invention because the memories may not be sprinkled between the logic but may rather be concentrated in the memory die, which may be vertically connected to the logic die. Constructing redundancy in the memory, and the proper self-repair flow, may have a smaller effect on the logic and system performance.

The potential dicing streets of the continuous array of this invention represent some loss of silicon area. The narrower the street the lower the loss is, and therefore, it may be advantageous to use advanced dicing techniques that can create and work with narrow streets.

An additional advantage of the 3D Configurable System of various embodiments of this invention may be a reduction in testing cost. This is the result of building a unique system by using standard 'Lego®' blocks. Testing standard blocks could reduce the cost of testing by using standard probe cards and standard test programs.

The disclosure presents two forms of 3D IC system, first by using TSV and second by using the method which we call 'Attic' described in FIGS. 21 to 35 and 39 to 40. Those two methods could even work together as a devices could have multiple layers of crystallized silicon produced using layer transfer and the techniques we call 'Foundation' and 'Attic' and then connected together using TSV. The most significant difference is that prior TSVs are associated with a relatively large misalignment (~1 micron) and limited connections (TSV) per mm sq. of ~10,000 for a connected fully fabricated device while the disclosed 'smart-cut'—layer transferred techniques allow 3D structures with a very small misalignment (<10 nm) and high connection (vias) per mm sq. of ~100,000,000 and are produced in an integrated fabrication flow. An advantage of 3D using TSV is the ability to test each device before integrating it and utilize the Known Good Die (KGD) in the 3D stack or system. This is very helpful to provide good yield and reasonable costs of the 3D Integrated System.

An additional alternative of the invention is a method to allow redundancy so that the highly integrated 3D systems using the layer transfer technique could be produced with good yield. For the purpose of illustrating this redundancy invention we will use the programmable tile array presented in FIGS. 11A, 36-38.

Figure 41:
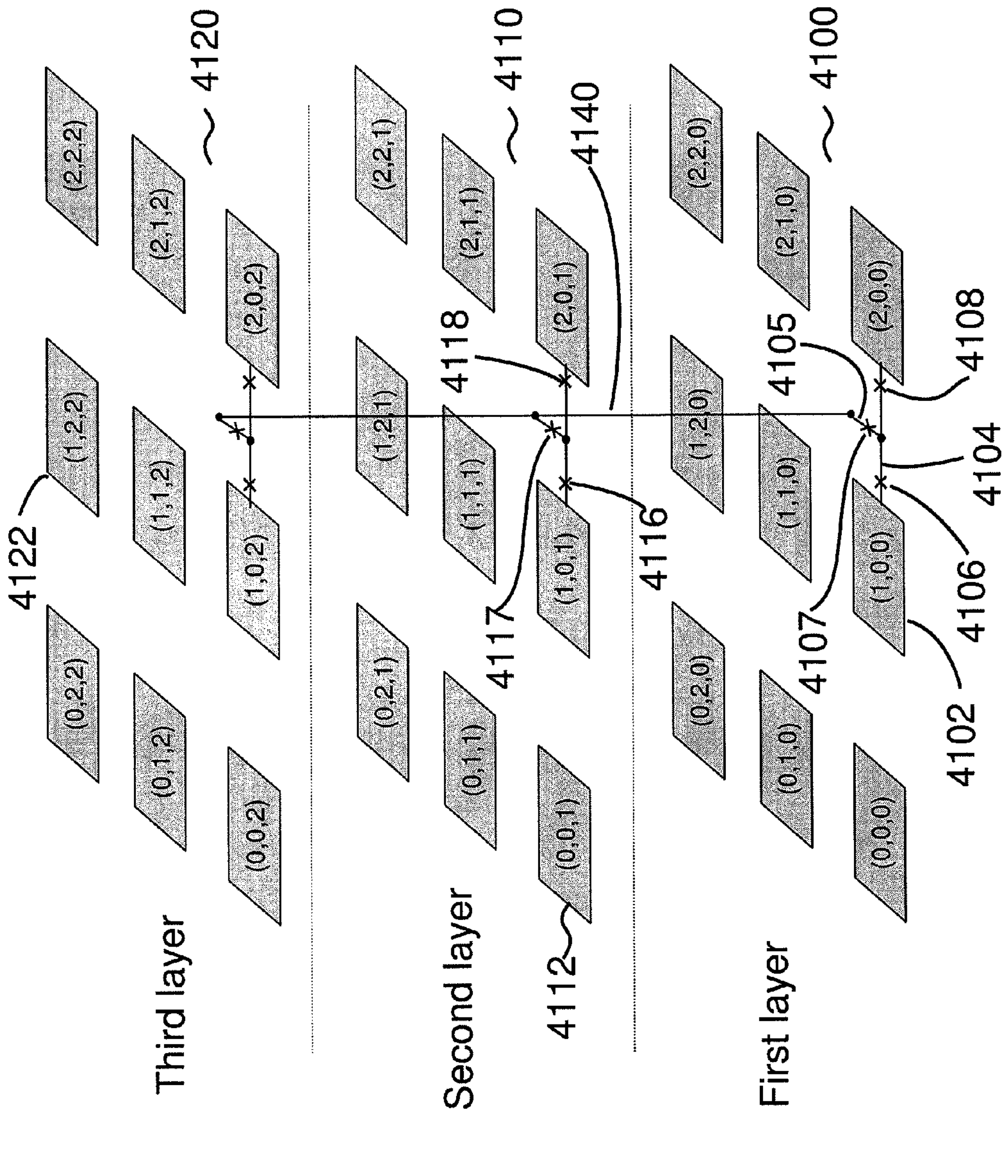
FIG. 41 is a drawing illustration of a 3D IC system with redundancy.

FIG. 41 is a drawing illustration of a 3D IC system with redundancy. It illustrates a 3D IC programmable system comprising: first programmable layer 4100 of 3×3 tiles 4102, overlaid by second programmable layer 4110 of 3×3 tiles 4112, overlaid by third programmable layer 4120 of 3×3 tiles 4122. Between a tile and its neighbor tile in the layer there are many programmable connections 4104. The programmable element 4106 could be antifuse, pass transistor controlled driver, floating gate flash transistor, or similar electrically programmable element. Each inter tile connection 4104 has a branch out programmable connection 4105 connected to inter layer vertical connection 4140. The end product is designed so that at least one layer such as 4110 is left for redundancy.

When the end product programmable system is being programmed for the end application each tile will run its own Built-in Test using its own MCU. A tile that is detected to have a defect will be replaced by the tile in the redundancy layer 4110. The replacement will be done by the tile that is at the same location but in the redundancy layer and therefore it should have an acceptable impact on the overall product functionality and performance. For example, if tile (1,0,0) has a defect then tile (1,0,1) will be programmed to have exactly the same function and will replace tile (1,0,0) by properly setting the inter tile programmable connections. Therefore, if defective tile (1,0,0) was supposed to be connected to tile (2,0,0) by connection 4104 with programmable element 4106, then programmable element 4106 would be turned off and programmable elements 4116, 4117, 4107 will be turned on instead. A similar multilayer connection structure should be used for any connection in or out of a repeating tile. So if the tile has a defect the redundant tile of the redundant layer would be programmed to the defected tile functionality and the multilayer inter tile structure would be activated to disconnect the faulty tile and connect the redundant tile. The inter layer vertical connection 4140 could be also used when tile (2,0,0) is defective to insert tile (2,0,1), of the redundant layer, instead. In such case (2,0,1) will be programmed to have exactly the same function as tile (2,0,0), programmable element 4108 will be turned off and programmable elements 4118, 4117, 4107 will be turned on instead.

It should be stated again that the invention could be applied to many applications other than programmable logic such a Graphics Processor which may comprise many repeating processing units.

An additional variation of the programmable 3D system may comprise a tiled array of programmable logic tiles connected with I/O structures that are pre fabricated on the base wafer 1402 of FIG. 14.

In yet an additional variation, the programmable 3D system may comprise a tiled array of programmable logic tiles connected with I/O structures that are pre-fabricated on top of the finished base wafer 1402 by using any of the techniques presented in conjunction to FIGS. 21-35 or FIGS. 39-40. In fact any of the alternative structures presented in FIG. 11 may be fabricated on top of each other by the 3D techniques presented in conjunction with FIGS. 21-35 or FIGS. 39-40. Accordingly many variations of 3D programmable systems may be constructed with a limited set of masks by mixing different structures to form various 3D programmable systems by varying the amount and 3D position of logic and type of I/Os and type of memories and so forth.

Additional flexibility and reuse of masks may be achieved by utilizing only a portion of the full reticle exposure. Modern steppers allow covering portions of the reticle and hence projecting only a portion of the reticle. Accordingly a portion of a mask set may be used for one function while another portion of that same mask set would be used for another function. For example, let the structure of FIG. 37 represent the logic portion of the end device of a 3D programmable system. On top of that 3×3 programmable tile structure I/O structures could be built utilizing process techniques according to FIGS. 21-35 or FIGS. 39-40. There may be a set of masks where various portions provide for the overlay of different I/O structures; for example, one portion comprising simple I/Os, and another of Serializer/Deserializer (Ser/Des) I/Os. Each set is designed to provide tiles of I/O that perfectly overlay the programmable logic tiles. Then out of these two portions on one mask set, multiple variations of end systems could be produced, including one with all nine tiles as simple I/Os, another with SerDes overlaying tile (0,0) while simple I/Os are overlaying the other eight tiles, another with SerDes overlaying tiles (0,0), (0,1) and (0,2) while simple I/Os are overlaying the other 6 tiles, and so forth. In fact, if properly designed, multiples of layers could be fabricated one on top of the other offering a large variety of end products from a limited set of masks.

In yet an additional alternative of the current invention, the 3D antifuse Configurable System, may also comprise a Programming Die. In some cases of FPGA products, and primarily in antifuse-based products, there is an external apparatus that may be used for the programming the device. In many cases it is a user convenience to integrate this programming function into the FPGA device. This may result in a significant die overhead as the programming process requires higher voltages as well as control logic. The programmer function could be designed into a dedicated Programming Die. Such a Programmer Die could comprise the charge pump, to generate the higher programming voltage, and a controller with the associated programming to program the antifuse configurable dies within the 3D Configurable circuits, and the programming check circuits. The Programming Die might be fabricated using a lower cost older semiconductor process. An additional advantage of this 3D architecture of the Configurable System may be a high volume cost reduction option wherein the antifuse layer may be replaced with a custom layer and, therefore, the Programming Die could be removed from the 3D system for a more cost effective high volume production.

It will be appreciated by persons skilled in the art, that the present invention is using the term antifuse as it is the common name in the industry, but it also refers in this invention to any micro element that functions like a switch, meaning a micro element that initially has highly resistive-OFF state, and electronically it could be made to switch to a very low resistance—ON state. It could also correspond to a device to switch ON-OFF multiple times—a re-programmable switch. As an example there are new innovations, such as the electrostatically actuated Metal-Droplet micro-switch, that may be compatible for integration onto CMOS chips.

It will be appreciated by persons skilled in the art that the present invention is not limited to antifuse configurable logic and it will be applicable to other non-volatile configurable logic. A good example for such is the Flash based configurable logic. Flash programming may also require higher voltages, and having the programming transistors and the programming circuits in the base diffusion layer may reduce the overall density of the base diffusion layer. Using various embodiments of the current invention may be useful and could allow a higher device density. It is therefore suggested to build the programming transistors and the programming circuits, not as part of the diffusion layer, but according to one or more embodiments of the present invention. In high volume production one or more custom masks could be used to replace the function of the Flash programming and accordingly save the need to add on the programming transistors and the programming circuits.

Unlike metal-to-metal antifuses that could be placed as part of the metal interconnection, Flash circuits need to be fabricated in the base diffusion layers. As such it might be less efficient to have the programming transistor in a layer far above. An alternative embodiment of the current invention is to use Through-Silicon-Via 816 to connect the configurable logic device and its Flash devices to an underlying structure 804 comprising the programming transistors.

It will also be appreciated by persons skilled in the art, that the present invention is not limited to what has been particularly shown and described hereinabove. Rather, the scope of the present invention includes both combinations and sub-combinations of the various features described hereinabove as well as modifications and variations which would occur to persons skilled in the art upon reading the foregoing description and which are not in the prior art.

We claim:

1. A semiconductor device comprising:

a first single crystal silicon layer comprising a plurality of first transistors and a plurality of first alignment marks;

at least two metal layers overlying said first single crystal silicon layer, wherein said metal layers comprise copper or aluminum more than other materials; and a second thin single crystal silicon layer of less than 0.4 micron thickness overlying said at least two metal layers, wherein said second thin single crystal silicon layer comprises a plurality of second transistors, and wherein said second transistors comprise recessed channel transistors.

2. A semiconductor device according to claim 1, wherein said second thin single crystal silicon layer is constructed by a layer transfer process.

3. A semiconductor device according to claim 1, wherein said second transistors are annealed by an optical annealing.

4. A semiconductor device according to claim 1, wherein said at least two metal layers comprise a third metal layer overlying a second metal layer that overlies a first metal layer, wherein said third metal layer and said first metal layer each has an associated pitch that is tighter than a pitch associated with said second metal layer.

5. A semiconductor device according to claim 1, wherein said second transistors are aligned with said first alignment marks.

6. A semiconductor device according to claim 1, wherein said recessed channel transistors comprise P type transistors and N type transistors.

7. A semiconductor device according to claim 1, wherein said second single crystal silicon layer comprises a second alignment mark and wherein said second transistors are aligned with said first alignment marks by an offset, wherein said offset relates to a distance between one of said first alignment marks and said second alignment mark.

* * * * *